US011573437B2

(12) United States Patent
Woodgate et al.

(10) Patent No.: US 11,573,437 B2
(45) Date of Patent: Feb. 7, 2023

(54) DIRECTIONAL DISPLAY APPARATUS

(71) Applicant: REALD SPARK, LLC, Beverly Hills, CA (US)

(72) Inventors: Graham J. Woodgate, Henley-on-Thames (GB); Michael G. Robinson, Boulder, CO (US); Jonathan Harrold, Upper Heyford (GB); Robert A. Ramsey, Boulder, CO (US)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

(21) Appl. No.: 16/920,035

(22) Filed: Jul. 2, 2020

(65) Prior Publication Data

US 2021/0018773 A1    Jan. 21, 2021

Related U.S. Application Data

(60) Provisional application No. 62/879,052, filed on Jul. 26, 2019, provisional application No. 62/869,918, filed on Jul. 2, 2019.

(51) Int. Cl.
*G02F 1/13* (2006.01)
*H01L 27/32* (2006.01)
(Continued)

(52) U.S. Cl.
CPC ........ *G02F 1/1323* (2013.01); *G02F 1/13338* (2013.01); *G02F 1/133528* (2013.01);
(Continued)

(58) Field of Classification Search
CPC ..... G02F 1/1323; H01L 27/3232; E06B 9/24; E06B 2009/2464
See application file for complete search history.

(56) References Cited

U.S. PATENT DOCUMENTS 3,914,022 A    10/1975  Kashnow
4,059,916 A    11/1977  Tachihara et al.
(Continued)

FOREIGN PATENT DOCUMENTS

CA    2222313 A1    6/1998
CN    1125943 C    10/2003
(Continued)

OTHER PUBLICATIONS

Adachi, et al. "P-228L: Late-News Poster: Controllable Viewing-Angle Displays using a Hybrid Aligned Nematic Liquid Crystal Cell", ISSN, SID 2006 Digest, pp. 705-708.
(Continued)

*Primary Examiner* — Mariam Qureshi
(74) *Attorney, Agent, or Firm* — Penny L. Lowry

(57) ABSTRACT

A switchable privacy display comprises an emissive SLM, a parallax barrier, a switchable LC retarder, and passive retarders arranged between parallel output polarisers. In privacy mode, on-axis light from the SLM is directed without loss, whereas the parallax barrier and retarder layers cooperate to increase the VSL to off-axis snoopers. The display may be rotated to achieve privacy operation in landscape and portrait orientations. In public mode, the LC retardance is adjusted so that off-axis luminance is increased so that the image visibility is increased for multiple users. The display may also switch between day-time and night-time operation, for example for use in an automotive environment. A low reflectivity emissive display for use in ambient illumination comprises a SLM with emissive pixels, an absorptive parallax barrier and a high spectral leakage optical isolator. Head-on light from the pixels is directed with increased transmission efficiency while ambient light is strongly absorbed.

76 Claims, 62 Drawing Sheets

(51) Int. Cl.
*G02F 1/1333* (2006.01)
*G02F 1/1335* (2006.01)
*H01L 51/52* (2006.01)
*H01L 51/56* (2006.01)

(52) U.S. Cl.
CPC ...... G02F 1/133553 (2013.01); H01L 27/323 (2013.01); H01L 27/3232 (2013.01); H01L 51/5284 (2013.01); H01L 51/56 (2013.01); *G02F 1/133531* (2021.01)

(56) References Cited

U.S. PATENT DOCUMENTS

| | | |
|---|---|---|
| 4,621,898 A | 11/1986 | Cohen |
| 4,974,941 A | 12/1990 | Gibbons et al. |
| 5,005,108 A | 4/1991 | Pristash et al. |
| 5,035,491 A | 7/1991 | Kawagishi et al. |
| 5,126,882 A | 6/1992 | Oe et al. |
| 5,184,114 A | 2/1993 | Brown |
| 5,608,550 A | 3/1997 | Epstein et al. |
| 5,658,490 A | 8/1997 | Sharp et al. |
| 5,671,994 A | 9/1997 | Tai et al. |
| 5,715,028 A | 2/1998 | Abileah et al. |
| 5,779,337 A | 7/1998 | Saito et al. |
| 5,791,757 A | 8/1998 | O'Neil et al. |
| 5,808,784 A | 9/1998 | Ando et al. |
| 5,812,105 A | 9/1998 | Ven |
| 5,835,166 A | 11/1998 | Hall et al. |
| 5,854,872 A | 12/1998 | Tai |
| 5,894,361 A | 4/1999 | Yamazaki et al. |
| 5,914,760 A | 6/1999 | Daiku |
| 5,997,148 A | 12/1999 | Ohkawa |
| 6,055,103 A | 4/2000 | Woodgate et al. |
| 6,099,758 A | 8/2000 | Verrall et al. |
| 6,144,433 A | 11/2000 | Tillin et al. |
| 6,169,589 B1 | 1/2001 | Kaneko |
| 6,204,904 B1 | 3/2001 | Tillin et al. |
| 6,222,672 B1 | 4/2001 | Towler et al. |
| 6,280,043 B1 | 8/2001 | Ohkawa |
| 6,364,497 B1 | 4/2002 | Park et al. |
| 6,379,016 B1 | 4/2002 | Boyd et al. |
| 6,392,727 B1 | 5/2002 | Larson et al. |
| 6,437,915 B2 | 8/2002 | Moseley et al. |
| 6,547,423 B2 | 4/2003 | Marshall et al. |
| 6,570,324 B1 | 5/2003 | Tutt et al. |
| 6,731,355 B2 | 5/2004 | Miyashita |
| 6,752,505 B2 | 6/2004 | Parker et al. |
| 7,014,964 B1 | 3/2006 | Hsu et al. |
| 7,067,985 B2 | 6/2006 | Adachi |
| 7,072,096 B2 | 7/2006 | Holman et al. |
| 7,084,435 B2 | 8/2006 | Sugimoto et al. |
| 7,163,319 B2 | 1/2007 | Kuo et al. |
| 7,171,874 B1 | 2/2007 | Huang |
| 7,227,602 B2 | 6/2007 | Jeon et al. |
| 7,366,392 B2 | 4/2008 | Honma et al. |
| 7,524,542 B2 | 4/2009 | Kim et al. |
| 7,528,893 B2 | 5/2009 | Schultz et al. |
| 7,528,913 B2 | 5/2009 | Kobayashi |
| 7,633,586 B2 | 12/2009 | Winlow et al. |
| 7,660,047 B1 | 2/2010 | Travis et al. |
| 7,766,534 B2 | 8/2010 | Iwasaki |
| 7,834,834 B2 | 11/2010 | Takatani et al. |
| 7,863,614 B2 | 1/2011 | Toyama et al. |
| 7,970,246 B2 | 6/2011 | Travis et al. |
| 7,991,257 B1 | 8/2011 | Coleman |
| 7,994,531 B2 | 8/2011 | Lin et al. |
| 8,070,346 B2 | 12/2011 | Maeda et al. |
| 8,098,350 B2 | 1/2012 | Sakai et al. |
| 8,154,686 B2 | 4/2012 | Mather et al. |
| 8,237,876 B2 | 8/2012 | Tan et al. |
| 8,249,408 B2 | 8/2012 | Coleman |
| 8,262,271 B2 | 9/2012 | Tillin et al. |
| 8,469,575 B2 | 6/2013 | Weber et al. |
| 8,646,931 B2 | 2/2014 | Choi et al. |
| 8,721,115 B2 | 5/2014 | Ing et al. |
| 8,794,792 B1 | 8/2014 | Moghal et al. |
| 8,801,260 B2 | 8/2014 | Urano et al. |
| 8,848,132 B2 | 9/2014 | O'Neill et al. |
| 8,939,595 B2 | 1/2015 | Choi et al. |
| 8,973,149 B2 | 3/2015 | Buck |
| 9,195,087 B2 | 11/2015 | Terashima |
| 9,274,260 B2 | 3/2016 | Urano et al. |
| 9,304,241 B2 | 4/2016 | Wang et al. |
| 9,324,234 B2 | 4/2016 | Ricci et al. |
| 9,448,355 B2 | 9/2016 | Urano et al. |
| 9,501,036 B2 | 11/2016 | Kang et al. |
| 9,519,153 B2 | 12/2016 | Robinson et al. |
| 9,541,698 B2 | 1/2017 | Wheatley et al. |
| 10,054,732 B2 | 8/2018 | Robinson et al. |
| 10,121,772 B1 | 11/2018 | Wu et al. |
| 10,126,575 B1 | 11/2018 | Robinson et al. |
| 10,146,093 B2 | 12/2018 | Sakai et al. |
| 10,216,018 B2 | 2/2019 | Fang et al. |
| 10,303,030 B2 | 5/2019 | Robinson et al. |
| 10,401,638 B2 | 9/2019 | Robinson et al. |
| 10,488,705 B2 | 11/2019 | Xu et al. |
| 10,527,775 B2 | 1/2020 | Yang et al. |
| 10,533,730 B2 | 1/2020 | Harrold et al. |
| 10,627,670 B2 | 4/2020 | Robinson et al. |
| 10,649,248 B1 | 5/2020 | Jiang et al. |
| 10,649,259 B2 | 5/2020 | Lee et al. |
| 10,712,608 B2 | 7/2020 | Robinson et al. |
| 10,935,714 B2 | 3/2021 | Woodgate et al. |
| 10,976,578 B2 | 4/2021 | Robinson et al. |
| 11,016,341 B2 | 5/2021 | Robinson et al. |
| 11,070,791 B2 | 7/2021 | Woodgate et al. |
| 11,079,645 B2 | 8/2021 | Harrold et al. |
| 11,099,448 B2 | 8/2021 | Woodgate et al. |
| 11,237,417 B2 | 2/2022 | Woodgate et al. |
| 11,442,316 B2 | 9/2022 | Woodgate et al. |
| 2001/0024561 A1 | 9/2001 | Cornelissen et al. |
| 2002/0015300 A1 | 2/2002 | Katsu et al. |
| 2002/0024529 A1 | 2/2002 | Miller et al. |
| 2002/0171793 A1 | 11/2002 | Sharp et al. |
| 2003/0030764 A1 | 2/2003 | Lee |
| 2003/0058381 A1 | 3/2003 | Shinohara et al. |
| 2003/0089956 A1 | 5/2003 | Allen et al. |
| 2003/0107686 A1 | 6/2003 | Sato et al. |
| 2003/0117792 A1 | 6/2003 | Kunimochi et al. |
| 2003/0169499 A1 | 9/2003 | Bourdelais et al. |
| 2003/0214615 A1 | 11/2003 | Colgan et al. |
| 2003/0222857 A1 | 12/2003 | Abileah |
| 2004/0015729 A1 | 1/2004 | Elms et al. |
| 2004/0080938 A1 | 4/2004 | Holman et al. |
| 2004/0089935 A1 | 5/2004 | Lehner |
| 2004/0100598 A1 | 5/2004 | Adachi et al. |
| 2004/0125430 A1 | 7/2004 | Kasajima et al. |
| 2004/0126911 A1 | 7/2004 | Kimura |
| 2004/0141107 A1 | 7/2004 | Jones |
| 2004/0145703 A1 | 7/2004 | O'Connor et al. |
| 2004/0161871 A1 | 8/2004 | Omori |
| 2004/0218390 A1 | 11/2004 | Holman et al. |
| 2004/0239243 A1 | 12/2004 | Roberts et al. |
| 2004/0240777 A1 | 12/2004 | Woodgate et al. |
| 2004/0263061 A1 | 12/2004 | Ishikawa et al. |
| 2004/0264910 A1 | 12/2004 | Suzuki et al. |
| 2005/0002174 A1 | 1/2005 | Min et al. |
| 2005/0111100 A1* | 5/2005 | Mather .................. H04N 13/31 359/464 |
| 2005/0117186 A1 | 6/2005 | Li et al. |
| 2005/0135116 A1 | 6/2005 | Epstein et al. |
| 2005/0157225 A1 | 7/2005 | Toyooka et al. |
| 2005/0190326 A1 | 9/2005 | Jeon et al. |
| 2005/0190329 A1 | 9/2005 | Okumura |
| 2005/0213348 A1 | 9/2005 | Parikka et al. |
| 2005/0219693 A1 | 10/2005 | Hartkop et al. |
| 2005/0259205 A1 | 11/2005 | Sharp et al. |
| 2005/0270798 A1 | 12/2005 | Lee et al. |
| 2006/0066785 A1 | 3/2006 | Moriya |
| 2006/0082702 A1 | 4/2006 | Jacobs et al. |
| 2006/0098296 A1 | 5/2006 | Woodgate et al. |
| 2006/0146405 A1 | 7/2006 | MacMaster |
| 2006/0152931 A1 | 7/2006 | Holman |
| 2006/0203162 A1 | 9/2006 | Ito et al. |

(56) References Cited

U.S. PATENT DOCUMENTS

| | | |
|---|---|---|
| 2006/0215244 A1 | 9/2006 | Yosha et al. |
| 2006/0221611 A1 | 10/2006 | Noh et al. |
| 2006/0244884 A1 | 11/2006 | Jeon et al. |
| 2006/0256255 A1 | 11/2006 | Minami |
| 2006/0262255 A1 | 11/2006 | Wang et al. |
| 2006/0262258 A1 | 11/2006 | Wang et al. |
| 2006/0262558 A1 | 11/2006 | Cornelissen |
| 2006/0268207 A1 | 11/2006 | Tan et al. |
| 2006/0285040 A1 | 12/2006 | Kobayashi |
| 2006/0290276 A1 | 12/2006 | Cok et al. |
| 2007/0007237 A1 | 1/2007 | Wu et al. |
| 2007/0008471 A1 | 1/2007 | Wang et al. |
| 2007/0019131 A1 | 1/2007 | Choi et al. |
| 2007/0030240 A1 | 2/2007 | Sumiyoshi et al. |
| 2007/0035964 A1 | 2/2007 | Olczak |
| 2007/0047254 A1 | 3/2007 | Schardt et al. |
| 2007/0064163 A1 | 3/2007 | Tan et al. |
| 2007/0116424 A1 | 5/2007 | Ting et al. |
| 2007/0139772 A1 | 6/2007 | Wang |
| 2007/0165394 A1 | 7/2007 | Chang |
| 2007/0176195 A1 | 8/2007 | Kuiseko et al. |
| 2007/0223251 A1 | 9/2007 | Liao |
| 2007/0236628 A1 | 10/2007 | Epstein |
| 2007/0242477 A1 | 10/2007 | Yoo et al. |
| 2007/0256453 A1 | 11/2007 | Barnes et al. |
| 2007/0268427 A1 | 11/2007 | Uehara |
| 2007/0285775 A1 | 12/2007 | Lesage et al. |
| 2008/0008434 A1 | 1/2008 | Lee et al. |
| 2008/0043466 A1 | 2/2008 | Chakmakjian et al. |
| 2008/0068329 A1 | 3/2008 | Shestak et al. |
| 2008/0068862 A1 | 3/2008 | Shimura |
| 2008/0089093 A1 | 4/2008 | Miller et al. |
| 2008/0123350 A1 | 5/2008 | Choe et al. |
| 2008/0129899 A1 | 6/2008 | Sharp |
| 2008/0158491 A1 | 7/2008 | Zhu et al. |
| 2008/0158912 A1 | 7/2008 | Chang et al. |
| 2008/0205066 A1 | 8/2008 | Ohta et al. |
| 2008/0225523 A1 | 9/2008 | Samber et al. |
| 2008/0237612 A1 | 10/2008 | Cok |
| 2008/0258162 A1 | 10/2008 | Koung et al. |
| 2008/0285310 A1 | 11/2008 | Aylward et al. |
| 2008/0315755 A1 | 12/2008 | Han |
| 2008/0316198 A1 | 12/2008 | Fukushima et al. |
| 2009/0001869 A1 | 1/2009 | Tanimoto et al. |
| 2009/0040426 A1 | 2/2009 | Mather et al. |
| 2009/0073350 A1 | 3/2009 | Toyama et al. |
| 2009/0085894 A1 | 4/2009 | Gandhi et al. |
| 2009/0086508 A1 | 4/2009 | Bierhuizen |
| 2009/0086509 A1 | 4/2009 | Omori et al. |
| 2009/0109656 A1 | 4/2009 | Chang |
| 2009/0109703 A1 | 4/2009 | Chen et al. |
| 2009/0128735 A1 | 5/2009 | Larson et al. |
| 2009/0128746 A1 | 5/2009 | Kean et al. |
| 2009/0135623 A1 | 5/2009 | Kunimochi |
| 2009/0174843 A1 | 7/2009 | Sakai et al. |
| 2009/0213298 A1 | 8/2009 | Mimura et al. |
| 2009/0213305 A1 | 8/2009 | Ohmuro et al. |
| 2009/0242929 A1 | 10/2009 | Lin |
| 2009/0244415 A1 | 10/2009 | Ide |
| 2009/0268428 A1 | 10/2009 | Tsukada |
| 2009/0296389 A1 | 12/2009 | Hsu |
| 2010/0002296 A1 | 1/2010 | Choi et al. |
| 2010/0061096 A1 | 3/2010 | Sato |
| 2010/0097809 A1 | 4/2010 | Munro et al. |
| 2010/0128200 A1 | 5/2010 | Morishita et al. |
| 2010/0149459 A1 | 6/2010 | Yabuta et al. |
| 2010/0165635 A1 | 7/2010 | Chen et al. |
| 2010/0171215 A1 | 7/2010 | Fischer et al. |
| 2010/0172152 A1 | 7/2010 | Boonekamp |
| 2010/0177113 A1 | 7/2010 | Gay et al. |
| 2010/0195330 A1 | 8/2010 | Schaefer et al. |
| 2010/0205667 A1 | 8/2010 | Anderson et al. |
| 2010/0238376 A1 | 9/2010 | Sakai et al. |
| 2010/0258543 A1 | 10/2010 | Mizuno et al. |
| 2010/0283930 A1 | 11/2010 | Park et al. |
| 2010/0289989 A1 | 11/2010 | Adachi et al. |
| 2010/0295755 A1 | 11/2010 | Broughton et al. |
| 2010/0295762 A1 | 11/2010 | Yeom et al. |
| 2010/0317132 A1 | 12/2010 | Rogers et al. |
| 2010/0328438 A1 | 12/2010 | Ohyama et al. |
| 2011/0003410 A1 | 1/2011 | Tsay et al. |
| 2011/0018860 A1* | 1/2011 | Parry-Jones ......... H04N 13/351 345/214 |
| 2011/0032483 A1 | 2/2011 | Hruska et al. |
| 2011/0038150 A1 | 2/2011 | Woodgate et al. |
| 2011/0090672 A1 | 4/2011 | Zhu et al. |
| 2011/0151602 A1 | 6/2011 | Speier |
| 2011/0176089 A1 | 7/2011 | Ishikawa et al. |
| 2011/0194034 A1 | 8/2011 | Shimizu |
| 2011/0241573 A1 | 10/2011 | Tsai et al. |
| 2011/0241983 A1 | 10/2011 | Chang |
| 2011/0255303 A1 | 10/2011 | Nichol et al. |
| 2011/0255304 A1 | 10/2011 | Kinoshita |
| 2011/0286222 A1 | 11/2011 | Coleman |
| 2011/0321143 A1 | 12/2011 | Angaluri et al. |
| 2012/0002121 A1 | 1/2012 | Pirs et al. |
| 2012/0086875 A1 | 4/2012 | Yokota |
| 2012/0119237 A1 | 5/2012 | Leatherdale et al. |
| 2012/0127573 A1 | 5/2012 | Robinson et al. |
| 2012/0140462 A1 | 6/2012 | Pickard |
| 2012/0147026 A1 | 6/2012 | Gass et al. |
| 2012/0147280 A1 | 6/2012 | Osterman et al. |
| 2012/0147296 A1 | 6/2012 | Montgomery et al. |
| 2012/0188792 A1 | 7/2012 | Matsumoto et al. |
| 2012/0212414 A1 | 8/2012 | Osterhout et al. |
| 2012/0235891 A1 | 9/2012 | Nishitani et al. |
| 2012/0258963 A1 | 10/2012 | Berger et al. |
| 2012/0294037 A1 | 11/2012 | Holman et al. |
| 2012/0299913 A1 | 11/2012 | Robinson et al. |
| 2012/0314145 A1 | 12/2012 | Robinson |
| 2012/0320311 A1 | 12/2012 | Gotou et al. |
| 2012/0320627 A1 | 12/2012 | Araki et al. |
| 2012/0327101 A1 | 12/2012 | Blixt et al. |
| 2013/0033849 A1 | 2/2013 | Roberts et al. |
| 2013/0039062 A1 | 2/2013 | Vinther et al. |
| 2013/0057807 A1 | 3/2013 | Goto et al. |
| 2013/0100097 A1 | 4/2013 | Martin |
| 2013/0107174 A1 | 5/2013 | Yun et al. |
| 2013/0107525 A1 | 5/2013 | Woodgate et al. |
| 2013/0121000 A1 | 5/2013 | Lee et al. |
| 2013/0128165 A1 | 5/2013 | Lee et al. |
| 2013/0194812 A1 | 8/2013 | Tseng |
| 2013/0235580 A1 | 9/2013 | Smith |
| 2013/0242231 A1 | 9/2013 | Kurata et al. |
| 2013/0242612 A1 | 9/2013 | Lee et al. |
| 2013/0258663 A1 | 10/2013 | Woodgate et al. |
| 2013/0278544 A1 | 10/2013 | Cok |
| 2013/0293793 A1* | 11/2013 | Lu ......... H04N 13/398 349/15 |
| 2013/0300985 A1 | 11/2013 | Bulda |
| 2013/0307831 A1 | 11/2013 | Robinson et al. |
| 2013/0308339 A1 | 11/2013 | Woodgate et al. |
| 2013/0321340 A1 | 12/2013 | Seo et al. |
| 2013/0328866 A1 | 12/2013 | Woodgate et al. |
| 2014/0009508 A1 | 1/2014 | Woodgate et al. |
| 2014/0022619 A1* | 1/2014 | Woodgate ......... G02B 27/0093 359/240 |
| 2014/0071382 A1 | 3/2014 | Scardato |
| 2014/0098418 A1* | 4/2014 | Lin ......... G02B 30/27 359/463 |
| 2014/0098558 A1 | 4/2014 | Vasylyev |
| 2014/0111760 A1 | 4/2014 | Guo et al. |
| 2014/0132887 A1 | 5/2014 | Kurata |
| 2014/0133181 A1 | 5/2014 | Ishida et al. |
| 2014/0140091 A1 | 5/2014 | Vasylyev |
| 2014/0140095 A1 | 5/2014 | Yuki et al. |
| 2014/0140654 A1 | 5/2014 | Brown et al. |
| 2014/0176873 A1 | 6/2014 | Shinohara et al. |
| 2014/0186979 A1 | 7/2014 | Tu et al. |
| 2014/0201844 A1 | 7/2014 | Buck |
| 2014/0211125 A1 | 7/2014 | Kurata |
| 2014/0211462 A1 | 7/2014 | Keller et al. |
| 2014/0211503 A1 | 7/2014 | Tarsa |
| 2014/0232836 A1 | 8/2014 | Woodgate et al. |

(56) References Cited

U.S. PATENT DOCUMENTS

| | | |
|---|---|---|
| 2014/0232960 A1 | 8/2014 | Schwartz et al. |
| 2014/0240344 A1 | 8/2014 | Tomono et al. |
| 2014/0240828 A1 | 8/2014 | Robinson et al. |
| 2014/0240839 A1 | 8/2014 | Yang et al. |
| 2014/0268358 A1 | 9/2014 | Kusaka et al. |
| 2014/0286043 A1 | 9/2014 | Sykora et al. |
| 2014/0286044 A1 | 9/2014 | Johnson et al. |
| 2014/0289835 A1 | 9/2014 | Varshavsky et al. |
| 2014/0299897 A1 | 10/2014 | Zhang et al. |
| 2014/0316742 A1 | 10/2014 | Sun et al. |
| 2014/0340728 A1 | 11/2014 | Taheri |
| 2014/0361990 A1 | 12/2014 | Leister |
| 2014/0367873 A1 | 12/2014 | Yang et al. |
| 2015/0054011 A1 | 2/2015 | Koizumi et al. |
| 2015/0055366 A1 | 2/2015 | Chang et al. |
| 2015/0062490 A1 | 3/2015 | Kwon |
| 2015/0116212 A1 | 4/2015 | Freed et al. |
| 2015/0160396 A1 | 6/2015 | Wilcox et al. |
| 2015/0177447 A1 | 6/2015 | Woodgate et al. |
| 2015/0177563 A1 | 6/2015 | Cho et al. |
| 2015/0185398 A1 | 7/2015 | Chang et al. |
| 2015/0205157 A1 | 7/2015 | Sakai et al. |
| 2015/0268479 A1 | 9/2015 | Woodgate et al. |
| 2015/0268513 A1 | 9/2015 | Chang et al. |
| 2015/0286061 A1 | 10/2015 | Seo et al. |
| 2015/0286817 A1 | 10/2015 | Haddad et al. |
| 2015/0293273 A1 | 10/2015 | Chen et al. |
| 2015/0293289 A1 | 10/2015 | Shinohara et al. |
| 2015/0295154 A1 | 10/2015 | Tu et al. |
| 2015/0301400 A1 | 10/2015 | Kimura et al. |
| 2015/0308635 A1 | 10/2015 | Li et al. |
| 2015/0338564 A1 | 11/2015 | Zhang et al. |
| 2015/0346417 A1 | 12/2015 | Powell |
| 2015/0346532 A1 | 12/2015 | Do et al. |
| 2015/0355490 A1 | 12/2015 | Kao et al. |
| 2015/0378085 A1 | 12/2015 | Robinson et al. |
| 2016/0018077 A1 | 1/2016 | Mallory et al. |
| 2016/0054508 A1 | 2/2016 | Hirayama et al. |
| 2016/0103264 A1 | 4/2016 | Lee et al. |
| 2016/0132721 A1 | 5/2016 | Bostick et al. |
| 2016/0147074 A1 | 5/2016 | Kobayashi et al. |
| 2016/0154259 A1 | 6/2016 | Kim et al. |
| 2016/0211413 A1 | 7/2016 | Park et al. |
| 2016/0216420 A1 | 7/2016 | Gaides et al. |
| 2016/0216540 A1 | 7/2016 | Cho et al. |
| 2016/0224106 A1 | 8/2016 | Liu |
| 2016/0238869 A1 | 8/2016 | Osterman et al. |
| 2016/0259115 A1 | 9/2016 | Kitano et al. |
| 2016/0299281 A1 | 10/2016 | Robinson et al. |
| 2016/0334898 A1 | 11/2016 | Kwak et al. |
| 2016/0349444 A1 | 12/2016 | Robinson et al. |
| 2016/0356943 A1 | 12/2016 | Choi et al. |
| 2016/0357046 A1 | 12/2016 | Choi et al. |
| 2017/0003436 A1 | 1/2017 | Inoue et al. |
| 2017/0031085 A1 | 2/2017 | Lim et al. |
| 2017/0031206 A1 | 2/2017 | Smith et al. |
| 2017/0045666 A1 | 2/2017 | Vasylyev |
| 2017/0059127 A1 | 3/2017 | Jansma et al. |
| 2017/0090103 A1 | 3/2017 | Holman |
| 2017/0092187 A1 | 3/2017 | Bergquist |
| 2017/0092229 A1 | 3/2017 | Greenebaum et al. |
| 2017/0102127 A1 | 4/2017 | Woodgate et al. |
| 2017/0115485 A1 | 4/2017 | Saito et al. |
| 2017/0123241 A1 | 5/2017 | Su et al. |
| 2017/0139110 A1 | 5/2017 | Woodgate et al. |
| 2017/0139114 A1 | 5/2017 | Woodgate et al. |
| 2017/0154919 A1 | 6/2017 | Chen et al. |
| 2017/0161179 A1 | 6/2017 | Maple et al. |
| 2017/0168633 A1 | 6/2017 | Kwak et al. |
| 2017/0205558 A1 | 7/2017 | Hirayama et al. |
| 2017/0205959 A1 | 7/2017 | Seong |
| 2017/0219883 A1 | 8/2017 | Yin |
| 2017/0236494 A1 | 8/2017 | Sommerlade et al. |
| 2017/0248289 A1 | 8/2017 | Vasylyev |
| 2017/0261179 A1 | 9/2017 | Wu et al. |
| 2017/0269283 A1 | 9/2017 | Wang et al. |
| 2017/0269285 A1 | 9/2017 | Hirayama et al. |
| 2017/0276960 A1 | 9/2017 | Osterman et al. |
| 2017/0315423 A1 | 11/2017 | Serati et al. |
| 2017/0329399 A1 | 11/2017 | Azam et al. |
| 2017/0336661 A1 | 11/2017 | Harrold et al. |
| 2017/0339398 A1 | 11/2017 | Woodgate et al. |
| 2017/0343715 A1 | 11/2017 | Fang et al. |
| 2017/0363798 A1 | 12/2017 | Hirayama et al. |
| 2017/0363913 A1 | 12/2017 | Yi |
| 2018/0011173 A1 | 1/2018 | Newman |
| 2018/0014007 A1* | 1/2018 | Brown ................. G02B 17/002 |
| 2018/0052346 A1 | 2/2018 | Sakai et al. |
| 2018/0082068 A1 | 3/2018 | Lancioni et al. |
| 2018/0095581 A1 | 4/2018 | Hwang et al. |
| 2018/0113334 A1 | 4/2018 | Fang et al. |
| 2018/0135831 A1 | 5/2018 | Smith et al. |
| 2018/0188576 A1 | 7/2018 | Xu et al. |
| 2018/0188603 A1 | 7/2018 | Fang et al. |
| 2018/0196275 A1 | 7/2018 | Robinson et al. |
| 2018/0210243 A1 | 7/2018 | Fang et al. |
| 2018/0226384 A1 | 8/2018 | Park et al. |
| 2018/0231811 A1 | 8/2018 | Wu |
| 2018/0252949 A1 | 9/2018 | Klippstein et al. |
| 2018/0259799 A1 | 9/2018 | Kroon |
| 2018/0259812 A1 | 9/2018 | Goda et al. |
| 2018/0284341 A1 | 10/2018 | Woodgate et al. |
| 2018/0321523 A1 | 11/2018 | Robinson et al. |
| 2018/0321553 A1 | 11/2018 | Robinson et al. |
| 2018/0329245 A1 | 11/2018 | Robinson et al. |
| 2018/0364526 A1 | 12/2018 | Finnemeyer et al. |
| 2019/0086706 A1 | 3/2019 | Robinson et al. |
| 2019/0121173 A1 | 4/2019 | Robinson et al. |
| 2019/0139243 A1 | 5/2019 | You et al. |
| 2019/0154896 A1 | 5/2019 | Yanai |
| 2019/0196235 A1 | 6/2019 | Robinson et al. |
| 2019/0196236 A1 | 6/2019 | Chen et al. |
| 2019/0197928 A1 | 6/2019 | Schubert et al. |
| 2019/0215509 A1 | 7/2019 | Woodgate et al. |
| 2019/0220121 A1 | 7/2019 | Kim et al. |
| 2019/0227366 A1 | 7/2019 | Harrold et al. |
| 2019/0235304 A1 | 8/2019 | Tamada et al. |
| 2019/0250458 A1 | 8/2019 | Robinson et al. |
| 2019/0265478 A1 | 8/2019 | Cok et al. |
| 2019/0278010 A1 | 9/2019 | Sakai et al. |
| 2019/0278135 A1 | 9/2019 | Woodgate et al. |
| 2019/0293858 A1 | 9/2019 | Woodgate et al. |
| 2019/0293983 A1 | 9/2019 | Robinson et al. |
| 2019/0294004 A1 | 9/2019 | Hashimoto |
| 2019/0353944 A1 | 11/2019 | Acreman et al. |
| 2019/0361165 A1 | 11/2019 | Chang et al. |
| 2019/0377067 A1 | 12/2019 | Han et al. |
| 2020/0026125 A1 | 1/2020 | Robinson et al. |
| 2020/0041839 A1 | 2/2020 | Robinson et al. |
| 2020/0049876 A1 | 2/2020 | Watanabe et al. |
| 2020/0096171 A1 | 3/2020 | Han et al. |
| 2020/0124834 A1 | 4/2020 | Woodgate et al. |
| 2020/0159055 A1 | 5/2020 | Robinson et al. |
| 2020/0166783 A1 | 5/2020 | Roy et al. |
| 2020/0218101 A1 | 7/2020 | Ihas et al. |
| 2020/0225402 A1 | 7/2020 | Ihas et al. |
| 2020/0233142 A1 | 7/2020 | Liao et al. |
| 2020/0259307 A1 | 8/2020 | Sharma et al. |
| 2020/0321553 A1 | 10/2020 | Kwon et al. |
| 2020/0355896 A1 | 11/2020 | Woodgate et al. |
| 2021/0033898 A1 | 2/2021 | Woodgate et al. |
| 2021/0116627 A1 | 4/2021 | Tsuji |
| 2021/0149233 A1 | 5/2021 | Robinson et al. |

FOREIGN PATENT DOCUMENTS

| | | |
|---|---|---|
| CN | 1776484 A | 5/2006 |
| CN | 101042449 A | 9/2007 |
| CN | 101256251 A | 9/2008 |
| CN | 101518095 A | 8/2009 |
| CN | 101681061 A | 3/2010 |
| CN | 102859268 A | 1/2013 |
| CN | 103117348 A | 5/2013 |
| CN | 103473494 A | 12/2013 |

(56) References Cited

FOREIGN PATENT DOCUMENTS

| | | |
|---|---|---|
| CN | 104133292 A | 11/2014 |
| CN | 104303085 A | 1/2015 |
| CN | 104321686 A | 1/2015 |
| CN | 104380177 A | 2/2015 |
| CN | 204740413 U | 11/2015 |
| CN | 105556374 A | 5/2016 |
| CN | 105849595 A | 8/2016 |
| CN | 106104372 A | 11/2016 |
| CN | 106415342 A | 2/2017 |
| CN | 107402475 A | 11/2017 |
| CN | 209171779 U | 7/2019 |
| DE | 102010031945 A1 | 1/2012 |
| EP | 1387412 A1 | 2/2004 |
| EP | 1835550 A2 | 9/2007 |
| EP | 1890343 A1 | 2/2008 |
| EP | 1986023 A1 | 10/2008 |
| EP | 2037318 A1 | 3/2009 |
| EP | 2182783 A2 | 5/2010 |
| EP | 2595295 A1 | 5/2013 |
| GB | 2418518 A | 3/2006 |
| GB | 2428100 A | 1/2007 |
| GB | 2428345 A | 1/2007 |
| GB | 2464102 A | 4/2010 |
| GB | 2482065 A | 1/2012 |
| GB | 2484711 A | 4/2012 |
| GB | 2486935 B | 9/2013 |
| JP | H01130783 U | 9/1989 |
| JP | H11174489 A | 7/1999 |
| JP | 2000323755 A | 11/2000 |
| JP | 2005316470 A | 11/2005 |
| JP | 2006139160 A | 6/2006 |
| JP | 2007148279 A | 6/2007 |
| JP | 2007273288 A | 10/2007 |
| JP | 2007294411 A | 11/2007 |
| JP | 2009295309 A | 12/2009 |
| JP | 2010238846 A | 10/2010 |
| JP | 2013219397 A | 10/2013 |
| JP | 2014099363 A | 5/2014 |
| KR | 20120011228 A | 2/2012 |
| KR | 1020170040565 A | 4/2017 |
| KR | 101990286 B1 | 6/2019 |
| TW | M537663 U | 3/2017 |
| TW | I612360 B | 1/2018 |
| WO | 2005071449 A2 | 8/2005 |
| WO | 2006115313 A1 | 11/2006 |
| WO | 2007074932 A1 | 7/2007 |
| WO | 2008001896 A1 | 1/2008 |
| WO | 2008109296 A1 | 9/2008 |
| WO | 2009008406 A1 | 1/2009 |
| WO | 2010021926 A2 | 2/2010 |
| WO | 2010038025 A2 | 4/2010 |
| WO | 2010038025 A3 | 6/2010 |
| WO | 2010143705 A1 | 12/2010 |
| WO | 2011131200 A1 | 10/2011 |
| WO | 2012052722 A2 | 4/2012 |
| WO | 2012052723 A1 | 4/2012 |
| WO | 2013064801 A1 | 5/2013 |
| WO | 2013112435 A1 | 8/2013 |
| WO | 2014011328 A1 | 1/2014 |
| WO | 2014043384 A1 | 3/2014 |
| WO | 2014130860 A1 | 8/2014 |
| WO | 2015040776 A1 | 3/2015 |
| WO | 2015057625 A1 | 4/2015 |
| WO | 2015089517 A1 | 6/2015 |
| WO | 2015143227 A1 | 9/2015 |
| WO | 2015157184 A1 | 10/2015 |
| WO | 2015190311 A1 | 12/2015 |
| WO | 2015200814 A1 | 12/2015 |
| WO | 2016195786 A1 | 12/2016 |
| WO | 2017007770 A2 | 1/2017 |
| WO | 2017050631 A1 | 3/2017 |
| WO | 2017117570 A1 | 7/2017 |
| WO | 2018035492 A1 | 2/2018 |
| WO | 2018185475 A1 | 10/2018 |
| WO | 2018185476 A1 | 10/2018 |
| WO | 2018208618 A1 | 11/2018 |
| WO | 2019055755 A1 | 3/2019 |
| WO | 2019067846 A1 | 4/2019 |
| WO | 2019107826 A1 | 6/2019 |
| WO | 2019147762 A1 | 8/2019 |

OTHER PUBLICATIONS

Brudy et al., "Is Anyone Looking? Mitigating Shoulder Surfing on Public Displays through Awareness and Protection", Proceedings of the International Symposium on Persuasive Displays (Jun. 3, 2014), pp. 1-6.
CN201780030715.3 Notification of the First Office Action dated Jan. 21, 2020.
EP-16860628.3 Extended European Search Report of European Patent Office dated Apr. 26, 2019.
EP-17799963.8 Extended European Search Report of European Patent Office dated Oct. 9, 2019.
Gass, et al. "Privacy LCD Technology for Cellular Phones", Sharp Laboratories of Europe Ltd, Mobile LCD Group, Feb. 2007, pp. 45-49.
Ishikawa, T., "New Design for a Highly Collimating Turning Film", SID 06 Digest, pp. 514-517.
Kalantar, et al. "Backlight Unit With Double Surface Light Emission," J. Soc. Inf. Display, vol. 12, Issue 4, pp. 379-387 (Dec. 2004).
PCT/US2016/058695 International search report and written opinion of the international searching authority dated Feb. 28, 2017.
PCT/US2017/032734 International search report and written opinion of the international searching authority dated Jul. 27, 2017.
PCT/US2018/031206 International search report and written opinion of the international searching authority dated Jul. 20, 2018.
PCT/US2018/031218 International Preliminary Report on Patentability dated Nov. 21, 2019.
PCT/US2018/031218 International search report and written opinion of the international searching authority dated Jul. 19, 2018.
PCT/US2018/051021 International search report and written opinion of the international searching authority dated Nov. 21, 2018.
PCT/US2018/051027 International search report and written opinion of the international searching authority dated Nov. 30, 2018.
PCT/US2018/053328 International search report and written opinion of the international searching authority dated Nov. 30, 2018.
PCT/US2018/059249 International search report and written opinion of the international searching authority dated Jan. 3, 2019.
PCT/US2018/059256 International search report and written opinion of the international searching authority dated Jan. 3, 2019.
PCT/US2019/014889 International search report and written opinion of the international searching authority dated May 24, 2019.
PCT/US2019/014902 International search report and written opinion of the international searching authority dated Jun. 25, 2019.
PCT/US2019/023659 International search report and written opinion of the international searching authority dated Jun. 10, 2019.
PCT/US2019/038409 International search report and written opinion of the international searching authority dated Sep. 19, 2019.
PCT/US2019/038466 International search report and written opinion of the international searching authority dated Nov. 5, 2019.
PCT/US2019/042027 International search report and written opinion of the international searching authority dated Oct. 15, 2019.
PCT/US2019/054291 International search report and written opinion of the international searching authority dated Jan. 6, 2020.
PCT/US2019/059990 International search report and written opinion of the international searching authority dated Feb. 28, 2020.
PCT/US2019/066208 International search report and written opinion of the international searching authority dated Feb. 27, 2020.
PCT/US2020/017537 International search report and written opinion of the international searching authority dated Apr. 29, 2020.
PCT/US2020/040686 International search report and written opinion of the international searching authority dated Nov. 20, 2020.
PCT/US2020/044574 International search report and written opinion of the international searching authority dated Oct. 21, 2020.
Weindorf et al., "Active Circular Polarizer OLED E-Mirror", Proceedings of the Society for Information Display 25th Annual Symposium of Vehicle Displays, Livonia, MI, pp. 225-237, Sep. 25-26, 2018.

(56) References Cited

OTHER PUBLICATIONS

EP18200530.6—European Search Report of the European Patent Office dated May 23, 2019.
International search report and written opinion of international searching authority for PCT application PCT/GB2018/050893 dated Aug. 27, 2018.
International search report and written opinion of international searching authority for PCT application PCT/GB2018/050894 dated Aug. 27, 2018.
International search report and written opinion of international searching authority for PCT application PCT/GB2019/050076 dated May 9, 2019.
International search report and written opinion of international searching authority for PCT application PCT/US2019/021570 dated May 24, 2019.
International search report and written opinion of international searching authority for PCT application PCT/US2019/031526 dated Jul. 29, 2019.
International search report and written opinion of international searching authorily for PCT application PCT/US2020/040686 dated Nov. 20, 2020.
International search report and written opinion of international searching authority for PCT application PCT/US2020/047383 dated Dec. 4, 2020.
International search report and written opinion of international searching authority for PCT application PCT/US2020/050460 dated Dec. 8, 2020.
International search report and written opinion of international searching authority for PCT application PCT/US2020/053864 dated Dec. 14, 2020.
International search report and written opinion of international searching authority for PCT application PCT/US2020/050527 dated Feb. 3, 2021.
International search report and written opinion of international searching authority for PCT application PCT/US2020/053825 dated Dec. 30, 2020.
PCT/US2020/053863 International search report and written opinion of the international searching authority dated Mar. 12, 2021.
PCT/US2020/060155 International search report and written opinion of the international searching authority dated Feb. 5, 2021.
PCT/US2020/060191 International search report and written opinion of the internalional searching authority dated Feb. 8, 2021.
PCT/US2020/063638 International search report and written opinion of the international searching authority dated Mar. 2, 2021.
PCT/US2020/064633 International search report and written opinion of the international searching authority dated Mar. 15, 2021.
Robson, et al. "Spatial and temporal contrast-sensitivity functions of the visual system", J. Opt. Soc. Amer., vol. 56, pp. 1141-1142 (1966).
Simonyan et al., "Very Deep Convolutional Networks for Large-Scale Image Recognition", ICLR 2015.
CN201880042320.X Notification of the First Office Action dated May 25, 2021.
EP-18855604.7 Extended European Search Report of European Patent Office dated Jun. 1, 2021.
EP-18857077.4 Extended European Search Report of European Patent Office dated Jun. 16, 2021.
International search report and written opinion of international searching authority for PCT application PCT/US2021/018544 dated Apr. 29, 2021.
Cheng, et al., "Fast-Response Liquid Crystal Variable Optical Retarder and Multilevel Attenuator," Optical Engineering 52 (10), 107105 (Oct. 16, 2013). (Year: 2013).
PCT/US2021/029937 International search report and written opinion of the international searching authority dated Aug. 6, 2021.
PCT/US2021/029944 International search report and written opinion of the international searching authority dated Aug. 3, 2021.
PCT/US2021/029947 International search report and written opinion of the international searching authority dated Aug. 10, 2021.
PCT/US2021/029954 International search report and written opinion of the international searching authority dated Aug. 10, 2021.
PCT/US2021/029958 International search report and written opinion of the international searching authority dated Aug. 10, 2021.
CN201680061632.6 Notification of the First Office Action dated Sep. 14, 2021.
CN201880073578.6 Notification of the First Office Action dated Aug. 27, 2021.
EP-19743619.9 Extended European Search of European Patent Office dated Nov. 23, 2021.
EP-19743701.5 Extended European Search Report of European Patent Office dated Nov. 24, 2021.
EP19771688.9 Extended European Search Report of European Patent Office dated Dec. 2, 2021.
PCT/US2021/043435 International search report and written opinion of the international searching authority dated Nov. 1, 2021.
PCT/US2021/043444 International search report and written opinion of the international searching authority dated Nov. 1, 2021.
CN201980016364.X Notification of the First Office Action dated Dec. 27, 2021.
CN201880036805.8 Notification of the First Office Action dated Jul. 23, 2021.
CN201880036842.9 Notification of the First Office Action dated Jul. 23, 2021.
CN-201980020303.0—Notification of the First Office Action dated Dec. 16, 2021.
CN201980030275.0 Notification of the First Office Action dated Mar. 4, 2022.
CN201980030279.9 Notification of the First Office Action dated Mar. 29, 2022.
EP-19825448.4 Extended European Search Report of European Patent Office dated Mar. 10, 2022.
JP2019-561773 Non-Final Notice of Reasons for Rejection dated Mar. 22, 2022.
EP19804311.9—Extended European Search Report of the European Patent Office dated Dec. 15, 2021.
EP-19881483.2 Extended European Search Report of European Patent Office dated Aug. 5, 2022.
JP2020-509511 Non-Final Notice of Reasons for Rejection dated Jul. 19, 2022.
Nelkon et al., "Advanced Level Physics", Third edition with SI units, Heinemann Educational Books LTD, London, 1970.
EP-20754927.0 Extended European Search Report of European Patent Office dated Sep. 19, 2022.
PCT/US2022/034145 International search report and written opinion of the international searching authority dated Oct. 6, 2022.

* cited by examiner

DIRECTIONAL DISPLAY APPARATUS

TECHNICAL FIELD

This disclosure generally relates to illumination from light modulation devices, and more specifically relates to optical stacks for providing control of illumination for use in display including privacy display and night-time display.

BACKGROUND

Privacy displays provide image visibility to a primary user that is typically in an on-axis position and reduced visibility of image content to a snooper, that is typically in an off-axis position. A privacy function may be provided by micro-louvre optical films that transmit some light from a display in an on-axis direction with low luminance in off-axis positions. However such films have high losses for head-on illumination and the micro-louvres may cause Moiré artefacts due to beating with the pixels of the spatial light modulator. The pitch of the micro-louvre may need selection for panel resolution, increasing inventory and cost.

Switchable privacy displays may be provided by control of the off-axis optical output.

Control may be provided by means of luminance reduction, for example by means of switchable backlights for a liquid crystal display (LCD) spatial light modulator. Display backlights in general employ waveguides and edge emitting sources. Certain imaging directional backlights have the additional capability of directing the illumination through a display panel into viewing windows. An imaging system may be formed between multiple sources and the respective window images. One example of an imaging directional backlight is an optical valve that may employ a folded optical system and hence may also be an example of a folded imaging directional backlight. Light may propagate substantially without loss in one direction through the optical valve while counter-propagating light may be extracted by reflection off tilted facets as described in U.S. Pat. No. 9,519,153, which is herein incorporated by reference in its entirety.

BRIEF SUMMARY

According to a first aspect of the present disclosure there is provided a display device comprising: an emissive spatial light modulator comprising an array of pixels arranged in a pixel layer; a parallax barrier forming an array of apertures, wherein the parallax barrier is separated from the pixel layer by a parallax distance along an axis along a normal to the plane of the pixel layer; each pixel being aligned with an aperture. The parallax barrier may direct light from each pixel into a common viewing window. Advantageously a full resolution image with low reflectivity and reduced off-axis luminance may be achieved.

Along the direction in which the apertures are closest, the apertures have a width a and the pixels have a width w that may meet the requirement that $a \geq w$. Advantageously full luminance may be achieved in at least one viewing direction.

Along the direction in which the apertures are closest, the apertures have a width a, the pixels have a pitch p and the pixels have a width w that may meet the requirement that $a \leq (p-w/2)$. Advantageously the off-axis luminance may be reduced to at most 50% for at least one viewing direction.

The parallax barrier has a separation d from the pixels and the pixels have a pitch p along the direction in which the apertures are closest and material between the parallax barrier and the pixels has a refractive index n that may meet the requirement that $2d/p \leq \sqrt{(2n^2-1)}$. The direction of minimum luminance may be at least 45 degrees to advantageously achieve desirable off-axis luminance for a privacy display.

The parallax barrier has a separation d from the pixels and the apertures have a width a along the direction in which the apertures are closest and material between the parallax barrier and the pixels has a refractive index n that may meet the requirement that $d \geq a\sqrt{(n^2-1)}/2$. At most 50% luminance is provided at a polar angle of 90 degrees to advantageously achieve desirable off-axis luminance for a privacy display.

The parallax barrier has a separation d from the pixels and the apertures have a width a along the direction in which the apertures are closest and material between the parallax barrier and the pixels has a refractive index n that may meet the requirement that $d \geq an\sqrt{(1-3/(4n^2))}/\sqrt{3}$. At most 50% luminance is provided at a polar angle of 60 degrees to advantageously achieve desirable off-axis luminance for a privacy display.

The pitch p' along the direction in which the apertures are closest may be smaller than the pitch p of the respective aligned pixels along the direction in which the pixels are closest; and the viewing window may be formed at a viewing window plane that is on the output side of the spatial light modulator. Advantageously luminance uniformity is increased for a head-on display user.

The parallax barrier may form a two dimensional array of apertures, each pixel being aligned with a respective aperture. Luminance reduction may be achieved for lateral and elevation angles. Advantageously a privacy display may be provided with landscape and portrait privacy operation. Display reflectivity may be reduced and display efficiency in a head-on direction increased.

The pixels may be arranged in columns and rows, the direction in which the apertures are closest may be at 45 degrees with respect to the electric vector transmission direction of the output linear polariser; and each pixel may have a light emission region that is a square shape with edges rotated by 45 degrees with respect to the electric vector transmission direction of the output linear polariser. The apertures may have a square shape with edges rotated by 45 degrees with respect to the electric vector transmission direction of the output linear polariser; or the apertures may have a circular shape. Advantageously uniform luminance roll-off and reduced luminance at high polar angles may be achieved along lateral and elevation azimuthal directions.

For at least some of the pixels the light emission region may comprise light emitting sub-regions and non-light emitting sub-regions. The ratio of the area of light emitting sub-regions to non-light emitting regions may be different for red, green and blue pixels. The colour pixels may be driven with similar drive voltages to achieve matched output luminance to those that are provided in displays for which the parallax barrier is not provided. Advantageously control and driver electronics have reduced complexity and increased efficiency.

The parallax barrier may form a one dimensional array of apertures, the pixels being arranged in columns, each column of pixels being aligned with a respective aperture. Modifications to pixel arrangements may be reduced, reducing cost. Each pixel may have a light emission region that is extended in the direction in which the apertures are extended; the width of the red, green and blue light emission regions may be the same for each of the pixels; and the height of the light emission regions may be different for red, green and blue light emitting pixels. The display may conveniently be rotated about an axis one direction to advantageously provide a comfortable viewing height for a head-on observer. The yield and cost of alignment of the parallax barrier may be reduced.

The parallax barrier may be arranged to absorb light incident thereon. Display reflections may be reduced, advantageously increasing display contrast in brightly lit environments.

The absorption of the region of the parallax barrier between the apertures may be less than 100%, and may be greater than 80% preferably greater than 90% and more preferably greater than 95%. The off-axis image visibility of the display may be increased in comparison to parallax barriers that are provided with 100% absorption in absorbing regions.

The display device may be for use in ambient illumination and the parallax barrier may absorb at least some of the ambient illumination transmitted through the apertures that is reflected from the pixel layer. Reflections are reduced, advantageously increasing observed image contrast.

The display device may have one or more additional layers between the pixel layer and the parallax barrier, wherein the pixels, the one or more additional layers and the parallax barrier may be formed as a monolithic stack. Advantageously the separation of the pixel layer and parallax barrier layer may be provided with high stability during applied mechanical forces.

The one or more additional layers may comprise at least one light transmitting inorganic layer arranged to provide a barrier to water and oxygen. The parallax barrier may comprise at least one light transmitting inorganic material that is arranged to provide a barrier to water and oxygen. The parallax barrier may be arranged between the pixel layer and at least one light transmitting inorganic layer that may be arranged to provide a barrier to water and oxygen. Advantageously the lifetime of the display may be increased.

An output polariser may be arranged on the output of the spatial light modulator, the output polariser being a linear polariser; and a reflection control quarter-wave retarder may be arranged between the output polariser and spatial light modulator. Advantageously reflections from the pixel layer may be reduced.

The parallax barrier may be arranged between the pixel layer and the reflection control quarter-wave retarder. Advantageously a small separation between the pixel layer and the parallax barrier may be conveniently achieved.

The display device may further comprise an additional polariser arranged on the output side of the output polariser, the additional polariser being a linear polariser; and at least one polar control retarder arranged between the output polariser and the additional polariser. A privacy display may be provided that advantageously has high visual security level.

At least one of the output polariser and additional polariser, when crossed with a notional polariser of the same material may have transmission for wavelengths from 520 nm to 560 nm that is less than the transmission for wavelengths from 450 nm to 490 nm. The transmission for wavelengths from 450 nm to 490 nm may be greater than 1%, preferably greater than 2% and most preferably greater than 3%; and the transmission for wavelengths from 520 nm to 560 nm may be less than 3%, preferably less than 2% and most preferably less than 1%. The transmission of the display may be increased in comparison to broadband absorbing polarisers. Advantageously display efficiency is increased. The transmission may be relatively greater for blue wavelengths. Advantageously the lifetime of the display may be increased.

The at least one polar control retarder may further comprise at least one passive retarder.

The at least one polar control retarder may be capable of simultaneously introducing no net relative phase shift to orthogonal polarisation components of light passed by the output polariser along an axis along a normal to the plane of the at least one polar control retarder and introducing a relative phase shift to orthogonal polarisation components of light passed by the reflective polariser along an axis inclined to a normal to the plane of the at least one polar control retarder. The at least one passive retarder may comprise a retarder having its optical axis perpendicular to the plane of the retarder, the at least one passive retarder having a retardance for light of a wavelength of 550 nm in a range from −150 nm to −900 nm, preferably in a range from −200 nm to −500 nm and most preferably in a range from −250 nm to −400 nm. A large off-axis polar region with reduced luminance may be achieved. Advantageously the visual security level is high for many snooper locations.

The at least one retarder may comprise first and second quarter-wave plates arranged between the additional polariser and the output polariser, the first quarter-wave plate being arranged on the input side of the second quarter-wave plate and being arranged to convert a linearly polarised polarisation state passed by the output polariser on the input side thereof into a circularly polarised polarisation state, and the second quarter-wave plate on the output side being arranged to convert a circularly polarised polarisation state that is incident thereon into a linearly polarised polarisation state that is passed by the additional polariser on the output side thereof; and at least one retarder arranged between the pair of quarter-wave plates. The retarder arranged between the pair of quarter-wave plates may comprise a retarder having its optical axis perpendicular to the plane of the retarder, the at least one passive retarder having a retardance for light of a wavelength of 550 nm in a range from −150 nm to −500 nm, preferably in a range from −200 nm to −400 nm and most preferably in a range from −250 nm to −350 nm. A rotationally symmetric polar luminance reduction profile may be provided. Advantageously a privacy display may be operated in landscape and portrait modes. High visual security may be achieved for a snooper looking down from over a user's head.

The at least one polar control retarder may comprise a switchable liquid crystal (LC) retarder comprising a layer of liquid crystal material and electrodes arranged to apply a voltage for switching the layer of liquid crystal material. The at least one polar control retarder may be arranged, in a first switchable state of the switchable liquid crystal retarder, simultaneously to introduce no net relative phase shift to orthogonal polarisation components of light passed by the reflective polariser along an axis along a normal to the plane of the at least one polar control retarder and to introduce a net relative phase shift to orthogonal polarisation components of light passed by the reflective polariser along an axis inclined to a normal to the plane of the at least one polar control retarder; and in a second switchable state of the switchable liquid crystal retarder, simultaneously to introduce no net relative phase shift to orthogonal polarisation components of light passed by the reflective polariser along an axis along a normal to the plane of the at least one polar control retarder and to introduce no net relative phase shift to orthogonal polarisation components of light passed by the reflective polariser along an axis inclined to a normal to the plane of the at least one polar control retarder. Advantageously a display may be switched between privacy and public modes of operation. The region for which high visual security is provided to an off-axis snooper in privacy mode and high image visibility is provided to an off-axis user in public mode is extended. A head-on user sees an image with high efficiency and high image visibility in both modes.

The display device may further comprise a reflective polariser arranged between the output polariser and the at least one polar control retarder, the reflective polariser being a linear polariser arranged to pass the same linearly polarised polarisation component as the output polariser. A privacy display may be provided with high reflectivity in a privacy mode of operation. In a privacy mode, the visual security level may be maintained for a wide range of ambient lighting conditions. In a public mode the display reflectivity is reduced to achieve high image visibility for a wide range of viewing locations.

The output polariser may be a reflective polariser. Advantageously display efficiency may be increased. Display reflectivity may be reduced in comparison to displays with no parallax barrier.

The pixels may comprise light emitting diodes. Advantageously high luminous efficiency, high contrast and high luminance may be achieved with wide colour gamuts.

The light emitting diodes may be organic light emitting diodes comprising an organic light emitting material. Advantageously thin and robust display may be provided. The thickness of the light emitting material may be different for each of the red, green and blue light emitting regions. The pixel sizes may be nominally the same for all colours so that colour roll-off is substantially the same for all polar angles. The cost and complexity of drive electronics may be reduced.

At least some of the light emitting diodes may be inorganic micro light emitting diodes. Advantageously very high luminance can be achieved. Barrier layers for water and oxygen may be omitted, advantageously reducing cost. Large areas may be provided between the micro-LEDs. Advantageously the reflectivity of the pixel layer may be reduced. Leaking polarisers may be provided for switchable privacy displays to achieve increased output efficiency.

The apertures have an absorption that may have a transmission gradient at the edges of the aperture that has a transmission gradient width of greater than 1 micron, preferably greater than 2 microns and more preferably greater than 3 microns. Diffraction effects may be reduced to advantageously achieve increased uniformity. Luminance roll-off profiles may be provided with increased polar width to improve uniformity for off-axis uses.

The array of apertures may be formed on a touch sensor electrode array. The at least one absorbing region of the parallax barrier may comprise a touch sensor electrode array. Advantageously low reflectivity touch electrodes may be conveniently provided.

At least some of the apertures of the parallax barrier may comprise a colour filter. The apertures of the parallax barrier comprise an array of red, green and blue colour filters. Advantageously cross talk between adjacent pixels may be reduced. Colour gamut may be increased.

According to a second aspect of the present disclosure there is provided a method to form a display device comprising the steps of forming an array of emissive pixels on a backplane by means of directing emissive materials through a fine metal mask forming an encapsulation layer on the array of emissive pixels comprising at least one transparent inorganic layer; forming the parallax barrier comprising an array of apertures on the surface of the encapsulation layer by directing light absorbing material through a fine metal mask. Advantageously the parallax barrier may be formed using the same equipment used to form an OLED display, reducing cost.

According to a third aspect of the present disclosure there is provided a method to form a display device comprising the steps of forming an array of emissive pixels on a backplane by means of directing emissive materials through a fine metal mask forming an encapsulation layer on the array of emissive pixels comprising at least one transparent inorganic layer; forming the parallax barrier comprising an array of apertures on the surface of the encapsulation layer by means of lithographic patterning. Advantageously precise parallax barriers may be conveniently aligned with the pixel layer.

According to a fourth aspect of the present disclosure there is provided a reflectivity control display device for use in ambient illumination comprising the display device of the first aspect wherein the parallax barrier absorbs at least some of the ambient illumination. Advantageously output efficiency may be increased while display reflectivity is maintained or reduced.

Any of the aspects of the present disclosure may be applied in any combination.

Embodiments of the present disclosure may be used in a variety of optical systems. The embodiments may include or work with a variety of projectors, projection systems, optical components, displays, microdisplays, computer systems, processors, self-contained projector systems, visual and/or audio-visual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which.

DETAILED DESCRIPTION

Figure 1A:
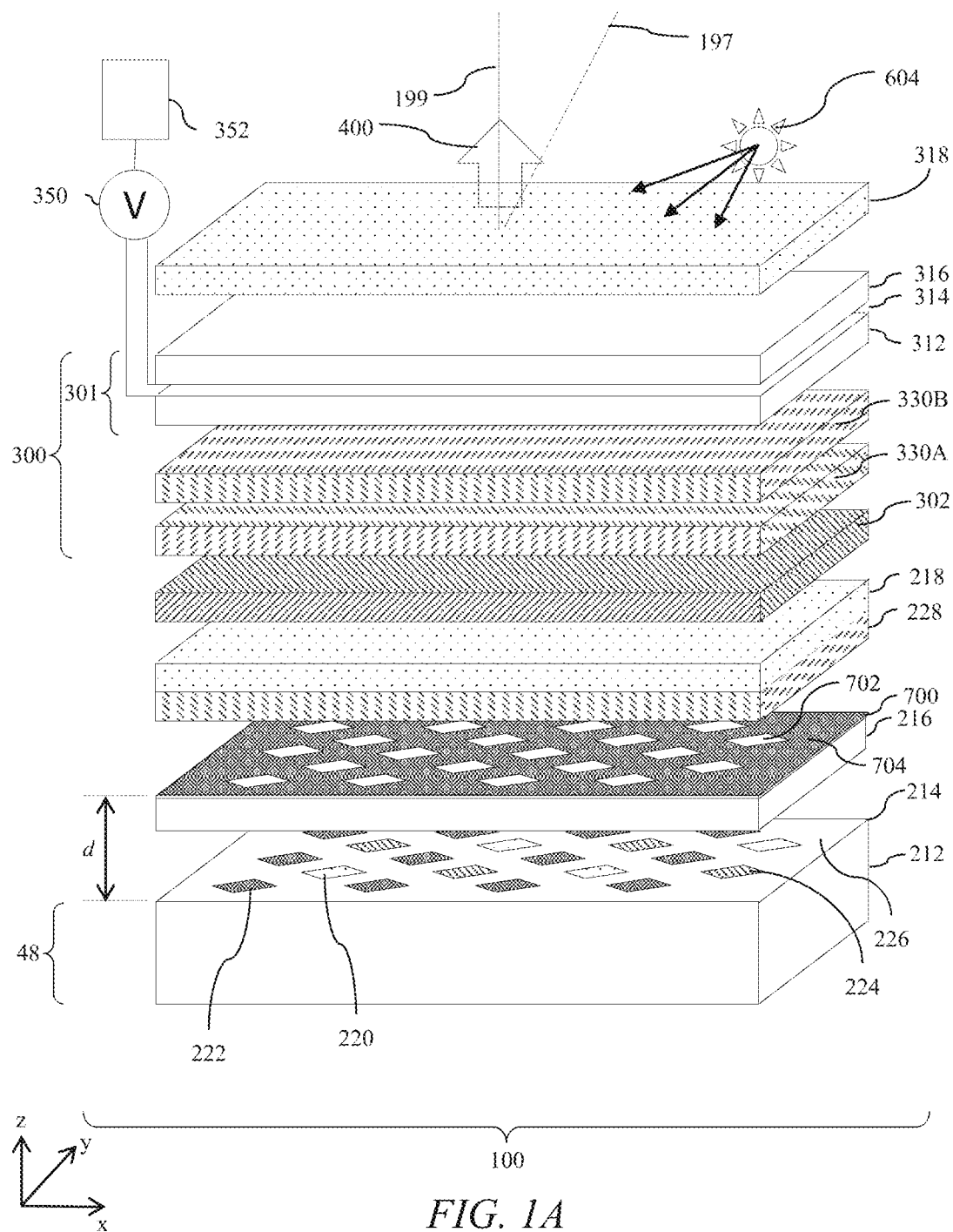
FIG. 1A is a schematic diagram illustrating in side perspective view a switchable privacy display for use in ambient illumination comprising an OLED emissive spatial light modulator, parallax barrier, output polariser and reflection control quarter-wave retarder, reflective polariser, a switchable polar control retarder and an additional polariser arranged on the output side of the spatial light modulator.

Terms related to optical retarders for the purposes of the present disclosure will now be described.

In a layer comprising a uniaxial birefringent material there is a direction governing the optical anisotropy whereas all directions perpendicular to it (or at a given angle to it) have equivalent birefringence.

The optical axis of an optical retarder refers to the direction of propagation of a light ray in the uniaxial birefringent material in which no birefringence is experienced. This is different from the optical axis of an optical system which may for example be parallel to a line of symmetry or normal to a display surface along which a principal ray propagates.

For light propagating in a direction orthogonal to the optical axis, the optical axis is the slow axis when linearly polarized light with an electric vector direction parallel to the slow axis travels at the slowest speed. The slow axis direction is the direction with the highest refractive index at the design wavelength. Similarly the fast axis direction is the direction with the lowest refractive index at the design wavelength.

For positive dielectric anisotropy uniaxial birefringent materials the slow axis direction is the extraordinary axis of the birefringent material. For negative dielectric anisotropy uniaxial birefringent materials the fast axis direction is the extraordinary axis of the birefringent material.

The terms half a wavelength and quarter a wavelength refer to the operation of a retarder for a design wavelength $\lambda_0$ that may typically be between 500 nm and 570 nm. In the present illustrative embodiments exemplary retardance values are provided for a wavelength of 550 nm unless otherwise specified.

The retarder provides a phase shift between two perpendicular polarization components of the light wave incident thereon and is characterized by the amount of relative phase, Γ, that it imparts on the two polarization components; which is related to the birefringence Δn and the thickness d of the retarder by $$\Gamma = 2 \cdot \pi \cdot \Delta n \cdot d / \lambda_0 \qquad \text{eqn. 1}$$

In eqn. 1, Δn is defined as the difference between the extraordinary and the ordinary index of refraction, i.e.

$$\Delta n = n_e - n_o \qquad \text{eqn. 2}$$

For a half-wave retarder, the relationship between d, Δn, and $\lambda_0$ is chosen so that the phase shift between polarization components is $\Gamma = \pi$. For a quarter-wave retarder, the relationship between d, Δn, and $\lambda_0$ is chosen so that the phase shift between polarization components is $\Gamma = \pi/2$.

The term half-wave retarder herein typically refers to light propagating normal to the retarder and normal to the spatial light modulator.

Some aspects of the propagation of light rays through a transparent retarder between a pair of polarisers will now be described.

The state of polarisation (SOP) of a light ray is described by the relative amplitude and phase shift between any two orthogonal polarization components. Transparent retarders do not alter the relative amplitudes of these orthogonal polarisation components but act only on their relative phase. Providing a net phase shift between the orthogonal polarisation components alters the SOP whereas maintaining net relative phase preserves the SOP. In the current description, the SOP may be termed the polarisation state.

A linear SOP has a polarisation component with a non-zero amplitude and an orthogonal polarisation component which has zero amplitude.

A linear polariser transmits a unique linear SOP that has a linear polarisation component parallel to the electric vector transmission direction of the linear polariser and attenuates light with a different SOP.

Absorbing polarisers are polarisers that absorb one polarisation component of incident light and transmit a second orthogonal polarisation component. Examples of absorbing linear polarisers are dichroic polarisers.

Reflective polarisers are polarisers that reflect one polarisation component of incident light and transmit a second orthogonal polarisation component. Examples of reflective polarisers that are linear polarisers are multilayer polymeric film stacks such as DBEF™ or APF™ from 3M Corporation, or wire grid polarisers such as ProFlux™ from Moxtek.

Reflective linear polarisers may further comprise cholesteric reflective materials and a quarter-wave plate arranged in series.

A retarder arranged between a linear polariser and a parallel linear analysing polariser that introduces no relative net phase shift provides full transmission of the light other than residual absorption within the linear polariser.

A retarder that provides a relative net phase shift between orthogonal polarisation components changes the SOP and provides attenuation at the analysing polariser.

In the present disclosure an 'A-plate' refers to an optical retarder utilizing a layer of birefringent material with its optical axis parallel to the plane of the layer.

A 'positive A-plate' refers to positively birefringent A-plates, i.e. A-plates with a positive Δn.

In the present disclosure a 'C-plate' refers to an optical retarder utilizing a layer of birefringent material with its optical axis perpendicular to the plane of the layer. A 'positive C-plate' refers to a positively birefringent C-plate, i.e. a C-plate with a positive Δn. A 'negative C-plate' refers to a negatively birefringent C-plate, i.e. a C-plate with a negative Δn.

'O-plate' refers to an optical retarder utilizing a layer of birefringent material with its optical axis having a component parallel to the plane of the layer and a component perpendicular to the plane of the layer. A 'positive O-plate' refers to positively birefringent O-plates, i.e. O-plates with a positive Δn.

Achromatic retarders may be provided wherein the material of the retarder is provided with a retardance Δn d that varies with wavelength λ as $$\Delta n \cdot d / \lambda = \kappa \qquad \text{eqn. 3}$$

where κ is substantially a constant.

Examples of suitable materials include modified polycarbonates from Teijin Films Achromatic retarders may be provided in the present embodiments to advantageously minimise color changes between polar angular viewing directions which have low luminance reduction and polar angular viewing directions which have increased luminance reductions as will be described below.

Various other terms used in the present disclosure related to retarders and to liquid crystals will now be described.

A liquid crystal cell has a retardance given by Δn. d where Δn is the birefringence of the liquid crystal material in the liquid crystal cell and d is the thickness of the liquid crystal cell, independent of the alignment of the liquid crystal material in the liquid crystal cell.

Homogeneous alignment refers to the alignment of liquid crystals in switchable liquid crystal displays where molecules align substantially parallel to a substrate. Homogeneous alignment is sometimes referred to as planar alignment. Homogeneous alignment may typically be provided with a small pre-tilt such as 2 degrees, so that the molecules at the surfaces of the alignment layers of the liquid crystal cell are slightly inclined as will be described below. Pretilt is arranged to minimise degeneracies in switching of cells.

In the present disclosure, homeotropic alignment is the state in which rod-like liquid crystalline molecules align substantially perpendicularly to the substrate. In discotic liquid crystals homeotropic alignment is defined as the state in which an axis of the column structure, which is formed by disc-like liquid crystalline molecules, aligns perpendicularly to a surface. In homeotropic alignment, pretilt is the tilt angle of the molecules that are close to the alignment layer and is typically close to 90 degrees and for example may be 88 degrees.

In a twisted liquid crystal layer a twisted configuration (also known as a helical structure or helix) of nematic liquid crystal molecules is provided. The twist may be achieved by means of a non-parallel alignment of alignment layers. Further, cholesteric dopants may be added to the liquid crystal material to break degeneracy of the twist direction (clockwise or anti-clockwise) and to further control the pitch of the twist in the relaxed (typically undriven) state. A supertwisted liquid crystal layer has a twist of greater than 180 degrees. A twisted nematic layer used in spatial light modulators typically has a twist of 90 degrees.

Liquid crystal molecules with positive dielectric anisotropy are switched from a homogeneous alignment (such as an A-plate retarder orientation) to a homeotropic alignment (such as a C-plate or O-plate retarder orientation) by means of an applied electric field.

Liquid crystal molecules with negative dielectric anisotropy are switched from a homeotropic alignment (such as a C-plate or O-plate retarder orientation) to a homogeneous alignment (such as an A-plate retarder orientation) by means of an applied electric field.

Rod-like molecules have a positive birefringence so that $n_e > n_o$ as described in eqn. 2. Discotic molecules have negative birefringence so that $n_e < n_o$.

Positive retarders such as A-plates, positive O-plates and positive C-plates may typically be provided by stretched films or rod-like liquid crystal molecules. Negative retarders such as negative C-plates may be provided by stretched films or discotic like liquid crystal molecules.

Parallel liquid crystal cell alignment refers to the alignment direction of homogeneous alignment layers being parallel or more typically antiparallel. In the case of pre-tilted homeotropic alignment, the alignment layers may have components that are substantially parallel or antiparallel. Hybrid aligned liquid crystal cells may have one homogeneous alignment layer and one homeotropic alignment layer. Twisted liquid crystal cells may be provided by alignment layers that do not have parallel alignment, for example oriented at 90 degrees to each other.

Transmissive spatial light modulators may further comprise retarders between the input display polariser and the output display polariser for example as disclosed in U.S. Pat. No. 8,237,876, which is herein incorporated by reference in its entirety. Such retarders (not shown) are in a different place to the passive retarders of the present embodiments. Such retarders compensate for contrast degradations for off-axis viewing locations, which is a different effect to the luminance reduction for off-axis viewing positions of the present embodiments.

Terms related to privacy display appearance will now be described.

A private mode of operation of a display is one in which an observer sees a low contrast sensitivity such that an image is not clearly visible. Contrast sensitivity is a measure of the ability to discern between luminances of different levels in a static image. Inverse contrast sensitivity may be used as a measure of visual security, in that a high visual security level (VSL) corresponds to low image visibility.

For a privacy display providing an image to an observer, visual security may be given as:

$$VSL = (Y+R)/(Y-K) \qquad \text{eqn. 4}$$

where VSL is the visual security level, Y is the luminance of the white state of the display at a snooper viewing angle, K is the luminance of the black state of the display at the snooper viewing angle and R is the luminance of reflected light from the display.

Panel contrast ratio is given as:

$$C = Y/K \qquad \text{eqn. 5}$$

For high contrast optical LCD modes, the white state transmission remains substantially constant with viewing angle. In the contrast reducing liquid crystal modes of the present embodiments, white state transmission typically reduces as black state transmission increases such that $$Y+K \sim P \cdot L \qquad \text{eqn. 6}$$

The visual security level may then be further given as:

$$VSL = \frac{(C + I \cdot \rho/\pi \cdot (C+1)/(P \cdot L))}{(C-1)} \qquad \text{eqn. 7}$$

where off-axis relative luminance, P is typically defined as the percentage of head-on luminance, L at the snooper angle and the display may have image contrast ratio C and the surface reflectivity is $\rho$.

The off-axis relative luminance, P is sometimes referred to as the privacy level. However, such privacy level P describes relative luminance of a display at a given polar angle compared to head-on luminance, and is not a measure of privacy appearance.

The display may be illuminated by Lambertian ambient illuminance I. Thus in a perfectly dark environment, a high contrast display has VSL of approximately 1.0. As ambient illuminance increases, the perceived image contrast degrades, VSL increases and a private image is perceived.

For typical liquid crystal displays the panel contrast C is above 100:1 for almost all viewing angles, allowing the visual security level to be approximated to:

$$VSL = 1 + I \cdot \rho/(\pi \cdot P \cdot L) \qquad \text{eqn. 8}$$

The perceptual image security may be determined from the logarithmic response of the eye, such that $$S = \log_{10}(V) \qquad \text{eqn. 9}$$

Desirable limits for S were determined in the following manner. In a first step a privacy display device was provided. Measurements of the variation of privacy level, $P(\theta)$ of the display device with polar viewing angle and variation of reflectivity $\rho(\theta)$ of the display device with polar viewing angle were made using photopic measurement equipment. A light source such as a substantially uniform luminance light box was arranged to provide illumination from an illuminated region that was arranged to illuminate the privacy display device along an incident direction for reflection to a viewer positions at a polar angle of greater than 0° to the normal to the display device. The variation $I(\theta)$ of illuminance of a substantially Lambertian emitting lightbox with polar viewing angle was determined by measuring the variation of recorded reflective luminance with polar viewing angle taking into account the variation of reflectivity $\rho(\theta)$. The measurements of $P(\theta)$, $r(\theta)$ and $I(\theta)$ were used to determine the variation of Security Factor $S(\theta)$ with polar viewing angle along the zero elevation axis.

In a second step a series of high contrast images were provided on the privacy display including (i) small text images with maximum font height 3 mm, (ii) large text images with maximum font height 30 mm and (iii) moving images.

In a third step each observer (with eyesight correction for viewing at 1000 mm where appropriate) viewed each of the images from a distance of 1000 m, and adjusted their polar angle of viewing at zero elevation until image invisibility was achieved for one eye from a position near on the display at or close to the centre-line of the display. The polar location of the observer's eye was recorded. From the relationship $S(\theta)$, the security factor at said polar location was determined. The measurement was repeated for the different images, for various display luminance $Y_{max}$, different lightbox illuminance $I(q=0)$, for different background lighting conditions and for different observers.

From the above measurements $S<1.0$ provides low or no visual security, $1.0 \leq S<1.5$ provides visual security that is dependent on the contrast, spatial frequency and temporal frequency of image content, $1.5 \leq S<1.8$ provides acceptable image invisibility (that is no image contrast is observable) for most images and most observers and $S \geq 1.8$ provides full image invisibility, independent of image content for all observers.

In comparison to privacy displays, desirably wide-angle displays are easily observed in standard ambient illuminance conditions. One measure of image visibility is given by the contrast sensitivity such as the Michelson contrast which is given by:

$$M=(I_{max}-I_{min})/(I_{max}+I_{min}) \qquad \text{eqn. 10}$$

and so:

$$M=((Y+R)-(K+R))/((Y+R)+(K+R))=(Y-K)/(Y+K+2 \cdot R) \qquad \text{eqn. 11}$$

Thus the visual security level (VSL), is equivalent (but not identical to) 1/M. In the present discussion, for a given off-axis relative luminance, P the wide-angle image visibility, W is approximated as $$W=1/\text{VSL}=1/(1+I \cdot \rho/(\pi \cdot P \cdot L)) \qquad \text{eqn. 12}$$

In the present discussion the colour variation $\Delta\varepsilon$ of an output colour $(u_w'+\Delta u', v_w'+\Delta v')$ from a desirable white point $(u_w', v_w')$ may be determined by the CIELUV colour difference metric, assuming a typical display spectral illuminant and is given by:

$$\Delta\varepsilon=(\Delta u'^2+\Delta v'^2)^{1/2} \qquad \text{eqn. 13}$$

Catadioptric elements employ both refraction and reflection, which may be total internal reflection or reflection from metallised surfaces.

The structure and operation of various directional display devices will now be described. In this description, common elements have common reference numerals. It is noted that the disclosure relating to any element applies to each device in which the same or corresponding element is provided. Accordingly, for brevity such disclosure is not repeated.

It would be desirable to provide a switchable privacy display using emissive spatial light modulators.

Figure 1B:
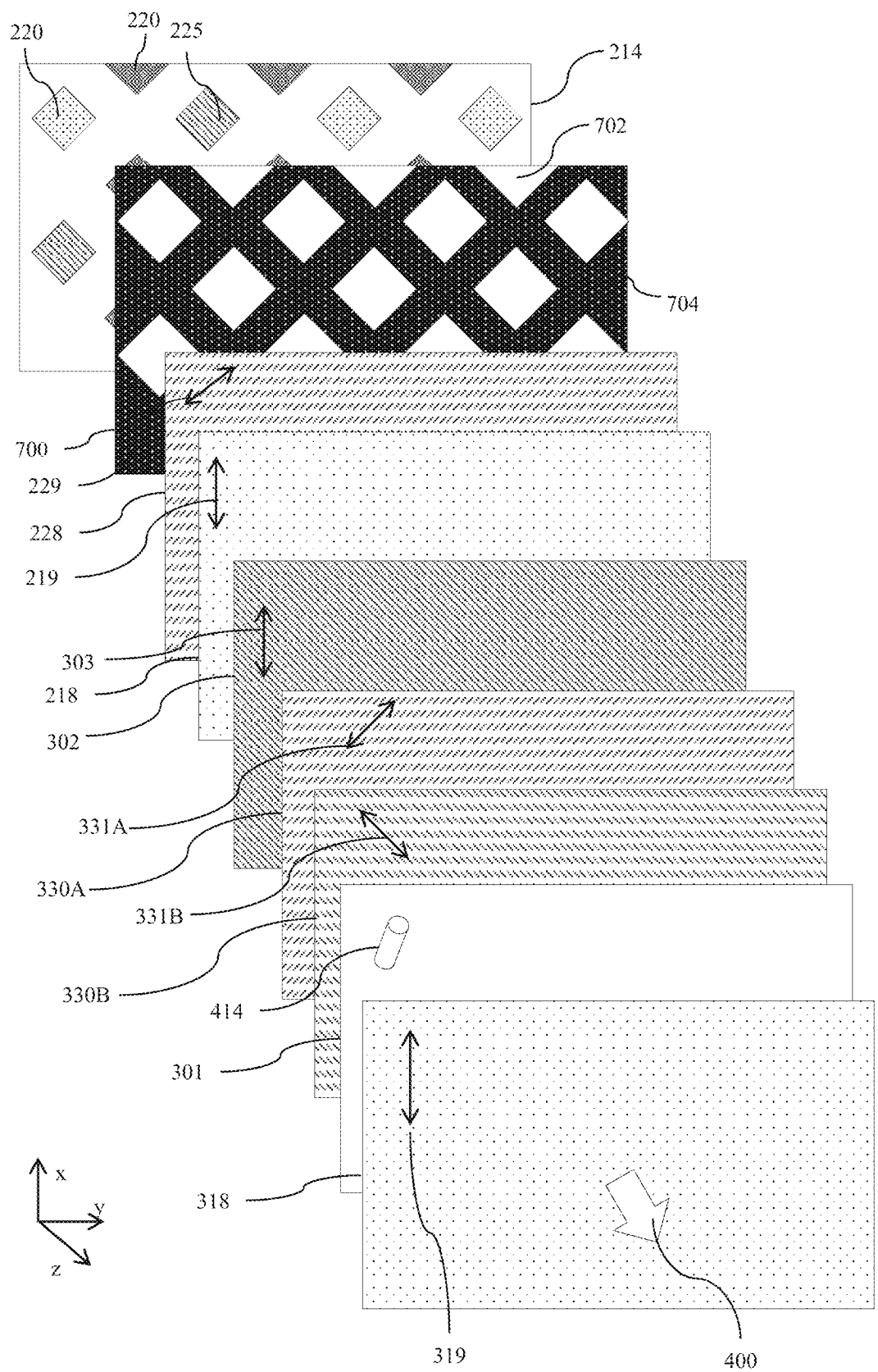
FIG. 1B is a schematic diagram illustrating in front view alignment of optical layers in the optical stack of FIG. 1A.

FIG. 1A is a schematic diagram illustrating in side perspective view a switchable privacy display 100 for use in ambient illumination 604 comprising an OLED emissive spatial light modulator 48, parallax barrier 700, output polariser 218 and reflection control quarter-wave retarder 228, reflective polariser 302, a switchable polar control retarder 300 and an additional polariser 318 arranged on the output side of the spatial light modulator 48; and FIG. 1B is a schematic diagram illustrating in front view alignment of optical layers in the optical stack of FIG. 1A.

Emissive spatial light modulator 48 comprises an array of red, green and blue pixels 220, 222, 224 arranged in a pixel layer 214 on backplane substrate 212. The pixels are arranged to output light 400 along an output direction. The pixels 220, 222, 224 comprise light emitting diodes that are organic light emitting diodes comprising an organic light emitting material 232.

The regions 226 between the pixels 220, 222, 224 comprises control electronics and are typically reflective for OLED pixel layers 214.

Parallax barrier 700 comprises an array of apertures 702 with a light absorbing region 704 between the apertures. The parallax barrier 700 is arranged a two dimensional array of apertures 702, each pixel 220, 222, 224 being aligned with a respective aperture.

The parallax barrier 700 is arranged on a spacer layer 216 that provides a separation from the pixel layer 214 with a parallax distance d along an axis 199 along a normal to the plane of the pixel layer 214.

An output polariser 218 is arranged on the output of the spatial light modulator 48, the output polariser 218 being a linear polariser with an electric vector transmission direction 219. A reflection control quarter-wave retarder 228 with optical axis direction 229 is arranged between the output polariser 218 and spatial light modulator 48. The retarder 228 may be provided by a stretched birefringent film such as polycarbonate. Advantageously low cost retarders 228 may be provided.

In the embodiment of FIGS. 1A-B the parallax barrier 700 is arranged between the pixel layer 214 and the reflection control quarter-wave retarder 228. In other embodiments (not shown) the quarter-wave retarder 228 may be provided by a layer formed between the pixel layer 214 and the parallax barrier 700. Such retarders 228 may comprise cured reactive mesogen liquid crystal layers for example. Advantageously a retarder may be provided with thickness that is the same or less than the desirable thickness d as will be described further below.

Additional polariser 318 is arranged on the output side of the output polariser 218, the additional polariser 318 being a linear polariser. Polar control retarder 300 is arranged between the output polariser 218 and the additional polariser 318. The output polariser 218 and the additional polariser 318 are arranged to pass respective linearly polarised polarisation states.

The polar control retarder 300 comprises passive retarders 330A, 330B and switchable liquid crystal retarder 301 that comprises transparent substrates 312, 316 and switchable liquid crystal layer 314. Voltage driver 350 may be used to select mode of operation, and may be controlled by controller 352.

Illustrative embodiments are described with respect to FIG. 9, FIG. 17D, FIGS. 22A-B and FIG. 23A as will be described in further detail below.

The embodiment of FIG. 1A further comprises a reflective polariser 302 arranged between the output polariser 218 and the at least one polar control retarder 300, the reflective polariser 302 being a linear polariser with electric vector transmission direction 303 arranged to pass the same linearly polarised polarisation state as the output polariser 218.

The structure and operation of polar control retarders 300 and reflective polariser 302 are described in further detail in U.S. Patent Publ. No. 2019-0086706, in U.S. Patent Publ. No. 2019-0250458, in U.S. Patent Publ. No. 2018-0321553, in U.S. Patent Publ. No. 2020-0159055, and in WIPO Publ. No. WO 2018/208618, all of which are herein incorporated by reference in their entireties. The polar control retarders in the present description can be replaced by any of the ones described therein.

The operation of the switchable liquid crystal retarder will be described further with reference to FIGS. 10A-D below. In the privacy mode of operation, the at least one polar control retarder 300 is capable of simultaneously introducing no net relative phase shift to orthogonal polarisation components of light passed by the output polariser 218 along an axis 199 along a normal to the plane of the at least one polar control retarder 300 and introducing a relative phase shift to orthogonal polarisation components of light passed by the reflective polariser 302 along an axis 197 inclined to a normal to the plane of the at least one polar control retarder 300. In the public mode of operation, the at least one polar control retarder 300 is capable of simultaneously introducing no net relative phase shift to orthogonal polarisation components of light passed by the output polariser 218 along an axis 199 along a normal to the plane of the at least one polar control retarder 300 and introducing substantially no relative phase shift to orthogonal polarisation components of light passed by the reflective polariser 302 along an axis 197 inclined to a normal to the plane of the at least one polar control retarder 300.

Such phase control of output light when combined with the reflective polariser 302 advantageously achieves reduction of off-axis luminance and increase of off-axis reflectivity of the display of FIG. 1A in privacy mode. In public mode, high transmission and low display reflectivity is achieved over a wide range of polar angles. Further in both modes of operation high transmission and low reflectivity is achieved for on-axis display users. Advantageously a display user sees a high luminance and high contrast image in both modes while an off-axis snooper sees a high visual security level in privacy mode and an off-axis user sees high image visibility in public mode.

The structure and operation of the parallax barrier 700 will now be described.

In emissive displays, high luminance is typically provided at high polar angles. A typical emissive display such as an OLED display may for example provide luminance of greater than 25% of head-on luminance at a polar angle of 60 degrees. Micro-LED displays that comprise inorganic LEDs may have substantially Lambertian luminance output so luminance at 60 degrees may approach 100% of head-on luminance.

As will be described in FIGS. 11A-B, the polar control retarders 300 are typically arranged to provide optimum visual security level at a design polar location. Such polar location may for example be +/−45 degrees lateral angle and 0 degrees elevation. At lateral angles that are different to the design polar location 5 degrees, the reduction of luminance and increase of reflectivity are reduced.

It would be desirable to provide a switchable privacy display with high visual security in privacy mode at polar angles greater than 45 degrees and with high image visibility in public mode at polar angles greater than 45 degrees. Desirably off-axis luminance may be at least 2.5% and preferably at least 5% of head-on luminance for high image visibility in typical ambient lighting conditions. Desirably off-axis luminance may be less than 1% and preferably less than 0.5% for high image security in typical ambient lighting conditions. It would be further desirable to provide low chromatic variations with polar viewing angle.

Figure 2A:
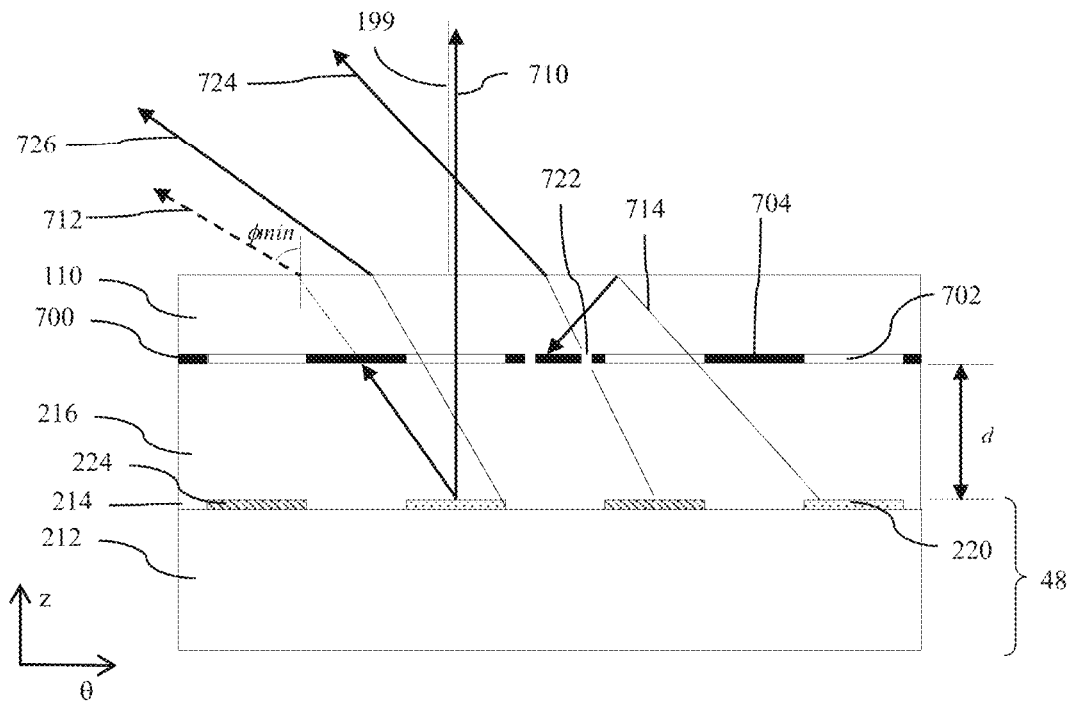
FIGS. 2A and 2B are schematic diagrams illustrating in side views a parallax barrier for the privacy display of FIGS. 1A-B.
Figure 2B:
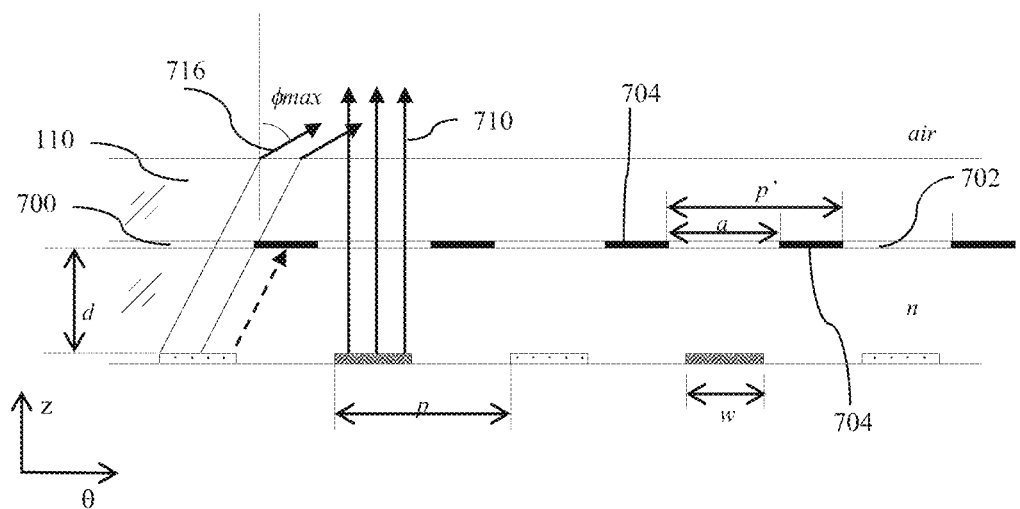

FIGS. 2A-B are schematic diagrams illustrating in side views a parallax barrier 700 for the privacy display 100 of FIGS. 1A-B. FIGS. 2A-B illustrate a cross section in the direction θ in which the apertures 702 are closest.

Features of the arrangements of FIGS. 2A-2B not discussed in further detail may be assumed to correspond to the features with equivalent reference numerals as discussed above, including any potential variations in the features.

Various output layers such as polarisers and retarders that are arranged at the output of the parallax barrier are indicated by monolithic layer 110 for purposes of description.

Desirable ranges for the structure of the parallax barrier have been established by means of simulation of retarder stacks, parallax barriers, pixel arrangements and experiments with display optical stacks.

Light rays 710 that are directed along the axis 199 that is normal to the spatial light modulator 48 are directed through the respective aligned aperture 702 of width a. The aperture size a is larger than the pixel width w to achieve 100% luminance for head-on directions. Thus along the direction in which the apertures 702 are closest, the apertures 702 have a width a and the pixels 220, 222, 224 have a width w meeting the requirement that:

$$a \geq w \qquad \text{eqn. 14}$$

Some light rays 726 are directed in off-axis directions such that the luminance in said off-axis direction is reduced in comparison to the head-on luminance for rays 710. The minimum absorption provided by the parallax barrier is desirably 50% so that along the direction in which the apertures 702 are closest, the apertures 702 have a width a, the pixels 220, 222, 224 have a pitch p and the pixels 220, 222, 224 have a width w meeting the requirement that:

$$a \leq (p-w/2) \qquad \text{eqn. 15}$$

Some light rays 712 from pixels 220, 222, 224 are incident on the lower side of the parallax barrier absorbing regions 704 and may be absorbed. The angle for minimum transmission is provided when the light ray 712 from the centre of the pixel is incident on the centre of the absorbing region 704. The polar angle in air ϕmin may be at least 45 degrees so that along the direction in which the apertures 702 are closest and material between the parallax barrier 700 and the pixels 220, 222, 224 has a refractive index n meeting the requirement that:

$$d \leq p\sqrt{(2n^2-1)}/2 \qquad \text{eqn. 16}$$

Light rays 716 from the centre of pixels 220, 222, 224 that are incident on the edge of the parallax barrier 700 absorbing region are at the polar angle in air ϕmax at which the luminance is at most 50% of the head-on luminance. Desirably ϕmax (in air) is at most 90 degrees and thus the parallax barrier has a separation d from the pixels 220, 222, 224 meeting the requirement that:

$$d \geq a\sqrt{(n^2-1)}/2 \qquad \text{eqn. 17}$$

In other embodiments the desirable angle for ϕmax is preferably at most 60 degrees and thus the parallax barrier has a separation d from the pixels 220, 222, 224 meeting the requirement that:

$$d \geq an\sqrt{(1-3/(4n^2))}/\sqrt{3} \qquad \text{eqn. 18}$$

Illustrative dimensions in micrometers for a pixel pitch of 50 micrometers in the direction in which the pixels are closest and refractive index of the medium between the pixel layer 214 and parallax barrier 700 of 1.5 are given in TABLE 1.

TABLE 1

| Pixel pitch, p | Pixel width, w | Aperture, a | | Thickness, d | |
|---|---|---|---|---|---|
| | | Minimum | Maximum | Minimum | Maximum |
| 50 μm | 25 μm | 25 μm | 37.5 μm | 28.0 μm | 46.8 μm |
| 50 μm | 3 μm | 3 μm | 48.5 μm | 28.0 μm | 46.8 μm |

Thus the thickness, d of the parallax barrier spacer layer 216 is of the order of 30 μm. Such thickness is typical of typical encapsulation layers for OLED panels as will be described further below. Parallax barrier 700 may be formed in desirable proximity to pixel layer 214 to advantageously achieve desirable performance for a switchable privacy display.

By way of comparison with the present embodiments, TABLE 2 illustrates a structure for a two view parallax barrier autostereoscopic display for the same pixel pitch and pixel widths wherein the pixel columns are directed to viewing windows, each window providing a left- or right-eye image. The ranges of desirable thickness are provided for minimum window size of 60 mm, maximum window size 67 mm, minimum viewing distance 250 mm and maximum window distance 700 mm.

TABLE 2

| Pixel pitch, p | Pixel width, w | Aperture, a | | Thickness, d | |
|---|---|---|---|---|---|
| | | Minimum | Maximum | Minimum | Maximum |
| 50 µm | 25 µm | ~5 µm | 25 µm | 290 µm | 875 µm |
| 50 µm | 3 µm | ~10 µm | 25 µm | 290 µm | 875 µm |

Advantageously the present embodiments achieve increased luminance and lower thickness than that used for autostereoscopic display. Autostereoscopic display parallax barriers do not achieve desirable privacy display luminance control characteristics.

Some light rays 714 may pass through apertures 702 at angles greater than the critical angle and are thus totally internally reflected. Such rays may be absorbed by the top of the parallax barrier absorbing regions 704. Other absorption mechanisms will be discussed further below.

The absorbing regions 704 may be partially absorbing. Some light rays 712 may pass through the absorbing regions 704 due to reduced absorption of the absorbing material. Additionally or alternatively the absorbing regions 704 may be arranged with sub-apertures 722 arranged to permit propagation of light rays 712. The sub-apertures 722 may have size and density arranged to provide desirable illumination profile in public mode of operation.

In an illustrative example, the barrier regions 704 may transmit 5% of incident light rays by means of sub-apertures 722. For a Lambertian emitting pixel 220, 222, 224, the luminance at an angle of 60 degrees may be arranged to be 5% by means of control of density and size of sub-apertures 722 and width of aperture for a given pixel pitch p and pixel size a. In privacy mode, the luminance may be less than 1%. Advantageously image visibility in public mode of operation may be increased while high visual security level may be achieved in privacy mode by means of the polar control retarders 300.

Arrangements of parallax barrier pitch p' compared to pixel pitch p will now be described.

Figure 3A:
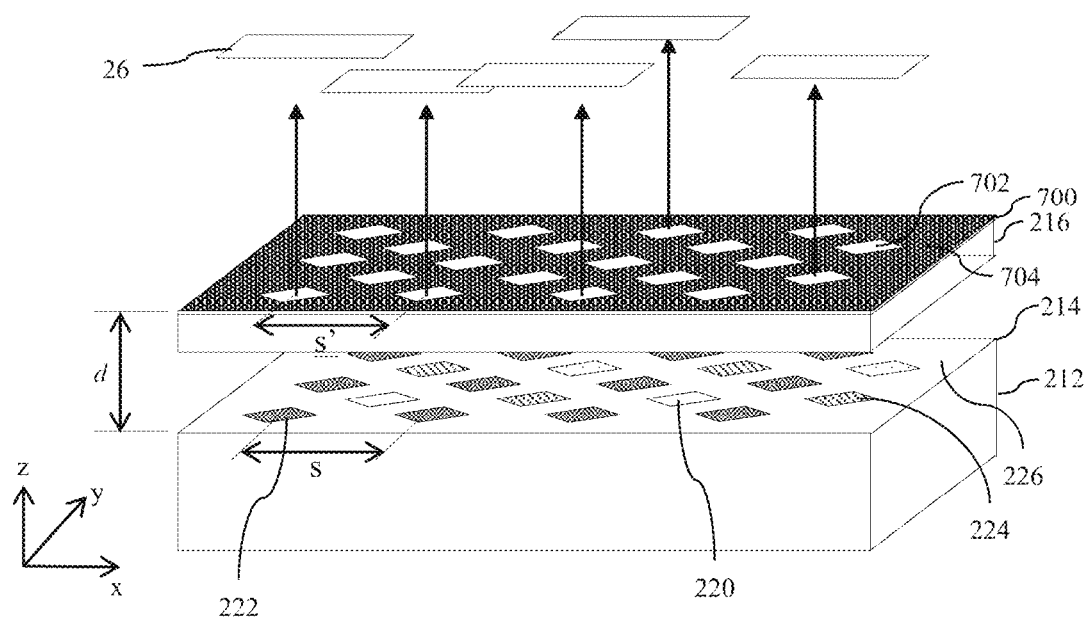
FIG. 3A is a schematic diagram illustrating in side perspective view the alignment of the parallax barrier with the pixels of FIG. 1A for a non-pupillated output.

FIG. 3A is a schematic diagram illustrating in side perspective view the alignment of the parallax barrier 700 with the pixels 220, 222, 224 of FIG. 1A for a non-pupillated output.

The parallax barrier 700 directs light from each pixel 220, 222, 224 into a common viewing window 26. In FIG. 3A, the common viewing windows are angularly aligned, in other words the common sub-windows 26 from each pixel and aligned barrier aperture 702 overlap at infinity and are collimated. The window represents the angular distribution of light from each slit. Advantageously, such an arrangement provides similar spatial roll-off across the area of the display 100 as the polar control retarders 300 and polarisers 218, 318. Natural variations of image uniformity across the display area are achieved for a moving observer, that is the part of the display nearest to the user appears the brightest.

Figure 3B:
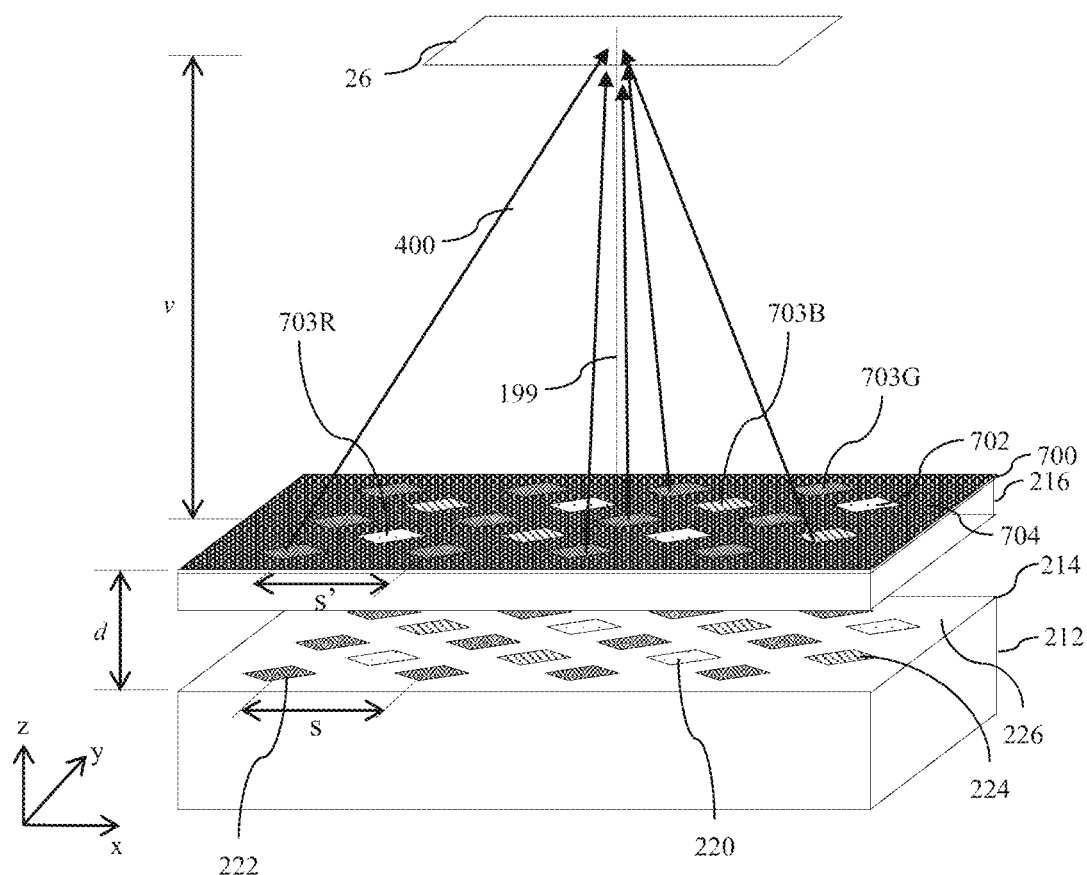
FIG. 3B is a schematic diagram illustrating in side perspective view the alignment of the parallax barrier with the pixels of FIG. 1A for a pupillated output.

FIG. 3B is a schematic diagram illustrating in side perspective view the alignment of the parallax barrier 700 with the pixels 220, 222, 224 of FIG. 1A for a pupillated output. The pitch p' along the direction in which the apertures 702 are closest is smaller than the pitch p of the respective aligned pixels 220, 222, 224 along the direction in which the pixels 220, 222, 224 are closest. In any given direction the pitch s' of the apertures 702 are closest is smaller than the pitch s of the respective aligned pixels 220, 222, 224.

The viewing window 26 is formed at a viewing window plane at distance v that is on the output side of the spatial light modulator 48 such that the common viewing window at which the viewing windows overlap is at a finite distance. Advantageously for a head-on observer located at the window plane the luminance uniformity across the area of the display is increased.

At least some of the apertures of the parallax barrier may comprise a colour filter 703R, 703G, 703B so the apertures of the parallax barrier comprise an array of red, green and blue colour filters. The colour filters may correspond to the colour of the respective aligned pixels 220, 222, 224. The filters reduce the colour crosstalk from for example blue light leaking into the red pixel aperture advantageously achieving increased colour gamut.

Alternatively only some of the apertures 702 may comprise a colour filter for example the apertures 702 corresponding to the red and green emitting pixels 220, 222 may comprise a yellow transmission filter. In some embodiments coloured emission may be achieved by for example blue emitting pixels and colour conversion materials aligned to the pixels 220, 222 to achieve coloured output. The yellow colour filters of the apertures 702 may provide absorption of residual blue light, advantageously achieving increased colour gamut.

The materials of the colour filter of the aperture 702 may comprise a non-scattering or low scattering material so that the angular control function of the apertures 702 and absorbing regions 704 is maintained.

Features of the arrangements of FIGS. 3A-B not discussed in further detail may be assumed to correspond to the features with equivalent reference numerals as discussed above, including any potential variations in the features.

Figure 4:
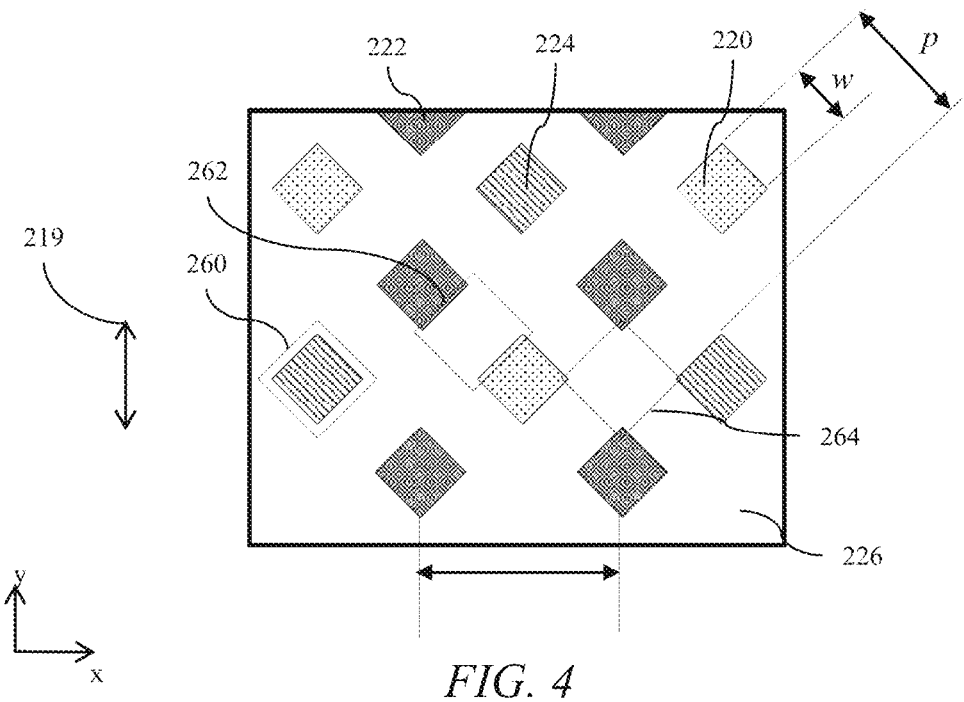
FIG. 4 is a schematic diagram illustrating in top view an arrangement of uniform emissive pixels and eye spot locations for various polar viewing angles.

FIG. 4 is a schematic diagram illustrating in top view an arrangement of uniform emissive pixels 220, 222, 224 and eye spot locations 260, 262, 264 for various polar viewing angles.

The pixels 220, 222, 224 are arranged in columns and rows, the direction in which the apertures 702 are closest is at 45 degrees with respect to the electric vector transmission direction 219 of the output linear polariser; and each pixel 220, 222, 224 has a light emission region that is a square shape with edges rotated by 45 degrees with respect to the electric vector transmission direction of the output linear polariser.

The apertures 702 have a square shape with edges rotated by 45 degrees with respect to the electric vector transmission direction of the output linear polariser.

The eye spot locations 260, 262, 264 represent the image of an observer's pupil at the pixel layer 214 provided by the aperture 702. The eye spot location 260 represents the location of a head-on observer's pupil. As the spot location 260 has a size larger than the pixel, the observer sees the same brightness as the pixel brightness and 100% luminance is achieved.

For location 262, the observer's eye is located in a display quadrant (with non-zero lateral angle and elevation) and at a transmission minimum. For location 262, the observer's eye is located with zero elevation with a lateral offset and at a transmission minimum.

The eye spot location 264 has a greater separation from the on-axis location than location 262 so that the transmission minimum is nearest in the quadrant rather than the lateral direction. Advantageously suppression in viewing quadrants can be optimised.

Further the pixel arrangement of FIG. 4 achieves desirable rendering of horizontal and vertical lines while reducing the number of red and blue pixels compared to the number of green pixels.

OLED displays typically provide different emitting areas for red, green and blue pixels due to the different luminous emittance (lumen/mm$^2$) for the respective material systems. By way of comparison in the embodiment of FIG. 4 the pixels 220, 222, 224 of the present disclosure when used with two dimensional aperture 702 arrays comprise emitting regions with substantially the same area for all pixels. Advantageously the variation of white point with viewing angle may be minimised.

It would be desirable to compensate for the different luminous emittance of red, green and blue emitters in an OLED display to achieve a desirable white point.

The luminous emittance of each pixel 220, 222, 224 may be varied by adjusting the drive current between the different coloured pixels so that white point is maintained. Thus the green pixels 222 may have for example twice the emitting area than conventionally used. The drive current for the green pixels 222 and red pixels 220 may be reduced to achieve desirable white points.

It may be desirable to provide drive currents that are the same as used for typical OLED displays.

Figure 5:
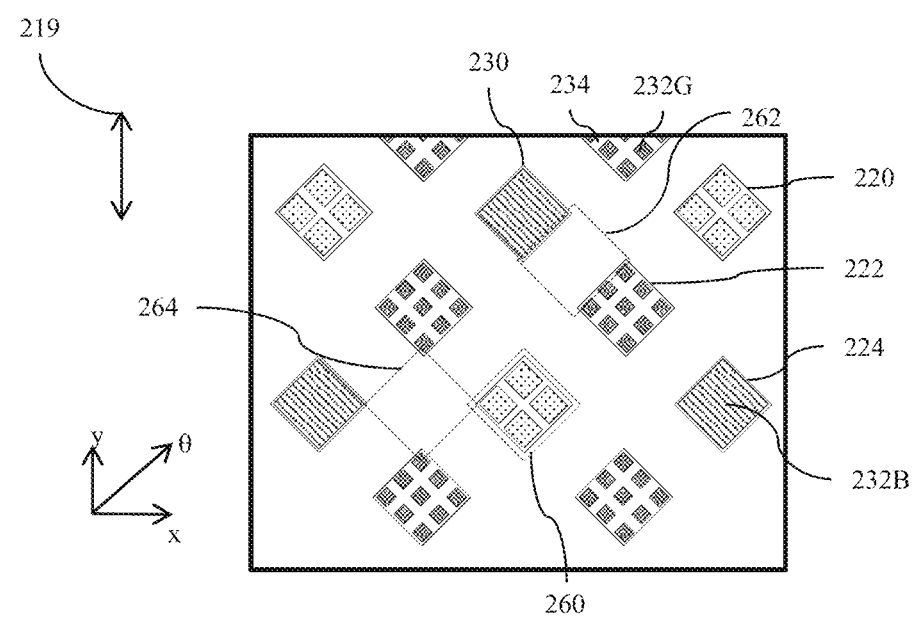
FIG. 5 is a schematic diagram illustrating in top view an arrangement of structured emissive pixels and eye spot locations for various polar viewing angles.

FIG. 5 is a schematic diagram illustrating in top view an arrangement of structured emissive pixels 220, 222, 224 and eye spot locations for various polar viewing angles.

For at least some of the pixels 220, 222, 224 the light emission region of at least some of the pixels comprises light emitting sub-regions 232R, 232G, 232B and non-light emitting sub-regions 234. The ratio of the area of light emitting sub-regions to non-light emitting regions is different for red, green and blue pixels 220, 222, 224. The sub-regions 232R, 232G, 232B may be provided within the same area for each of the pixels. The distribution of sub-regions 232 and eye-spot 260 size may be arranged to provide substantially uniform roll-off of luminance with polar angle to advantageously achieve minimised variation of white point with viewing angle; and desirable drive currents may be provided for each of the colour pixels 220, 222, 224.

Features of the arrangements of FIGS. 4-5 not discussed in further detail may be assumed to correspond to the features with equivalent reference numerals as discussed above, including any potential variations in the features.

The structure of OLED displays comprising the parallax barrier 700 will now be described.

Figure 6:
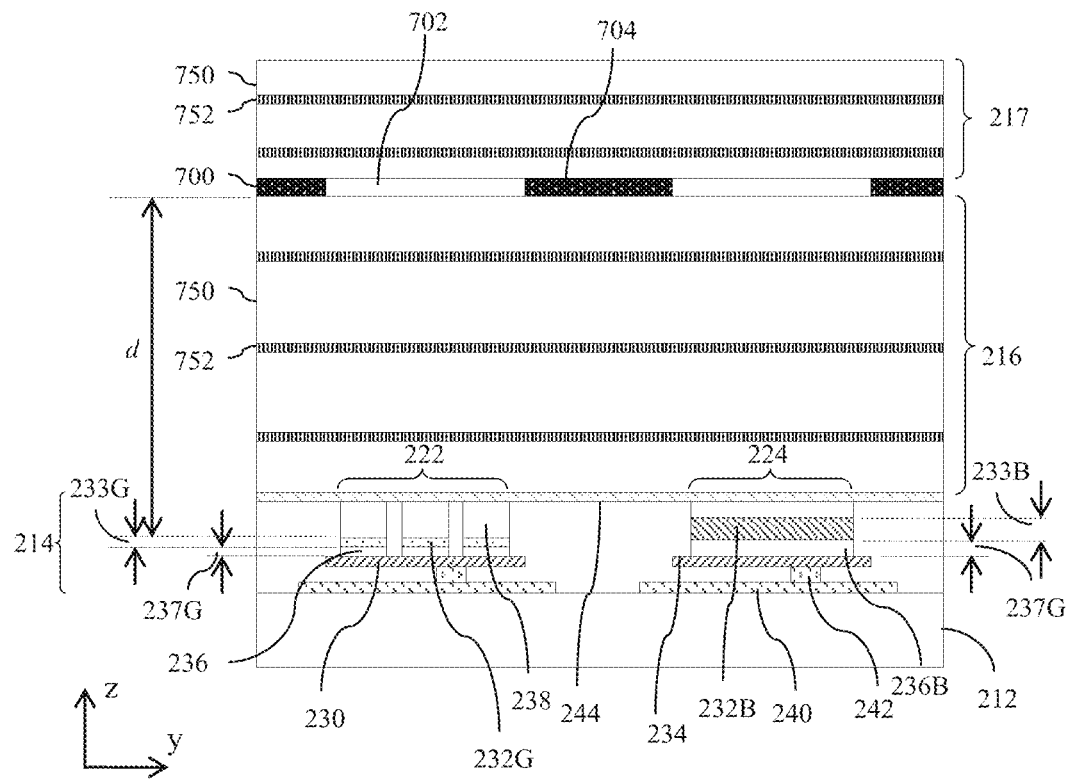
FIG. 6 is a schematic diagram illustrating in side view the structure of a spatial light modulator and aligned parallax barrier comprising upper ingress reduction layers.

FIG. 6 is a schematic diagram illustrating in side view the structure of a spatial light modulator 48 and aligned parallax barrier 700 comprising upper ingress reduction layers 750, 752.

Pixel layer 214 is formed on the substrate 212 and comprises thin film control circuitry 240 that comprises thin film transistors, capacitors, electrodes and other electronic control components. Electrical vias 242 provide connection to electrode 230 that is typically reflective. Emission layers 232R, 232G, 232B are arranged between electron transport layers 236R, 232G, 232B and hole transport layers 238R, 238G, 238B. Transparent electrode 244 is arranged to provide output side electrical connection.

The emission layer thickness 233R, 233G, 233B and electron transfer layer thickness 237R, 237G, 237B may be adjusted to provide suitable light output characteristics. The thickness 233R, 233G, 233B of the light emitting material is different for each of the red, green and blue light emitting regions in pixels 220, 222, 224.

In another arrangement (not shown) hole and electron transport layers 236, 238 may be alternatively arranged below and above emission region 232. The total thickness of pixel layer 214 may typically be one micron or less, and so differences in location of emission layer 232 are small in comparison to the distance of the spacer layer 216.

The display 100 device has one or more additional layers 750, 752 arranged in the spacer layer 216 between the pixel layer 214 and the parallax barrier 700, wherein the pixels 220, 222, 224, the one or more additional layers and the parallax barrier 700 are formed as a monolithic stack. The one or more additional layers comprise at least one light transmitting inorganic layer 752 arranged to provide a barrier to water and oxygen. The material 752 may for example be an oxide material such as $SiO_x$.

The layers 750 may be provided with an organic material. The substrate 212 may be further provided with layers 750, 752 (not shown). Ingress to water and oxygen may be inhibited while maintaining a flexible display structure with desirable mechanical properties. Advantageously display lifetime may be increased.

The total thickness d may be adjusted to advantageously achieve the desirable luminance roll-off as described elsewhere herein.

The parallax barrier 700 further comprises at least one light transmitting inorganic material that is arranged to provide a barrier to water and oxygen. Advantageously increased lifetime may be provided. Further non-transmissive barrier layers may be provided in the absorption regions 704 to achieve increased inhibition to ingress over at least part of the barrier.

Further reduction of ingress may be desirable. The parallax barrier 700 is arranged between the pixel layer 214 and at least one light transmitting inorganic layer 752 that is arranged to provide a barrier to water and oxygen. The inorganic layers 752 are separated by organic layer 750. Advantageously high resistance to water and oxygen ingress may be provided in a flexible substrate.

Figure 7:
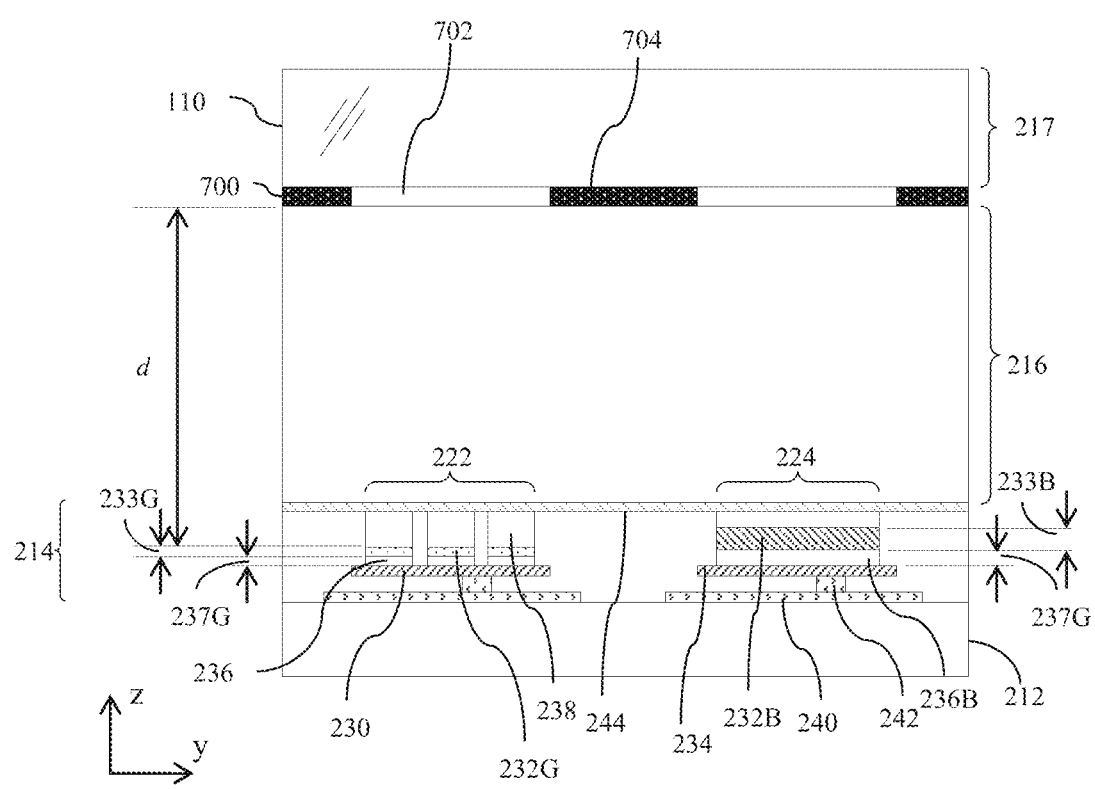
FIG. 7 is a schematic diagram illustrating in side view the structure of a spatial light modulator and aligned parallax barrier comprising a glass cover layer.

FIG. 7 is a schematic diagram illustrating in side view the structure of a spatial light modulator 48 and aligned parallax barrier comprising a glass material 110. In comparison to the arrangement of FIG. 6 a glass material 110 may be provided for the cover layer 217 that provides high barrier layer resistance to oxygen and water ingress in comparison to the layers 752, 750 of FIG. 6. The spacer layer 216 may be provided by an adhesive material or a polymer material. Alternatively the spacer layer 216 may be provided by a glass material which is thinned by chemical-mechanical polishing after fabrication of the backplane 212 and pixel layer 214 to achieve the desirable thickness d.

Features of the arrangements of FIGS. 6A-B not discussed in further detail may be assumed to correspond to the features with equivalent reference numerals as discussed above, including any potential variations in the features.

Arrangements of transmission profile of the parallax barrier 700 will now be described in further detail.

Figure 8A:
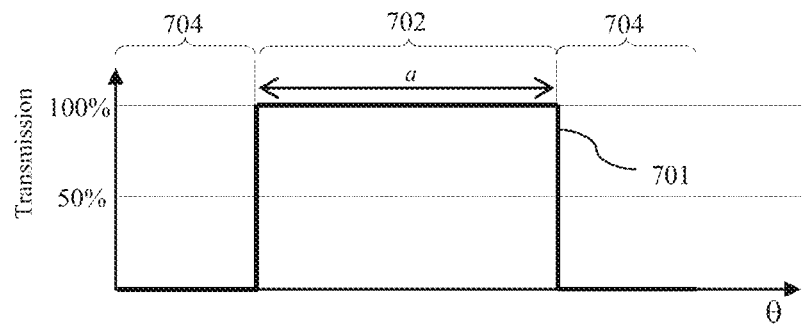
FIGS. 8A, 8B, and 8C are schematic graphs illustrating the variation of parallax barrier transmission with position for various parallax barrier structures.
Figure 8B:
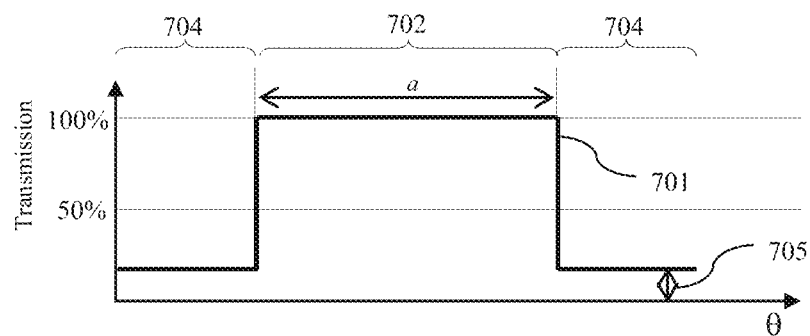
Figure 8C:
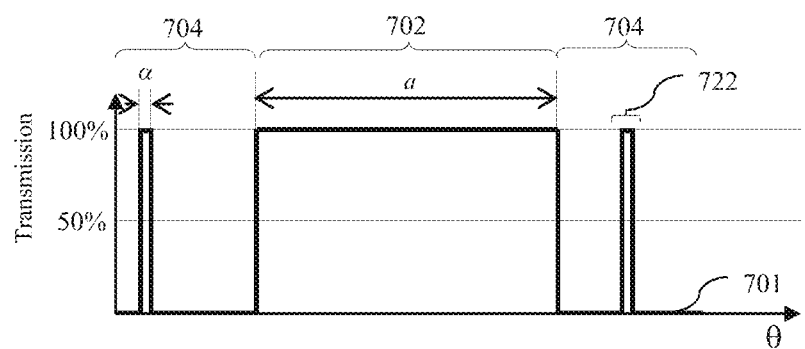

FIGS. 8A-C are schematic graphs illustrating the variation of parallax barrier 700 transmission with position for various parallax barrier 700 structures.

FIG. 8A illustrates a first transmission profile 701 of relative transmission against position in a direction θ at which the apertures are closest; wherein the absorption regions 704 have 100% absorption. Advantageously very low luminance can be achieved in privacy mode at polar angles greater than 45 degrees.

FIG. 8B illustrates increased transmission 705 for absorption regions 704, for example by control of the thickness of the material used to form the absorption regions 704. The absorption of the region of the parallax barrier 700 between the apertures 702 is less than 100%, and is greater than 80% preferably greater than 90% and more preferably greater than 95%. Transmission 705 may for example be less than 5% or less than 2.5%. Advantageously increased luminance may be provided at higher polar viewing angles in public mode of operation.

FIG. 8C illustrates increased transmission for absorption regions 704 by means of sub-aperture regions 722 as illustrated in FIG. 2A for example. Average transmission 705 across the light absorbing regions 704 may for example be less than 5% or less than 2.5%. Advantageously increased luminance may be provided at higher polar viewing angles in public mode of operation.

The structure of an illustrative embodiment of the polar retarder of FIG. 1A will now be described.

Features of the arrangements of FIGS. 8A-C not discussed in further detail may be assumed to correspond to the features with equivalent reference numerals as discussed above, including any potential variations in the features.

In the embodiment of FIGS. 1A-B, the polar control retarder 300 comprises passive polar control retarder 330 and switchable liquid crystal retarder 301, but in general may be replaced by other configurations of at least one retarder, some examples of which are present in the devices described below.

Figure 9:
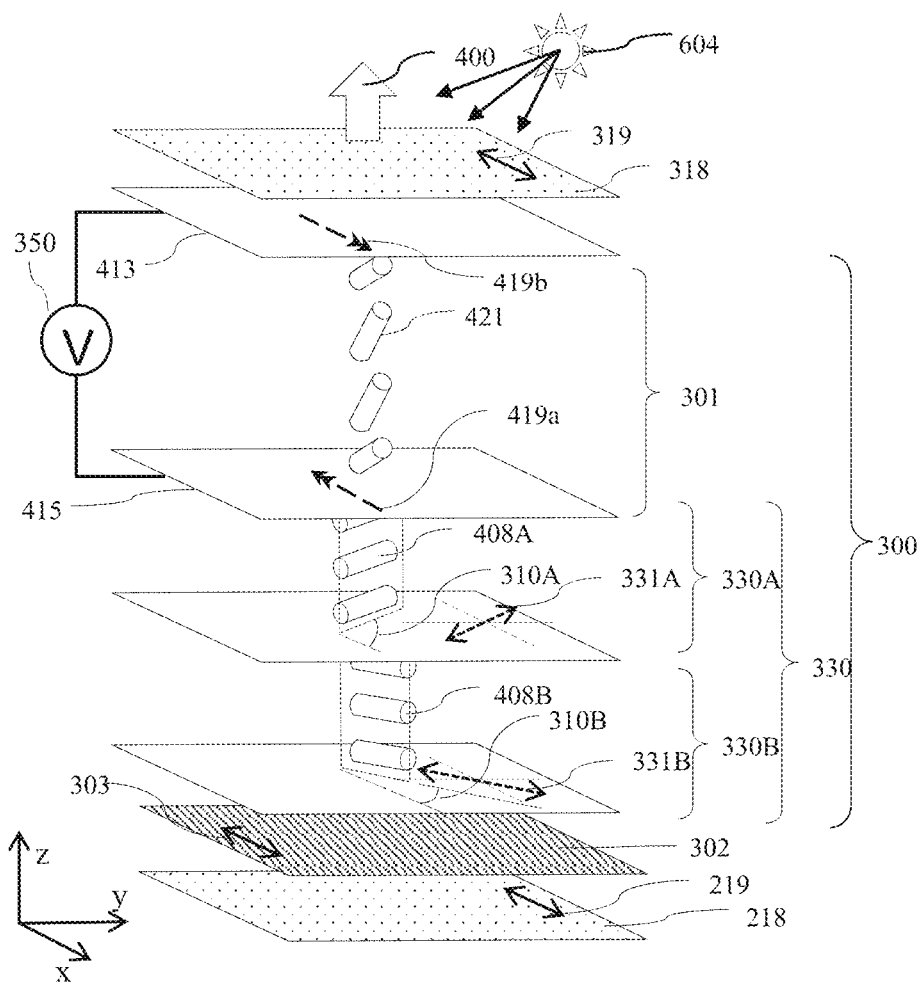
FIG. 9 is a diagram illustrating in perspective side view an arrangement of a switchable retarder in a public mode wherein the switchable retarder comprises a switchable LC layer with homogeneous alignment and crossed A-plate polar control retarders.

FIG. 9 is a diagram illustrating in perspective side view an arrangement of a switchable polar control retarder 300 comprising a liquid crystal retarder 301 comprising a switchable liquid crystal layer 314 with homogeneous alignment and crossed A-plate polar control retarders 330A, 330B. Features of the arrangements of FIG. 9 not discussed in further detail may be assumed to correspond to the features with equivalent reference numerals as discussed above, including any potential variations in the features.

An illustrative embodiment is given in TABLE 3 and polar profiles in privacy and public mode.

crystal retarder 301 comprises a liquid crystal material 421 with a positive dielectric anisotropy.

The passive polar control retarder 330 is provided by a pair of A-plates 330A, 330B that have crossed axes. In the present embodiments, 'crossed' refers to an angle of substantially 90° between the optical axes of the two retarders in the plane of the retarders. To reduce cost of retarder materials, it is desirable to provide materials with some variation of retarder orientation due to stretching errors during film manufacture for example. Variations in retarder orientation away from preferable directions can reduce the head-on luminance and increase the minimum transmission. Preferably the angle 310A is at least 35° and at most 55°, more preferably at least 40° and at most 50° and most preferably at least 42.5° and at most 47.5°. Preferably the angle 310B is at least 125° and at most 145°, more preferably at least 130° and at most 135° and most preferably at least 132.5° and at most 137.5°.

Homogeneous alignment advantageously provides reduced recovery time during mechanical distortion, such as when touching the display. The passive retarders 330A, 330B may be provided using stretched films to advantageously achieve low cost and high uniformity. Further field of view for liquid crystal retarders with homogeneous alignment is increased while providing resilience to the visibility of flow of liquid crystal material during applied pressure.

The at least one polar control retarder 300 is arranged, in a first switchable state of the switchable liquid crystal retarder 301, simultaneously to introduce no net relative phase shift to orthogonal polarisation components of light passed by the reflective polariser 302 along an axis 199 along a normal to the plane of the at least one polar control retarder 300 and to introduce a net relative phase shift to orthogonal polarisation components of light passed by the reflective polariser 302 along an axis 197 inclined to a normal to the plane of the at least one polar control retarder 300; and in a second switchable state of the switchable liquid crystal retarder 301, simultaneously to introduce no net relative phase shift to orthogonal polarisation components of light passed by the reflective polariser 302 along an axis 199 along a normal to the plane of the at least one polar control retarder 300 and to introduce no net relative phase shift to orthogonal polarisation components of light passed by the reflective polariser 302 along an axis 197 inclined to a normal to the plane of the at least one polar control retarder 300.

Such phase shifts provide polar transmission and reflectivity profiles that achieve (i) high transmission and low reflectivity on-axis; (ii) in a privacy mode reduced trans-

TABLE 3

| Mode | Passive polar control retarder(s) | | Active LC retarder | | | |
|------|------|------|------|------|------|------|
| | Type | Δn.d/ nm | Alignment layers | Pretilt/ deg | Δn.d/ nm | Δε | Voltage/ V |
| Public | Crossed A | +500 @ 45° | Homogeneous | 2 | 750 | 13.2 | 10 |
| Privacy | | +500 @ 135° | Homogeneous | 2 | | | 2.3 |

The switchable liquid crystal retarder 301 comprises two surface alignment layers 419a, 419b disposed adjacent to the layer of liquid crystal material 421 and on opposite sides thereof and each arranged to provide homogeneous alignment in the adjacent liquid crystal material 421. The layer 314 of liquid crystal material 421 of the switchable liquid mission and increased reflectivity off-axis; and (ii) in a public mode high transmission and low reflectivity off-axis. Advantageously a switchable privacy display provides high image quality to a head-on user, high visual security level to off-axis snooper and high image visibility to off-axis display users as will now be described.

Figure 10A:
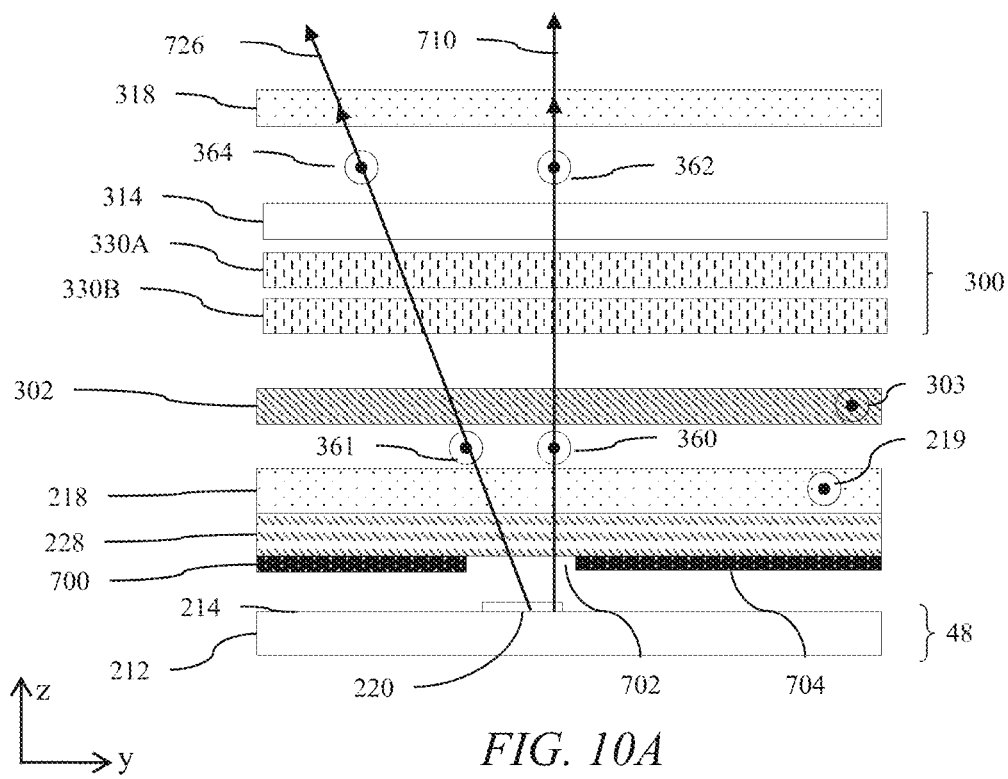
FIG. 10A is a schematic diagram illustrating in side view propagation of output light from a spatial light modulator through the optical stack of FIG. 1A in a public mode of operation.

FIG. 10A is a schematic diagram illustrating in side view propagation of output light from a spatial light modulator 48 through the optical stack of FIG. 1A in a public mode of operation.

In the public mode of operation, light rays 710 emitted by the pixels 220, 222, 224 and transmitted through the barrier 700 aperture 702 in an on-axis direction have a polarisation state 360 parallel to the electric vector transmission direction 219 of the output polariser 218. The on-axis ray 710 then traverses the multiple retarder layers 300 comprising the switchable liquid crystal retarder 301 and the passive retarder 330. In public mode, the switchable liquid crystal retarder 301 is in the off state with a different control voltage across the liquid crystal layer 314.

The polarised state of the on-axis light ray 710 therefore experiences a retardation when passing through the switchable liquid crystal retarder 301. In the case where the passive retarder 330 is a C-plate retarder, the on-axis light ray 710 is propagating in a direction that is substantially parallel to the optical axis of the passive retarder 330. The on-axis light ray 710 therefore experiences minimal retardation when passing through the passive retarder 330. The combined effect off the plurality of retarders 300 results in the on-axis light ray 710 exiting the plurality of retarders 300 with the same or similar linear polarisation state 362 to the linear polarisation state 360 with which the on-axis light ray 710 entered the plurality of retarders 300. This linear polarisation state 362 is parallel to the electric vector transmission direction 319 of the additional polariser 318 and the on-axis ray 710 therefore exits the display device 100 with a relatively unmodified luminance.

In the public mode, the off-axis ray 726 that is transmitted by the barrier 700 aperture 702 traverses the plurality of retarders 300 in a similar fashion to the on-axis ray 710. Thus, when the switchable liquid crystal retarder 301 is in a first state of said two states, the plurality of retarders 300 provides no overall transformation of polarisation states 360, 361 of light ray 710 passing therethrough perpendicular to the plane of the switchable retarder or light ray 726 passing therethrough at an acute angle to the perpendicular to the plane of the switchable retarder 301.

Polarisation state 362 is substantially the same as polarisation state 360 and polarisation state 364 is substantially the same as polarisation state 361. Thus the angular transmission profile is substantially uniformly transmitting across a wide polar region.

In other words, when the layer 314 of liquid crystal material 414 is in the first state of said two states, the plural retarders 300 provide no overall retardance to light passing therethrough perpendicular to the plane of the retarders or at an acute angle to the perpendicular to the plane of the plural retarders 300.

Advantageously the variation of display luminance with viewing angle in the first state is substantially unmodified. Multiple users may conveniently view the display from a wide range of viewing angles.

Figure 10B:
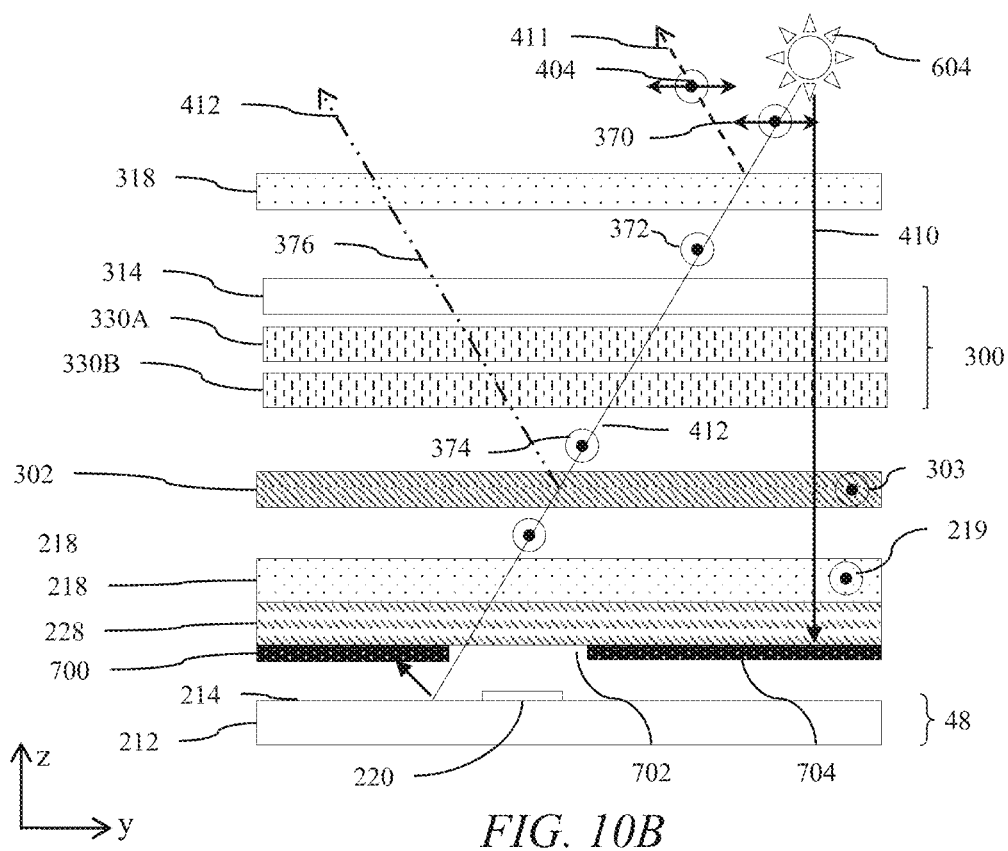
FIG. 10B is a schematic diagram illustrating in side view propagation of light rays from an ambient light source through the optical stack of FIG. 1A in a public mode of operation.

FIG. 10B is a schematic diagram illustrating in side view propagation of light rays from an ambient light source 604 through the optical stack of FIG. 1A in a public mode of operation.

The on-axis ray 410 of ambient light 604 traverses the plurality of retarders 300 in a similar fashion to the on-axis ray 710 emitted from the emissive pixels 220, 222, 224 discussed above. Although the on-axis ray 410 traverses the plurality of retarders 300 in the reverse direction to the on-axis ray 710 emitted from the emissive pixels 220, 222, 224, the traversal of the plurality of retarders 300 in a reverse direction may not change the effect of the plurality of retarders 300 on the light ray as discussed above for light emitted from the emissive pixels 220, 222, 224. The on-axis ray 410 therefore reaches the parallax barrier 700 absorption regions 704 whereon it is absorbed; or the pixel layer 214 whereon it may be absorbed or reflected as will be described further below.

In a similar fashion, the off-axis ray 412 experiences no overall transformation of polarisation state when passing through the plurality of retarders 300. Ambient light 604 is unpolarised and the off-axis light ray initially has no polarisation 370. The additional polariser 318 passes the polarisation component 372 that is parallel to the electric vector transmission direction 319 of the additional polariser. The additional polariser 318 absorbs the majority of the polarisation state 372 that is perpendicular to the electric vector transmission direction 319 of the additional polariser 318. Some light is reflected from the front surface of the polariser 318 by Fresnel reflections at the outer air interface. After traversing the plurality of retarders 300, the linear polarisation state 374 of the off-axis ray 412 is therefore parallel to the electric vector transmission direction 303 of the reflective polariser 302 and the off-axis ray is not reflected but instead passes the reflective polariser 302 to reach the parallax barrier 700 where it may be absorbed by the parallax barrier absorption regions or transmitted to the pixel layer 214. Some of the reflected light rays 412 will be further absorbed by the absorption regions 704 of the parallax barrier 700 as further described below.

Advantageously the display reflectance in the public mode is reduced across a wide range of viewing angles. Multiple users may conveniently view the display from a wide range of viewing angles with high image contrast.

Figure 10C:
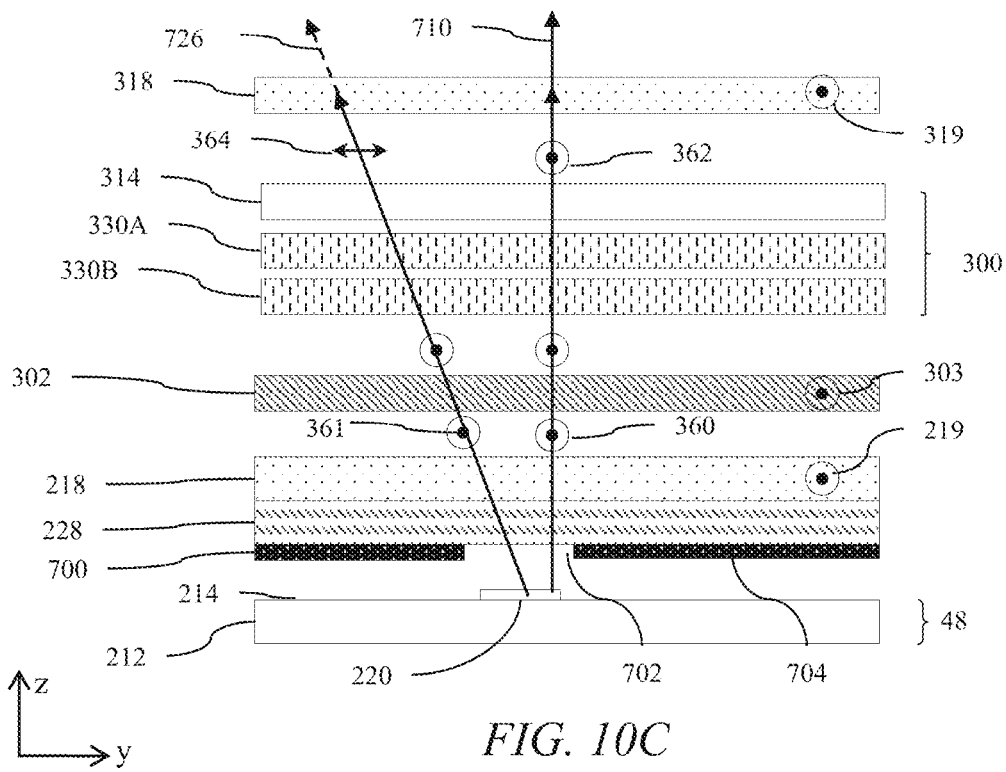
FIG. 10C is a schematic diagram illustrating in side view propagation of output light from a spatial light modulator through the optical stack of FIG. 1A in a privacy mode of operation.

FIG. 10C is a schematic diagram illustrating in side view propagation of output light from a spatial light modulator 48 through the optical stack of FIG. 1A in a privacy mode of operation.

In the privacy mode, the switchable liquid crystal retarder 301 is in the on state where a voltage is applied to the liquid crystal layer 314. The switchable liquid crystal retarder 301 may therefore be in the second state of the said two states. In the case where the switchable liquid crystal retarder 301 has a positive dielectric anisotropy, the switchable liquid crystal retarder 301 therefore acts in the second state in a similar manner to adjust the phase of the incident polarisation state that is output. The on-axis light ray 710 experiences no retardation when passing through the switchable liquid crystal retarder 301 in the second state, and therefore the linear polarisation state 360 of the on-axis light ray 710 prior to traversing the plurality of retarders 300 is the same as the linear polarisation state 362 after traversing the plurality of retarders 300. The on-axis ray 710 therefore exits the display via the additional polariser 318 with a largely unchanged luminance in the privacy mode of operation.

Off-axis light rays 726 emitted from the emissive pixels 220, 222, 224 and transmitted through aperture 702 of the barrier 700 experiences a transformation of polarisation when passing through the material of the switchable liquid crystal retarder 301. This is because of the acute angle of entry of the off-axis light ray 726. The off-axis light ray 726 therefore arrives at the additional polariser 318 with a linear polarisation state 364 that is at least partially rotated when compared to the linear polarisation state 361. The linear polarisation state 364 has at least some perpendicular component to the electric vector transmission direction 319 of the additional polariser 318 and the luminance of the off-axis light ray 726 is therefore reduced compared to the on-axis ray 710.

Advantageously the display luminance at wide viewing angles may be reduced in the second state. Snoopers may therefore be prevented from viewing the image emitted by the display device 100 at wide viewing angles. Stray light may be reduced in night-time operation while the head-on user may see an image.

Figure 10D:
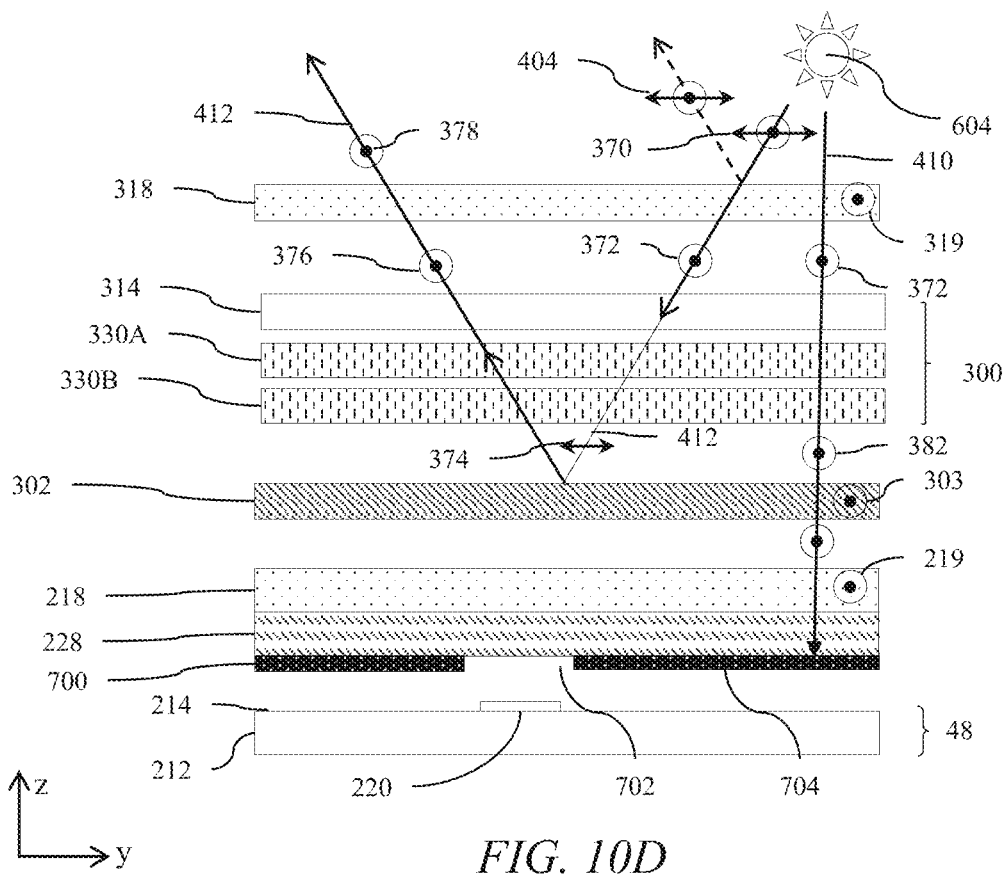
FIG. 10D is a schematic diagram illustrating in side view propagation of light rays from an ambient light source through the optical stack of FIG. 1A in a privacy mode of operation.

FIG. 10D is a schematic diagram illustrating in side view propagation of light rays from an ambient light source 604 through the optical stack of FIG. 1A in a privacy mode of operation.

In privacy mode operation, incident on-axis light rays 410 from the ambient light source 604 traverse the plurality of retarders 300 in a similar fashion to the on-axis ray 710 emitted from the emissive pixels 220, 222, 224 as described in relation to FIG. 10C. Although the on-axis ray 410 traverses the plurality of retarders 300 in the reverse direction to the on-axis ray 710 emitted from the emissive pixels 220, 222, 224, the direction of traversal of the plurality of retarders 300 into or out of the display does not change the effect of the plurality of retarders 300 on the light ray as discussed for light emitted from the emissive pixels 220, 222, 224. The on-axis ray 410 therefore reaches the parallax barrier 700 where it may be absorbed by the parallax barrier absorption regions or transmitted to the pixel layer 214. Some of the reflected light rays 412 will be further absorbed by the absorption regions 704 of the parallax barrier 700 as further described below.

In contrast to this, off-axis light rays 412 experience a transformation of polarisation when passing through the material 414 of the switchable liquid crystal retarder 301. This is because of the acute angle of entry of the off-axis light ray 412, as discussed in further detail below. The off-axis light ray 412 therefore arrives at the reflective polariser 302 with a linear polarisation state 374 that is at least partially rotated when compared to the linear polarisation state 372. The linear polarisation state 374 has at least some perpendicular state to the electric vector transmission direction 303 of the reflective polariser 302 and is therefore at least partially reflected by the reflective polariser 302. The ray 412 then traverses the plurality of retarders 300 in the reverse direction, reversing the polarisation conversion from the first pass of the plurality of retarders 300 and resulting in a polarisation state 376 that is parallel to the electric vector transmission direction of the additional polariser 318. The off-axis ray 412 therefore leaves the display device 100 with polarisation state 378, resulting in the stack appearing as a mirror when viewed from a wide-angle. The additional polariser 318 absorbs the majority of the polarisation state 372 that is perpendicular to the electric vector transmission direction 319 of the additional polariser, but may reflect a small proportion of the perpendicular state 404.

Advantageously the reflectance at wide viewing angles may be increased in the second state. Snoopers may therefore be prevented from viewing the image emitted by the display device 100 at wide viewing angles due to the reflected light reducing the contrast of the image being emitted by the display device, and so increasing visual security level, VSL as described in eqn. 7, above due to increased reflectivity, R.

Features of the arrangements of FIGS. 10A-D not discussed in further detail may be assumed to correspond to the features with equivalent reference numerals as discussed above, including any potential variations in the features.

The simulated output of an illustrative embodiment will now be described.

Figure 11A:
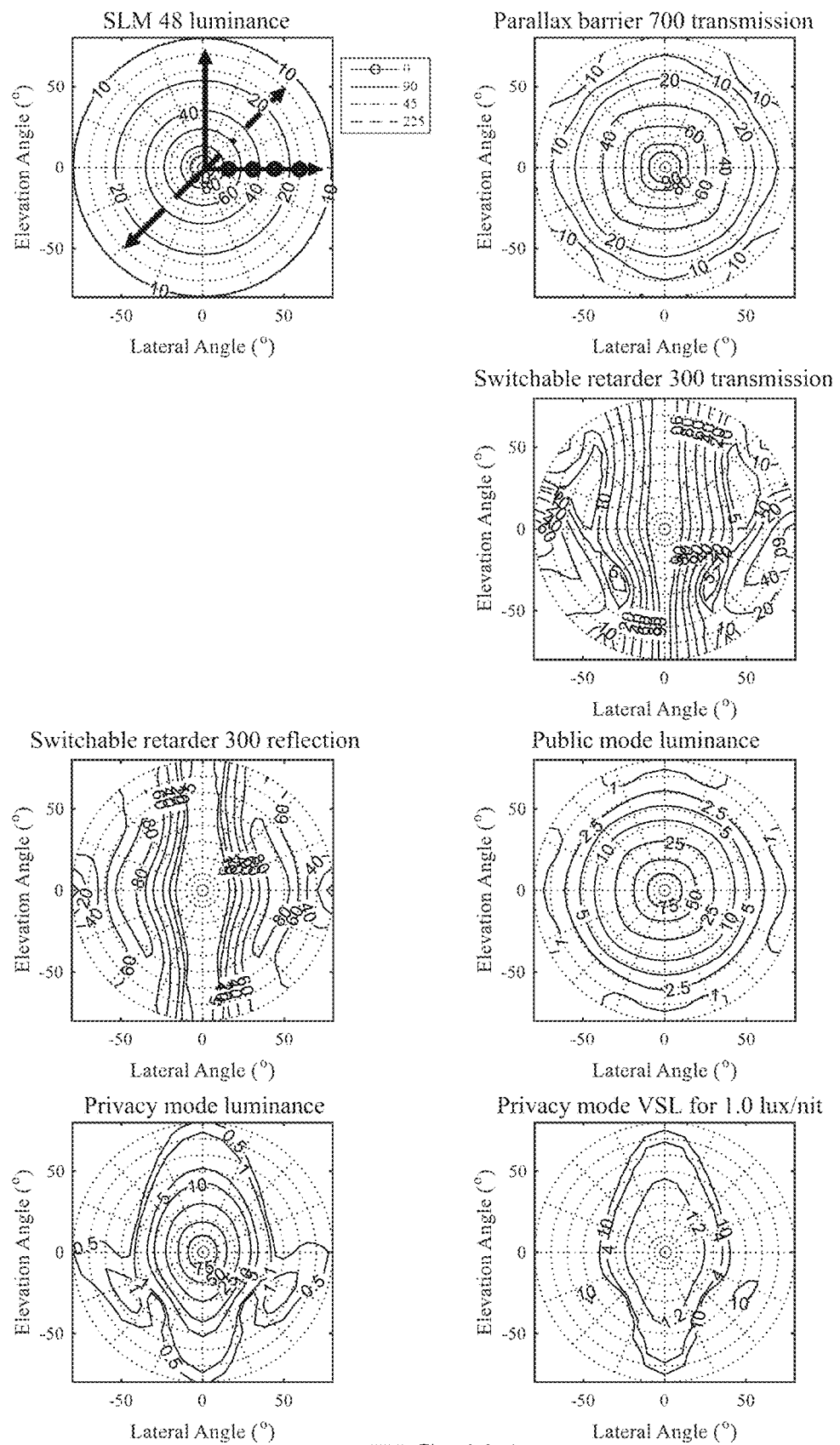
FIG. 11A is a polar plot array for the component contributions and output of the arrangement of FIG. 1A comprising polar plots for spatial light modulator luminance, parallax barrier transmission, switchable retarder transmission, switchable retarder reflection, public mode luminance, privacy mode luminance and visual security level for a lux/nit ratio of 1.0.
Figure 11B:
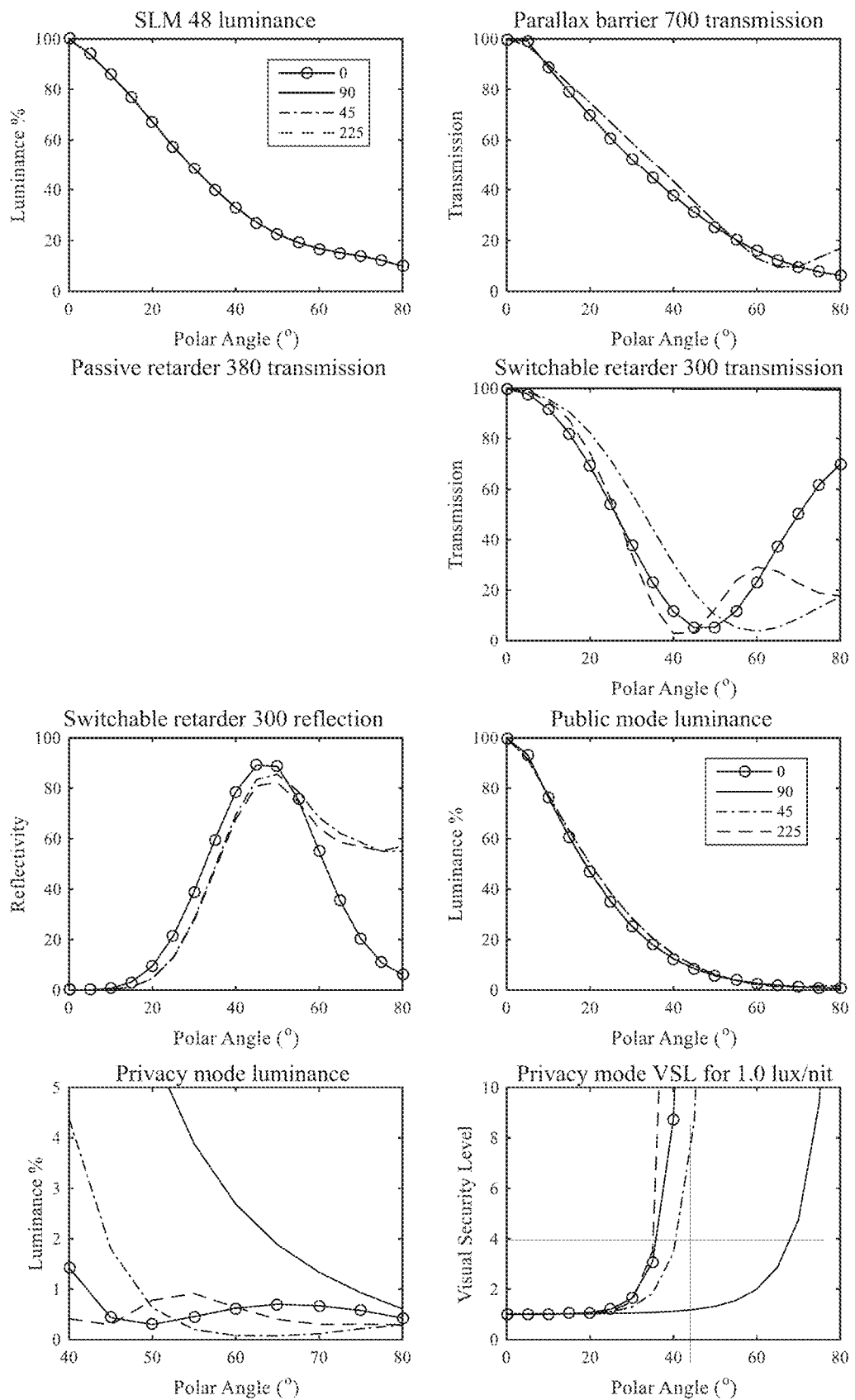
FIG. 11B is a linear profile plot array for the component contributions and output of the arrangements of FIG. 11A comprising linear profiles at azimuthal angles of 0 degrees (Eastern direction), 90 degrees (Northern direction), 45 degrees (North Eastern direction) and 225 degrees (South Western direction)

FIG. 11A is a polar plot array for the component contributions and output of the arrangement of FIG. 1A comprising polar plots for spatial light modulator 48 luminance, parallax barrier 700 transmission, switchable retarder 300 transmission, normalised switchable retarder 300 reflection, public mode luminance, privacy mode luminance and visual security level for a lux/nit ratio of 1.0; and FIG. 11B is a linear profile plot array for the component contributions and output of the arrangements of FIG. 11A comprising linear profiles at azimuthal angles of 0 degrees (Eastern direction), 90 degrees (Northern direction), 45 degrees (North Eastern direction) and 225 degrees (South Western direction). For purposes of the current description, the azimuthal orientations of the profiles in FIG. 11B are illustrated on the SLM luminance plot of FIG. 11A.

Illustrative parallax barrier 700 and OLED pixel parameters for FIGS. 11A-B are provided in the first row of TABLE 4 with reference to the pitch, p of 50 μm in the direction in which the pixels are closest. The pixels 220, 222, 224 are provided in the diamond arrangement of FIG. 4. The direction in which the pixels are closest is for an azimuth of 45 degrees.

TABLE 4

| FIGS. | Pixel pitch, p | Pixel width, w | Aperture, a | Thickness, d | Compensated LC retarder | Lux/nit ratio |
|---|---|---|---|---|---|---|
| 11A-B | 50 μm | 25 μm | 27.5 μm | 32.5 μm | See TABLE 3 | 1.0 |
| 11C | 50 μm | 25 μm | 27.5 μm | 32.5 μm | See TABLE 3 | 0.25 |
| 12A-B | 50 μm | 25 μm | None | None | See TABLE 3 | 1.0 |
| 13A-B | 50 μm | 25 μm | 25 μm | 50.0 μm | None | 1.0 |

A peak eQM reflectivity of 36% is used which corresponds to the 100% contour on the plot of normalised switchable retarder reflection after taking into account polariser 318 transmission and reflective polariser 302 reflectance to polarised light.

The SLM 48 luminance plot illustrates that OLED displays provide a non-Lambertian luminance roll-off typically with greater than 20% of head-on luminance provided at polar angles of 50 degrees.

The parallax barrier 700 transmission plot illustrates the difference in profiles for 0 degrees and 45 degrees azimuths due to the different separations of the pixels in this orientation.

The switchable retarder 300 transmission and reflectivity plots illustrate the control of phase is along the lateral direction using the structure of FIG. 9.

The public mode illuminance is determined by the transmission by the parallax barrier 700 of the light from the spatial light modulator 48. The switchable polar control retarder 300 provides only a small modulation of this luminance profile.

The privacy mode luminance illustrates that less than 1% luminance is provide in the lateral direction and in upper viewing quadrants. The display has high visibility for 0 degrees lateral angle and for rotations about the horizontal axis. Advantageously a comfortable viewing angle may be set for viewing the display from an on-axis position by the user.

The effect of ambient light level on visual security level will now be described.

Figure 11C:
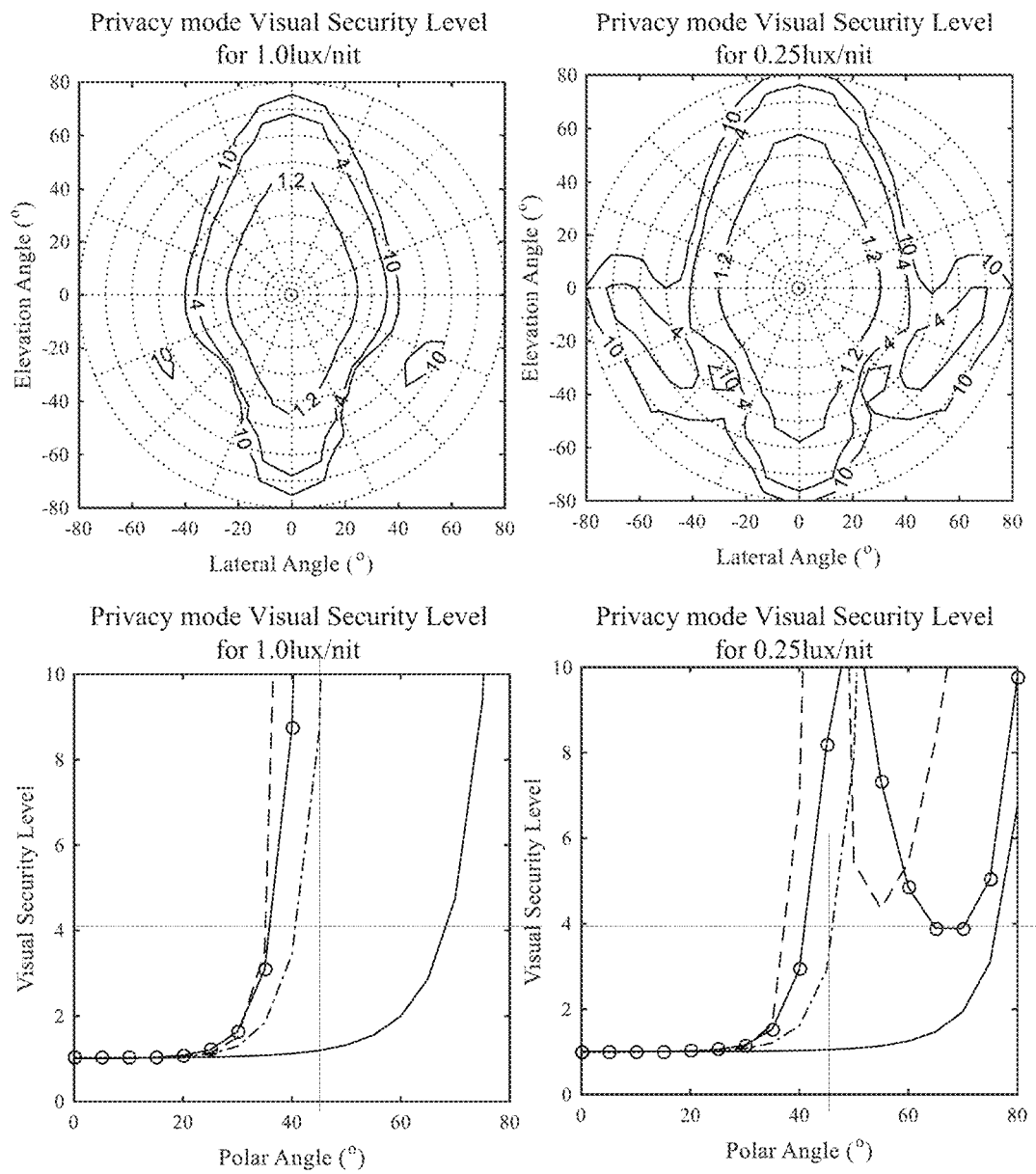
FIG. 11C is a polar profile plot and linear polar profile plot for the illustrative embodiment of FIGS. 11A-B with a lux/nit ratio of 0.25.

FIG. 11C is a polar profile plot and linear polar profile plot for the illustrative embodiment of FIGS. 11A-B with a lux/nit ratio of 0.25. The display 100 properties are described in the second row of TABLE 4.

The visual security level (VSL) plots are dependent on the ambient illuminance condition. The ambient illuminance is provided as a ratio of head-on luminance. Thus in a typical office environment a display with 300 nit head-on luminance and ambient illuminance falling on to the display of 300 lux has a lux/nit ratio of 1.0. In a darkened aircraft cabin, a head-on luminance of 100 nits may be provided for an ambient illuminance of 25 nits, providing a lux/nit ratio of 0.25.

The switchable reflectivity of the present embodiment achieves increased visual security level at low lux/nit ratios. Further the parallax barrier 700 may further reduce the off-axis luminance to advantageously achieve further increased visual security in low illuminance conditions.

It has been determined by means of experiment and simulation that a visual security level in privacy mode of greater than 3.0 and preferably greater than 4.0 is desirable for high isolation of the displayed image to an off-axis snooper. It has also been determined by means of experiment and simulation that an image visibility W of greater than 50% and preferably greater than 83.3% (visual security level V in public mode of less than 2.0 and preferably less than 1.2) achieves desirable image visibility of the displayed image to an off-axis user.

The visual security level line profiles of FIGS. 11B-C illustrate that a visual security level of greater than 4.0 may be achieved for lateral angles and in viewing quadrants at lateral angles of at least 45 degrees and for azimuthal angles in the lateral direction and in the viewing quadrants in illumination conditions of less than 0.25 lux/nit. Advantageously high visual security level may be achieved for off-axis users over a wide range of polar locations. The visual security level does not degrade at higher polar angles in the lateral direction.

By way of comparison with the present embodiments, the simulated appearance of the arrangement of FIG. 1A omitting the parallax barrier 700 will now be described.

Figure 12A:
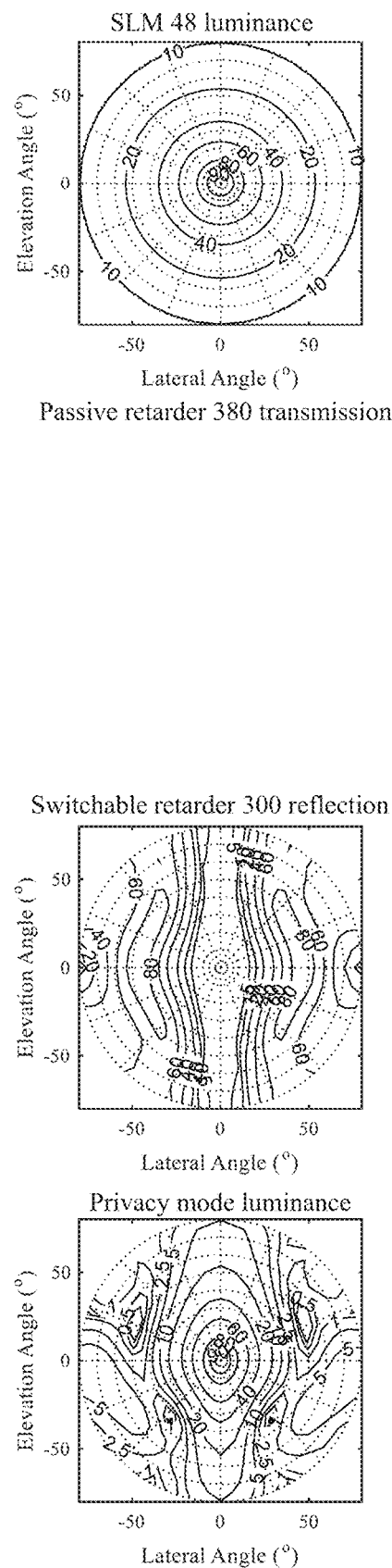
FIG. 12A is a polar plot array for the component contributions and output of the arrangement of FIG. 1A for an illustrative arrangement in which the parallax barrier is removed comprising polar plots for spatial light modulator luminance, parallax barrier transmission, switchable retarder transmission, switchable retarder reflection, public mode luminance, privacy mode luminance and visual security level.
Figure 12A:
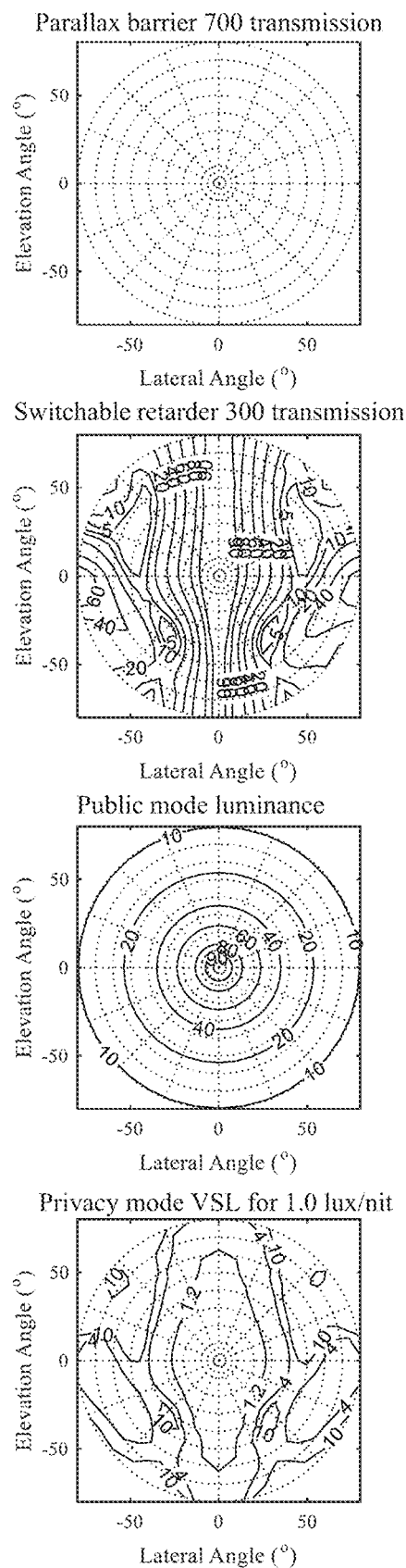
Figure 12B:
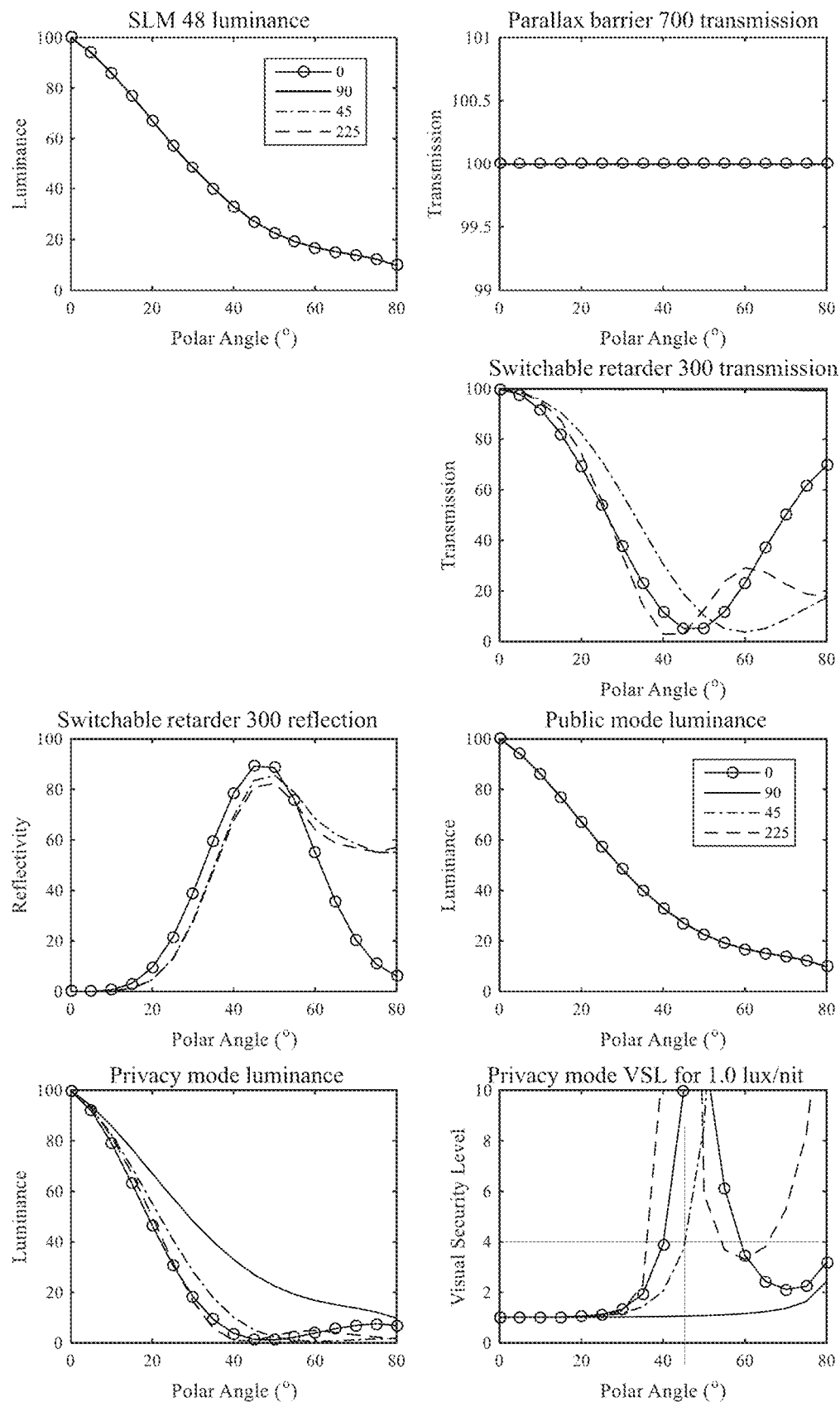
FIG. 12B is a linear profile plot array for the component contributions and output of the arrangements of FIG. 12A comprising linear profiles at azimuthal angles of 0, 90, 45 and 225 degrees.

FIG. 12A is a polar plot array for the component contributions and output of the arrangement of FIG. 1A for an illustrative arrangement in which the parallax barrier 700 is removed comprising polar plots for spatial light modulator 48 luminance, parallax barrier 700 transmission, switchable retarder transmission, switchable retarder reflection, public mode luminance, privacy mode luminance and visual security level at 1.0 lux/nit; and FIG. 12B is a linear profile plot array for the component contributions and output of the arrangements of FIG. 12A comprising linear profiles at azimuthal angles of 0, 90, 45 and 225 degrees. The display 100 properties are described in the third row of TABLE 4.

By way of comparison with the present embodiments as will be described in FIGS. 12A-B the polar control retarders 300 may not achieve desirable visual security levels in displays with the high off-axis luminance levels as are typically provided by emissive spatial light modulators 48 in which the parallax barrier 700 is not present.

Considering the linear polar profile plot of visual security level in the lateral (0 degrees) direction at angles of greater than 60 degrees, the VSL falls below 4.0 for 1.0 lux/nit. Such an arrangement provides undesirable visual security to an off-axis snooper despite having high VSL at angles around 45 degrees.

By way of comparison with the present embodiments, the simulated appearance of the arrangement of FIG. 1A omitting the polar control retarder 300 will now be described.

Figure 13A:
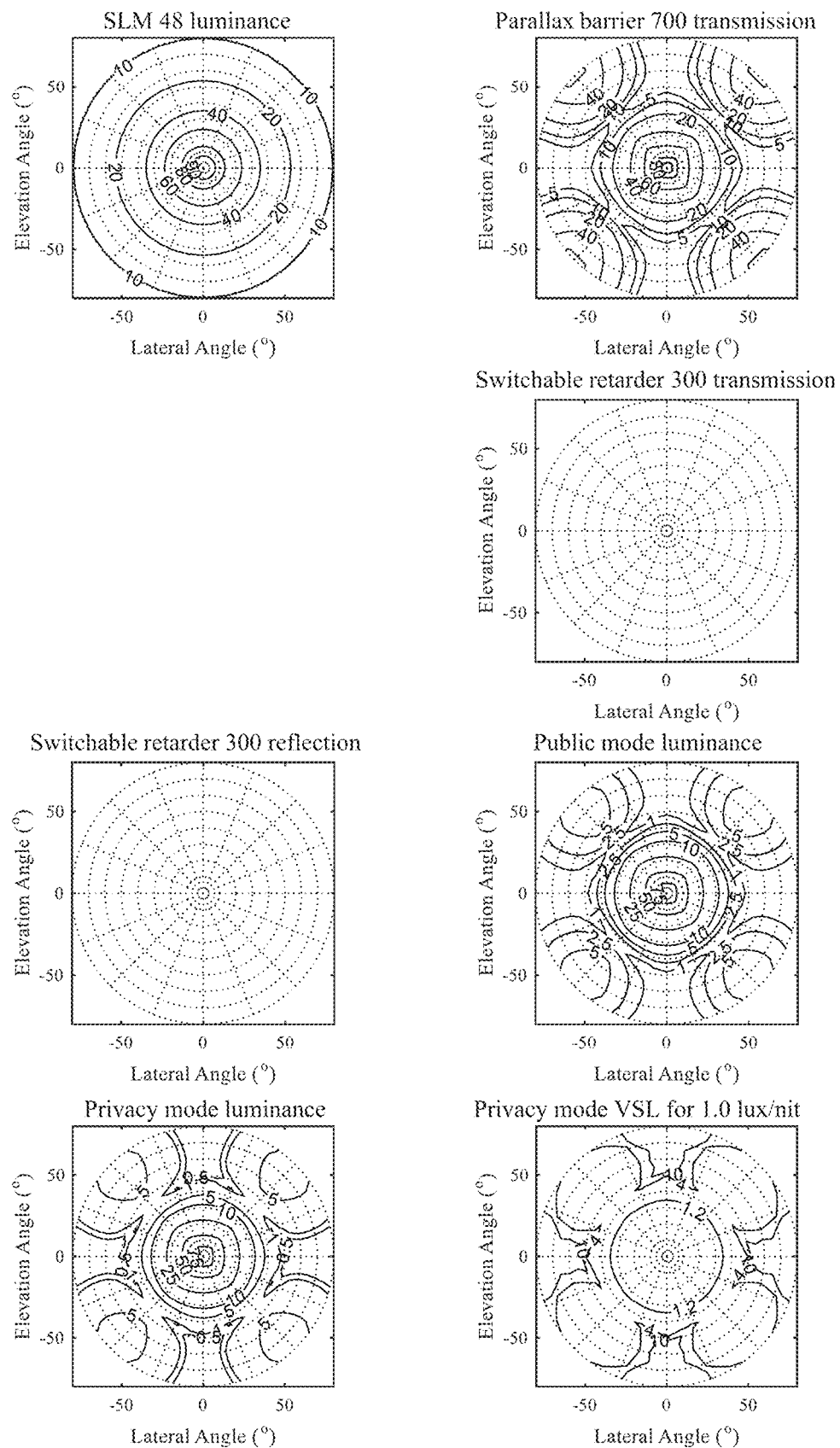
FIG. 13A is a polar plot array for the component contributions and output of the arrangement of FIG. 1A for an illustrative arrangement in which the switchable retarder is removed comprising polar plots for spatial light modulator luminance, parallax barrier transmission, switchable retarder transmission, switchable retarder reflection, public mode luminance, privacy mode luminance and visual security level.
Figure 13B:
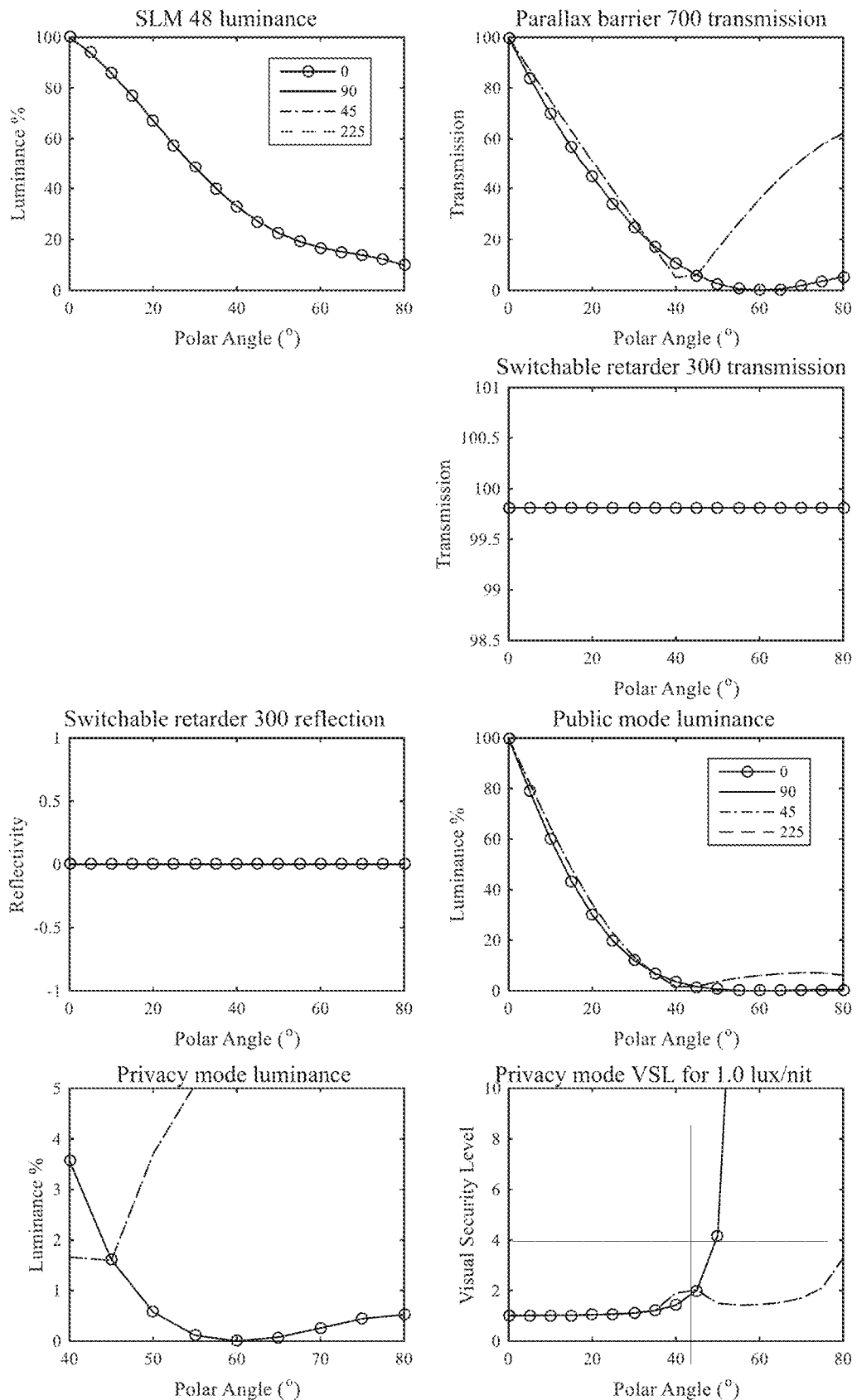
FIG. 13B is a linear profile plot array for the component contributions and output of the arrangements of FIG. 13A comprising linear profiles at azimuthal angles of 0, 90, 45 and 225 degrees.

FIG. 13A is a polar plot array for the component contributions and output of the arrangement of FIG. 1A for an illustrative arrangement in which the switchable retarder is removed comprising polar plots for spatial light modulator 48 luminance, parallax barrier 700 transmission, switchable retarder transmission, switchable retarder reflection, public mode luminance, privacy mode luminance and visual security level for 1.0 lux/nit; and FIG. 13B is a linear profile plot array for the component contributions and output of the arrangements of FIG. 13A comprising linear profiles at azimuthal angles of 0, 90, 45 and 225 degrees.

The display 100 properties are described in the fourth row of TABLE 4. The parallax barrier thickness 700 is designed to be the minimum thickness to provide a VSL of greater than 4.0 at at least one azimuth for a polar angle of 45 degrees in the lateral direction.

Such a display has undesirable privacy performance over a wide range of polar viewing angles and in particular viewing quadrants without substantial reduction in aperture size and subsequent undesirable loss of transmission efficiency.

The spectral transmission and spectral reflection of ambient light from surfaces of the display 100 of FIG. 1A in public mode of operation will now be considered further.

Figure 14:
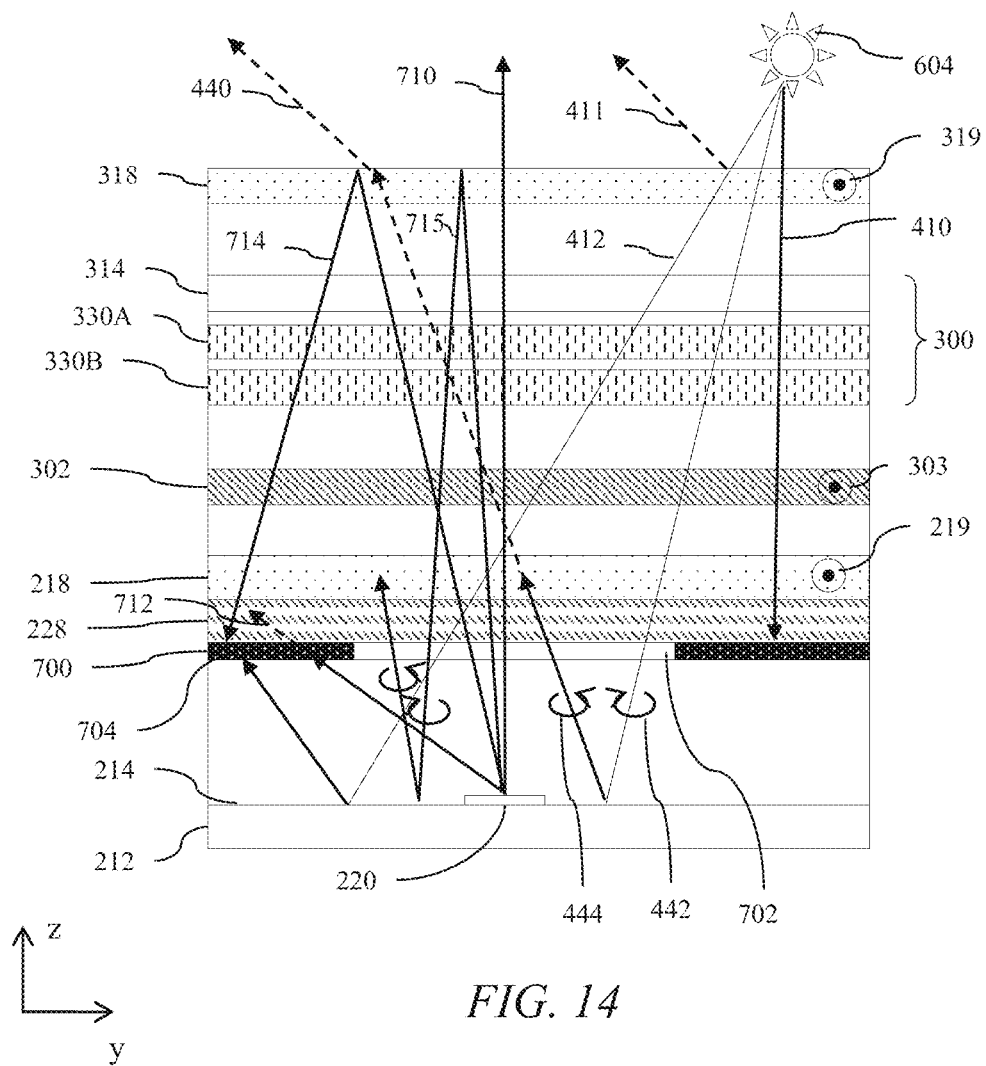
FIG. 14 is a schematic diagram illustrating in side view reflection of ambient light in the display of FIG. 1A.

FIG. 14 is a schematic diagram illustrating in side view reflection of ambient light in the display 100 of FIG. 1A. Features of the arrangement of FIG. 14 not discussed in further detail may be assumed to correspond to the features with equivalent reference numerals as discussed above, including any potential variations in the features.

Light rays 710 are passed by linear polarisers 218, 318 with a spectral modification of light from the pixels 220, 222, 224 provided by the spectral transmission of the polarisers 218, 318.

Light rays 714, 715 that are internally reflected from the outer surface of the display 100. Light rays 714 are absorbed at incidence are directed on to the parallax barrier 700 absorbing regions 704. Light rays 715 are reflected from the reflective pixel layer 214. The reflection reduction quarter-wave retarder 228 provides circular polarisation state 442 that undergoes a phase change at reflection to provide circular polarisation state 444 after reflection which is converted to a polarisation state that is orthogonal to the direction 219 and is absorbed.

Thus light rays 714, 715 undergo two or three passes by polarisers 218, 318, the spectral absorption modified accordingly.

The parallax barrier 700 is arranged to absorb light incident thereon. Light rays 410 from ambient source 604 are passed by polarisers 218, 318 and absorbed by barrier regions 704. Light rays 412 that pass through the barrier and are reflected may be absorbed by the barrier after reflection. The display 100 device is for use in ambient illumination 604 and the parallax barrier 700 absorbs at least some of the ambient illumination 604 light rays 412 transmitted through the apertures 702 that is reflected from the pixel layer 214.

It would be desirable to increase the spectral transmission of the display 100 of FIG. 1A. Further it would be desirable to increase blue transmission while not degrading appearance of display reflections.

Figure 15:
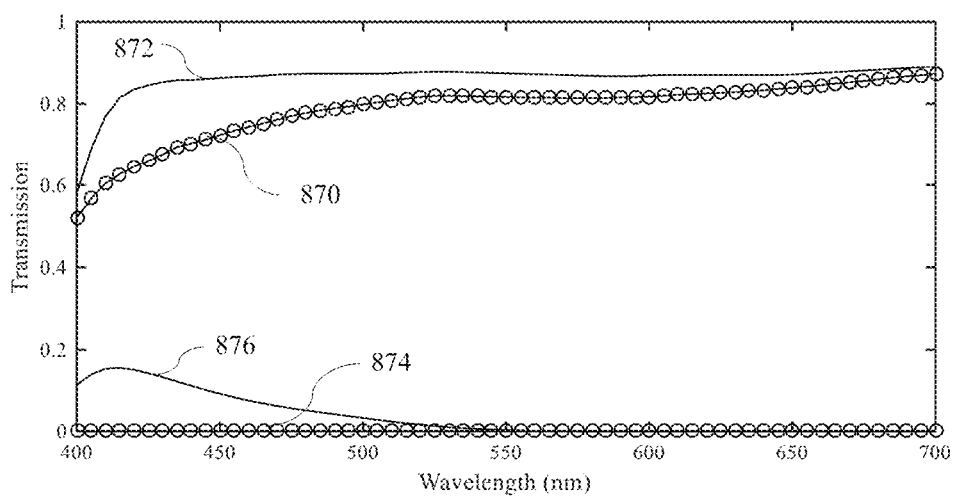
FIG. 15 is a schematic graph illustrating the variation of output luminance with wavelength for a broadband absorbing polariser and for a leaking absorbing polariser.

FIG. 15 is a schematic graph illustrating the variation of output luminance with wavelength for a case that the additional polariser 318 is a broadband absorbing polariser and for a case that the additional polariser 318 is a leaking absorbing polariser. Profile 870 illustrates the variation of transmitted luminance by parallel broadband polarisers; profile 872 illustrates the variation of transmitted luminance by parallel leaking polarisers; profile 874 illustrates the variation of transmitted luminance by crossed broadband polarisers; and profile 876 illustrates the variation of transmitted luminance by crossed leaking polarisers. The leaking polariser 318 has increased leakage in the blue spectral band and increased transmission.

The output polariser 218 and additional polariser 318 when crossed with a second notional polariser of the same material has transmission for wavelengths from 520 nm to 560 nm that is less than the transmission for wavelengths from 450 nm to 490 nm. The transmission for wavelengths from 450 nm to 490 nm is greater than 1%, preferably greater than 2% and most preferably greater than 3%; and the transmission for wavelengths from 520 nm to 560 nm is less than 3%, preferably less than 2% and most preferably less than 1%.

The operation of the display 100 of FIG. 1A when using leaking polarisers will now be described.

Figure 16A:
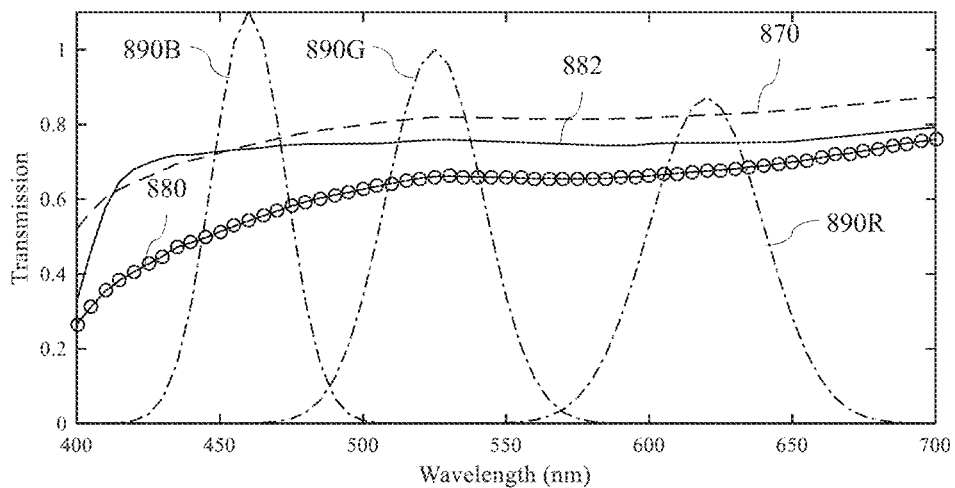
FIG. 16A is a schematic graph illustrating the variation of polariser transmission with wavelength for a broadband absorbing polariser and for a leaking absorbing polariser and with respect to the spectral output of red, green and blue emitting pixels for transmitted rays of FIG. 14.

FIG. 16A is a schematic graph illustrating the variation of polariser 218, 318 transmission with wavelength for broadband absorbing polarisers and for leaking absorbing polarisers and with respect to the spectral outputs 890R, 890G, 890B of red, green and blue emitting pixels 220, 222, 224 for transmitted rays 710 of FIG. 14.

Profile 882 illustrates the spectral transmission of the embodiment of FIG. 1A comprising leaking polarisers 218, 318.

By way of comparison with the present embodiment, profile 880 illustrates the spectral transmission of the embodiment of FIG. 1A comprising broadband absorbing polarisers 218, 318. Advantageously the present embodiment illustrated by profile 882 achieves substantially higher transmission in the red, green and blue channels in comparison to arrangements comprising broadband polarisers 218, 318.

By way of further comparison with the present embodiments, profile 870 illustrates the spectral output of a display that comprises a broadband absorbing polariser and broadband reflectance control quarter-wave retarder and does not comprise barrier 700, polar control retarder 300 or additional polariser 318. Advantageously the present embodiment illustrated by profile 882 has substantially the same transmission for blue light as a display not comprising additional polariser 318. Efficient blue light emission provides increased lifetime for OLED displays. Advantageously the present embodiment achieves the same display lifetime as for conventional displays without additional polariser 318.

Figure 16B:
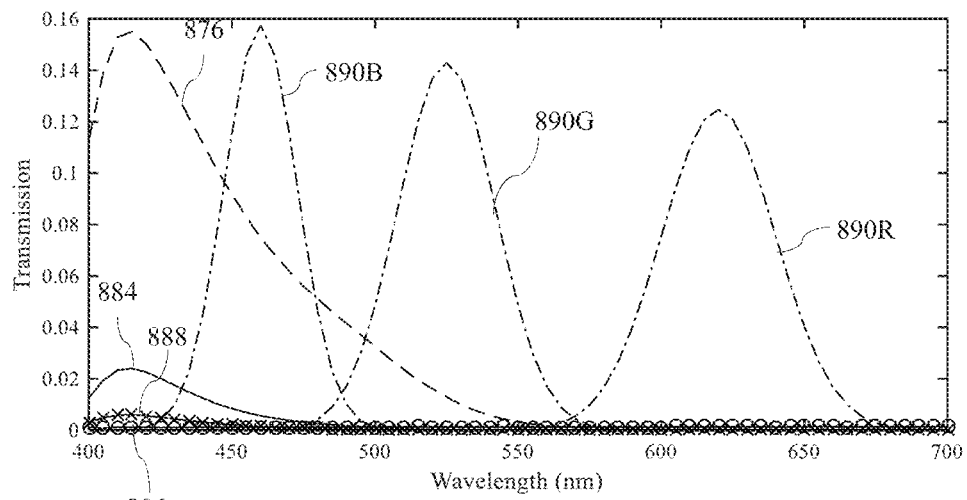
FIG. 16B is a schematic graph illustrating the variation of reflectance with wavelength for a broadband absorbing polariser and for a leaking absorbing polariser and with respect to the spectral output of red, green and blue emitting pixels for reflected rays of FIG. 14.

FIG. 16B is a schematic graph illustrating the variation of reflectance with wavelength for broadband absorbing polarisers 218, 318 and for leaking absorbing polarisers 218, 318 and with respect to the spectral output 890R, 890G, 890B of red, green and blue emitting pixels 220, 222, 224 for reflected rays of FIG. 14.

Reflectance is determined at least in part by the transmission of light rays 440 in FIG. 14 through polarisers 218, 318 after reflection reduction quarter-wave retarder 228 and by absorption of parallax barrier 700.

To continue the illustrative embodiment of the first row of TABLE 4, the aperture ratio of the parallax barrier is 25% so that the barrier absorption is 75% for light rays 410, 412 of FIG. 14.

Returning to the embodiment of FIG. 14 comprising leaking polarisers 218, 318 profile 888 illustrates the average spectral transmission of the display integrated over viewing angles. Advantageously very low average reflectance may be provided by the display. Further display efficiency is increased as illustrated in FIG. 16A.

Profile 884 illustrates the spectral transmission of the display of FIG. 14 for light rays 440 that are both transmitted and reflected by aperture 702 of the parallax barrier 700. Profile 884 has significantly improved extinction in comparison to profile 876 with leakage at the peak blue spectral wavelength of less than 1%. Advantageously, low reflectivity is achieved.

By way of further comparison with the present embodiments, profile 886 illustrates the spectral output of a display that comprises a broadband absorbing polariser and broadband reflectance control quarter-wave retarder and does not comprise barrier 700, polar control retarder 300 or additional polariser 318. Such a display achieves low reflectance over a wide spectral range but has reduced spectral transmission.

By way of further comparison with the present embodiments, profile 876 illustrates the spectral output of a display that comprises a leaking absorbing polariser and broadband reflectance control quarter-wave retarder and does not comprise barrier 700, polar control retarder 300 or additional polariser 318. Such a display achieves low reflectance over a wide spectral range. Such a display provides undesirable reflectance of light, particularly in the blue and green parts of the spectrum. Leaking polarisers with spectral transmission profiles 872, 876 are thus not suitable for reflectance control in emissive displays.

The operation of embodiments comprising inorganic micro-LEDs will now be described.

Figure 17A:
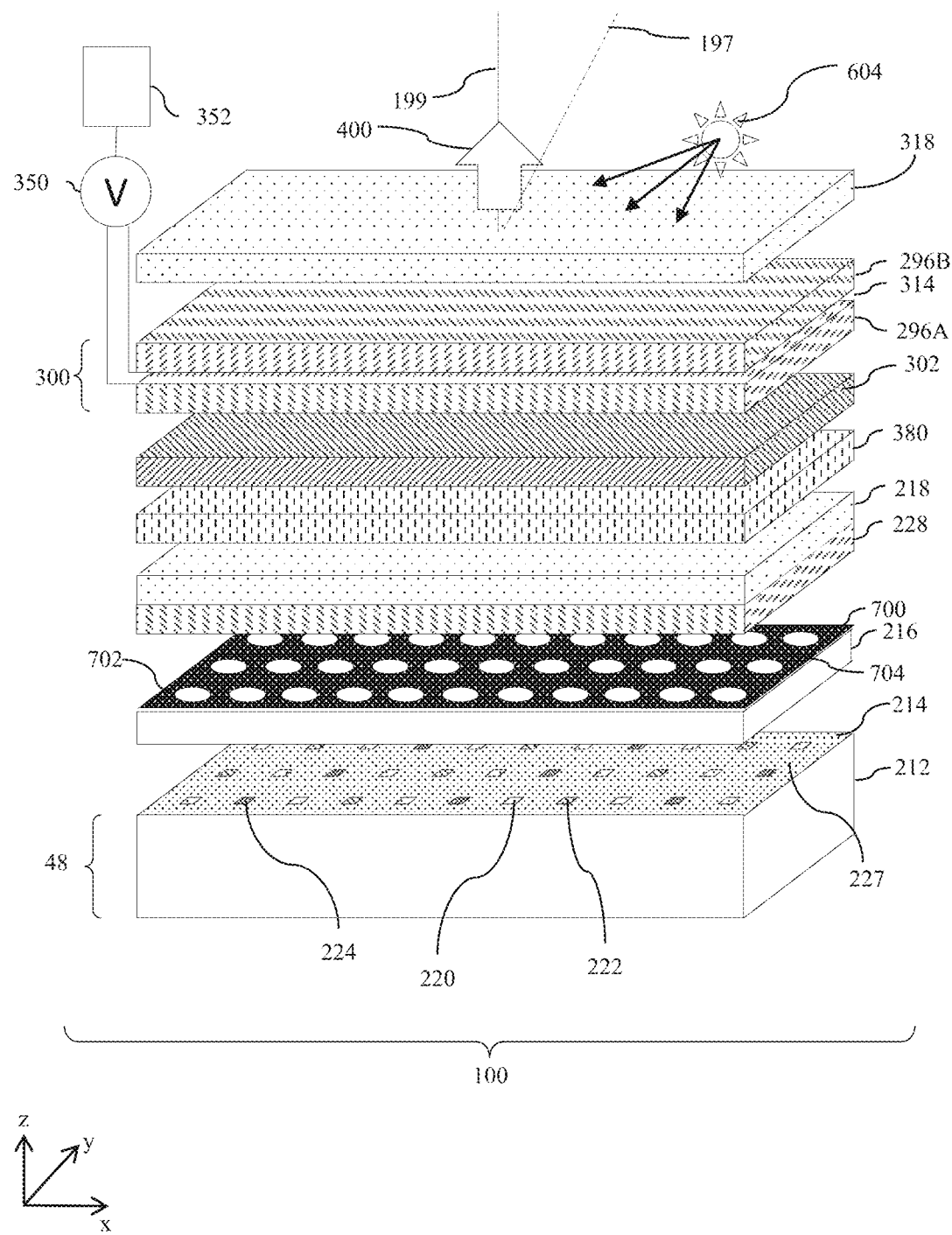
FIG. 17A is a schematic diagram illustrating in side perspective view a switchable privacy display for use in ambient illumination comprising a micro-LED emissive spatial light modulator, parallax barrier, output polariser and reflection control quarter-wave retarder, passive polar control retarder, reflective polariser, a switchable polar control retarder and an additional polariser arranged on the output side of the spatial light modulator.
Figure 17B:
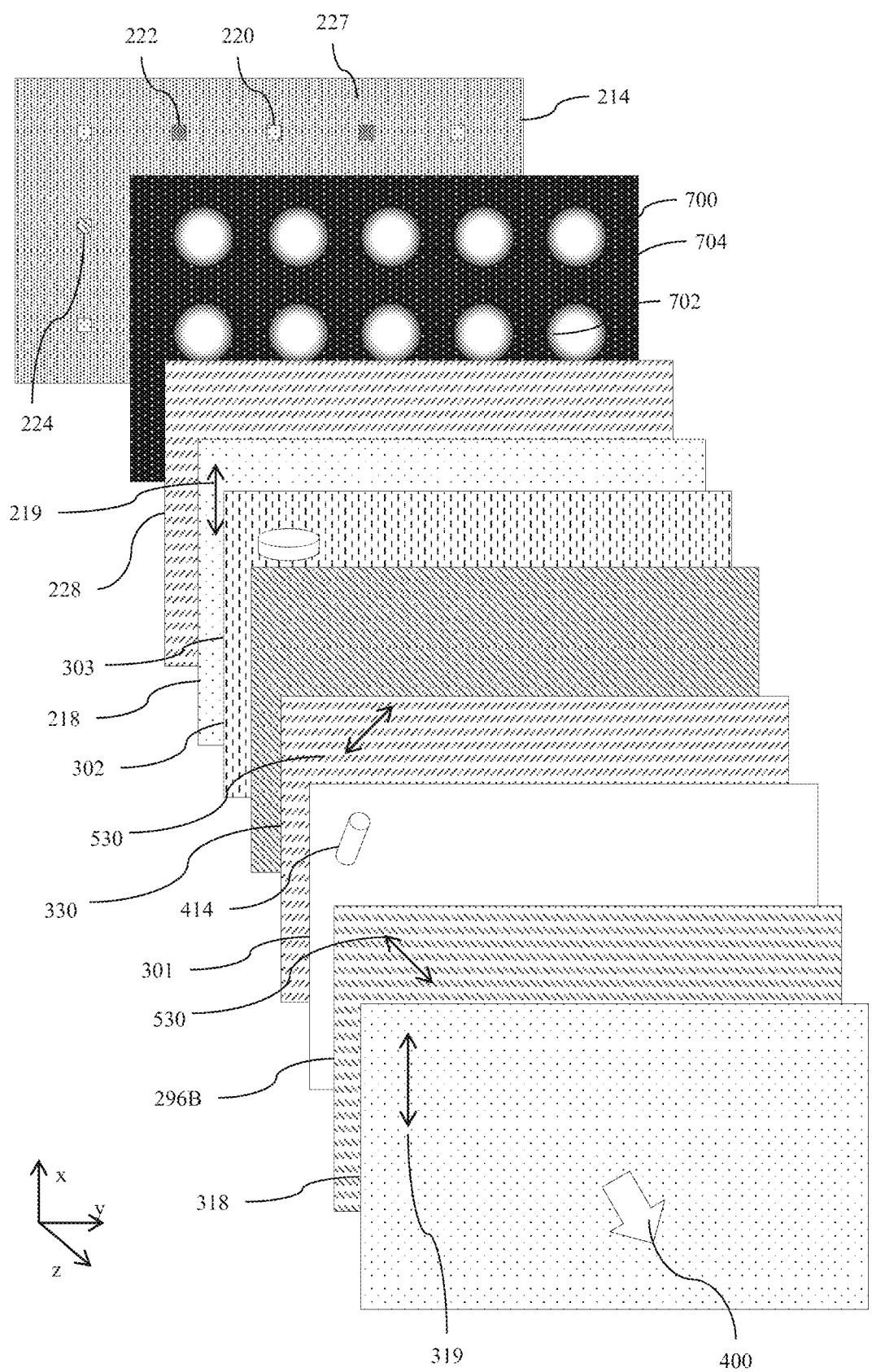
FIG. 17B is a schematic diagram illustrating in front view alignment of optical layers in the optical stack of FIG. 17A.

FIG. 17A is a schematic diagram illustrating in side perspective view a switchable privacy display 100 for use in ambient illumination 604 comprising a micro-LED emissive spatial light modulator 48, parallax barrier 700, output polariser 218 and reflection control quarter-wave retarder 228, passive polar control retarder 380, reflective polariser 302, a switchable polar control retarder 300 and an additional polariser 318 arranged on the output side of the spatial light modulator 48; and FIG. 17B is a schematic diagram illustrating in front view alignment of optical layers in the optical stack of FIG. 17A. Features of the arrangement of FIGS. 18A-B not discussed in further detail may be assumed to correspond to the features with equivalent reference numerals as discussed above, including any potential variations in the features.

In comparison to OLED materials, pixels 220, 222, 224 comprising inorganic micro-LEDs may have luminous emittance (1 m/mm$^2$) that is more than 10$^3$ greater. To achieve the same luminance the area of micro-LED pixels 220, 222, 224 may be significantly smaller than that used for OLED pixels 220, 222, 224. Further smaller micro-LED pixels 220, 222, 224 are lower cost due to reduced monolithic semiconductor area usage. For example micro-LEDs may have a width or diameter of less than 5 micrometers for a pixel pitch of 50 micrometers in the direction in which the pixels are closest.

It would be desirable to achieve a public mode of operation with high image visibility over a wide polar range and private mode with high visual security level to off-axis snoopers.

The pixel layer 214 may comprise a light absorbing material 227 to advantageously achieve reduced reflectance in comparison to the reflective pixel layer typical of OLED pixel layers 214 of FIG. 1A.

FIG. 17A further differs from FIG. 1A in comprising apertures 702 with a circular shape. Advantageously transmission profile symmetry may be increased.

The pixels 220, 222, 224 are arranged on a square grid rather than diamond grid. Such an arrangement provides for reduced luminance in the lateral direction with increased luminance in the quadrants. Advantageously visual security level in privacy mode may be increased for small elevations as will be illustrated below.

In embodiments (not shown) displays comprising mixtures of OLED and micro-LED pixels may be provided (not shown). For example blue micro-LEDs may be provided and green and blue OLED pixels. Advantageously blue lifetime may be increased and colour conversion for micro-LEDs is not used.

Figure 17C:
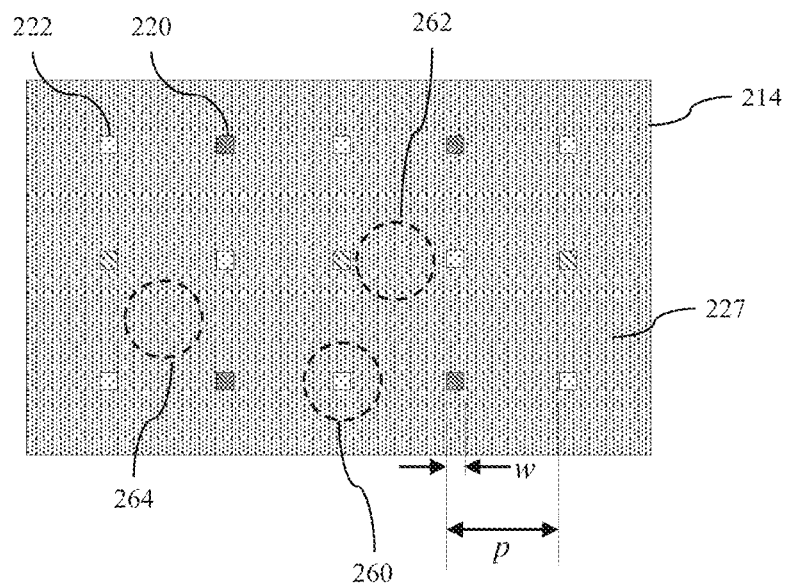
FIG. 17C is a schematic diagram illustrating in top view an arrangement of micro-LED emissive pixels and eye spot locations for various polar viewing angles.

FIG. 17C is a schematic diagram illustrating in top view an arrangement of micro-LED emissive pixels 220, 222, 224 and eye spot locations for various polar viewing angles.

Figure 17D:
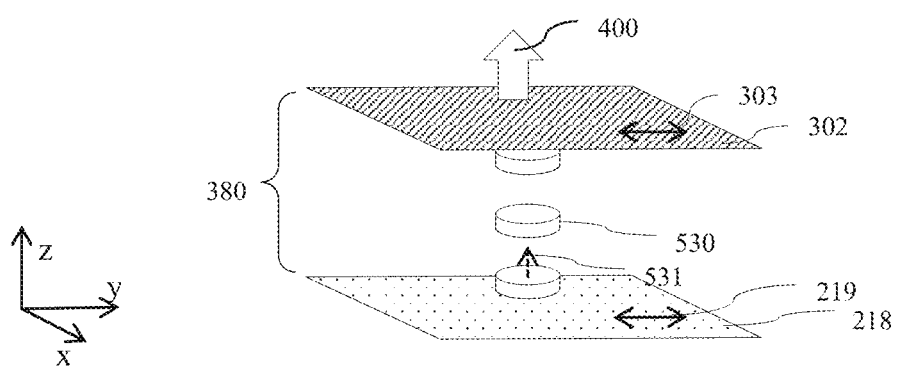
FIG. 17D is a schematic diagram illustrating in side perspective view the passive polar control retarder arranged between the output polariser and reflective polariser.

FIG. 17D is a schematic diagram illustrating in side perspective view the passive polar control retarder 380 arranged between the output polariser 218 and reflective polariser 302.

Passive polar control retarder 380 is arranged between the output polariser 218 and reflective polariser 302. The passive polar control retarder 380 is capable of simultaneously introducing no net relative phase shift to orthogonal polarisation components of light rays passed by the output polariser 218 along an axis 199 along a normal to the plane of the at least one polar control retarder 380 and introducing a relative phase shift to orthogonal polarisation components of light passed by the reflective polariser 302 along an axis 197 inclined to a normal to the plane of the at least one polar control retarder 380.

The at least one passive retarder 380 comprises a retarder material 430 having its optical axis 431 perpendicular to the plane of the retarder, the at least one passive retarder 330 having a retardance for light of a wavelength of 550 nm in a range from −150 nm to −900 nm, preferably in a range from −200 nm to −500 nm and most preferably in a range from −250 nm to −400 nm.

The operation of the passive polar control retarder 380 will be described further below with regards to FIGS. 19A-B.

It would be desirable to optimise the spatial luminance uniformity of the display 100 comprising micro-LED pixels 220, 222, 224.

Figure 18A:
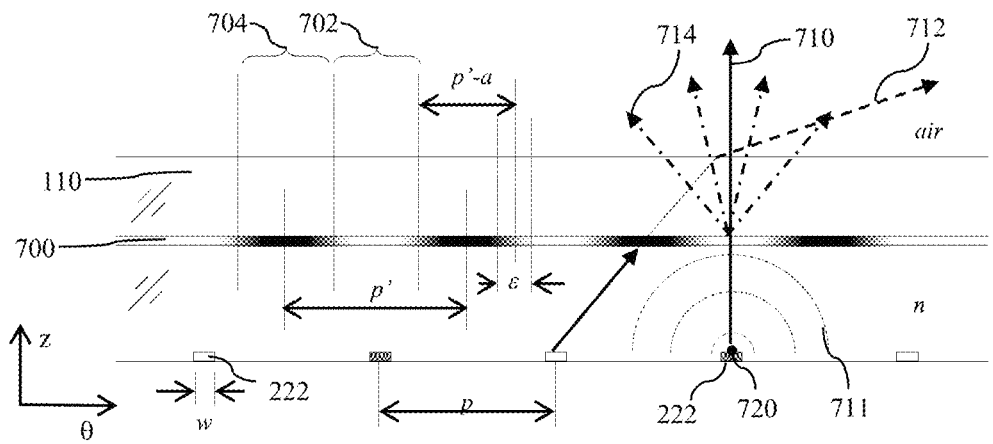
FIG. 18A is a schematic diagram illustrating in side view the structure of a spatial light modulator and aligned parallax barrier comprising vignetted parallax barrier apertures.

FIG. 18A is a schematic diagram illustrating in side view the structure of a spatial light modulator and aligned parallax barrier comprising vignetted parallax barrier apertures.

The apertures 702 have an absorption that has a transmission gradient at the edges of the aperture 702 that has a transmission gradient width s of greater than 1 micron, preferably greater than 2 microns and more preferably greater than 3 microns.

In operation a point emitter 720 within the pixel 222 emits a spherical wavefront 711 towards the aperture 702. On incidence at the aperture 702 with the wavefront 711, residual wavefront curvature results in near field Fresnel diffraction such that rays 714 are provided at unintended angles in the far field.

In parallax barriers with hard edges such that the transmission gradient width s is smaller than 1 micron such rays may provide undesirable polar luminance variations from a point source and provide visible uniformity variations that can be seen by an observer across the area of the display 100.

In an illustrative micro-LED embodiment, the separation p of pixels may be 50 micrometers and the pixel width may be 3 micrometers. In an illustrative OLED embodiment, the separation p of pixels may be 50 micrometers and the pixel width may be 25 micrometers. In both arrangements the aperture 702 width a may be 16 micrometers. In displays with organic emitters such as those illustrated in FIG. 1A, the diffracted rays are blurred due to the convolution with the large pixel area. Advantageously high display uniformity may be achieved. The convolution blurring in OLED arrangements may be substantially greater than for micro-LED displays due to the small size of the micro-LED emitters 220, 222, 224.

In the present embodiments, the transmission gradient width ε provides diffractive apodisation of diffracted rays 714 in particular for small emitting areas such as micro-LEDs in which substantial convolution blurring is not provided. The luminance variations from the diffracted rays 714 are reduced by the transmission gradient width ε. Advantageously the visibility of spatial luminance variations across the display using micro-LED pixels 220, 222, 224 is reduced.

The transmission profile of various parallax barriers 700 will now be further described.

Figure 18B:
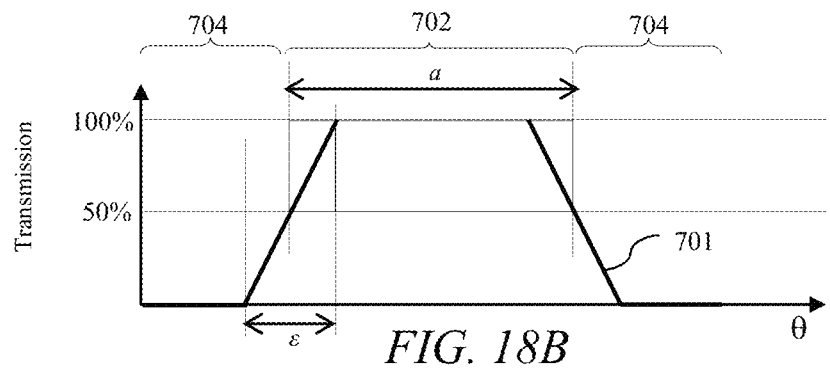
FIGS. 18B, 18C, and 18D are schematic graphs illustrating the variation of parallax barrier transmission with position for various parallax barrier structures.
Figure 18C:
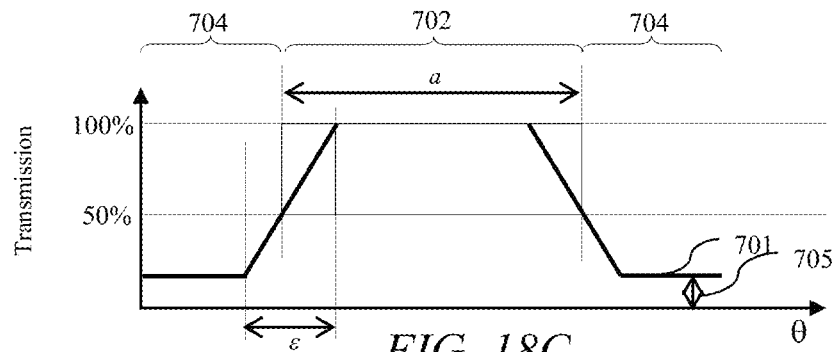
Figure 18D:
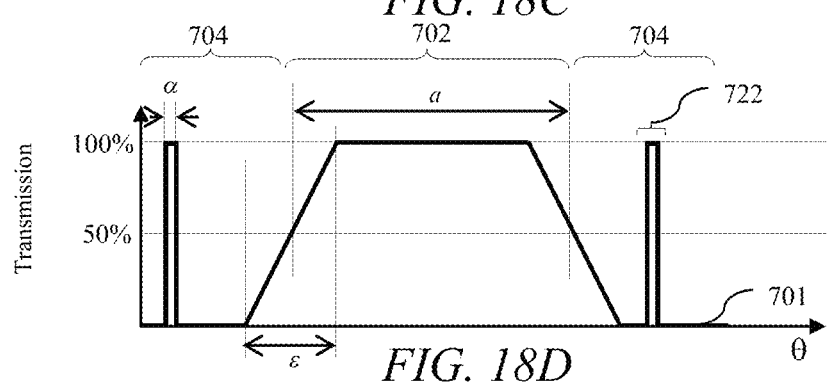

FIGS. 18B-D are schematic graphs illustrating the variation of parallax barrier transmission with position for various parallax barrier 700 structures.

FIG. 18B illustrates a first apodised transmission profile 701 of relative transmission against position in a direction θ at which the apertures are closest; wherein the absorption regions 704 have 100% absorption. The slope may be formed by thickness variations of absorbing material and/or by half tone patterning across the width ε. Advantageously luminance variations across the display may be minimised. Within the region of the widths of the slope of the profile 701 the transmission varies to apodise the output as described with reference to FIG. 18A.

FIG. 18C illustrates increased transmission 705 for absorption regions 704, for example by control of the thickness of the material used to form the absorption regions 704. The absorption of the region of the parallax barrier 700 between the apertures 702 is less than 100%, and is greater than 80% preferably greater than 90% and more preferably greater than 95%. Transmission 705 may for example be less than 5% or less than 2.5%. Advantageously increased luminance may be provided at higher polar viewing angles in public mode of operation.

FIG. 18D illustrates increased transmission for absorption regions 704 by means of sub-aperture regions 722 as illustrated in FIG. 2A for example. Average transmission 705 across the light absorbing regions 704 may for example be less than 5% or less than 2.5%. Advantageously increased luminance may be provided at higher polar viewing angles in public mode of operation.

The simulated output of an illustrative embodiment of FIG. 17A will now be described.

Figure 19A:
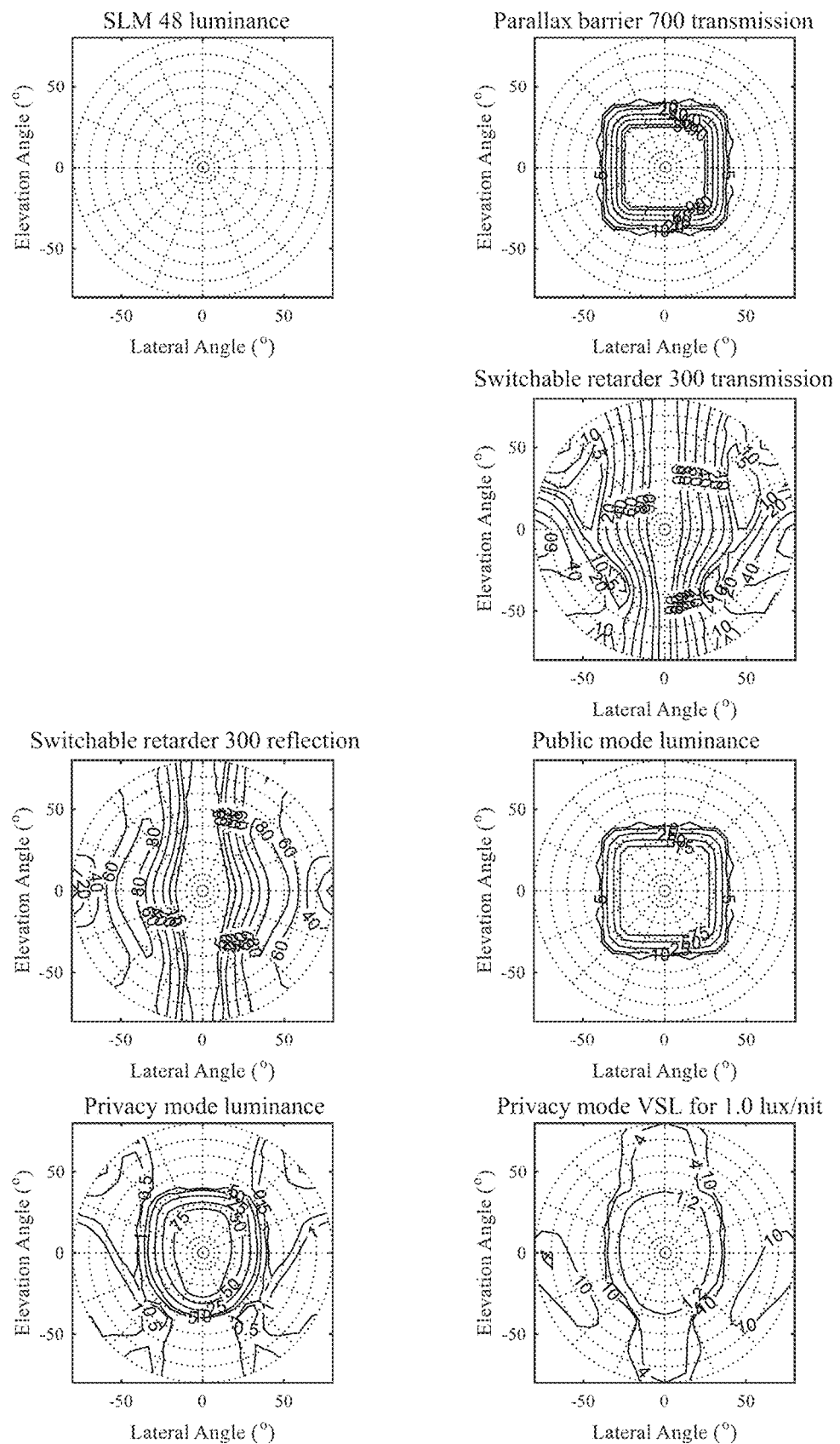
FIG. 19A is a polar plot array for the component contributions and output of the arrangement of FIG. 17A comprising polar plots for spatial light modulator luminance, parallax barrier transmission, passive polar control retarder, switchable retarder transmission, switchable retarder reflection, public mode luminance, privacy mode luminance and visual security level.
Figure 19B:
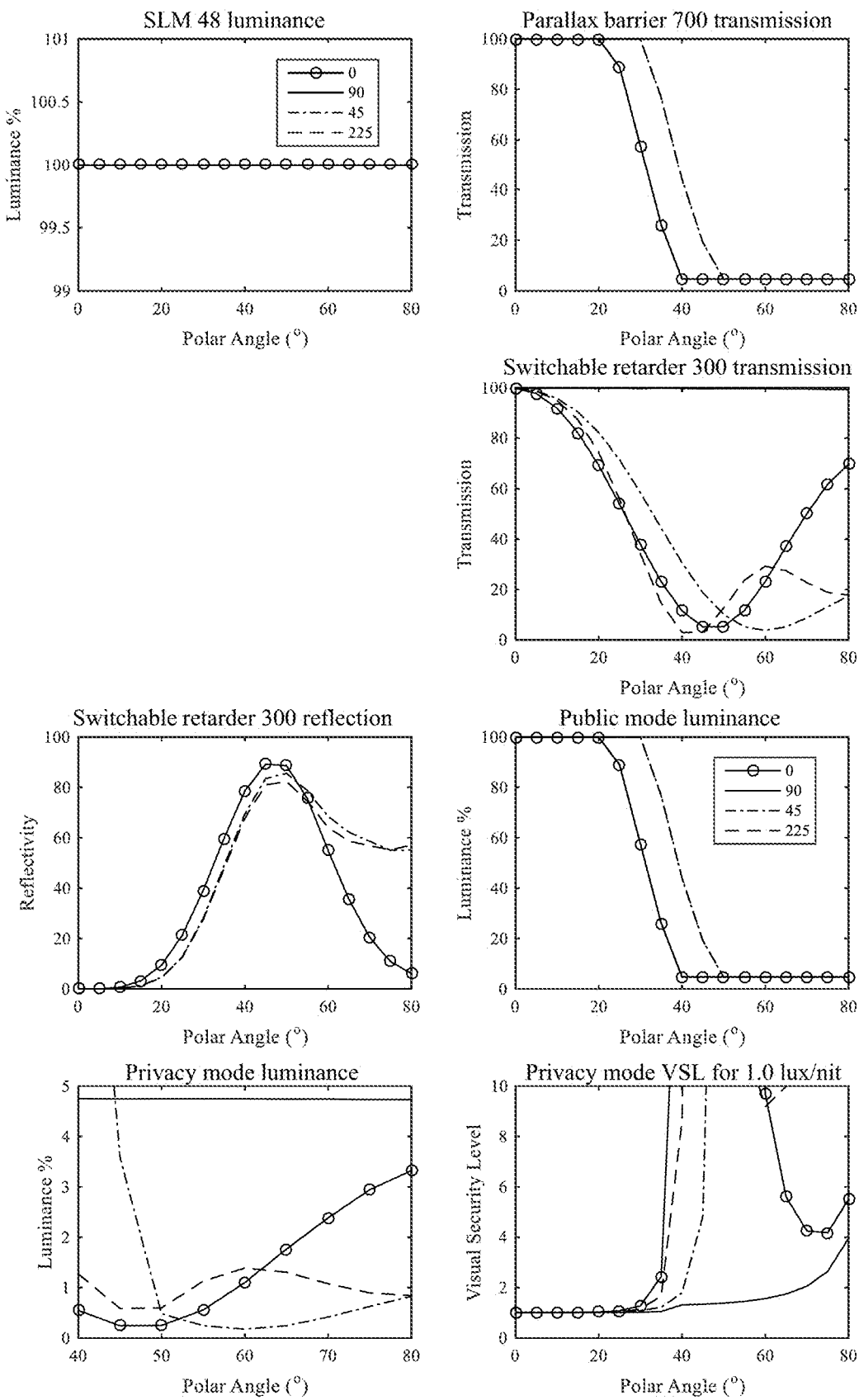
FIG. 19B is a linear profile plot array for the component contributions and output of the arrangements of FIG. 19A comprising linear profiles at azimuthal angles of 0, 90, 45 and 225 degrees.

FIG. 19A is a polar plot array for the component contributions and output of the arrangement of FIG. 17A omitting the passive polar control retarder 380 comprising polar plots for spatial light modulator 48 luminance, parallax barrier 700 transmission, switchable retarder 300 transmission, normalised switchable retarder 300 reflection, public mode luminance, privacy mode luminance and visual security level for a lux/nit ratio of 1.0; and FIG. 19B is a linear profile plot array for the component contributions and output of the arrangements of FIG. 19A.

Illustrative parallax barrier 700 and micro-LED pixel 220, 222, 224 parameters for FIGS. 19A-B are provided in the first row of TABLE 5 with reference to the pitch, p of 50 μm in the direction in which the pixels are closest. The pixels 220, 222, 224 are provided in the square packed arrangement of FIG. 17C and square parallax barrier 700 apertures 702 are provided (in comparison to the illustrated circular apertures). The direction in which the pixels are closest is for an azimuth of 0 degrees.

TABLE 5

| FIGS. | Pixel pitch, p | Pixel width, w | Aperture, a | Absorption region 704 transmission | Thickness, d | Passive retarder 330 | Compensated LC retarder | Lux/nit ratio |
|---|---|---|---|---|---|---|---|---|
| 19A-B | 50 μm | 5 μm | 20 μm | 5% | 27.5 μm | None | See TABLE 3 | 1.0 |
| 19C-D | 50 μm | 5 μm | 20 μm | 5% | 27.5 μm | C plate −350 nm | See TABLE 3 | 1.0 |
| 20A-B | 50 μm | None | None | None | None | None | See TABLE 3 | 1.0 |
| 21A-B | 50 μm | 5 μm | 20 μm | 5% | 27.5 μm | None | None | 1.0 |
| 21C-D | 50 μm | 5 μm | 20 μm | 0% | 27.5 μm | None | None | 1.0 |

In comparison to the output of FIG. 11A, the luminance profile from the micro-LED pixels 220, 222, 224 is illustrated as Lambertian and thus higher levels of luminance are provided at higher polar angles.

The polar output profile from the parallax barrier 700 has a high central output region and then slopes to 5% luminance at high polar angles using for example the arrangements of FIG. 2A. Advantageously the public mode of operation retains desirable image visibility at high viewing angles.

The slope of the luminance roll-off in public mode is determined by the profile of the barrier edge which in the present illustrative embodiment is hard-edged. The soft-edged parallax barriers of FIGS. 18A-D may further achieve a smoother roll-off of luminance profile in public mode of operation. Advantageously luminance uniformity for head-on use, and uniformity for off-axis polar viewing regions is improved.

In privacy mode of operation, advantageously a visual security level of greater than 4.0 is achieved for polar angles above 45 degrees and in particular in the viewing quadrants. In other embodiments, not shown, the visual security level may be further increased by reducing the transmission level of the parallax barrier 700 absorption regions 704.

It may be desirable to provide further luminance reduction in the viewing quadrants.

Figure 19C:
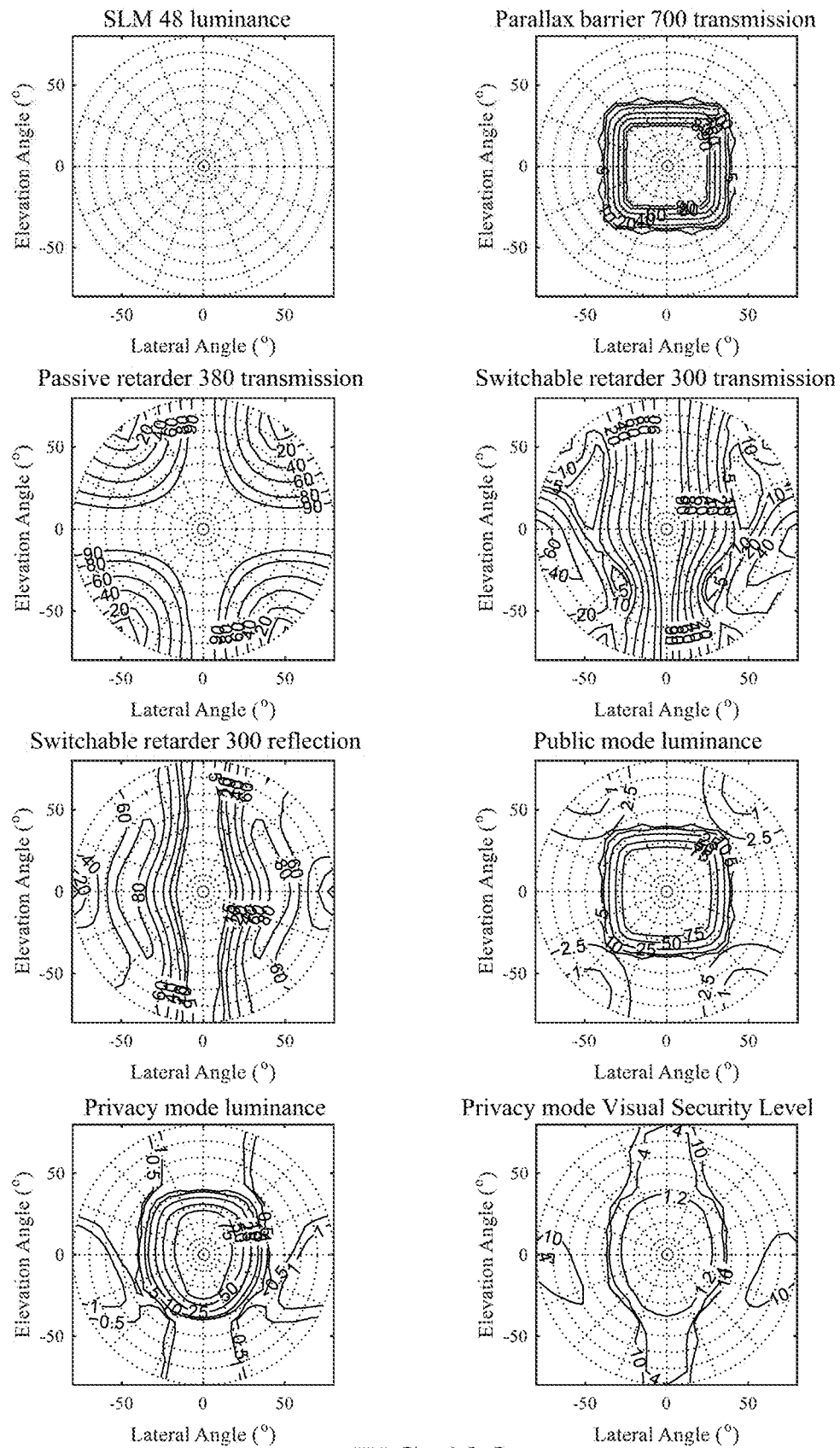
FIG. 19C is a polar plot array for the component contributions and output of the arrangement of FIG. 17A comprising polar plots for spatial light modulator luminance, parallax barrier transmission, passive polar control retarder, switchable retarder transmission, switchable retarder reflection, public mode luminance, privacy mode luminance and visual security level.
Figure 19D:
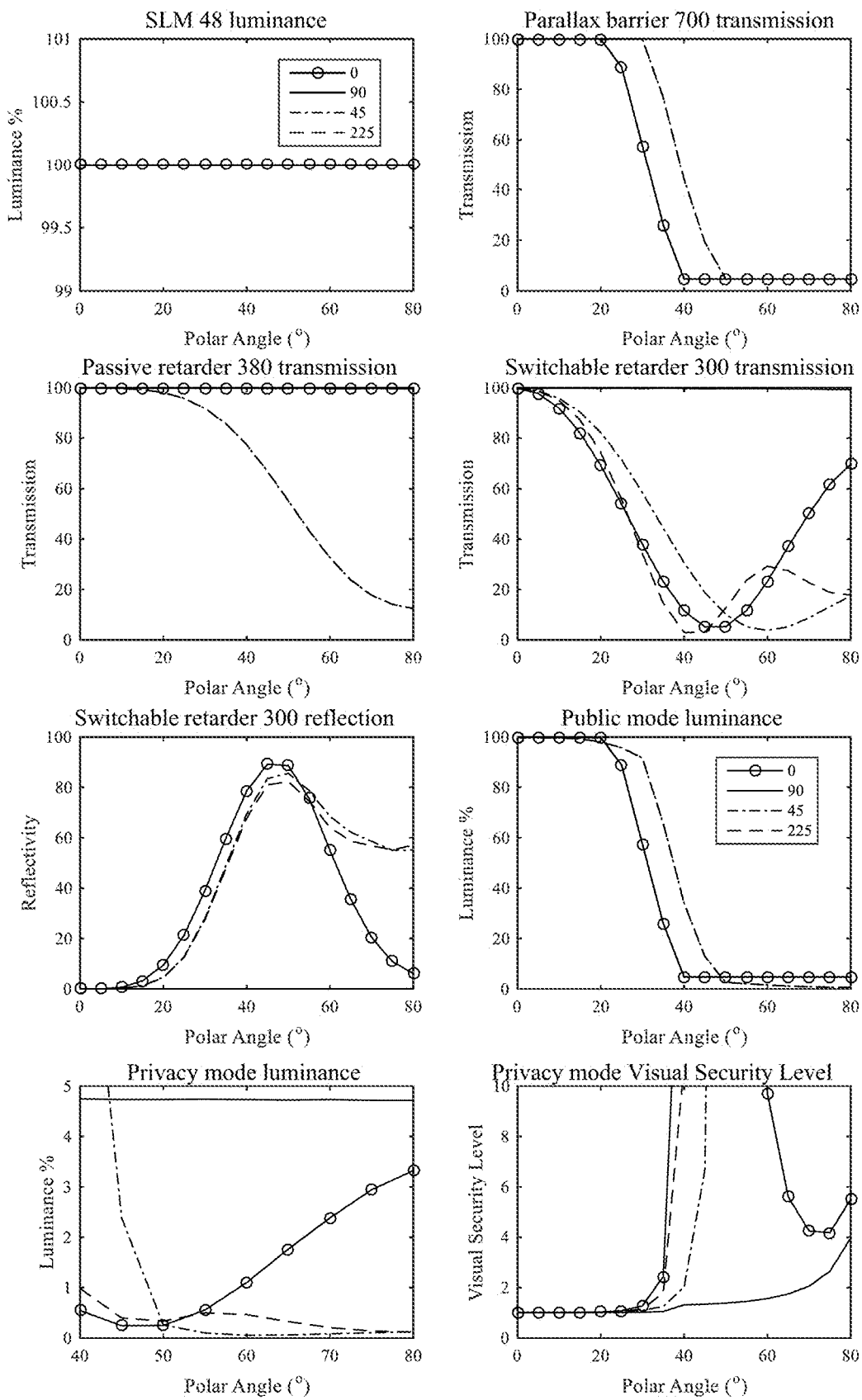
FIG. 19D is a linear profile plot array for the component contributions and output of the arrangements of FIG. 19C comprising linear profiles at azimuthal angles of 0, 90, 45 and 225 degrees.

FIG. 19C is a polar plot array for the component contributions and output of the arrangement of FIG. 17A comprising polar plots for spatial light modulator 48 luminance, parallax barrier 700 light absorbing region 704 transmission, passive polar control retarder 380 transmission, switchable retarder 300 transmission, switchable retarder 300 reflection, public mode luminance, privacy mode luminance and visual security level; and FIG. 19D is a linear profile plot array for the component contributions and output of the arrangements of FIG. 19C comprising linear profiles at azimuthal angles of 0, 90, 45 and 225 degrees. The display 100 properties are described in the second row of TABLE 5. The passive polar control retarder 380 reduces the luminance in the viewing quadrants. Advantageously the visual security levels in the viewing quadrants may be improved.

By way of comparison with the present embodiments, the simulated appearance of the arrangement of FIG. 17A omitting the parallax barrier 700 and polar control retarder 380 will now be described.

Figure 20A:
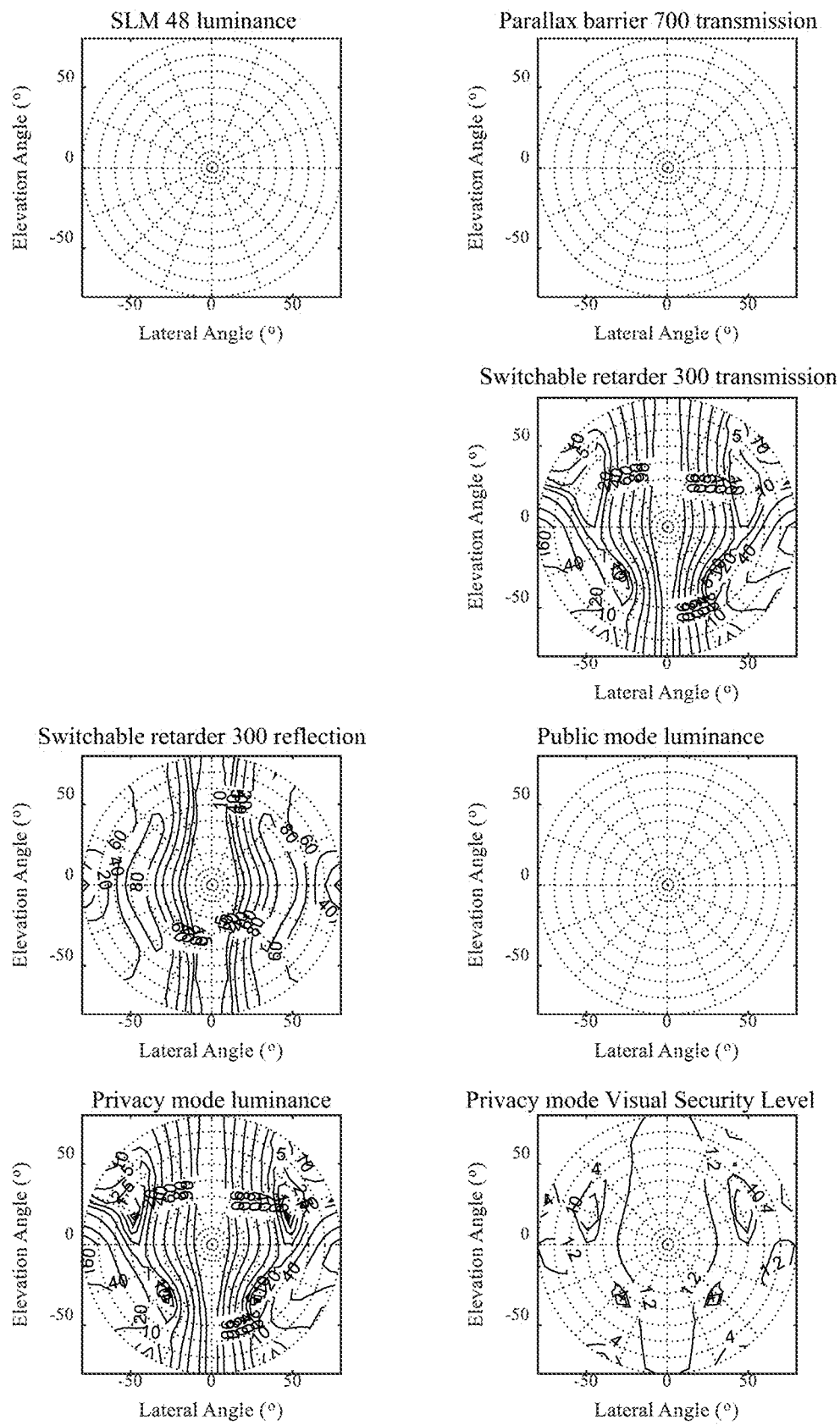
FIG. 20A is a polar plot array for the component contributions and output of the arrangement of FIG. 17A for an illustrative arrangement in which the parallax barrier is removed comprising polar plots for spatial light modulator luminance, parallax barrier transmission, switchable retarder transmission, switchable retarder reflection, public mode luminance, privacy mode luminance and visual security level.
Figure 20B:
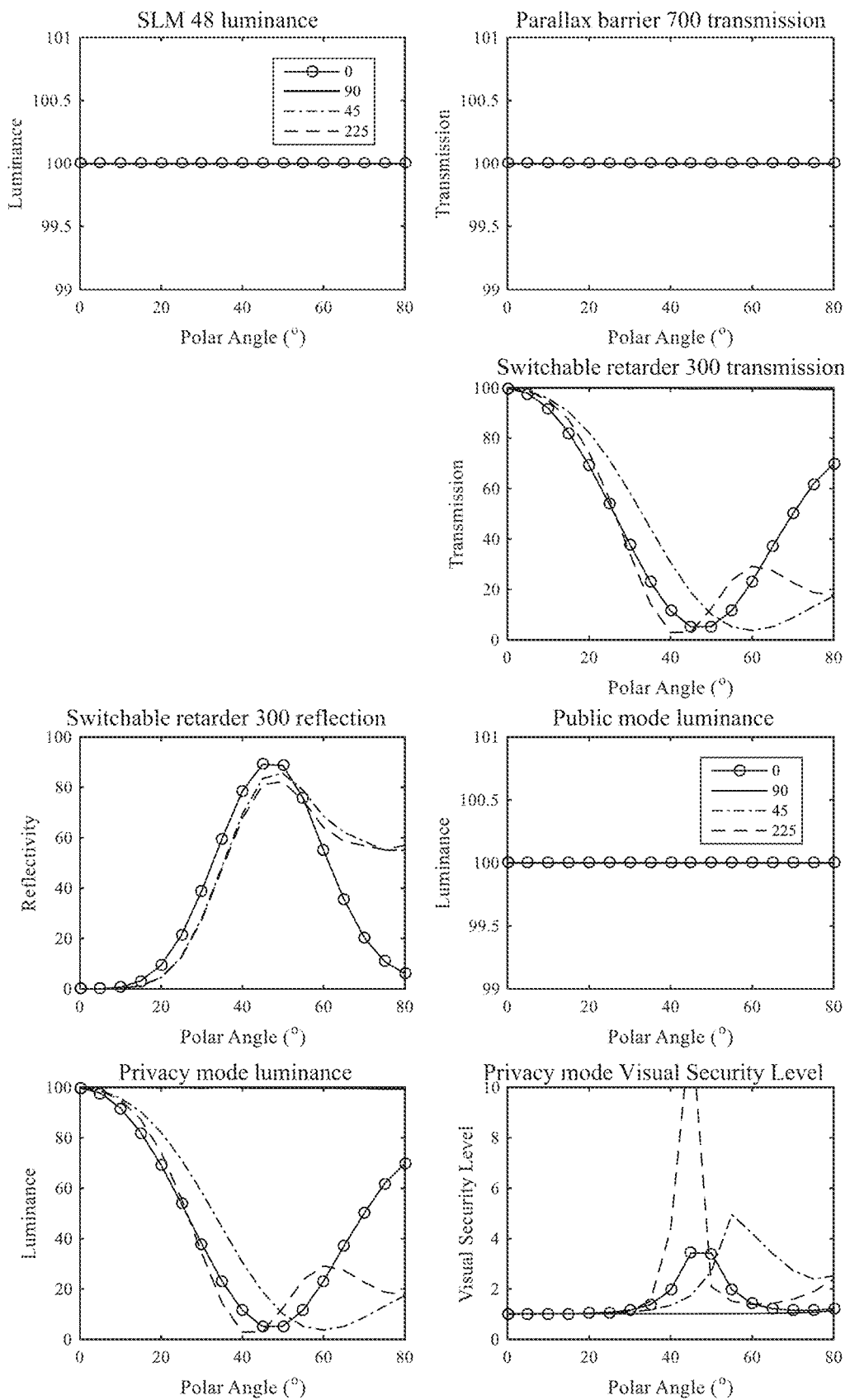
FIG. 20B is a linear profile plot array for the component contributions and output of the arrangements of FIG. 20A comprising linear profiles at azimuthal angles of 0, 90, 45 and 225 degrees.

FIG. 20A is a polar plot array for the component contributions and output of the arrangement of FIG. 17A for an illustrative arrangement in which the parallax barrier 700 is removed comprising polar plots for spatial light modulator 48 luminance, parallax barrier 700 light absorbing region 704 transmission, switchable retarder 300 transmission, switchable retarder 300 reflection, public mode luminance, privacy mode luminance and visual security level; and FIG. 20B is a linear profile plot array for the component contributions and output of the arrangements of FIG. 20A comprising linear profiles at azimuthal angles of 0, 90, 45 and 225 degrees. The display 100 properties are described in the third row of TABLE 5.

By way of comparison with the present embodiments the polar control retarders 300 may not achieve desirable visual security levels in displays with the high off-axis luminance levels as are typically provided by emissive spatial light modulators 48 comprising micro-LEDs in which the parallax barrier 700 is not present.

Considering the linear polar profile plot of visual security level in the lateral (0 degrees) direction at angles of greater than 60 degrees, the VSL remains below 4.0 for 1.0 lux/nit for almost all polar viewing angles. Such an arrangement provides undesirable visual security to an off-axis snooper.

By way of comparison with the present embodiments, the simulated appearance of the arrangement of FIG. 1A omitting the polar control retarders 300, 380 will now be described.

Figure 21A:
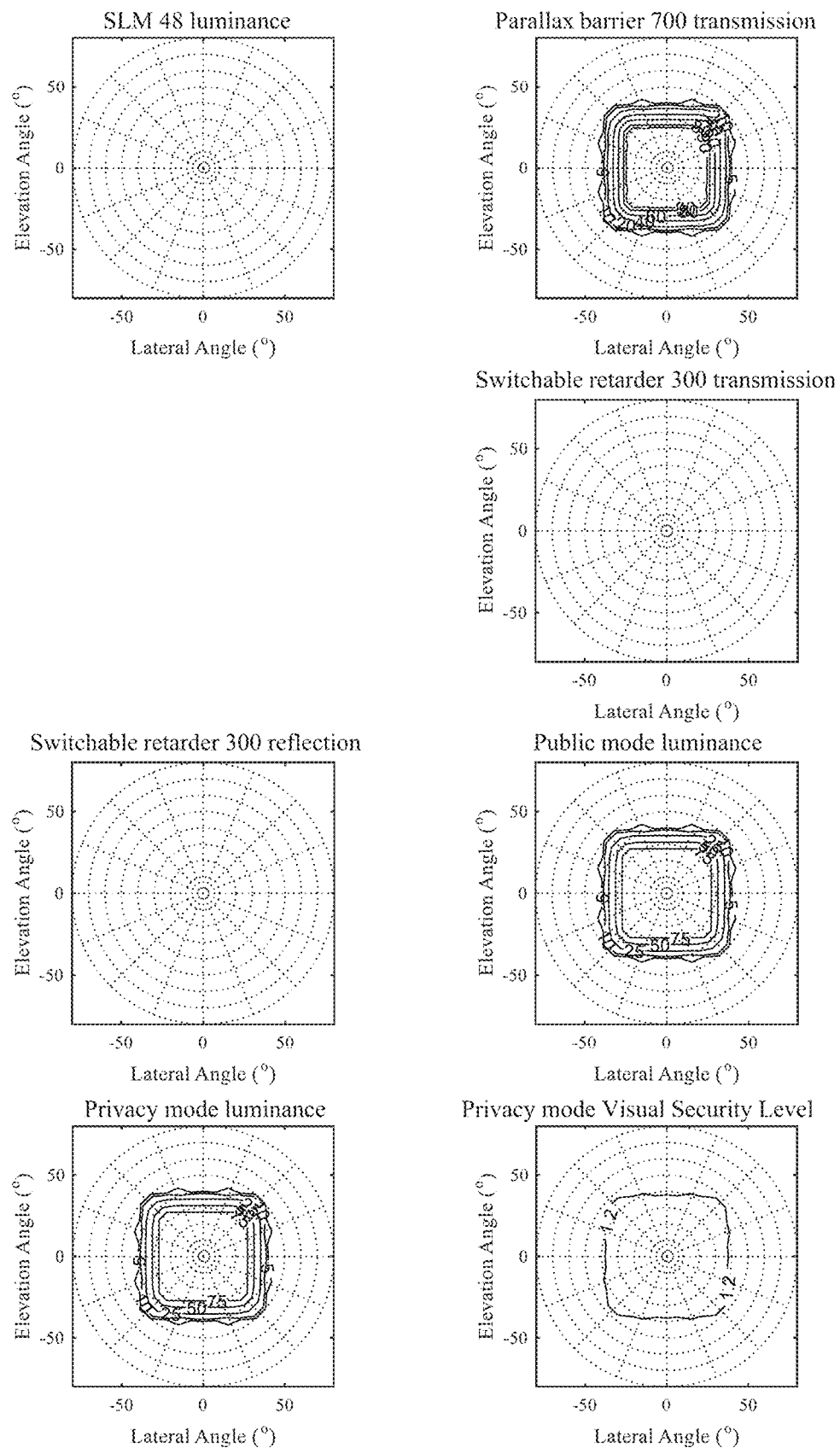
FIG. 21A is a polar plot array for the component contributions and output of the arrangement of FIG. 17A for an illustrative arrangement in which the switchable retarder and passive polarisation control retarder are removed and the parallax barrier provides transmission in the light absorbing regions; comprising polar plots for spatial light modulator luminance, parallax barrier transmission, switchable retarder transmission, switchable retarder reflection, public mode luminance, privacy mode luminance and visual security level.
Figure 21B:
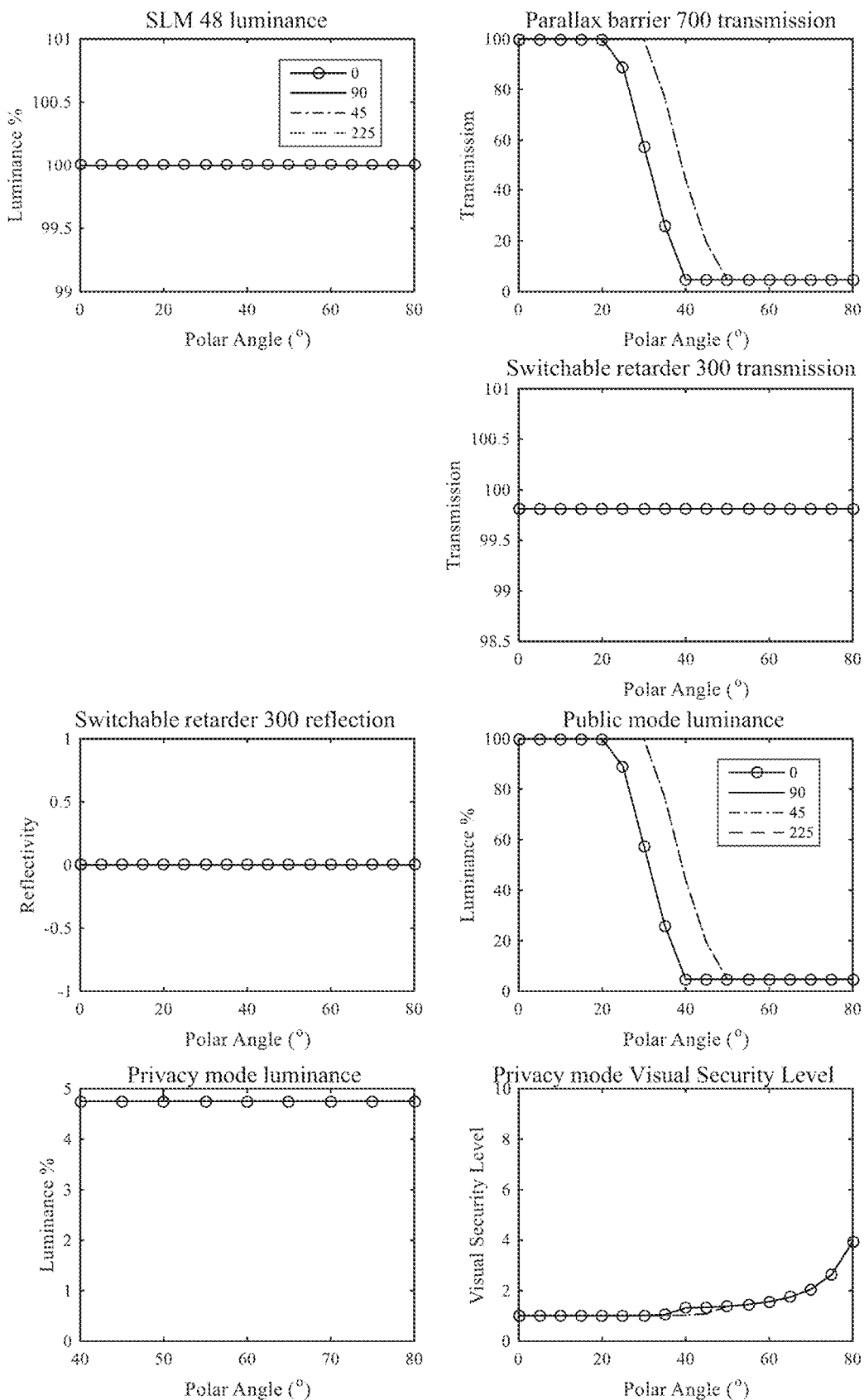
FIG. 21B is a linear profile plot array for the component contributions and output of the arrangements of FIG. 21A comprising linear profiles at azimuthal angles of 0, 90, 45 and 225 degrees.

FIG. 21A is a polar plot array for the component contributions and output of the arrangement of FIG. 17A for an illustrative arrangement in which the switchable retarder 300 and passive polarisation control retarder 380 are removed and the parallax barrier 700 provides transmission in the light absorbing regions 704; comprising polar plots for spatial light modulator 48 luminance, parallax barrier 700 transmission, switchable retarder 300 transmission, switchable retarder 300 reflection, public mode luminance, privacy mode luminance and visual security level; and FIG. 21B is a linear profile plot array for the component contributions and output of the arrangements of FIG. 21A comprising linear profiles at azimuthal angles of 0, 90, 45 and 225 degrees. The display 100 properties are described in the fourth row of TABLE 5. To achieve desirable image visibility in public mode, the luminance at high polar viewing angles is 5%. However, the visual security level is below 4.0 for all polar viewing angles and below 2.0 for most polar viewing angles. Such a display does not provide a satisfactory privacy mode of operation.

Figure 21C:
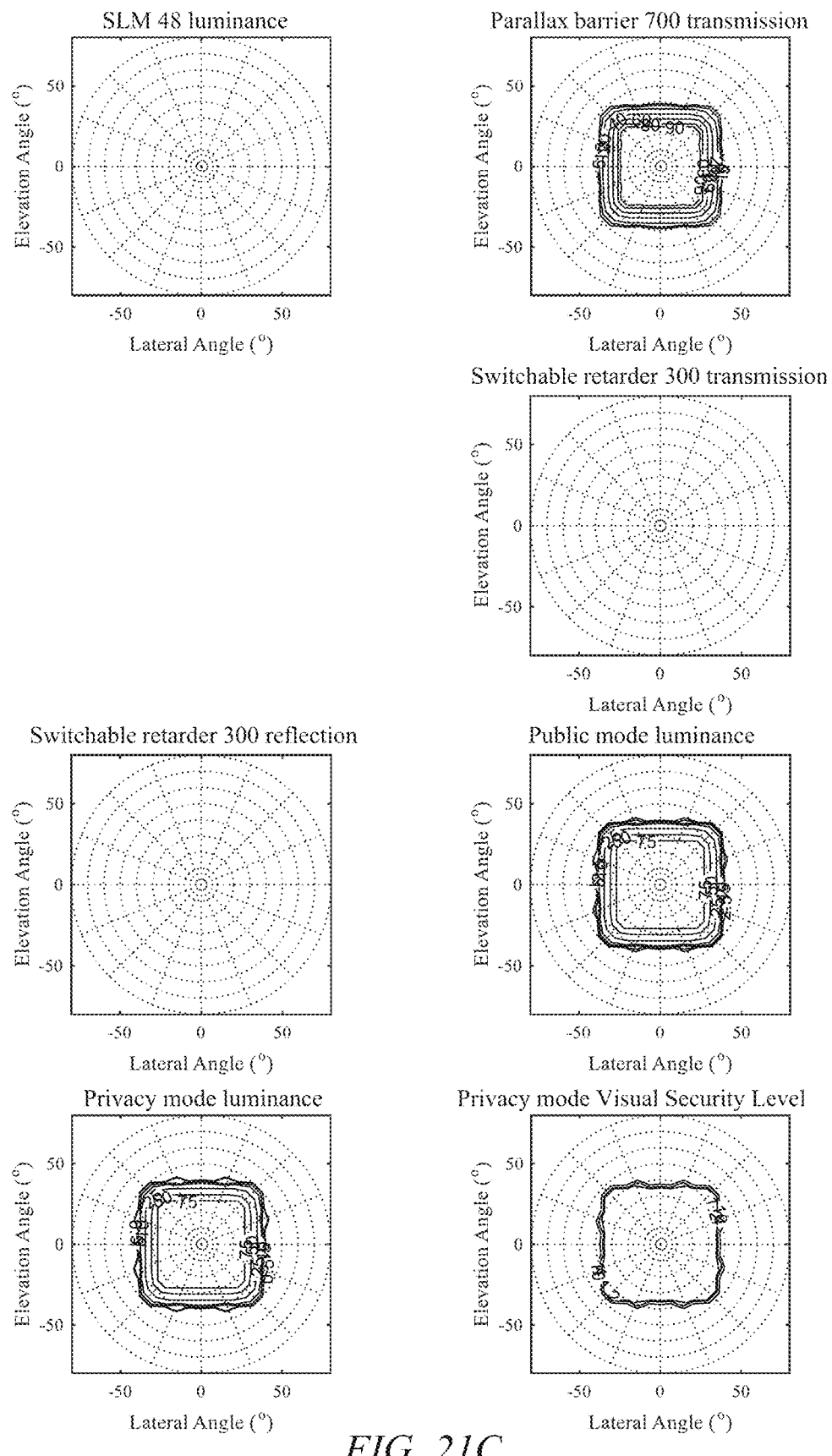
FIG. 21C is a polar plot array for the component contributions and output of the arrangement of FIG. 17A for an illustrative arrangement in which the switchable retarder and passive polarisation control retarder are removed and the parallax barrier provides no transmission in the light absorbing regions; comprising polar plots for spatial light modulator luminance, parallax barrier transmission, switchable retarder transmission, switchable retarder reflection, public mode luminance, privacy mode luminance and visual security level.
Figure 21D:
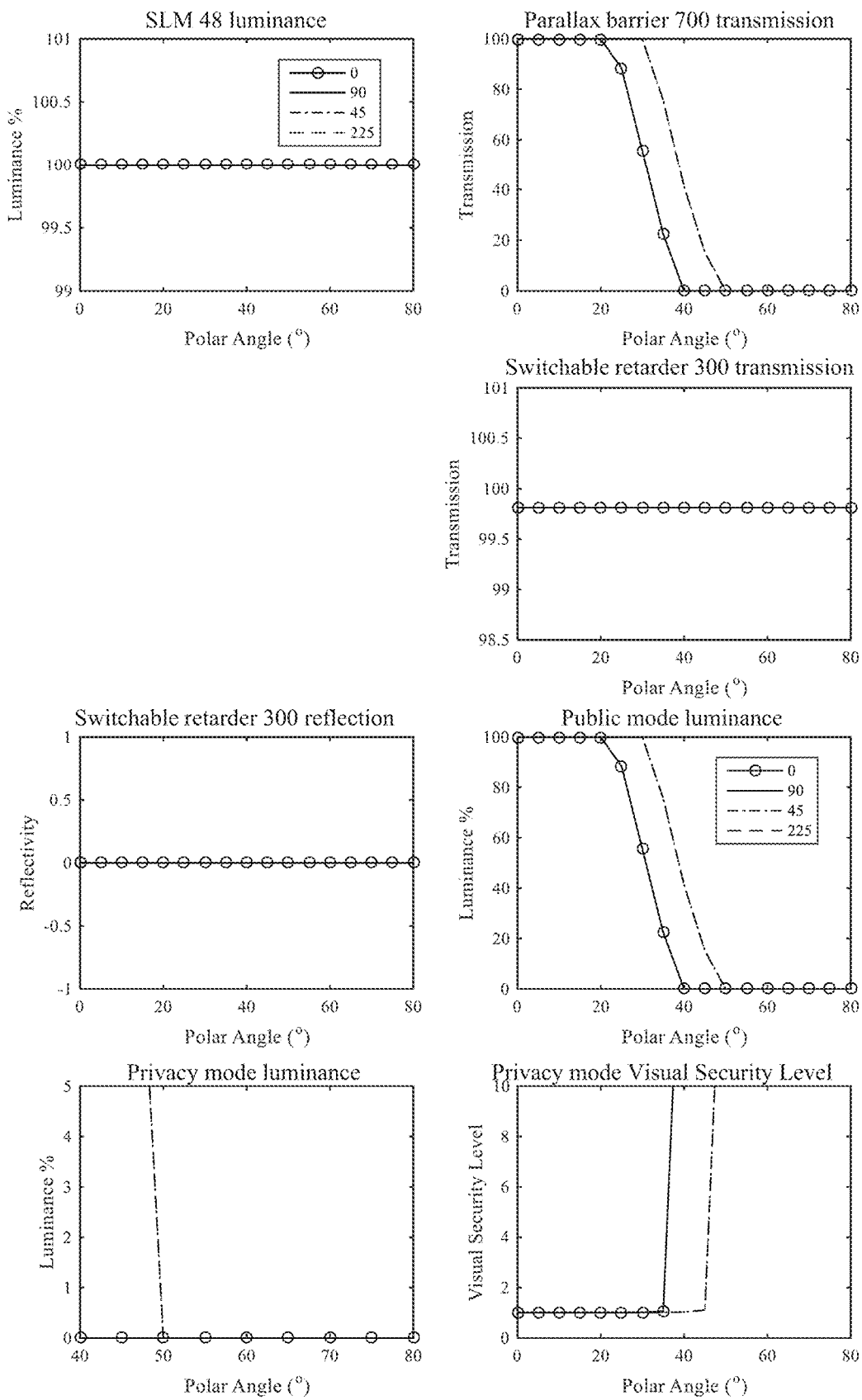
FIG. 21D is a linear profile plot array for the component contributions and output of the arrangements of FIG. 21A comprising linear profiles at azimuthal angles of 0, 90, 45 and 225 degrees.

FIG. 21C is a polar plot array for the component contributions and output of the arrangement of FIG. 17A for an illustrative arrangement in which the switchable retarder 300 and passive polarisation control retarder 380 are omitted and the parallax barrier 700 provides no transmission in the light absorbing regions 704; comprising polar plots for spatial light modulator 48 luminance, parallax barrier 700 transmission, switchable retarder 300 transmission, switchable retarder 300 reflection, public mode luminance, privacy mode luminance and visual security level; and FIG. 21D is a linear profile plot array for the component contributions and output of the arrangements of FIG. 21C comprising linear profiles at azimuthal angles of 0, 90, 45 and 225 degrees. The display 100 properties are described in the fifth row of TABLE 5. To achieve desirable visual security level in privacy mode, the luminance at high polar viewing angles is 0%, that is the absorbing regions 704 are highly absorbing.

However, there is no image visibility for polar viewing angles above about 45 degrees. Such a display does not provide a satisfactory public mode of operation. Transmission levels between 0% and 5% do not provide satisfactory trade-offs between privacy and public modes of operation.

Advantageously the present embodiments achieve high visual security level over a wide polar range in privacy mode and achieve high image visibility of a wide polar range in public mode. Further high head-on image visibility is achieved in both privacy and public modes of operation.

Further arrangements of polar control retarders will now be described.

Figure 22A:
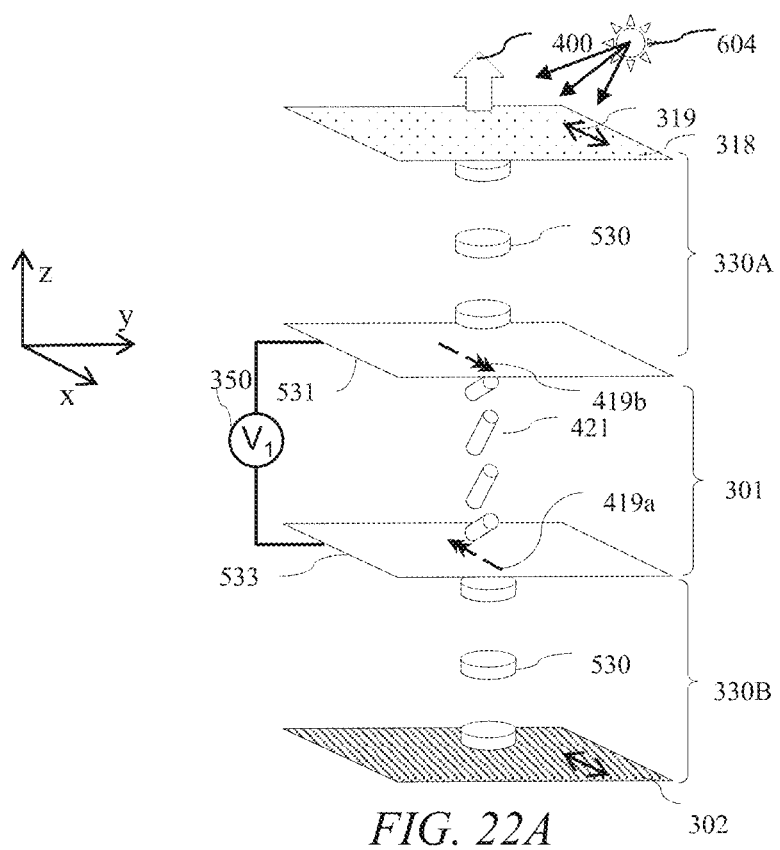
FIG. 22A is a diagram illustrating in perspective side view an arrangement of a switchable retarder in a privacy mode wherein the switchable retarder comprises a switchable LC layer with homogeneous alignment arranged between C-plate passive polar control retarders.
Figure 22B:
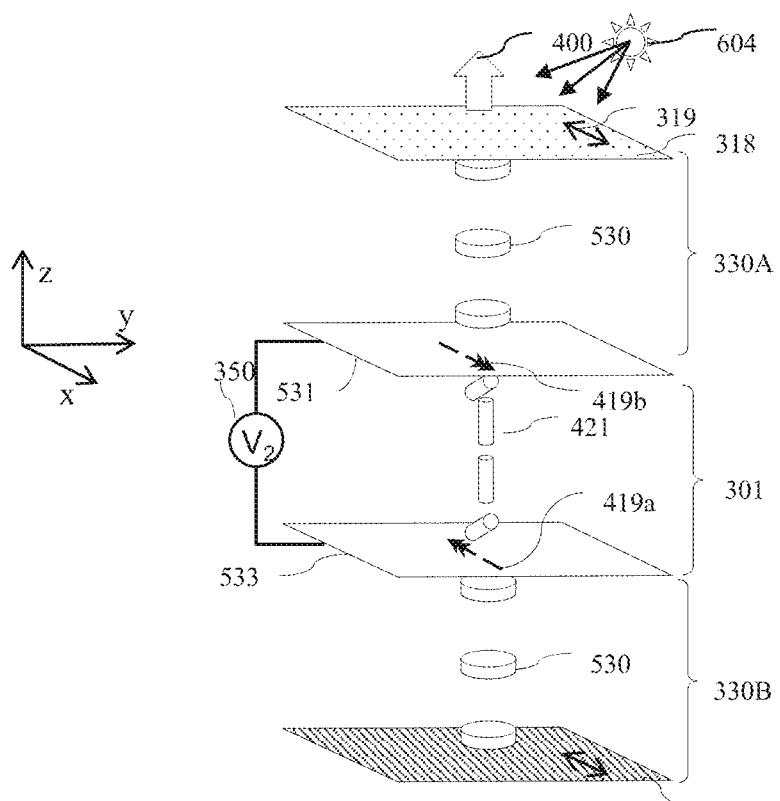
FIG. 22B is a diagram illustrating in perspective side view an arrangement of a switchable retarder in a public mode wherein the switchable retarder comprises a switchable LC layer with homogeneous alignment arranged between C-plate passive polar control retarders.

FIG. 22A is a diagram illustrating in perspective side view an arrangement of a switchable retarder in a privacy mode wherein the switchable retarder comprises a switchable LC layer with homogeneous alignment arranged between C-plate passive polar control retarders 330A, 330B; and FIG. 22B is a diagram illustrating in perspective side view an arrangement of a switchable retarder in a public mode wherein the switchable retarder comprises a switchable LC layer with homogeneous alignment arranged between C-plate passive polar control retarders 330A, 330B. Features of the arrangement of FIGS. 22A-B not discussed in further detail may be assumed to correspond to the features with equivalent reference numerals as discussed above, including any potential variations in the features.

The retarders 330A, 330B may comprise the substrates for the switchable liquid crystal layer 314. Advantageously thickness may be reduced. Further, flexible substrates may be provided. The display 100 may be provided in active flexible embodiments (bendable multiple times by the user) or in passive flexible embodiments (bendable during manufacturing) to achieve free-form display profiles.

It would be desirable to provide displays that operate in landscape and portrait orientations for both privacy and public modes of operation.

Figure 23A:
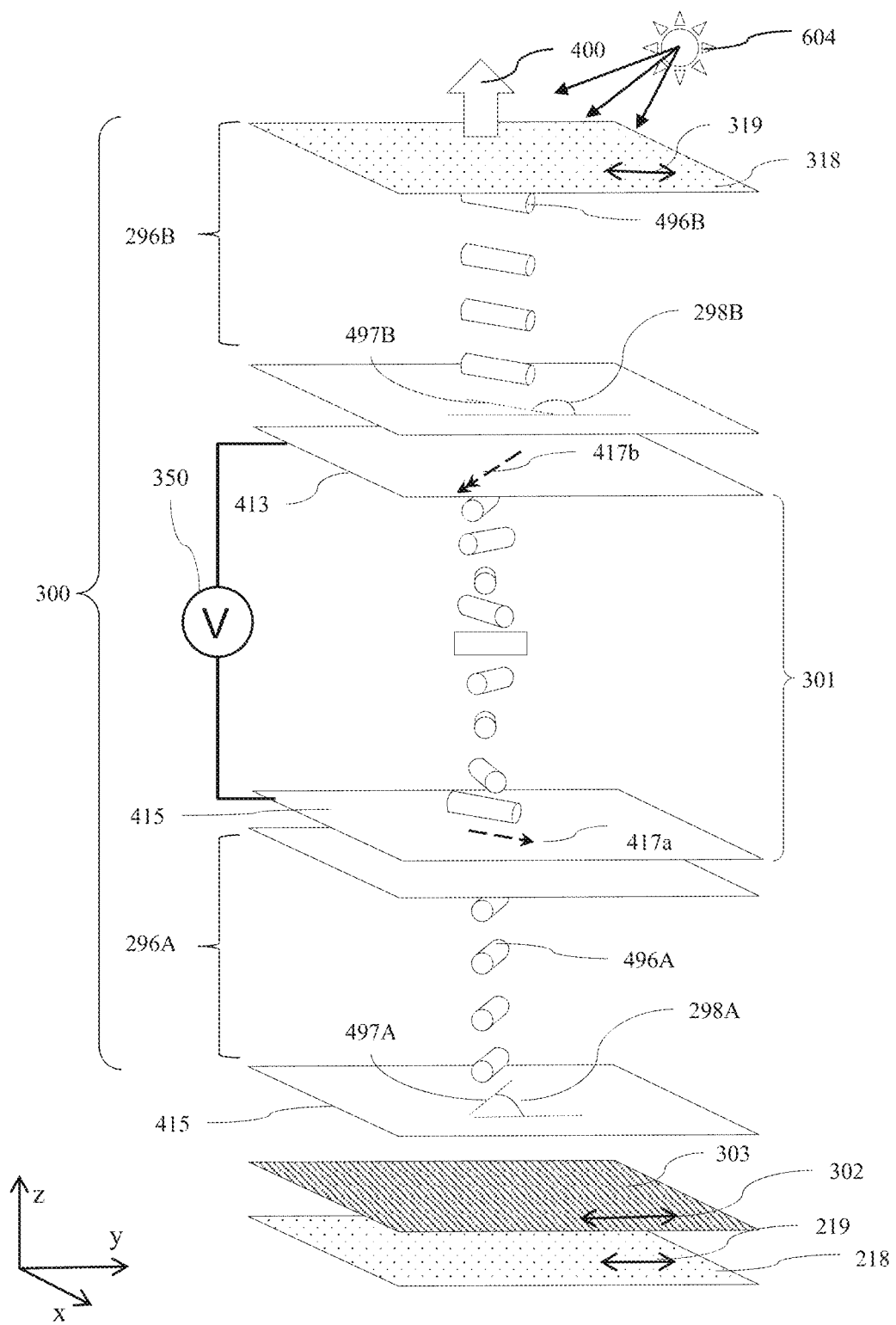
FIG. 23A is a schematic diagram illustrating in perspective side view an arrangement of retarder layers arranged between parallel polarisers and comprising a 270 degree supertwisted switchable liquid crystal retarder arranged between quarter-wave plates.

FIG. 23A is a schematic diagram illustrating in perspective side view an arrangement of retarder layers arranged between parallel polarisers and comprising a 270 degree supertwisted switchable liquid crystal retarder 301 arranged between quarter-wave plates. Features of the arrangements of FIGS. 23A-C not discussed in further detail may be assumed to correspond to the features with equivalent reference numerals as discussed above, including any potential variations in the features. Further embodiments of polar control retarders that achieve symmetric polar profiles are described in U.S. Patent Publ. No. 2020-0159055, which is herein incorporated by reference in its entirety.

First and second quarter-wave plates 296A, 296B are arranged between the additional polariser 318 and the output polariser 218. The first quarter-wave plate 296A is arranged on the input side of the second quarter-wave plate 296B and is arranged to convert a linearly polarised polarisation state passed by the output polariser 218 on the input side thereof into a circularly polarised polarisation state. The second quarter-wave plate 296B on the output side being arranged to convert a circularly polarised polarisation state that is incident thereon into a linearly polarised polarisation state that is passed by the additional polariser 318 on the output side thereof. At least one retarder 301 is arranged between the pair of quarter-wave plates 296A, 296B.

The at least one polar control retarder 300 comprises a switchable liquid crystal retarder 301 comprising a layer of liquid crystal material and electrodes arranged to apply a voltage for switching the layer of liquid crystal material. The layer of liquid crystal material has a twist of 360 degrees and a retardance for light of a wavelength of 550 nm in a range from 1100 nm to 1400 nm and most preferably in a range from 1150 nm to 1300 nm.

The simulated output of an illustrative embodiment of FIG. 17A comprising the switchable polar control retarder of FIG. 23A will now be described.

Figure 23B:
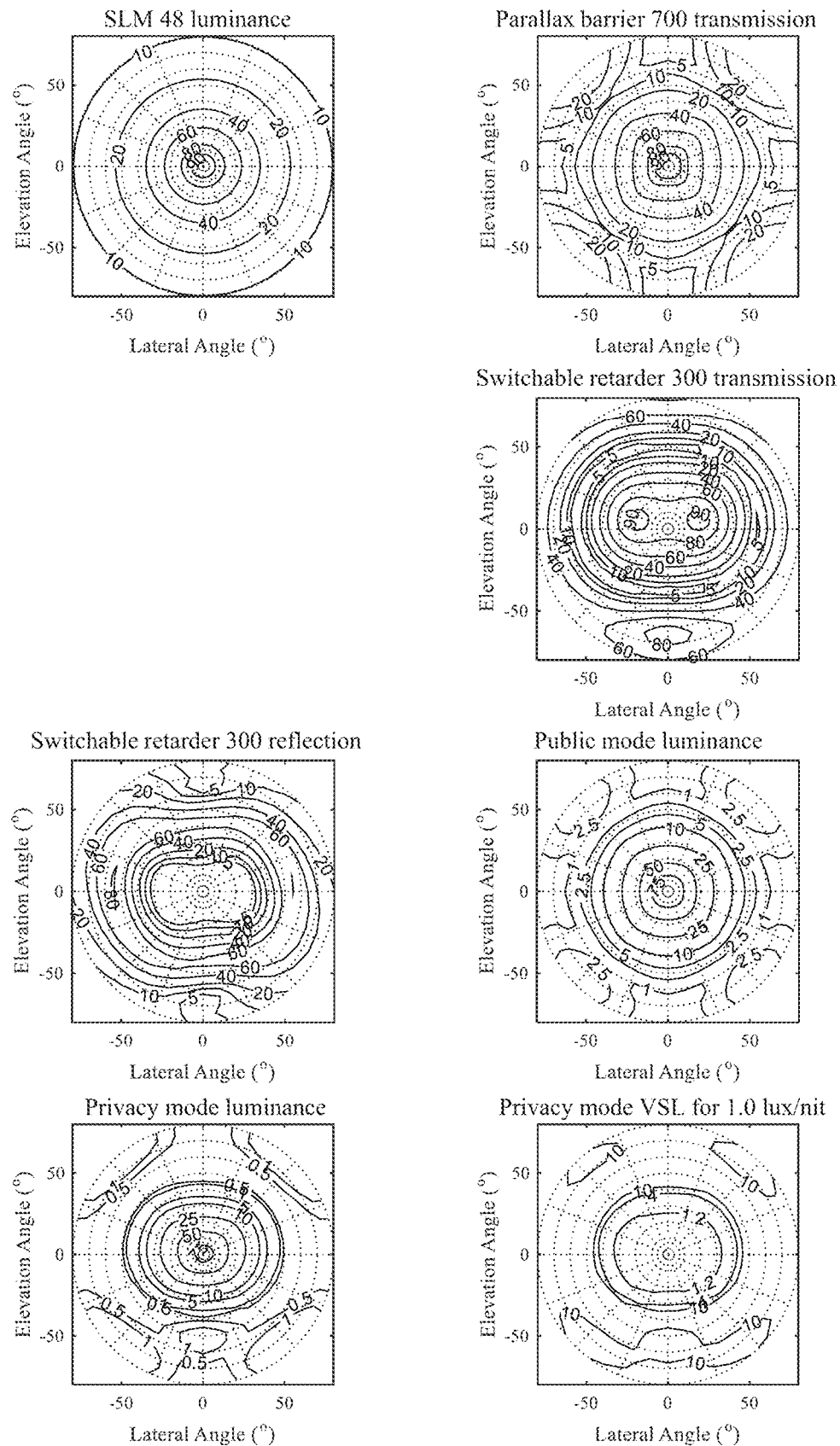
FIG. 23B is a polar plot array for the component contributions and output of the arrangement of FIG. 23A comprising polar plots for spatial light modulator luminance, parallax barrier transmission, switchable retarder transmission, switchable retarder reflection, public mode luminance, privacy mode luminance and visual security level.
Figure 23C:
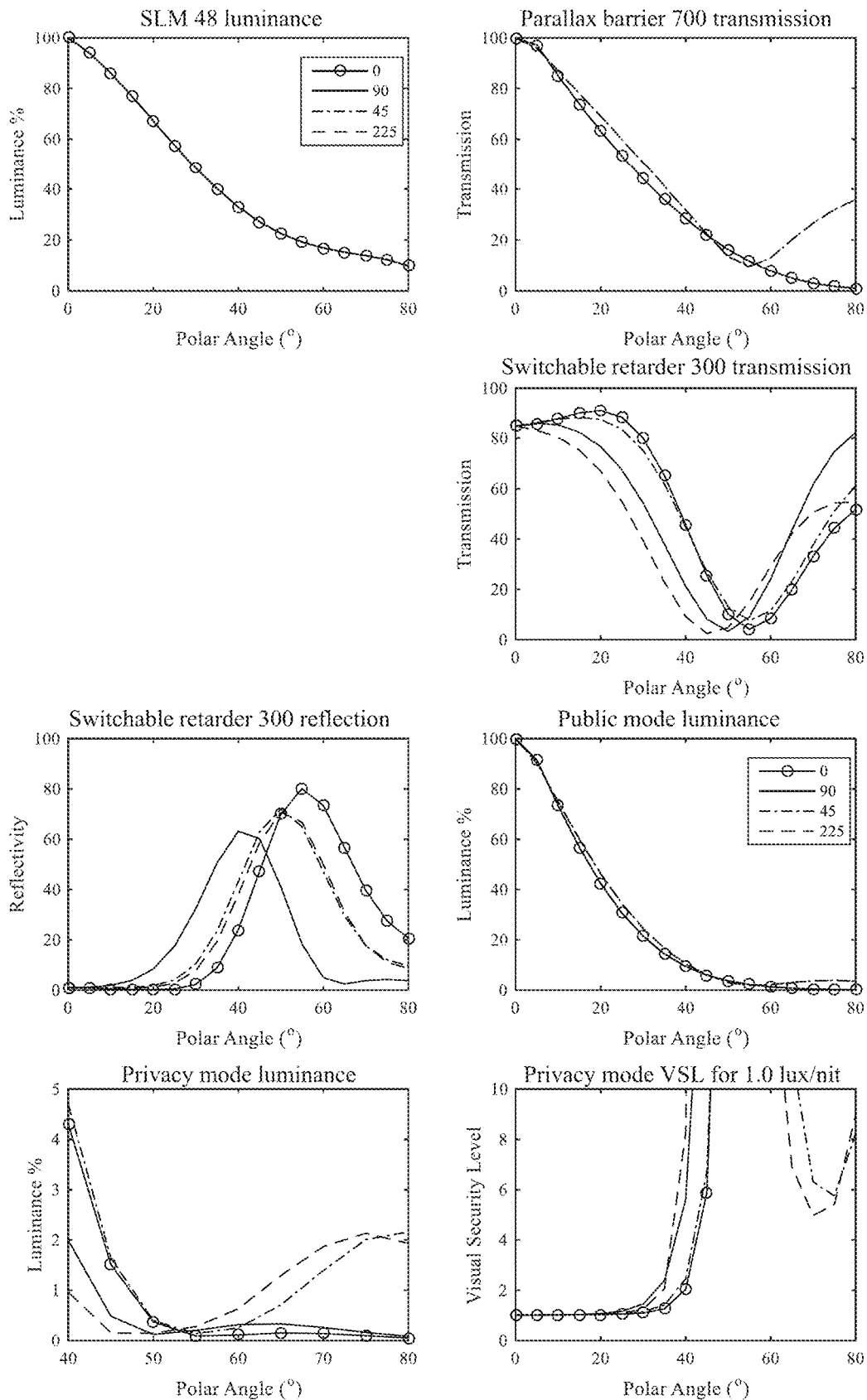
FIG. 23C is a linear profile plot array for the component contributions and output of the arrangements of FIG. 23B comprising linear profiles at azimuthal angles of 0, 90, 45 and 225 degrees.

FIG. 23B is a polar plot array for the component contributions and output of the arrangement of FIG. 17A omitting the passive polar control retarder 380 comprising polar plots for spatial light modulator 48 luminance, parallax barrier 700 transmission, switchable retarder 300 transmission, normalised switchable retarder 300 reflection, public mode luminance, privacy mode luminance and visual security level for a lux/nit ratio of 1.0; and FIG. 23C is a linear profile plot array for the component contributions and output of the arrangements of FIG. 23A.

An illustrative liquid crystal retarder 300 is described in TABLE 6. An illustrative parallax barrier 700 and OLED pixel 220, 222, 224 for FIGS. 23B-C is described in TABLE 7 with reference to the pitch, p of 50 μm in the direction in which the pixels are closest. The pixels 220, 222, 224 are provided in the square packed arrangement of FIG. 4 and square parallax barrier 700 apertures 702 are provided. The direction in which the pixels are closest is for an azimuth of 0 degrees.

TABLE 6

| LC alignment layer 314 & pretilt directions | LC twist | LC retardance (desirable range) | Dielectric anisotropy Δε | Drive voltage | | Quarter-wave 296A, 296B retardance | Polariser spectral profile |
| --- | --- | --- | --- | --- | --- | --- | --- |
| Homogeneous 45°/135° | 360° | 1220 nm (1100 nm~1400 nm) | 10 | Public mode Privacy mode | 0 V 10 V | 135 nm | Leaking type profile 872, 876 |

TABLE 7

| FIGS. | Pixel pitch, p | Pixel width, w | Aperture, a | Absorption region 704 transmission | Thickness, d | Passive retarder 330 | Compensated LC retarder | Lux/nit ratio |
| --- | --- | --- | --- | --- | --- | --- | --- | --- |
| 23B-C | 50 μm | 25 μm | 27.5 μm | 0% | 38.5 μm | None | See TABLE 6 | 1.0 |

Advantageously a rotationally symmetric privacy mode may be achieved in comparison to the laterally symmetric profiles achieved by the embodiments using polar control retarders 300 such as those of FIG. 9 for example.

Figure 24A:
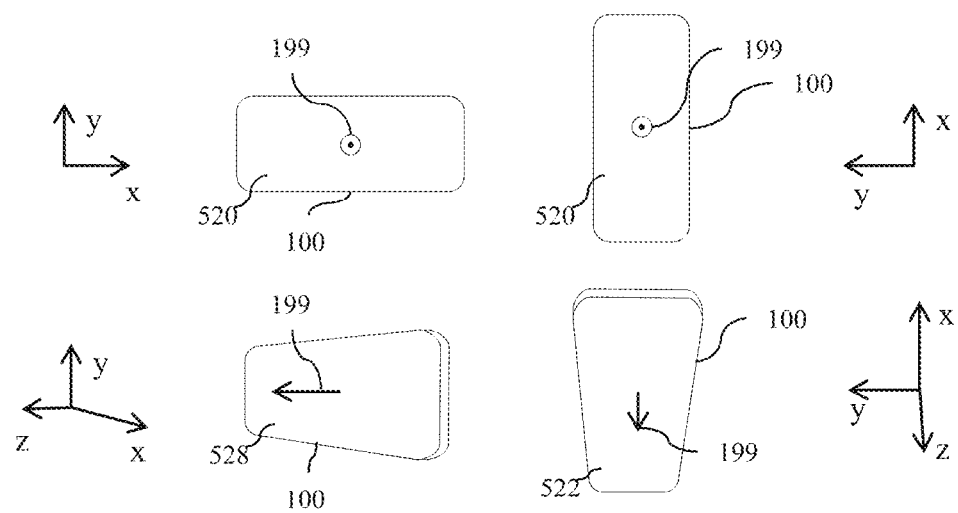
FIG. 24A is a schematic diagram illustrating in perspective views the appearance of luminance of a mobile device in public mode comprising the display of FIG. 1A with polar control retarder of FIG. 23A with appearance shown in order from top left clockwise: head-on landscape, head-on portrait, look-down portrait and look-from-right landscape.

FIG. 24A is a schematic diagram illustrating in perspective views the appearance of luminance of a mobile device in public mode comprising the display device 100 of FIG. 1A with the switchable polar control retarder 300 of FIG. 23 with appearance shown in order from top left clockwise: head-on landscape, head-on portrait, look-down portrait and look-from-right landscape.

The viewing direction along axis 199 of the display device 100 is perpendicular to the viewing surface of the display device 100. In all the orientations shown, in public mode the image being emitted by the display device 100 is visible to an observer as represented by the white colouring representing the image emitted by the display device 100. The image is visible in all of an on-axis landscape and portrait orientation 520, a look-down portrait orientation 522 and a look-from-right landscape orientation 528.

Figure 24B:
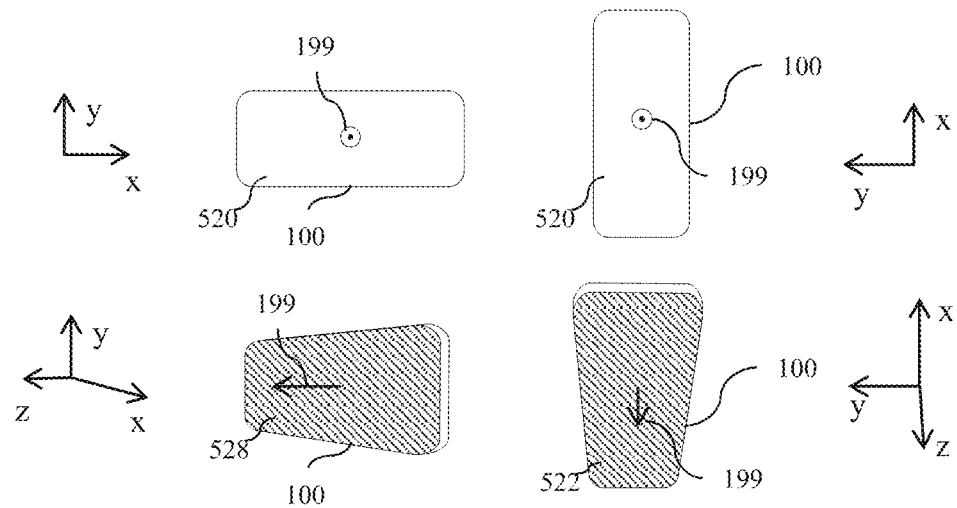
FIG. 24B is a schematic diagram illustrating in perspective views the appearance of luminance of a mobile device in privacy mode comprising the display of FIG. 1A with polar control retarder of FIG. 23A with appearance shown in order from top left clockwise: head-on landscape, head-on portrait, look-down portrait and look-from-right landscape.

FIG. 24B is a schematic diagram illustrating in perspective views the appearance of luminance of a mobile device in privacy mode comprising the display device 100 of FIG. 1A with the switchable polar control retarder 300 of FIG. 23 with appearance shown in order from top left clockwise: head-on landscape, head-on portrait, look-down portrait and look-from-right landscape.

In the privacy mode, the view to an observer remains unchanged in the on-axis landscape and portrait orientation 520 and the image emitted by the display device 100 is visible to an observer. However, in the look-down portrait orientation 522 and the look-from-right landscape orientation 528 the image emitted by the display device is no longer visible. A snooper observing from a wide-angle instead observes a mirror-like surface provided by the reflective polariser 302 as described above.

Figure 24C:
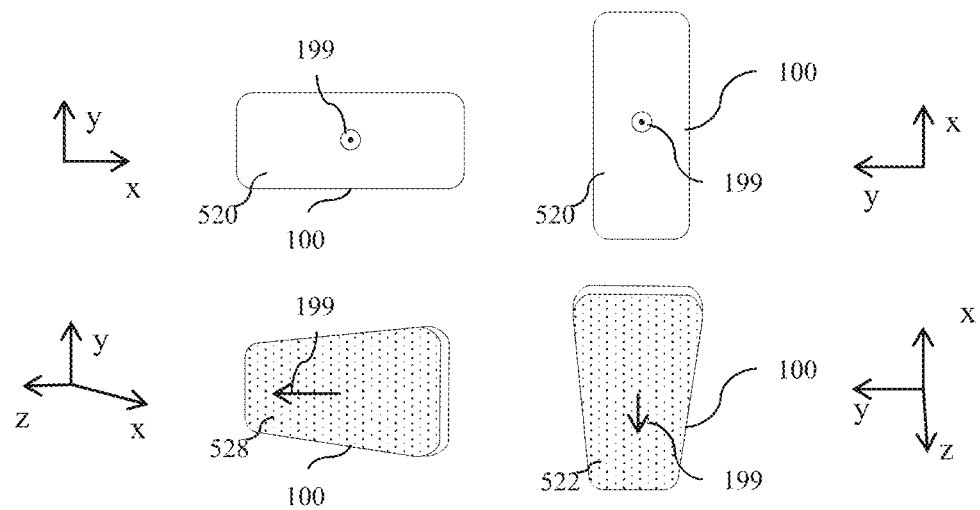
FIG. 24C is a schematic diagram illustrating in perspective views the appearance of reflectivity of a mobile device in privacy mode comprising the display of FIG. 1A with polar control retarder of FIG. 23A with appearance shown in order from top left clockwise: head-on landscape, head-on portrait, look-down portrait and look-from-right landscape.

FIG. 24C is a schematic diagram illustrating in perspective views the appearance of reflectivity of a mobile device in privacy mode comprising the display device 100 of FIG. 1A with the switchable polar control retarder 300 of FIG. 23 with appearance shown in order from top left clockwise: head-on landscape, head-on portrait, look-down portrait and look-from-right landscape.

In the privacy mode, the view to an observer remains unchanged in the on-axis landscape and portrait orientation 520 as the reflectivity from the additional polariser 318 is minimal. However, in the look-down portrait orientation 522 and the look-from-right landscape orientation 528, reflections from the surface of the additional polariser 318 may result in frontal reflections as described above, desirably increasing visual security level, VSL.

Figure 25A:
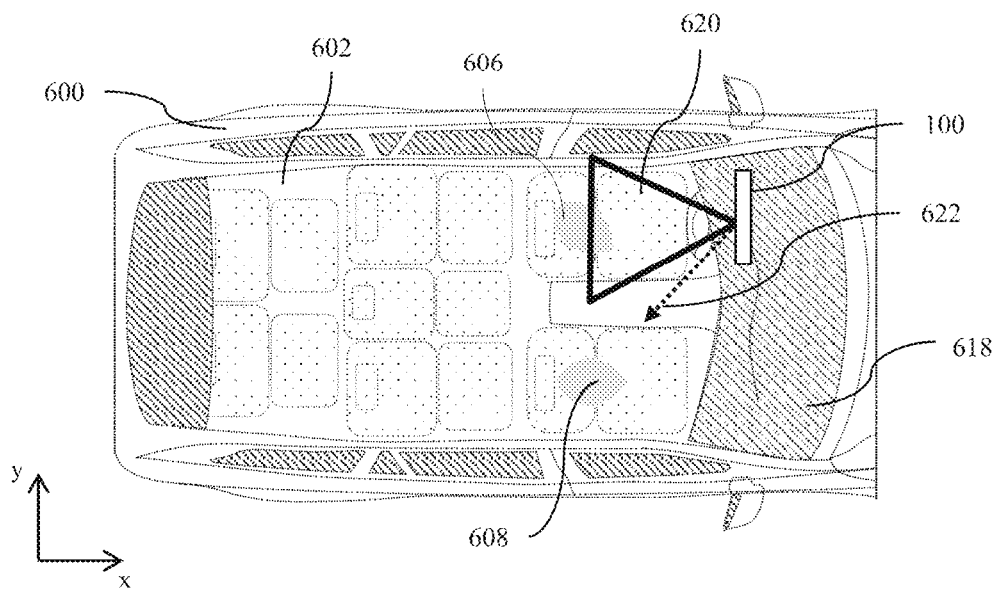
FIG. 25A is a schematic diagram illustrating in top view an automotive vehicle with a switchable directional display arranged within the vehicle cabin in a night mode of operation.

FIG. 25A is a schematic diagram illustrating in top view an automotive vehicle 600 with a switchable directional display 100 arranged within the vehicle cabin 602 in a night mode of operation.

The night mode of the switchable directional display 100 may correspond to the privacy mode discussed above. A light cone 620 (for example representing the cone of light within which the luminance is greater than 50% of the peak luminance emitted by the switchable directional display 100) may indicate the range of angles in which the image emitted by the switchable directional display 100 is discernible. As shown in FIG. 25A, when the switchable directional display 100 is in night mode, the driver 604 falls within the area defined by the light cone 620 in a horizontal direction and the image emitted by the switchable directional display 100 is therefore discernible to the driver 604. In contrast to this, high-angle light rays 622 falling outside the light cone 620 in a horizontal direction have a reduced luminance and the image emitted by the switchable directional display 100 therefore may not be discernible to a passenger 608 in the vehicle 600. This may be advantageous if the passenger is attempting to sleep or relax during the night.

In such an arrangement, the reflective polariser 302 may be omitted if some image visibility to other users is acceptable. Advantageously display efficiency may be increased and visibility of stray light reduced.

Figure 25B:
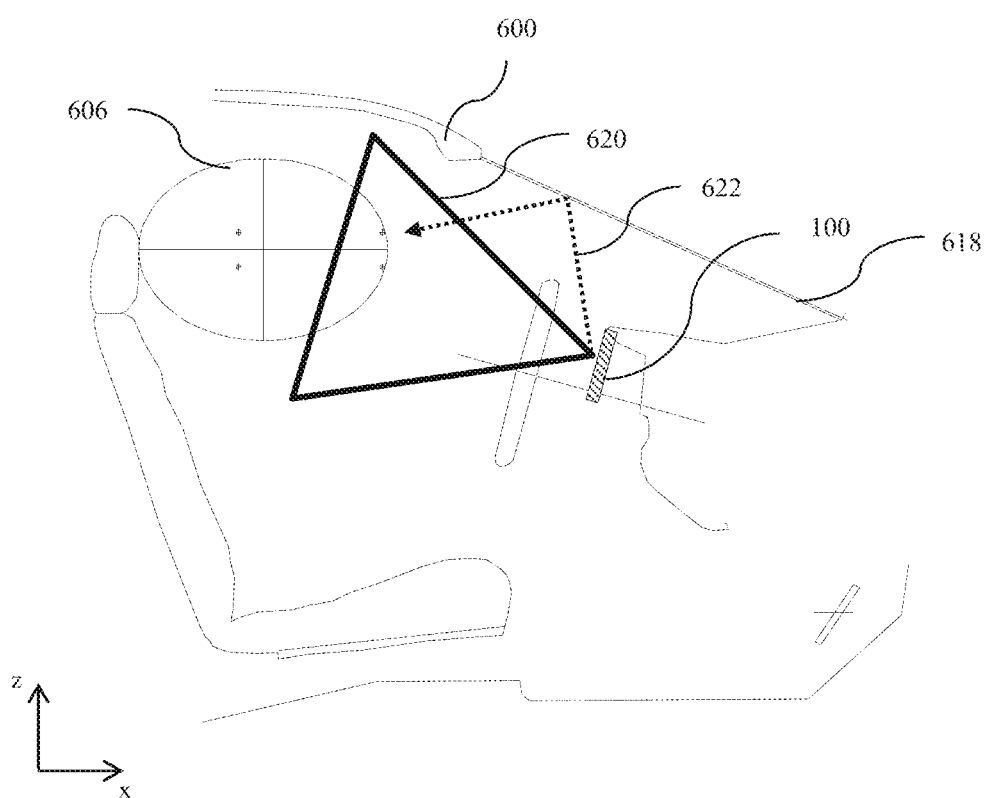
FIG. 25B is a schematic diagram illustrating in side view an automotive vehicle with a switchable directional display arranged within the vehicle cabin in a night mode of operation.

FIG. 25B is a schematic diagram illustrating in side view an automotive vehicle 600 with a switchable directional display 100 arranged within the vehicle cabin 602 in a night mode of operation.

In night mode, the volume 606 occupied by the face of the driver falls within the area defined by the light cone 620 in a vertical direction and the image emitted by the switchable directional display 100 is therefore discernible to the driver in volume 606. However, high-angle light rays 622 falling outside the light cone 620 in a vertical direction may have a reduced luminance in night mode operation. The luminance of high-angle light rays 622 that may reflect off of the windscreen 618 of the automotive vehicle 600 may be reduced. This advantageously may reduce the reflections of the display 100 perceived on the windscreen 618 by the driver in volume 606.

It would be desirable to provide increased uniformity for rotation of the display 100 about a horizontal axis and to relax alignment tolerances between the parallax barrier 700 and pixel layer 214.

Figure 26:
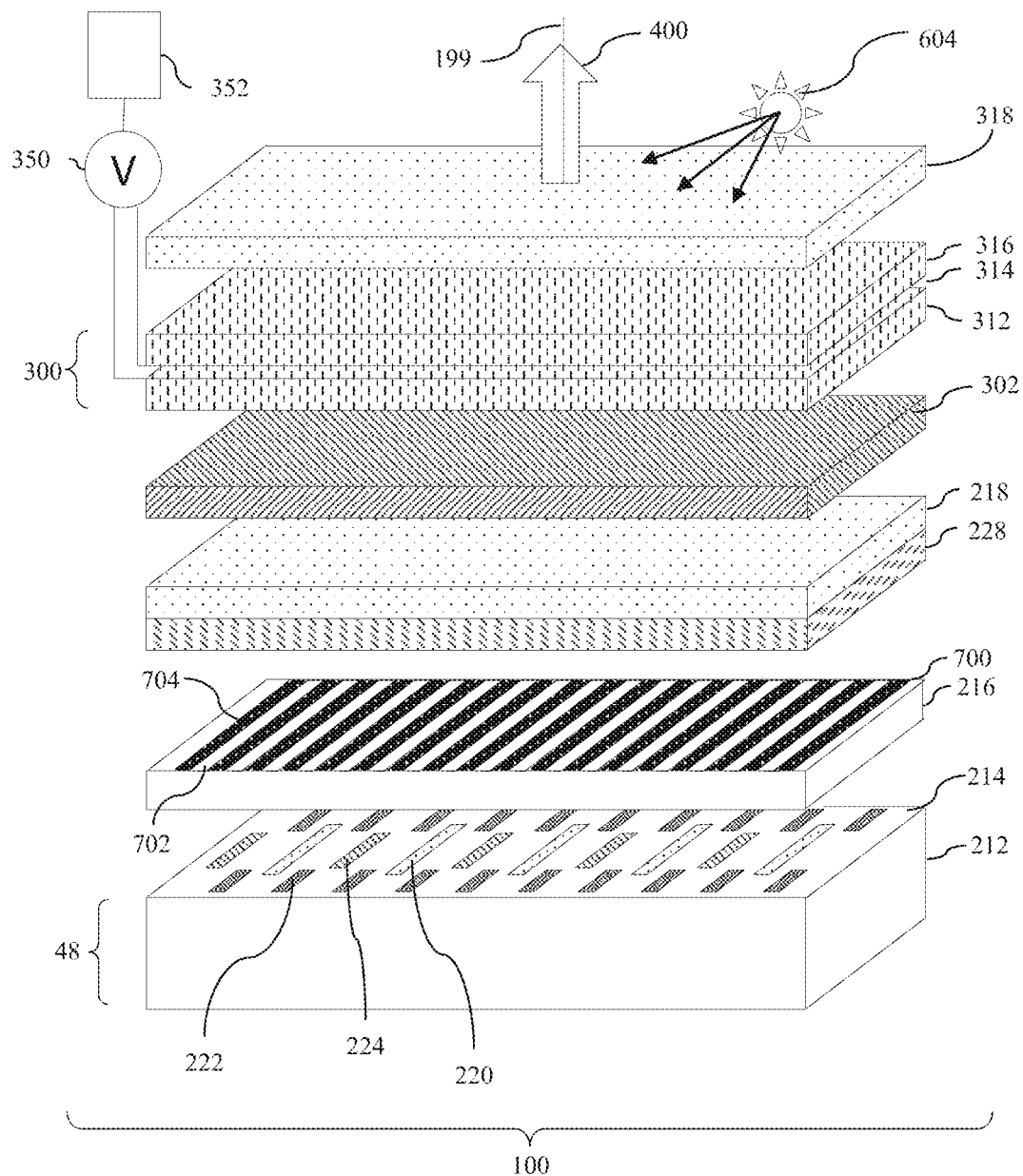
FIG. 26 is a schematic diagram illustrating in side perspective view a switchable privacy display for use in ambient illumination comprising an OLED emissive spatial light modulator, one dimensional parallax barrier, output polariser and reflection control quarter-wave retarder, a reflective polariser, a switchable polar control retarder and an additional polariser arranged on the output side of the spatial light modulator.
Figure 27:
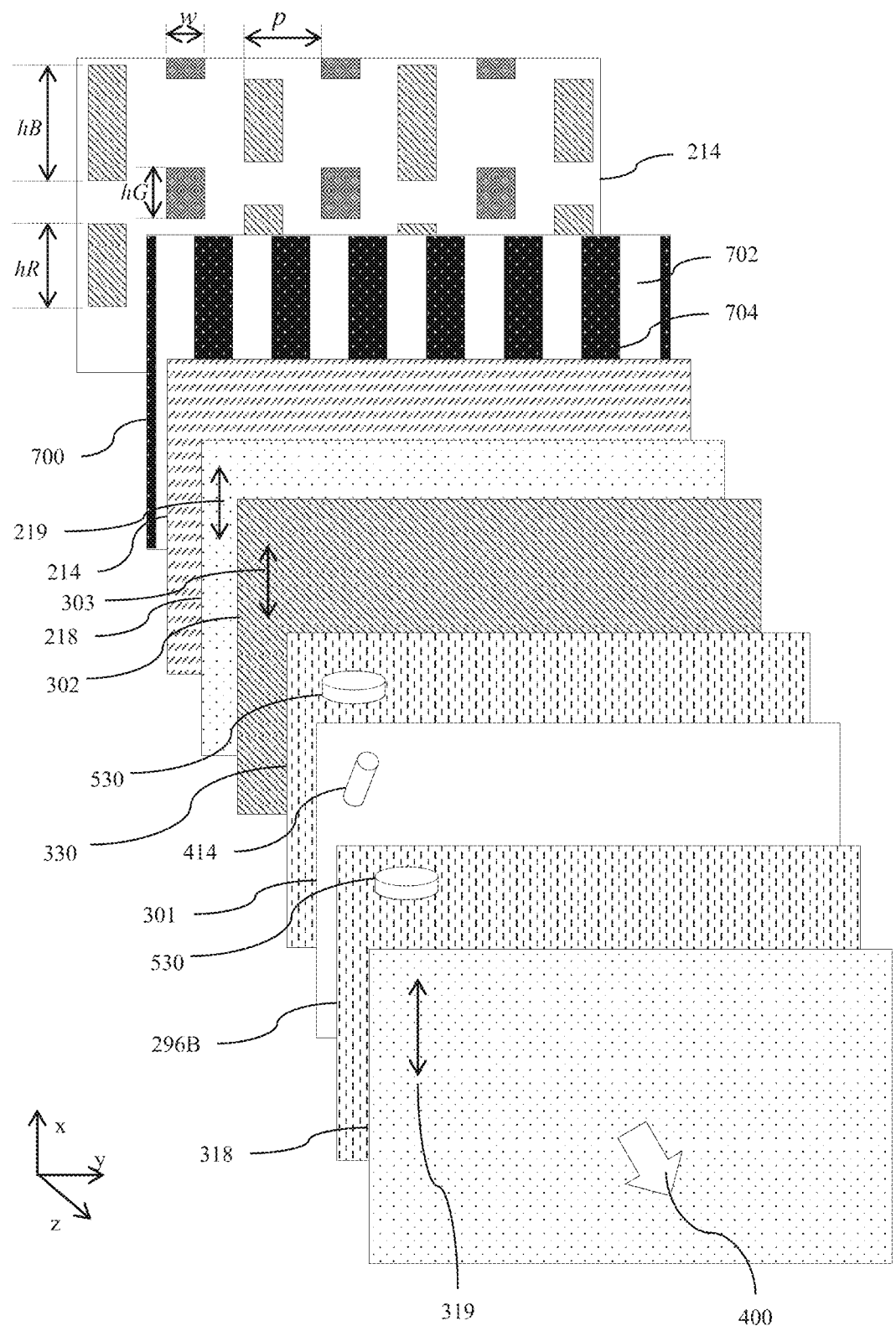
FIG. 27 is a schematic diagram illustrating in front view alignment of optical layers in the optical stack of FIG. 26.

FIG. 26 is a schematic diagram illustrating in side perspective view a switchable privacy display 100 for use in ambient illumination 604 comprising an OLED emissive spatial light modulator 48, one dimensional parallax barrier 700, output polariser 218 and reflection control quarter-wave retarder 228, a reflective polariser 302, a switchable polar control retarder 300 and an additional polariser 318 arranged on the output side of the spatial light modulator 48; and FIG. 27 is a schematic diagram illustrating in front view alignment of optical layers in the optical stack of FIG. 26. Features of the arrangement of FIGS. 26-27 not discussed in further detail may be assumed to correspond to the features with equivalent reference numerals as discussed above, including any potential variations in the features.

The polar control retarder 300 is as illustrated in FIGS. 22A-B.

The parallax barrier 700 forms a one dimensional array of apertures 702, the pixels 220, 222, 224 being arranged in columns, each column of pixels 220, 222, 224 being aligned with a respective aperture.

Pixel 220, 222, 224 has a light emission region that is extended in the direction in which the apertures 702 are extended; the width of the red, green and blue light emission regions are the same for each of the pixels 220, 222, 224; and the height of the light emission regions are different for red, green and blue light emitting pixels 220, 222, 224.

Advantageously a switchable privacy display may be provided with high image visibility for off-axis users in a lateral direction and high visual security for off-axis snoopers in a lateral direction in public and privacy modes respectively. Viewing freedom for rotation about a horizontal axis may be increased. Advantageously the head-on user location may be conveniently adjusted in the elevation direction with high luminance uniformity.

Further the alignment of the parallax barrier 700 to the pixel layer may be controlled in lateral and orientation axes only in comparison to the arrangement of FIG. 1A wherein the alignment is controlled in lateral, vertical and orientation axes. Advantageously yield may be increased and cost reduced.

It would be desirable to increase the efficiency of the display 100 while providing low reflectivity of light from the reflective pixel layer 214.

Figure 28:
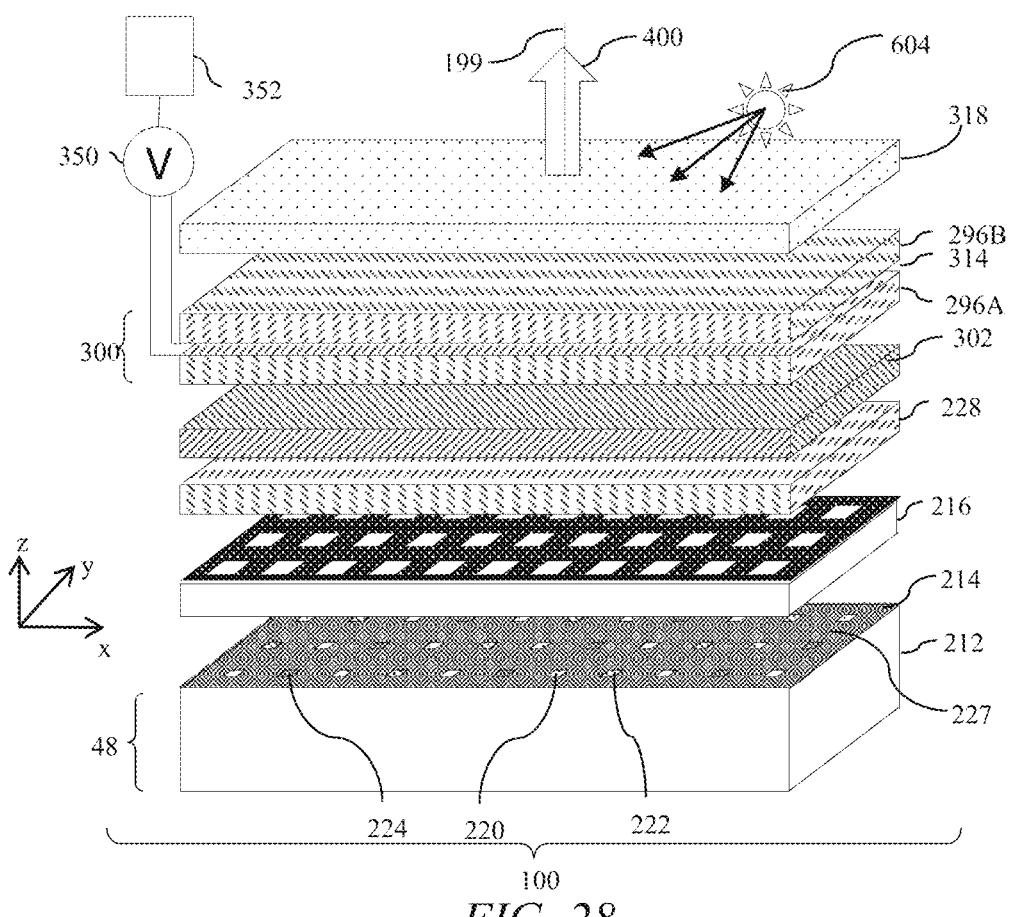
FIG. 28 is a schematic diagram illustrating in side perspective view a switchable privacy display for use in ambient illumination comprising a micro-LED emissive spatial light modulator, parallax barrier, and output polariser that is a reflective polariser, reflection control quarter-wave retarder, a switchable polar control retarder and an additional polariser arranged on the output side of the spatial light modulator.
Figure 29:
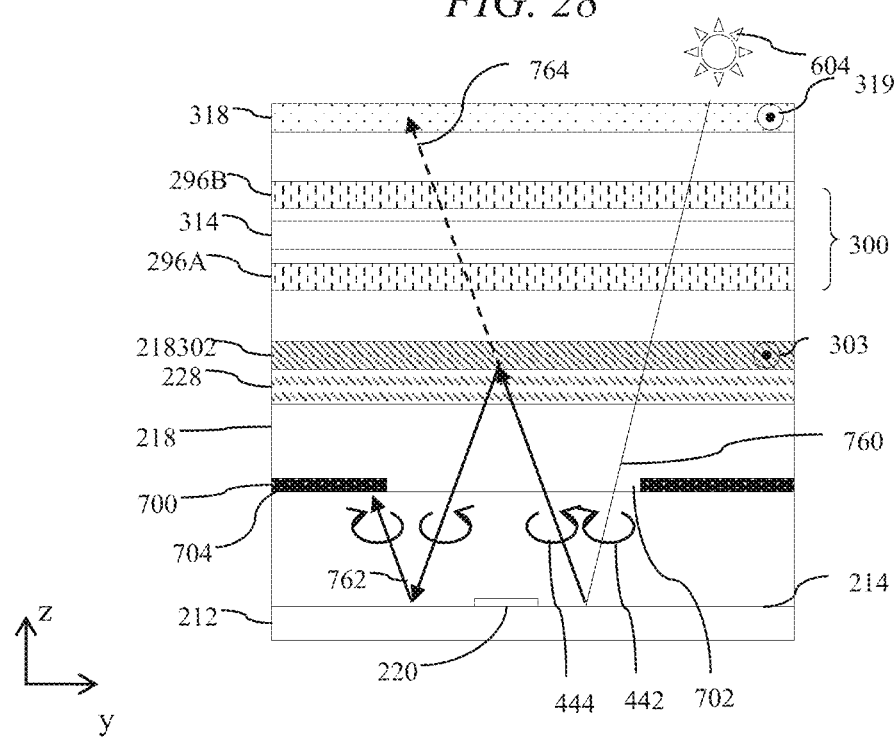
FIG. 29 is a schematic diagram illustrating in side view reflection of ambient light in the display of FIG. 28.

FIG. 28 is a schematic diagram illustrating in side perspective view a switchable privacy display 100 for use in ambient illumination 604 comprising a micro-LED emissive spatial light modulator 48, parallax barrier 700, and output polariser 218 that is a reflective polariser 302, reflection control quarter-wave retarder 228, a switchable polar control retarder 300 and an additional polariser 318 arranged on the output side of the spatial light modulator 48; and FIG. 29 is a schematic diagram illustrating in side view reflection of ambient light in the display 100 of FIG. 28. Features of the arrangement of FIGS. 28-29 not discussed in further detail may be assumed to correspond to the features with equivalent reference numerals as discussed above, including any potential variations in the features.

In comparison to the arrangement of FIGS. 1A and 17A, a reflective output polariser 218302 is provided. The absorptive polariser 218 is omitted so that the transmission of the display is advantageously increased, achieving increased luminance and reduced power consumption for a desirable image luminance.

In comparison to the embodiment of FIG. 14, light ray 760 from ambient light source 604 has a polarisation state that is substantially reflected from the reflective output polariser 218302 to provide ray 762, which is absorbed by absorptive regions 704 of the parallax barrier 700. Light rays 764 that are transmitted by the reflective polariser 218302 are absorbed by polariser 318. Advantageously reflection of ambient light rays 760 is reduced.

It would be desirable to provide a low reflectivity display with high efficiency.

Figure 30:
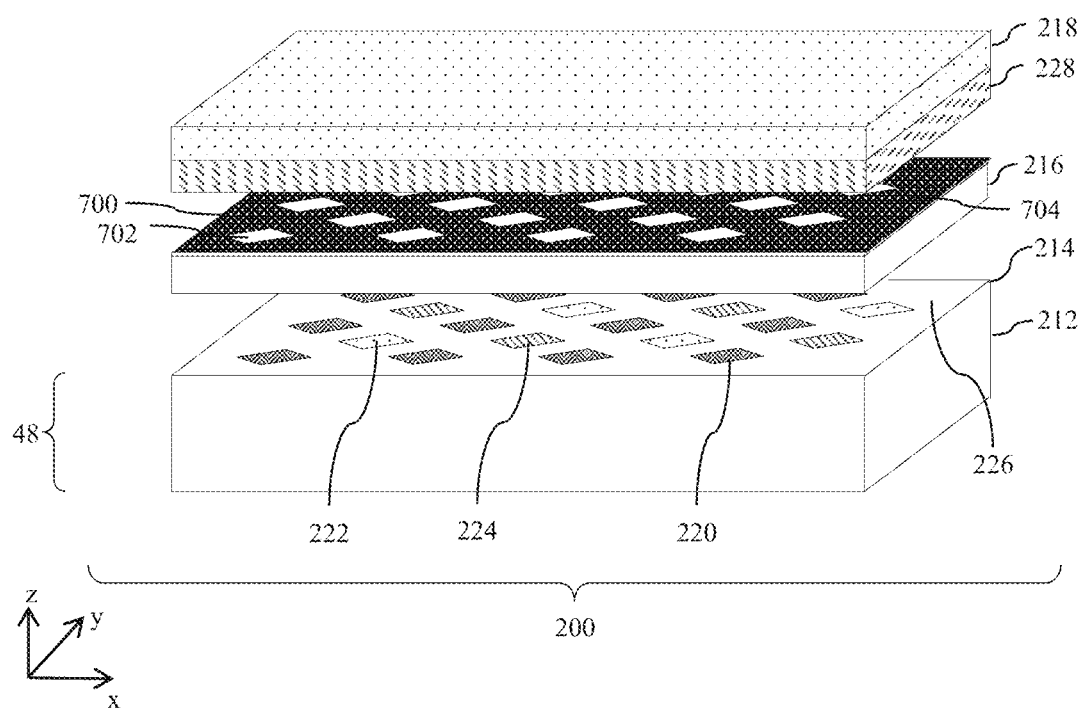
FIG. 30 is a schematic diagram illustrating in side perspective view a low reflectivity display for use in ambient illumination comprising an OLED emissive spatial light modulator, two dimensional parallax barrier, leaking output polariser and reflection control quarter-wave retarder arranged on the output side of the spatial light modulator.
Figure 31:
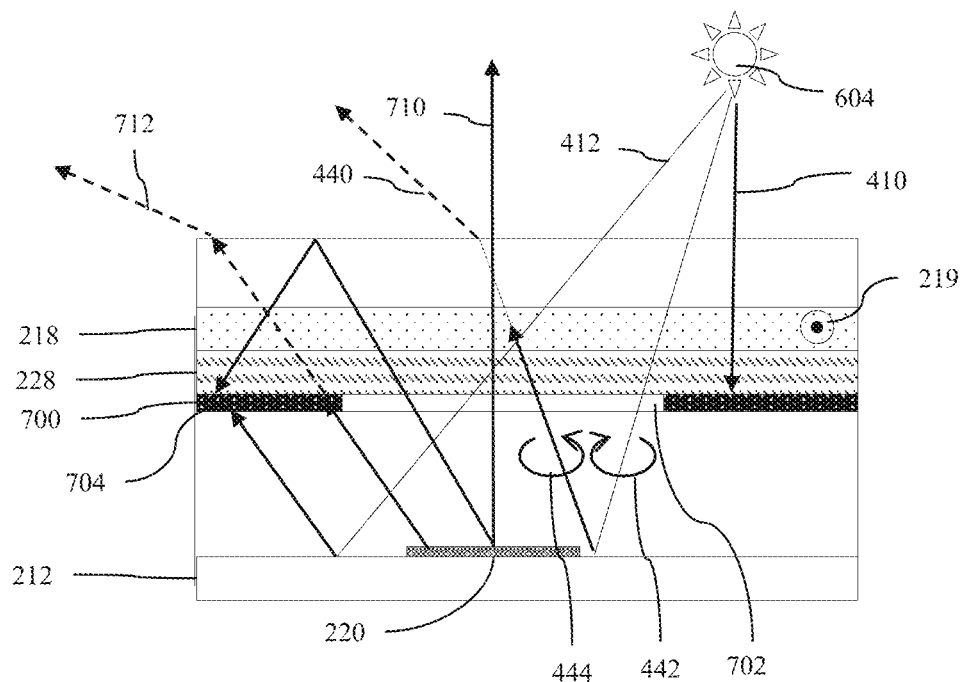
FIG. 31 is a schematic diagram illustrating in side view reflection of ambient light in the display of FIG. 30.

FIG. 30 is a schematic diagram illustrating in side perspective view a low reflectivity display 200 for use in ambient illumination 604 comprising an OLED emissive spatial light modulator 48, two dimensional parallax barrier 700, leaking output polariser 218 and reflection control quarter-wave retarder 228 arranged on the output side of the spatial light modulator 48; and FIG. 31 is a schematic diagram illustrating in side view reflection of ambient light in the display 200 of FIG. 30. Features of the arrangement of FIGS. 30-31 not discussed in further detail may be assumed to correspond to the features with equivalent reference numerals as discussed above, including any potential variations in the features.

A reflectivity control display 200 device for use in ambient illumination comprises the display 200 wherein the parallax barrier 700 absorbs at least some of the ambient illumination 604.

In comparison to the arrangement of FIG. 1A, the display 200 is not provided as a privacy display 100. The output may be provided for example as illustrated in FIGS. 21A-B and in the illustrative embodiment of the fourth row of TABLE 5 such that the aperture ratio of the apertures 702 is 25% and the transmission of the absorbing regions 704 of the parallax barrier 700 is 5%. The polariser 218 comprises a leaking polariser such as illustrated in FIG. 15. Advantageously output efficiency in the head-on direction is increased in comparison to arrangements with a high extinction type polariser.

It would be desirable to provide a touch sensor for a low reflectivity display 200.

Figure 32:
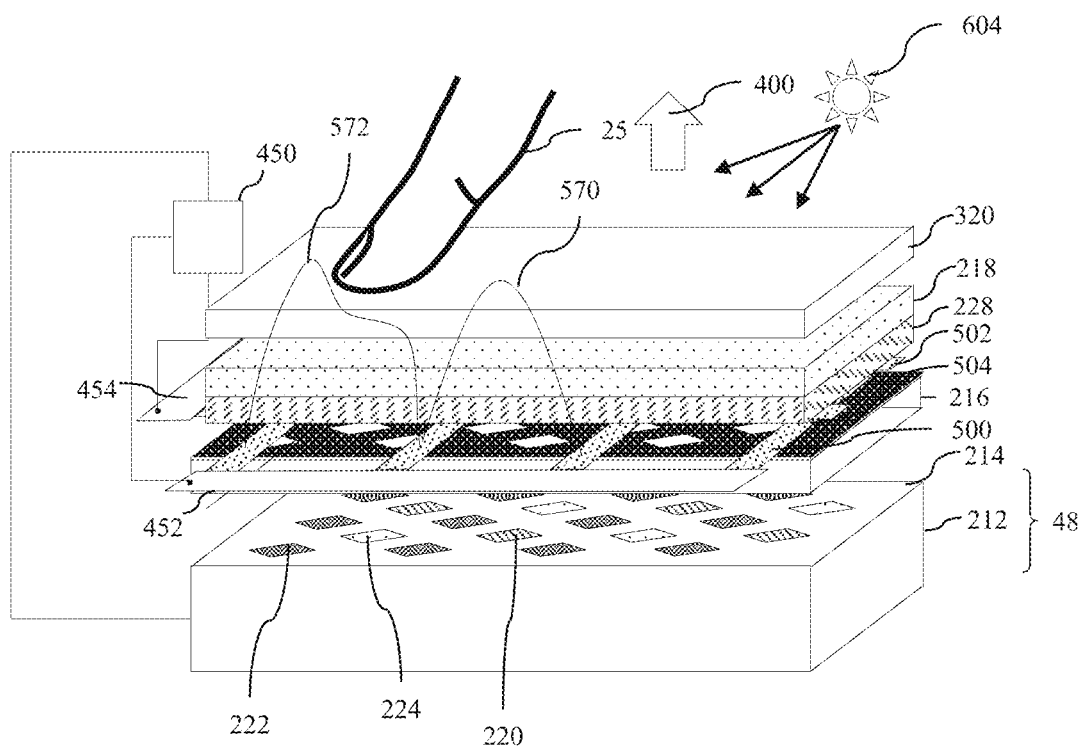
FIG. 32 is a schematic diagram illustrating in side perspective view a touch screen low reflectivity display for use in ambient illumination comprising an OLED emissive spatial light modulator, two dimensional parallax barrier comprising touch sensor electrode layers, leaking output polariser and reflection control quarter-wave retarder arranged on the output side of the spatial light modulator.
Figure 33:
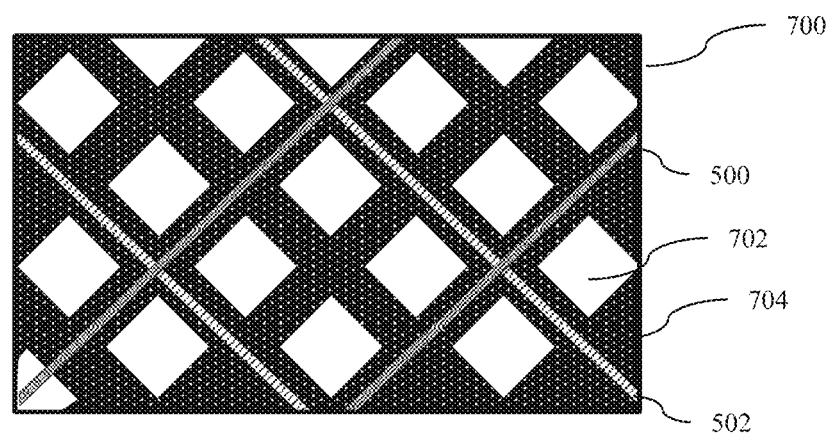
FIG. 33 is a schematic diagram illustrating in front view reflection of ambient light in the display of FIG. 32.
Figure 34:
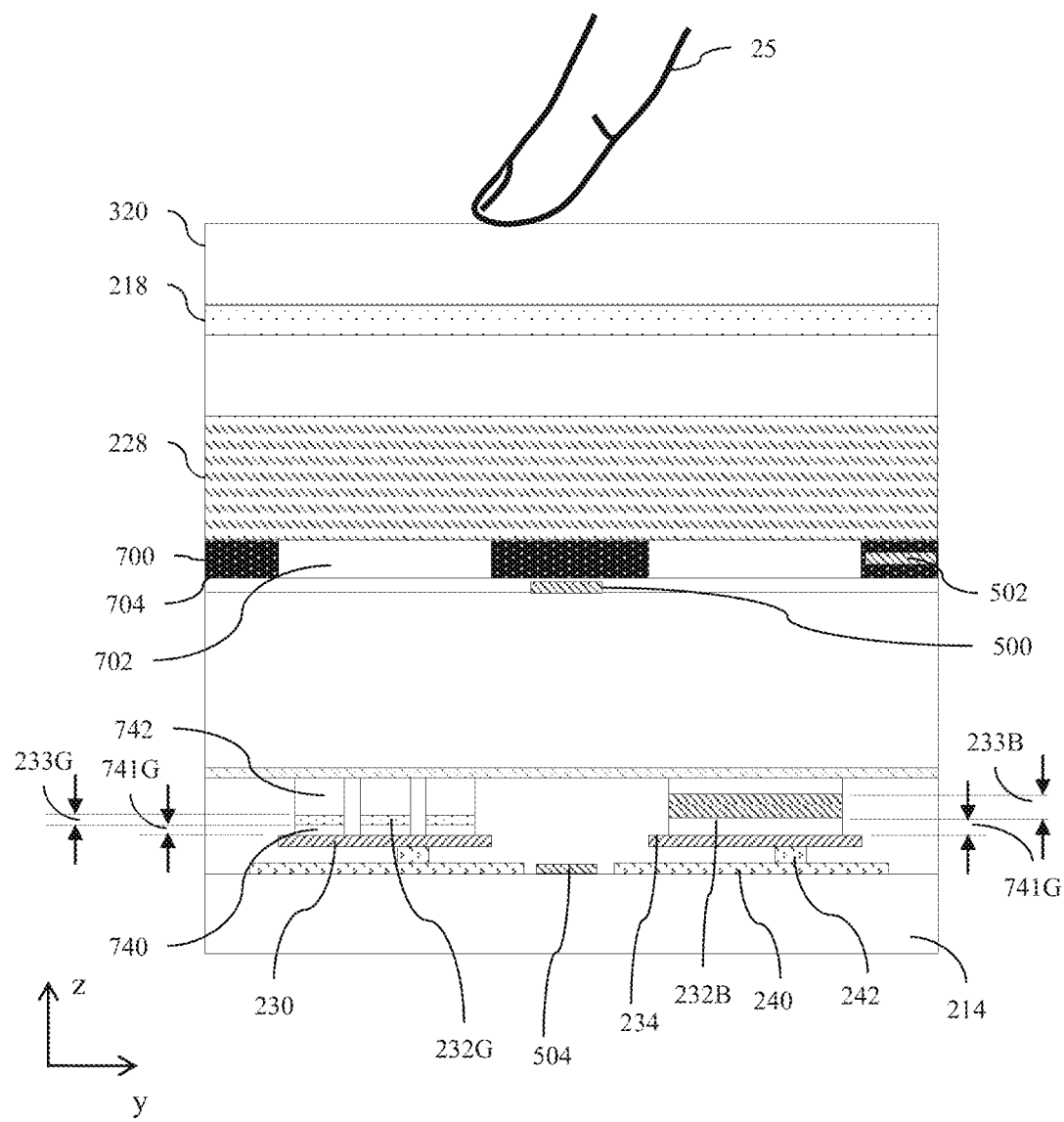
FIG. 34 is a schematic diagram illustrating in side view the structure of FIG. 32.

FIG. 32 is a schematic diagram illustrating in side perspective view a touch screen low reflectivity display 200 for use in ambient illumination 604 comprising an OLED emissive spatial light modulator 48, two dimensional parallax barrier 700 comprising touch sensor electrode layers, leaking output polariser 218 and reflection control quarter-wave retarder 228 arranged on the output side of the spatial light modulator 48; FIG. 33 is a schematic diagram illustrating in front view reflection of ambient light in the display 200 of FIG. 32; and FIG. 34 is a schematic diagram illustrating in side view the structure of FIG. 32. Features of the arrangement of FIGS. 32-34 not discussed in further detail may be assumed to correspond to the features with equivalent reference numerals as discussed above, including any potential variations in the features.

The array of apertures 702 are formed on a touch sensor electrode array 500. Finger 25 location at or near a protective cover layer 320 is detected by means of the touch electrode arrays 500, 502, touch drivers 452, 454 and touch control system 450. The touch electrode array 500, may be formed on the surface of the parallax barrier 700 or on the surface of the quarter-wave retarder.

The pair of touch electrode arrays 500, 502 are arranged in layers separated by dielectric layer 504. The dielectric layer 504 is arranged between the switchable liquid crystal layer 314 and the additional polariser 318. The first and second touch electrode arrays 500, 502 are arranged on the dielectric layer 504 and on opposite sides of the dielectric layer 504.

The touch electrode arrays 500, 502 are arranged between the pixel layer 214 and parallax barrier 700 or as illustrated in FIG. 32 between the parallax barrier 700 and quarter-wave reflection control retarder 228.

The touch input display device 100 further comprises a control system 450, wherein the control system 450 is arranged to address the touch electrode arrays 500, 502 for capacitive touch sensing.

The control system 450 is further arranged to address the SLM 48. The control system comprises a system controller that is arranged to control the signal applied to and measured from the touch electrode arrays 500, 502 by means of touch drivers 452, 454.

The electrodes 500, 502 are arranged between the apertures 702 of the parallax barrier. Advantageously high efficiency may be achieved.

In other embodiments as illustrated in FIG. 34 the at least one absorbing region 704 of the parallax barrier 700 comprises a touch sensor electrode array 502. Advantageously the touch sensor electrode arrays 500, 502 may have reduced reflectivity. Further touch electrodes 504 may be provided at the pixel layer 214.

In other embodiments (not shown) a touch sensing electrode layer may be arranged at the pixel layer 214. Advantageously the control of the sensing electrodes may be provided with the control of the pixel data, reducing cost and complexity.

It would be further desirable to achieve increased transmission efficiency.

Figure 35A:
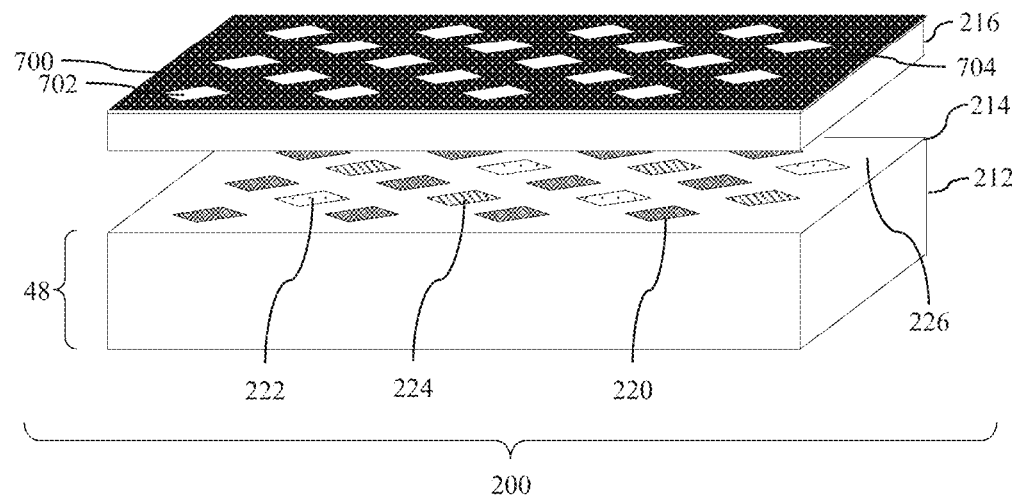
FIG. 35A is a schematic diagram illustrating in side perspective view a low reflectivity display for use in ambient illumination comprising an OLED emissive spatial light modulator, two dimensional parallax barrier and no output polariser arranged on the output side of the spatial light modulator.
Figure 35B:
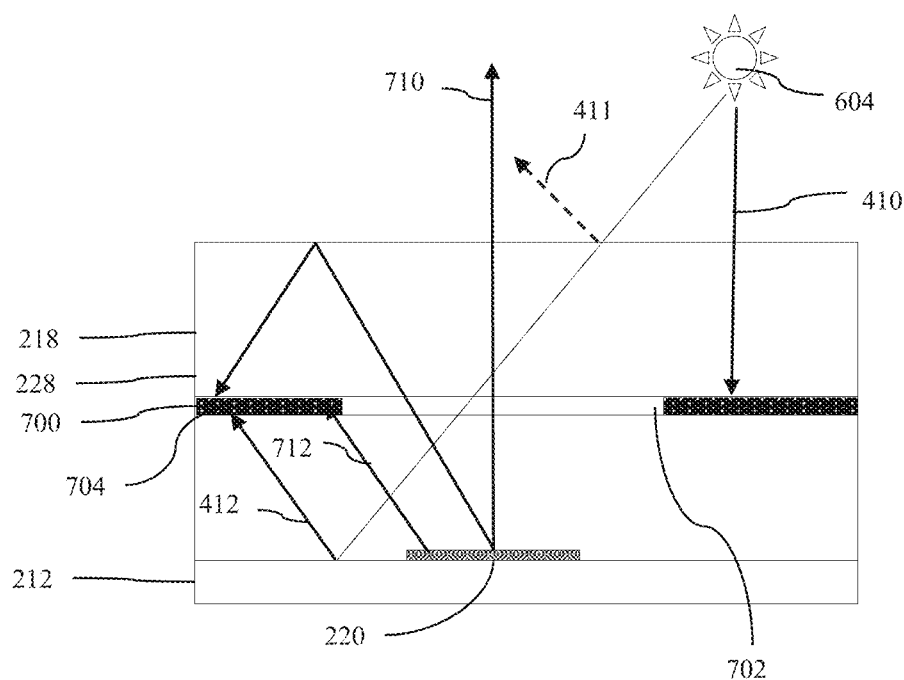
FIG. 35B is a schematic diagram illustrating in side view reflection of ambient light in the display of FIG. 35A.
Figure 35B:
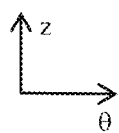

FIG. 35A is a schematic diagram illustrating in side perspective view a low reflectivity display 200 for use in ambient illumination 604 comprising an OLED emissive spatial light modulator 48, two dimensional parallax barrier 700 and no output polariser arranged on the output side of the spatial light modulator 48; and FIG. 35B is a schematic diagram illustrating in side view reflection of ambient light in the display 200 of FIG. 35A. Features of the arrangement of FIGS. 35A-B not discussed in further detail may be assumed to correspond to the features with equivalent reference numerals as discussed above, including any potential variations in the features.

In comparison to the embodiment of FIG. 30, the output polariser 218 is omitted. Advantageously efficiency is increased.

Ambient light rays 410, 412 are absorbed by absorption regions 704 while output rays 710 in the normal are transmitted without loss. High angle light rays 712 from pixel 220 are further absorbed. Thus some ambient light rays are absorbed, advantageously increasing image contrast.

It would be desirable to further reduce reflectivity of ambient light rays.

Figure 36A:
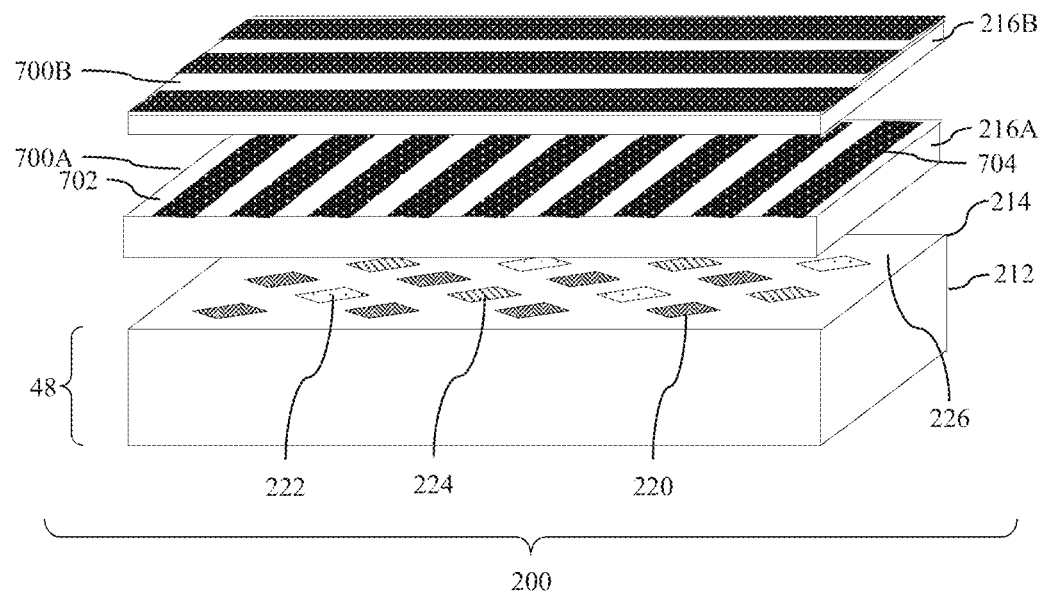
FIG. 36A is a schematic diagram illustrating in side perspective view a low reflectivity display for use in ambient illumination comprising an OLED emissive spatial light modulator, two one dimensional parallax barriers and no output polariser arranged on the output side of the spatial light modulator.
Figure 36B:
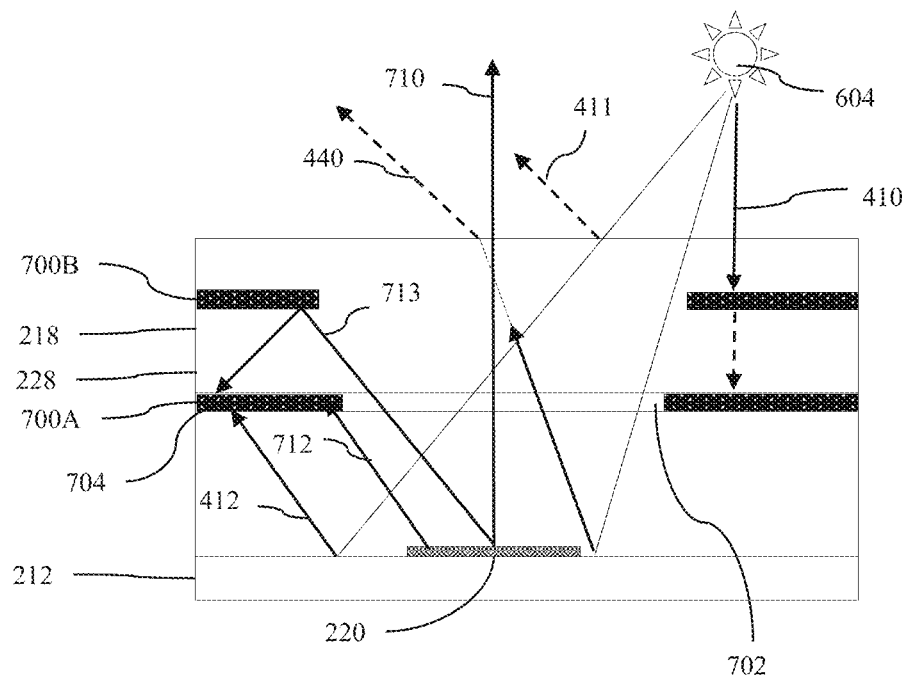
FIG. 36B is a schematic diagram illustrating in side view reflection of ambient light in the display of FIG. 36A.

FIG. 36A is a schematic diagram illustrating in side perspective view a low reflectivity display for use in ambient illumination comprising an OLED emissive spatial light modulator, two one-dimensional parallax barriers 700A, 700B and no output polariser arranged on the output side of the spatial light modulator 48; and FIG. 36B is a schematic diagram illustrating in side view reflection of ambient light in the display of FIG. 36A. Features of the arrangement of FIGS. 36A-B not discussed in further detail may be assumed to correspond to the features with equivalent reference numerals as discussed above, including any potential variations in the features.

The barriers 700A, 700B may be arranged on separate substrates 216A, 216B that provide a separation of the barriers. Light may be trapped within the substrate 216B and absorbed.

In comparison to the embodiments of FIGS. 35A-B, the alignment tolerance for each barrier 700A, 700B may be relaxed, increasing yield and reducing cost. Further additional high light rays 713 may be absorbed reducing leakage between pixels. Advantageously image contrast may be increased.

It may be desirable to reduce off-axis light from emissive pixels and increase efficiency directed into the forwards direction.

Figure 37A:
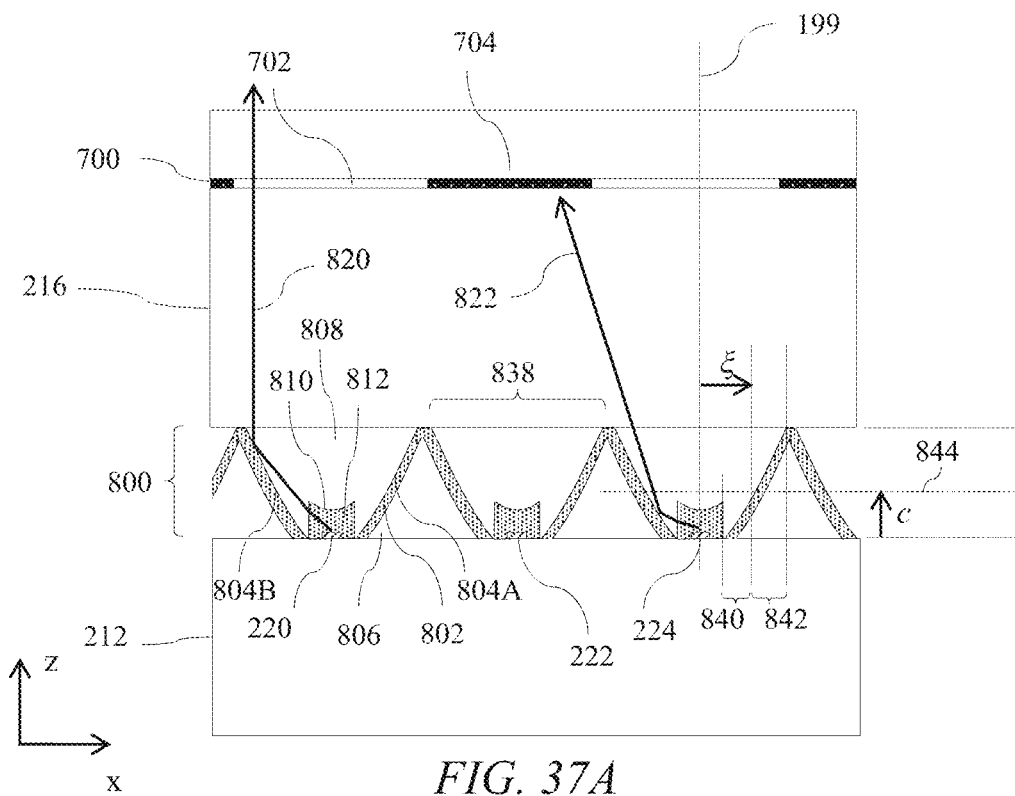
FIG. 37A is a schematic diagram illustrating in side view a catadioptric optical element array arranged between the pixels of the spatial light modulator and the parallax barrier.
Figure 37B:
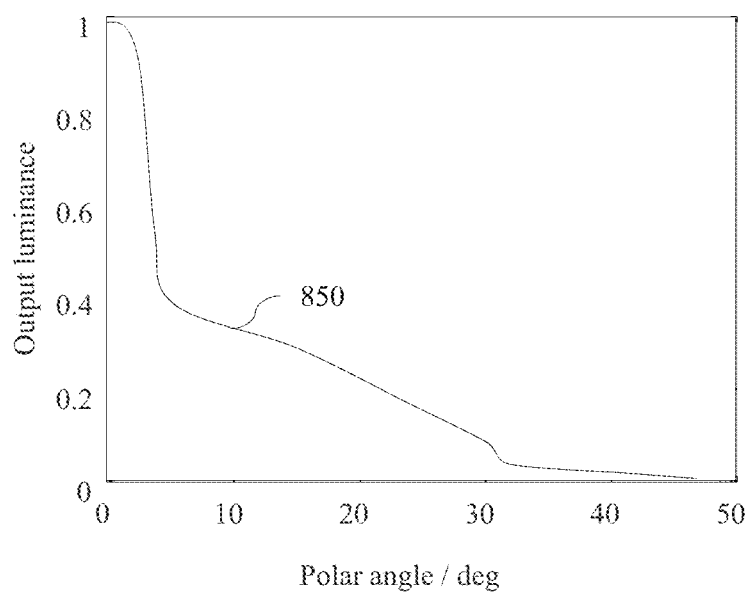
FIG. 37B is a schematic graph illustrating the variation of output luminance with polar angle for the arrangement of FIG. 37A.

FIG. 37A is a schematic diagram illustrating in side view a catadioptric optical element array arranged between the pixels 220, 222, 224 of the spatial light modulator 48 and the parallax barrier 700; and FIG. 37B is a schematic graph illustrating the variation of output luminance with polar angle for the arrangement of FIG. 37A. Features of the arrangement of FIG. 37A not discussed in further detail may be assumed to correspond to the features with equivalent reference numerals as discussed above, including any potential variations in the features.

Catadioptric optical elements for emissive displays are described in WIPO Publ. No. WO 2019/138243, which is herein incorporated by reference in its entirety.

Catadioptric optical structure 800 is aligned with the emissive pixels 220, 222, 224 to provide a directional light output distribution from the spatial light modulator 48 that is similar to that illustrated in FIG. 11A or FIG. 19A. The catadioptric optical structure 800 comprises a plurality of catadioptric optical elements 838 arranged in a catadioptric optical element array, each of the catadioptric optical elements 838 of the plurality of catadioptric optical elements 800 aligned in correspondence with a respective one or more of the pixels of the plurality of pixels 220, 222, 224, each of the pixels of the plurality of LEDs being aligned with only a respective one of the catadioptric optical elements 838 of the catadioptric optical structure 800.

Each of the plurality of catadioptric optical elements 838 comprises in at least one catadioptric cross-sectional plane through its optical axis 199 a first cross-sectional outer interface 804A and a second cross-sectional outer interface 804B facing the first cross-sectional outer interface 804A.

The first and second cross-sectional outer interfaces 804A, 804B each comprise curved interfaces comprising first and second outer interface regions 840, 842.

The first and second cross-sectional outer interfaces 804A, 804B extend from a first end of the catadioptric optical element 838 to a second end of the catadioptric optical element 838, the second end of the catadioptric optical element 838 facing the first end of the catadioptric element.

The distance between the first and second cross-sectional outer interfaces at the first end of the catadioptric optical element that is at the pixel layer is less than the distance between the first and second cross-sectional outer interfaces 804A, 804B at the second end of the catadioptric optical element 838 that is at the output side of the catadioptric optical element 838.

At least one transparent inner interface 810 is arranged between the first and second ends and between the first and second outer interfaces 804A, 804B.

The catadioptric optical structure 838 comprises: (i) a first transparent non-gaseous material with a first refractive index arranged between the first and second cross-sectional outer interfaces and the at least one transparent inner interface and between the first and second end of each of the catadioptric optical elements; (ii) a second transparent non-gaseous material with a second refractive index lower than the first refractive index arranged between a respective aligned pixel 220, 222, 224 and the transparent inner interface of each of the catadioptric optical elements; (iii) a third transparent non-gaseous material with a third refractive index lower than the first refractive index arranged between the first cross-sectional outer interface of a first catadioptric optical element and the second cross-sectional outer interface of an adjacent catadioptric optical element of the plurality of catadioptric optical elements and between the first and second end of each of the catadioptric optical elements.

The tilt angle with respect to the optical axis 199 of the interface normal of each of the first and second cross-sectional outer interfaces 804A, 804B varies continuously with the distance c from the first end towards the second end. The derivative of the tilt angle with respect to distance from the optical axis 199 has a discontinuity at the boundary 844 between the respective first and second outer interface regions 840, 842 of the first and second cross-sectional outer interfaces 804A, 804B.

The materials 802, 814 may be transparent and conveniently provided in layer 800, reducing manufacturing cost and complexity.

The present embodiments achieve encapsulation of an OLED pixel by means of the solid catadioptric optical element 838 that has interfaces 804A, 804B arranged to advantageously achieve directional illumination with low levels of cross talk to snoopers. Profile 850 of FIG. 37B may be provided by the illustrative embodiment of TABLE 8.

TABLE 8

| Material 808 Refractive index | Material 802 Refractive index | Material 812 Refractive index | Critical angle/ deg |
|---|---|---|---|
| 1.60 | 1.38 | 1.38 | 59.6 |

Most of the principal rays 820 in the second outer interface region 842 are directed in a direction that is close to parallel to the optical axis 199 by total internal reflection, providing high levels of collimation for light rays reflected from the outer surfaces 804A, 804B. Light rays 822 that are incident on the region 840 are directed in directions that are close to but not identical to the collimation direction for known low cost materials in a solid catadioptric optical element 38.

Advantageously losses are reduced and efficiency is increased for on-axis light rays.

In other embodiments, the interfaces 804 may be provided by metallic surfaces to provide some collimation of output light.

It would be desirable to reduce the number of rays at higher polar angles. Parallax barrier 700 absorption regions 704 may be arranged to reduce the luminance at higher polar angles.

In further embodiments, the shape of the surfaces 804A, 804B may be arranged to provide controlled light rays at high polar angles to achieve increased luminance at higher polar angles, for example between 2.5% and 15% of head-on luminance. Public mode luminance may be provided with high image visibility. Polarisers 218, 318 and polar control retarders 300 may be arranged to achieve switching between public mode and privacy mode. Further pixels may be arranged on the pixel layer between in catadioptric optical elements 838 to achieve increased light at high polar angles as described in WIPO Publ. No. WO 2018/185475, which is herein incorporated by reference in its entirety.

Methods to manufacture display apparatuses of the present embodiments will now be described.

FIGS. 38A-D are schematic diagrams illustrating in side views a method to manufacture a parallax barrier 700 for an emissive display 100, 200 using a fine metal mask 900.

Figure 38A:
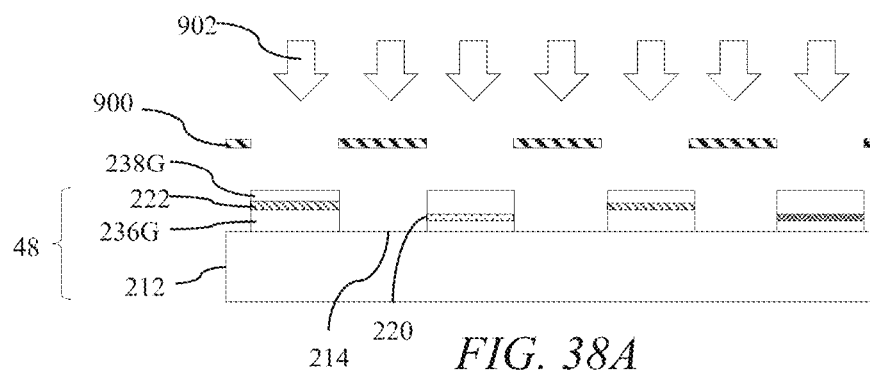
FIGS. 38A, 38B, 38C, and 38D are schematic diagrams illustrating in side views a method to manufacture a parallax barrier for an emissive display using a fine metal mask.

FIG. 38A illustrates in a first step the forming an array of emissive pixels 220, 222, 224 on a backplane by means of directing emissive materials 802 through a fine metal mask. The structure of pixels 220, 222, 224 is further described in FIG. 6 for example.

Figure 38B:
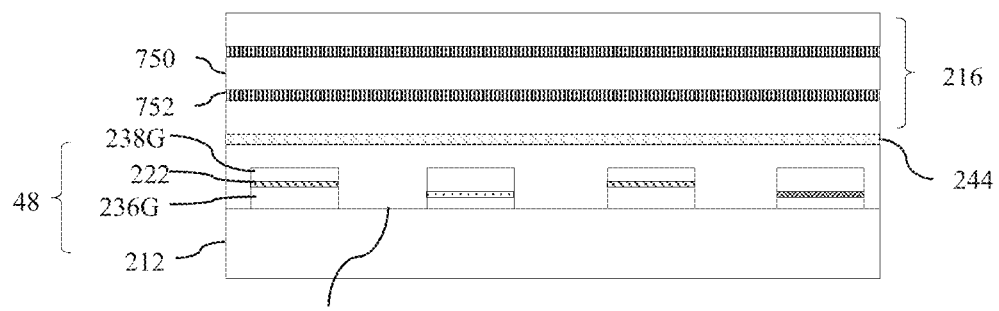

FIG. 38B illustrates in a second step the addition of inorganic layers 752 and organic layers 750 to provide substrate 216 as an encapsulation layer for the pixel layer 214. The step of forming an encapsulation layer on the array of emissive pixels 220, 222, 224 thus comprises forming at least one transparent inorganic layer 752. The at least one transparent inorganic layer may be a glass layer. The glass layer may be provided with the appropriate thickness d by means of chemical-mechanical polishing of a thicker glass layer. The organic layers 750 may be omitted. An adhesive layer 244 may be provided between the pixel layer 214 and the substrate 216.

Figure 38C:
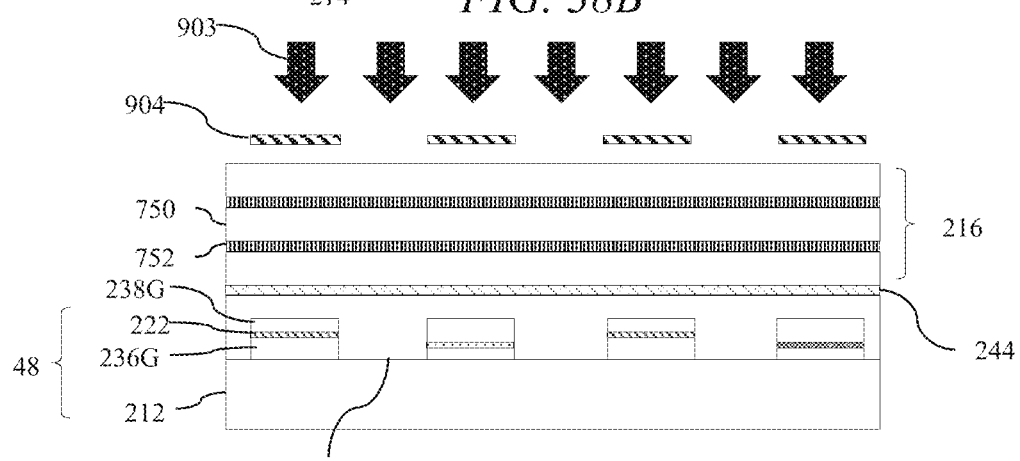

FIG. 38C illustrates forming the parallax barrier 700 comprising an array of apertures 702 on the surface of the encapsulation layer substrate 216 by directing light absorbing material 903 through a fine metal mask 904. The mask 904 may be the same as the mask 900. The alignment of the mask 904 is displaced in lateral position with respect to the alignment of the mask 900 to achieve alignment of the apertures 702 with the centre of the pixels 220, 222, 224.

Figure 38D:
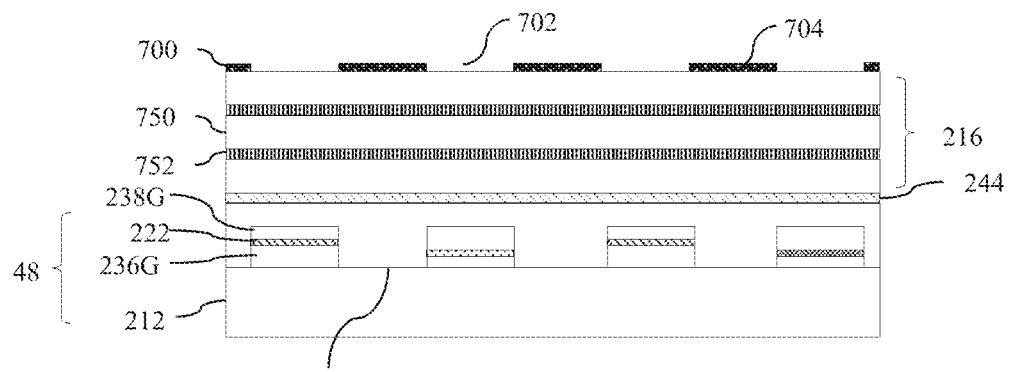

FIG. 38D illustrates the barrier formed on the layer 216 prior to arranging layers such as further encapsulation layers, reflection reduction retarder 228, polarisers 218, 318 and polar control retarder 300 on the parallax barrier.

Advantageously the parallax barrier 700 may be formed using similar equipment and masking technologies used for forming the pixels 220, 222, 224. Cost of applying parallax barriers 700 may be advantageously reduced.

The pixels 220, 222, 224 have a pitch p along the direction in which the apertures 702 are closest, the material between the parallax barrier 700 and the pixels 220, 222, 224 has a bulk refractive index n and the encapsulation layer has a thickness d meeting the requirement that $2d/p \leq \sqrt{(2n^2-1)}$. The apertures 702 have a width a along the direction in which the apertures 702 are closest, the material between the parallax barrier 700 and the pixels 220, 222, 224 has a bulk refractive index n and the encapsulation layer has a thickness d meeting the requirement that $d \geq a\sqrt{(n^2-1)}/2$ and preferably meeting the requirement that $d \geq an\sqrt{(1-3/(4n^2))}/\sqrt{3}$.

It would be desirable to provide the parallax barrier by means of high precision lithography.

FIGS. 39A-F are schematic diagrams illustrating in side views a method to manufacture a parallax barrier 700 for an emissive display using lithography.

A method to form a display device comprising the steps of forming an array of emissive pixels 220, 222, 224 on a backplane by means of directing emissive materials through a fine metal mask forming an encapsulation layer on the array of emissive pixels 220, 222, 224 comprising at least one transparent inorganic layer; forming the parallax barrier 700 comprising an array of apertures 702 on the surface of the encapsulation layer by means of lithographic patterning.

In the first and second steps the emissive display is provided as illustrated in FIGS. 38A-B.

Figure 39A:
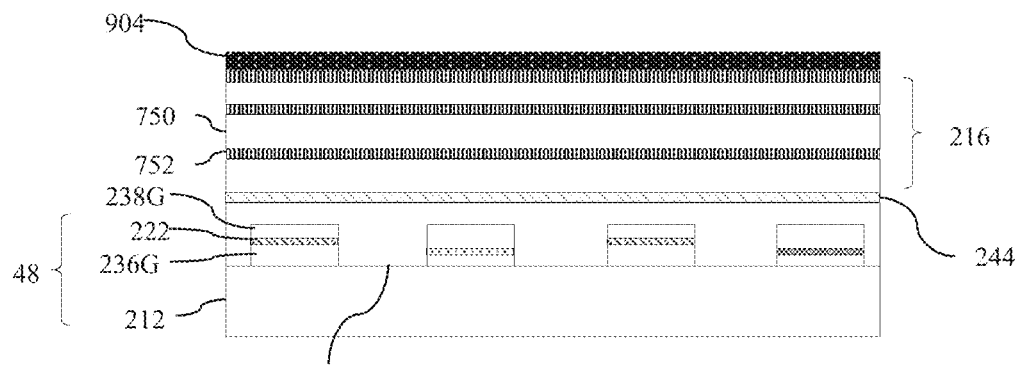
FIGS. 39A, 39B, 39C, 39D, 39E, and 39F are schematic diagrams illustrating in side views a method to manufacture a parallax barrier for an emissive display using lithography.

FIG. 39A illustrates that in a third step barrier material 904 is formed on the upper surface of the layer 216.

Figure 39B:
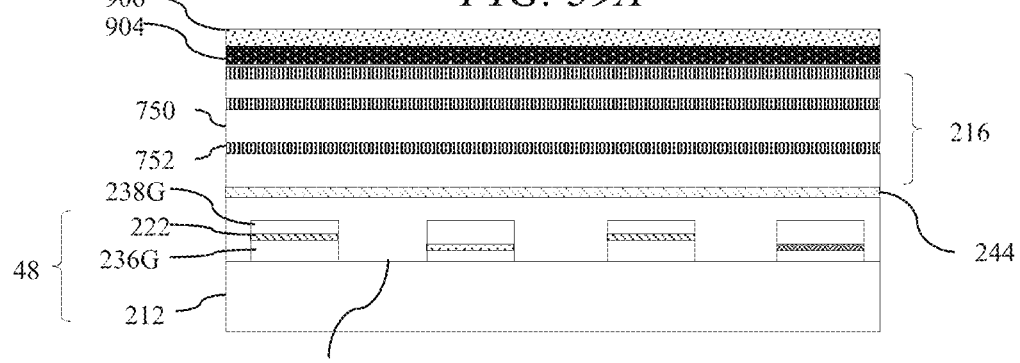

FIG. 39B illustrates that in a fourth step a photolithographic masking material 906 is arranged on the upper surface of the material 904.

Figure 39C:
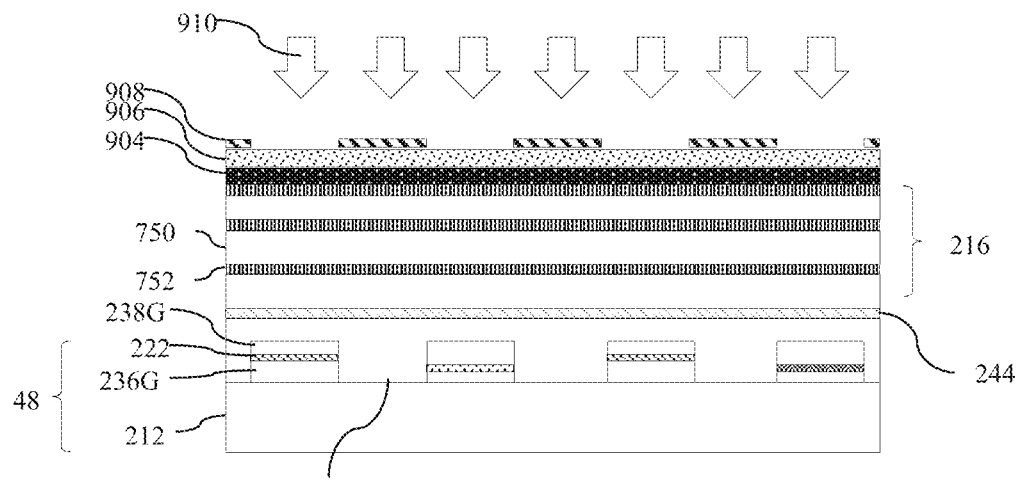

FIG. 39C illustrates that in a fifth step a photomask 908 is arranged in alignment with the pixels 220, 222, 224 and exposed to UV radiation 910.

Figure 39D:
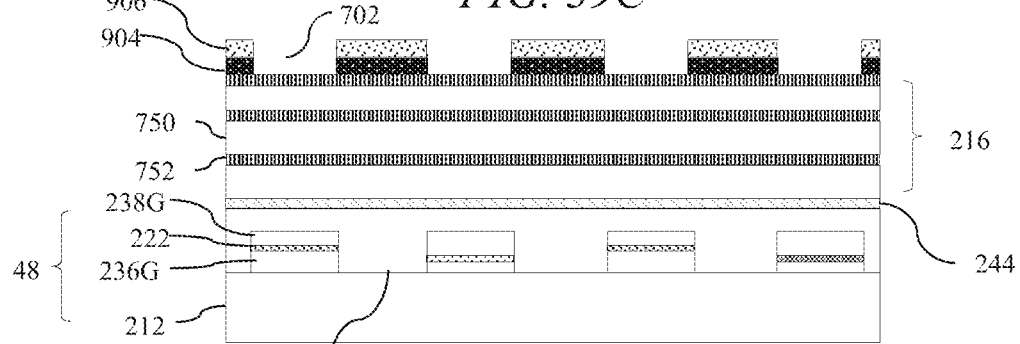

FIG. 39D illustrates that in a sixth etch step the material 904 is removed.

Figure 39E:
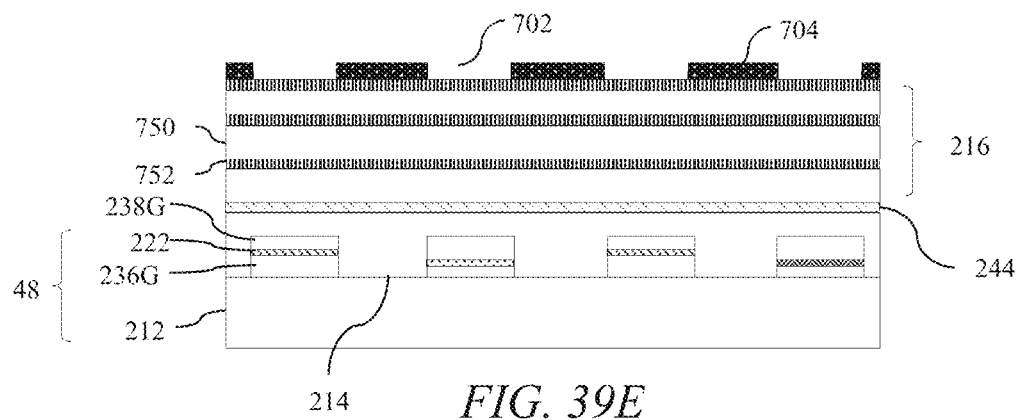

FIG. 39E illustrates that in a seventh step the photolithographic material is removed.

Figure 39F:
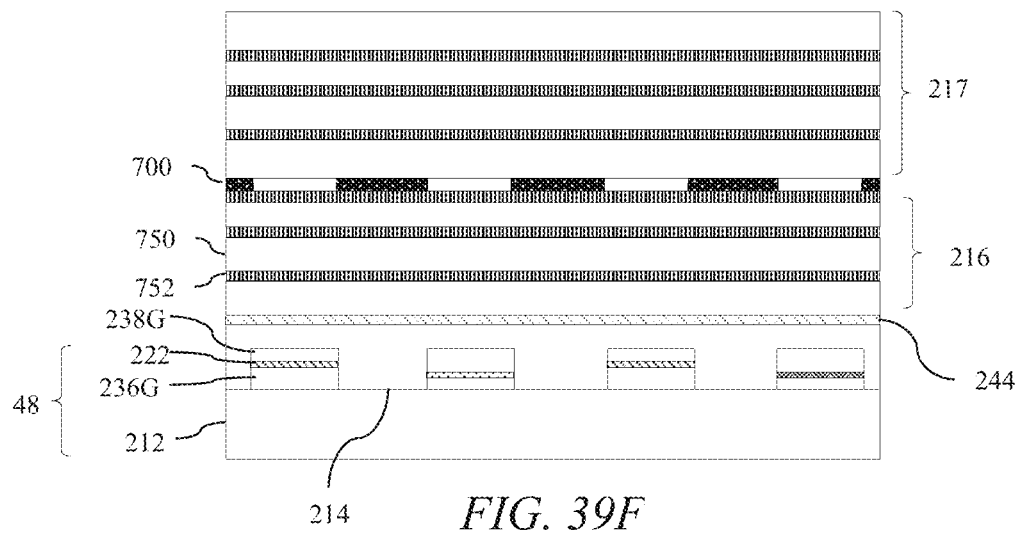

FIG. 39F illustrates the final device after addition of a further encapsulation layer.

Advantageously a high resolution and accurately aligned parallax barrier may be provided, reducing cost and complexity and providing highest luminance in the normal direction aligned with axis 199.

It may be desirable to provide the parallax barrier on a separate layer and align with the spatial light modulator 48.

FIGS. 40A-D are schematic diagrams illustrating in side views a method to manufacture a parallax barrier 700 for an emissive display 100, 200 using printing.

Figure 40A:
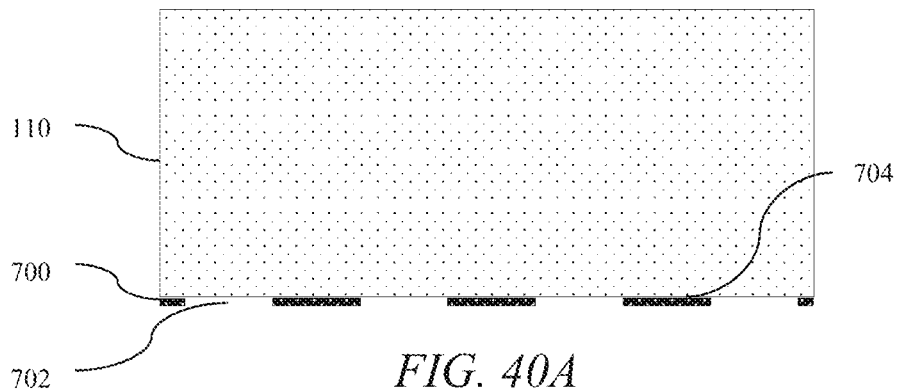
FIGS. 40A, 40B, 40C, and 40D are schematic diagrams illustrating in side views a method to manufacture a parallax barrier for an emissive display using printing.

FIG. 40A illustrates that parallax barrier 700 may be provided using a printing method such as ink jet printing, lithography, flexography or other know printing technology to apply absorbing material in regions 704. The parallax barrier 700 may be provided on substrate 110.

Figure 40B:
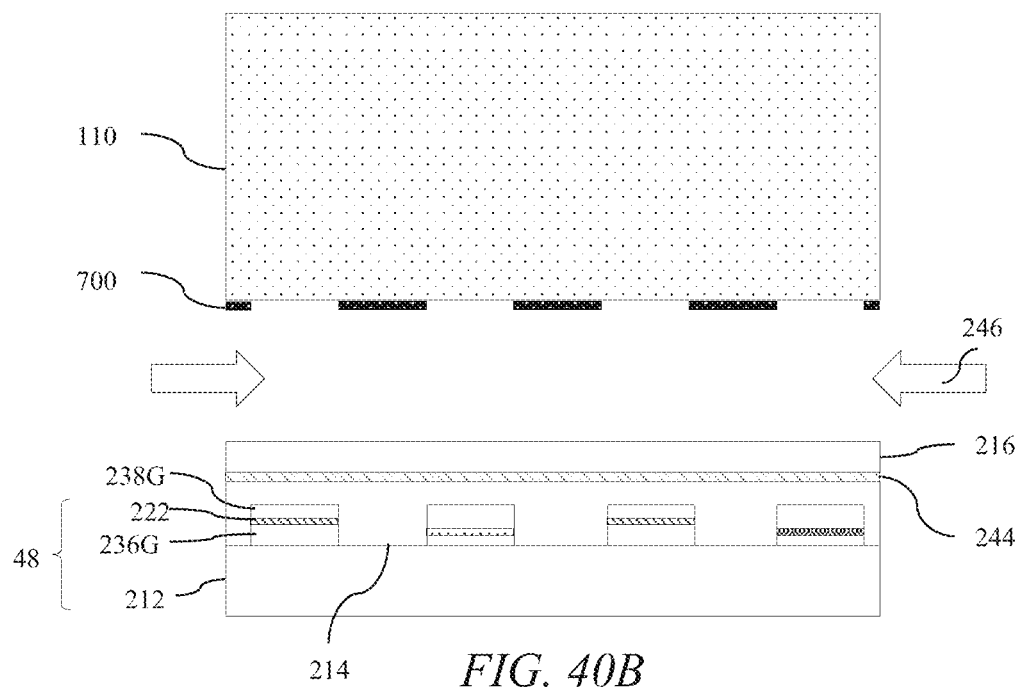

FIG. 40B illustrates that the parallax barrier may be aligned to the pixel layer 214. Material 246 is input into the gap between the substrate 216 and parallax barrier 700.

Figure 40C:
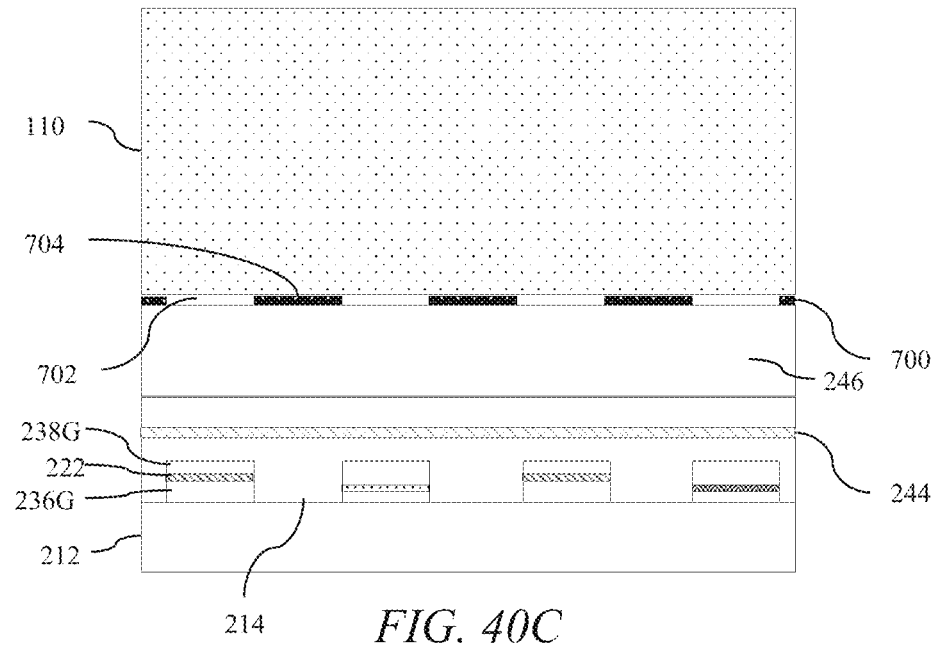

FIG. 40C illustrates the device structure after curing of the adhesive material 246.

Figure 40D:
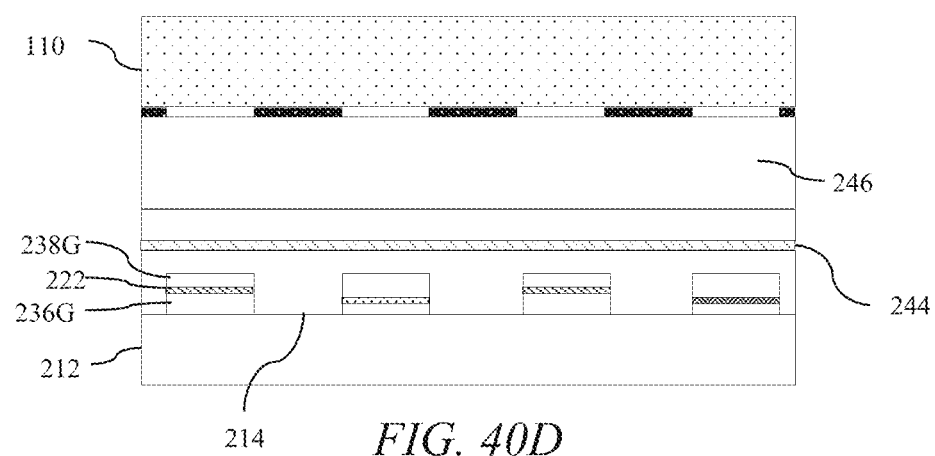

FIG. 40D illustrates thinning of the substrate 110 for example by chemical-mechanical polishing of the substrate 110.

Advantageously the parallax barrier may be formed after fabrication of the emissive display.

Features of the arrangement of FIGS. 38A-D, FIGS. 39A-F and FIGS. 40A-D not discussed in further detail may be assumed to correspond to the features with equivalent reference numerals as discussed above, including any potential variations in the features.

It would be desirable to provide an emissive privacy display with increased head-on efficiency and reduced off-axis luminance.

Figure 41:
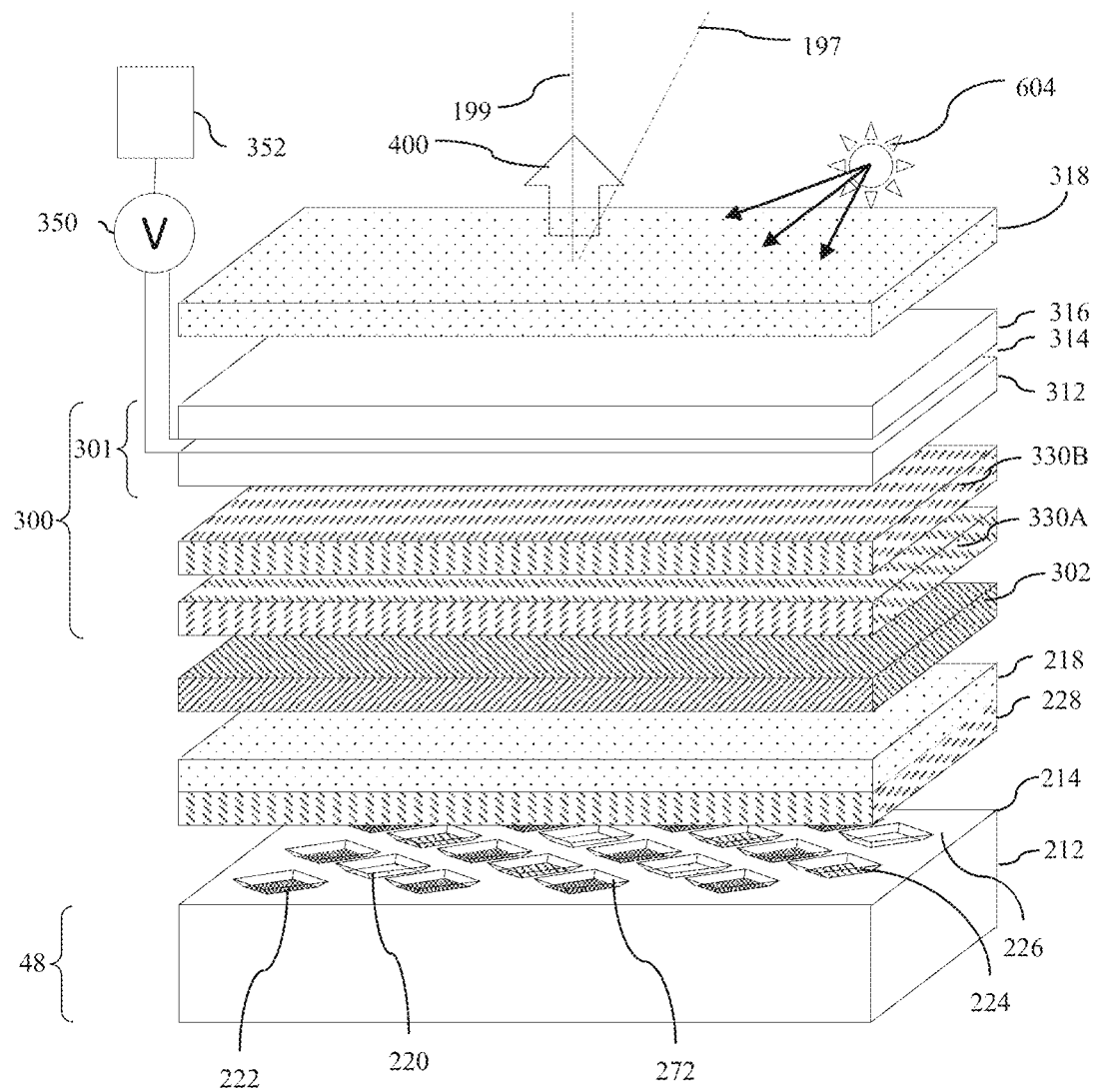
FIG. 41 is a schematic diagram illustrating in side perspective view a switchable privacy display for use in ambient illumination comprising an OLED emissive spatial light modulator comprising profiled OLED pixels, output polariser and reflection control quarter-wave retarder, reflective polariser, a switchable polar control retarder and an additional polariser arranged on the output side of the spatial light modulator.
Figure 42:
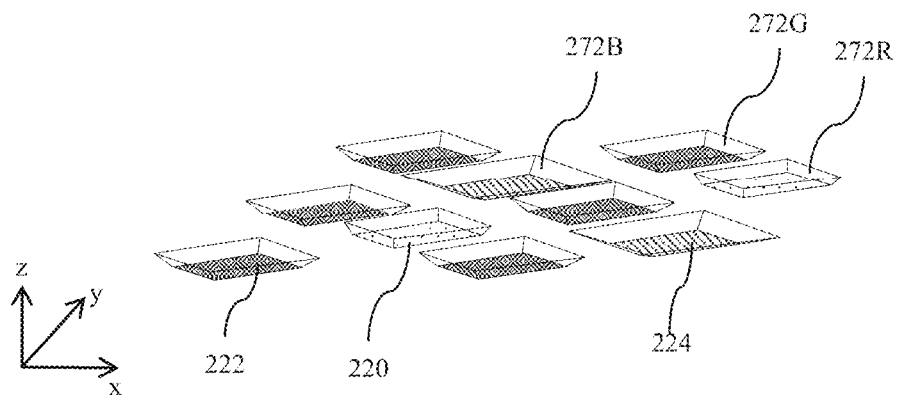
FIG. 42 is a schematic diagram illustrating in side perspective view pixels of an OLED emissive spatial light modulator wherein the OLED pixels are profiled OLED pixels comprising profiled wells and a high index filler material.

FIG. 41 is a schematic diagram illustrating in side perspective view a switchable privacy display 100 for use in ambient illumination comprising an OLED emissive spatial light modulator 48 comprising profiled OLED pixels 220, 222, 224, output polariser 218 and reflection control quarter-wave retarder 228, reflective polariser 302, a switchable polar control retarder 300 and an additional polariser 318 arranged on the output side of the spatial light modulator 48; and FIG. 42 is a schematic diagram illustrating in side perspective view pixels of an OLED emissive spatial light modulator 48 wherein the OLED pixels 220, 222, 224 are profiled OLED pixels comprising profiled wells 272 and a high index filler material 270. Features of the arrangement of FIGS. 41-42 not discussed in further detail may be assumed to correspond to the features with equivalent reference numerals as discussed above and below, including any potential variations in the features.

The structure and operation of one of the pixels 220 will now be described.

Figure 43:
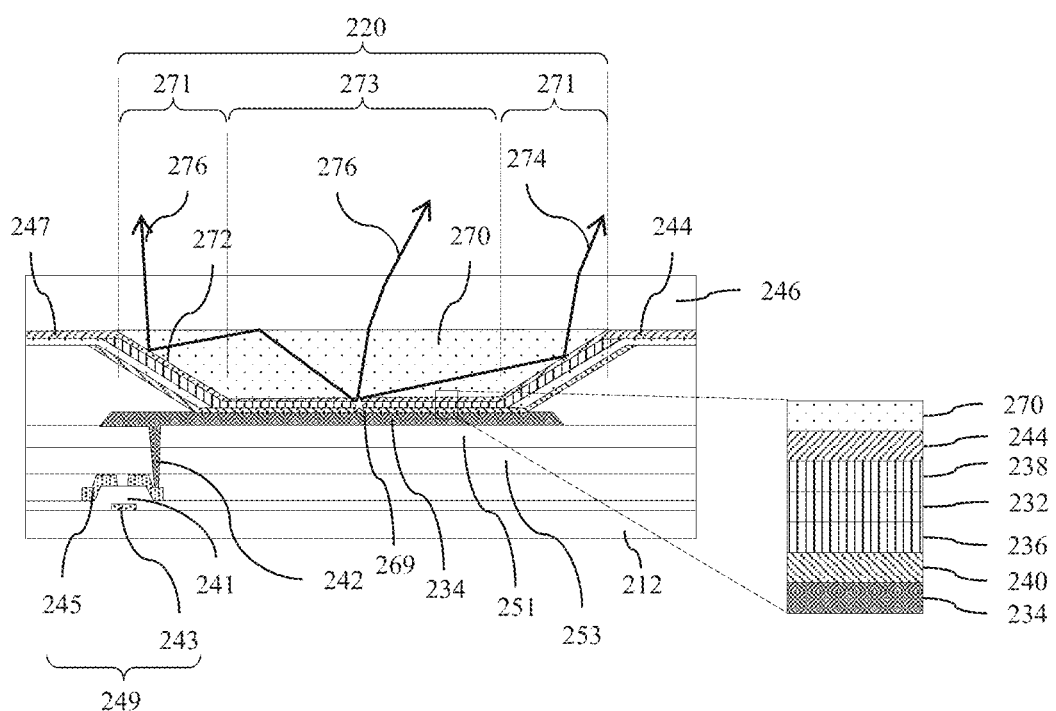
FIG. 43 is a schematic diagram illustrating in side view one pixel of an OLED emissive spatial light modulator wherein the OLED pixel comprises profiled wells and a high index filler material.

FIG. 43 is a schematic diagram illustrating in side view one pixel of an OLED emissive spatial light modulator wherein the OLED pixel comprises profiled wells 272 and a high index filler material 270. The pixel 220 is driven by pixel circuitry 249 comprising electrodes 243, 245 and layers 241, 251, 253 comprising semiconductor and dielectric layers to provide transistor, capacitor and other drive circuity elements. As illustrated in FIGS. 6-7 via 242 is arranged to connect to electrode 234 that in turn is contacted to rear reflector 240 that may for example be a silver electrode. Electron transport layer 236, emission layer 232, hole transparent electrode layer 238 and transparent electrode 244 is provided on the electrode 234 to achieve the emitting pixel 220.

The pixel 220 is provided with well profile 272 with a central region 273 that may be substantially planar and tilt regions 271 that are tilted and may further be provided with planar surfaces or curved surfaces.

Filler material 270 is provided between the tilt regions 271. The filler material may for example have a refractive index of approximately 1.8. The refractive index of the filler material may be similar to the refractive index of the emission layer 232 material.

In operation, light rays are provided by source 269 that have an angular distribution of luminous intensity that is determined by wavelength, reflections from reflective layer, interference between coherent wavefronts, guiding within layers and surface plasmon absorption in the metal layers. Such propagation properties are commonly referred to as microcavity emission effects.

In the present embodiments, light rays 276 are emitted towards the normal direction are directly output without incidence at the outer regions 271 of the pixel 220. Light rays 274 are output after incidence at the reflective layers of the tilt regions 271. Light rays 276 are guided within the filler material 270 and output after incidence of the tilt region 271.

Advantageously light rays 274, 276 that would be lost by guiding within the cover layer 246 are directed in the forwards direction. In comparison to the arrangements described elsewhere, the parallax barrier 700 may be omitted and cost reduced. In other embodiments, not shown the profiled pixels of FIGS. 41-43 may be provided together with parallax barrier 700. Advantageously efficiency is increased and off-axis visual security level increased for privacy mode of operation.

Returning to FIG. 42, the profiles of the tilt regions 271 may be different for red, green and blue pixels 220, 222, 224. Such differences may compensate for different colour roll-offs for microcavity interference affects. Advantageously colour uniformity may be improved.

Figure 44:
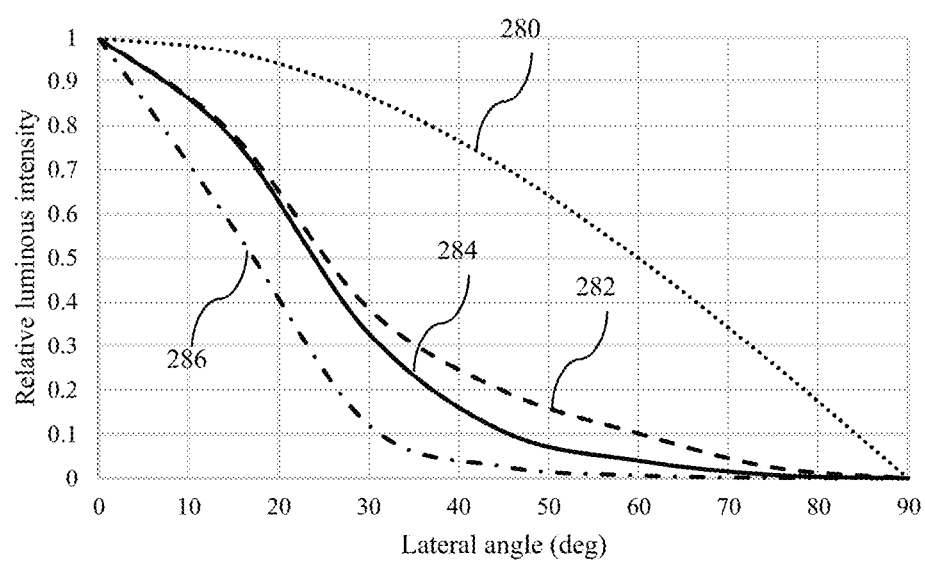
FIG. 44 is a schematic graph illustrating variation of luminous intensity for profiled and non-profiled OLED pixels.

FIG. 44 is a schematic graph illustrating variation of luminous intensity for profiled and non-profiled OLED pixels. In comparison to the profiles of luminance against polar angle, the profile of luminous intensity against lateral angle is given. Thus a Lambertian output profile 280 has a $\cos \theta$ profile. The profile 282 for a conventional OLED pixel is provided together with a desirable profiles 284, 286 that may be provided by the profiled pixel 220 with tilt regions 271. Desirably the luminous intensity at polar angles of at least 45 degrees is less than 15% of the maximum luminous intensity and preferably less than 10% of the maximum luminous intensity. Further the maximum luminous intensity at polar angles of at least 60 degrees is less than 7.5% of the maximum luminous intensity and preferably less than 5% of the maximum luminous intensity.

Figure 45A:
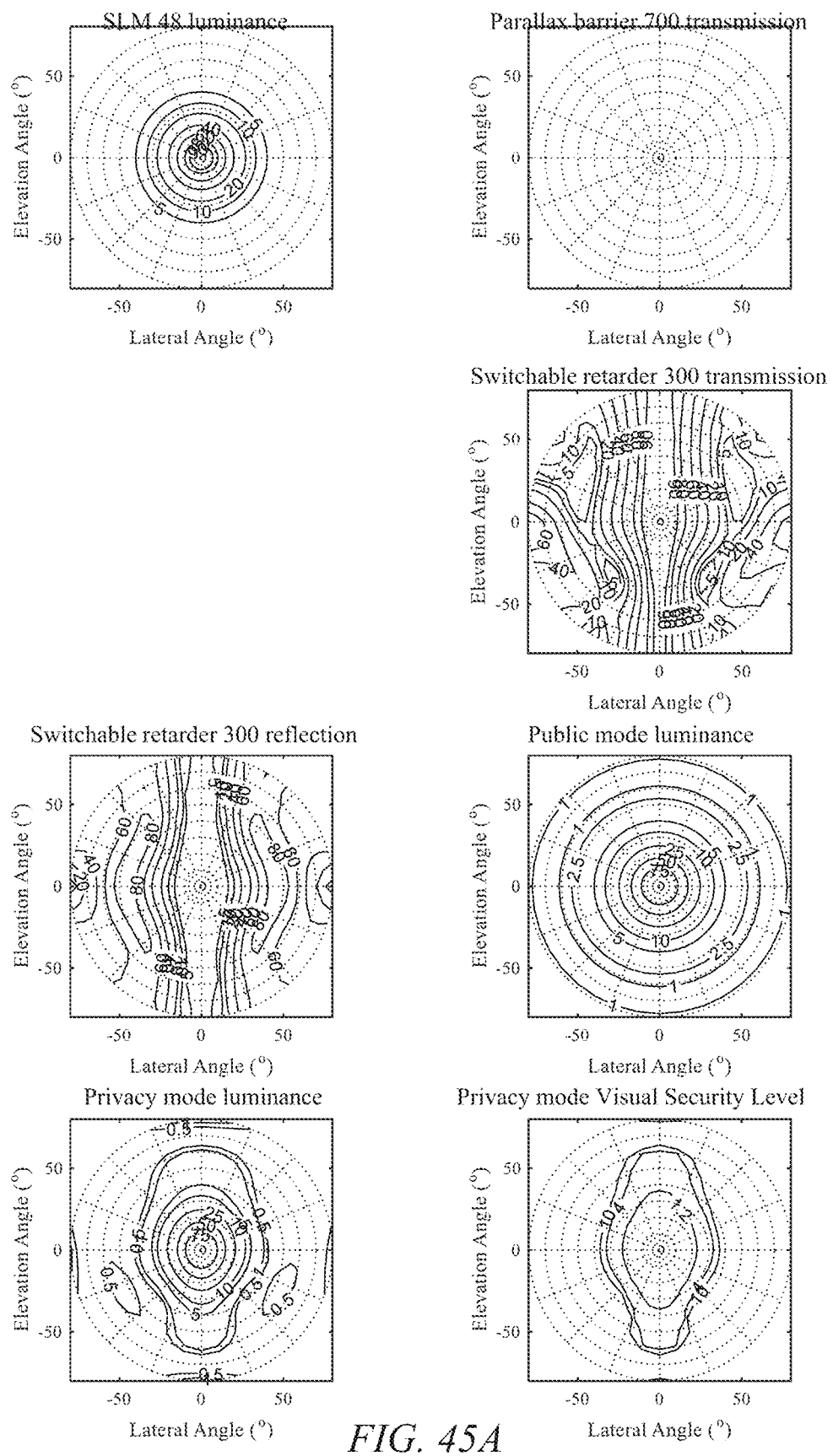
FIG. 45A is a polar plot array for the component contributions and output of the arrangement of FIG. 41 comprising polar plots for spatial light modulator luminance, switchable retarder transmission, switchable retarder reflection, public mode luminance, privacy mode luminance and visual security level.
Figure 45B:
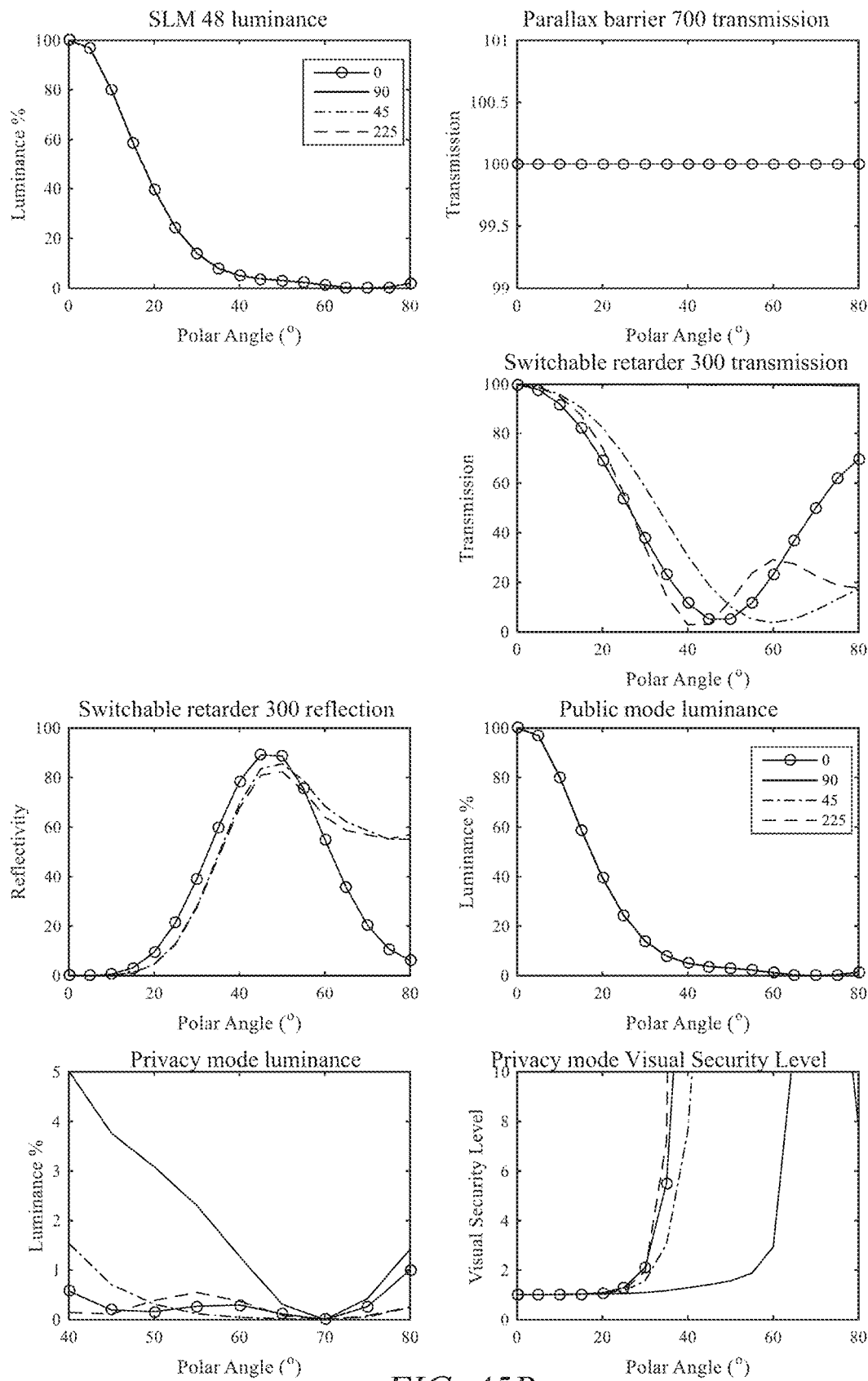
FIG. 45B is a linear profile plot array for the component contributions and output of the arrangements of FIG. 45A comprising linear profiles at azimuthal angles of 0, 90, 45 and 225 degrees.

FIG. 45A is a polar plot array for the component contributions and output of the arrangement of FIG. 41 comprising polar plots for spatial light modulator luminance of luminous intensity profile 286 in FIG. 44, switchable retarder transmission, switchable retarder reflection, public mode luminance, privacy mode luminance and visual security level; and FIG. 45B is a linear profile plot array for the component contributions and output of the arrangements of FIG. 45A comprising linear profiles at azimuthal angles of 0, 90, 45 and 225 degrees.

The profiled OLED pixels 220, 222, 224 are arranged to provide increased head-on luminance and reduced off-axis luminance. Advantageously visual security level is increased for off-axis snoopers in a privacy mode of operation. Further output efficiency is increased for the head-on user.

It may be desirable to provide a display that provides a privacy function in landscape and portrait modes of operation.

Figure 46:
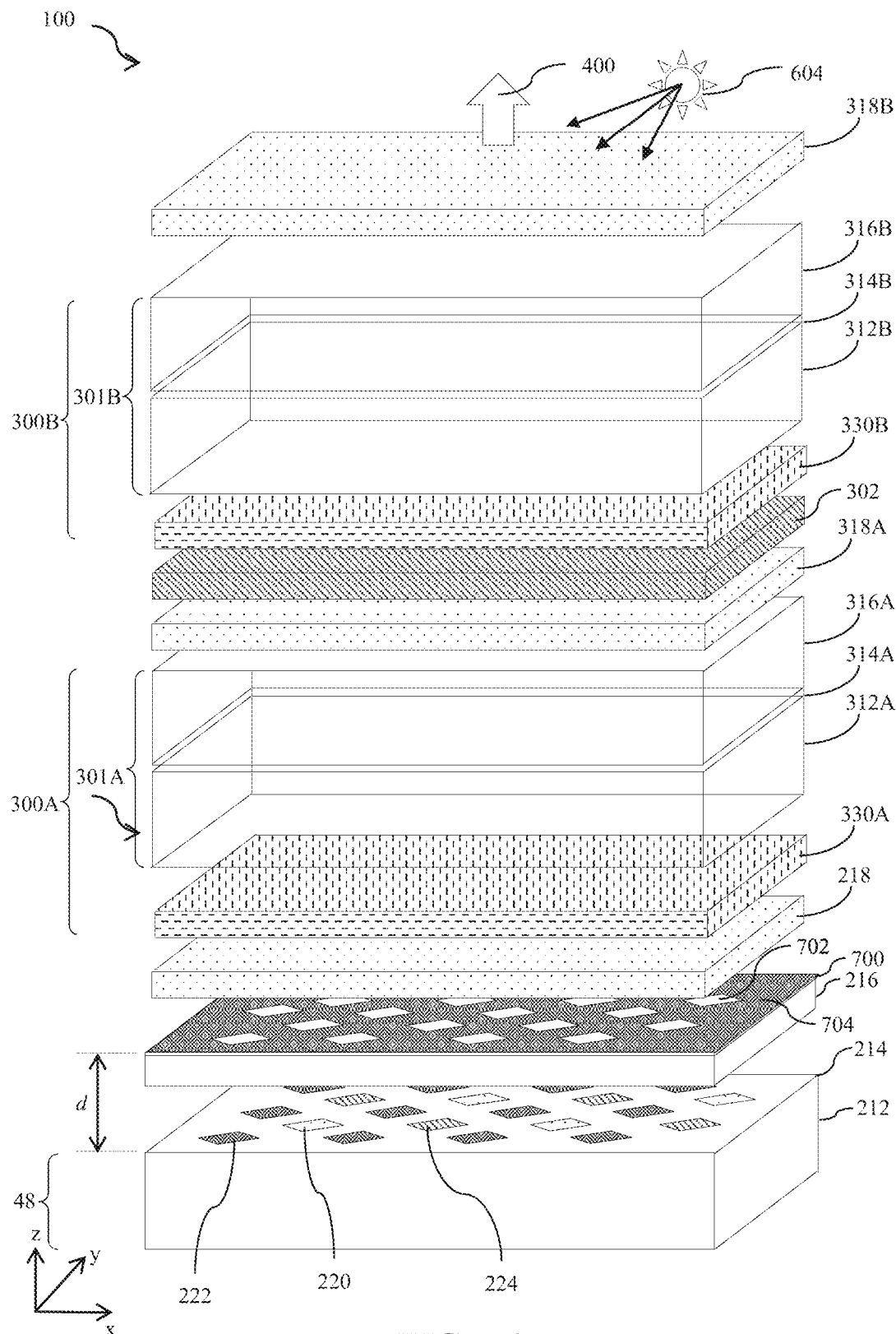
FIG. 46 is a schematic diagram illustrating in side perspective view a switchable privacy display for use in ambient illumination comprising an emissive spatial light modulator, a parallax barrier, a first polar control retarder arranged between the display polariser of the emissive spatial light modulator and a first additional polariser; and a reflective polariser and second polar control retarder arranged between the first additional polariser and a second additional polariser.

FIG. 46 is a schematic diagram illustrating in side perspective view a switchable privacy display device 100 for use in ambient illumination 604 comprising an emissive spatial light modulator 48, a parallax barrier 700, a first polar control retarder 300A arranged between the display polariser 218 of the emissive spatial light modulator 48 and a first additional polariser 318A; and a reflective polariser 302 and second polar control retarder 300B arranged between the first additional polariser 318A and a second additional polariser 318B.

Figure 47A:
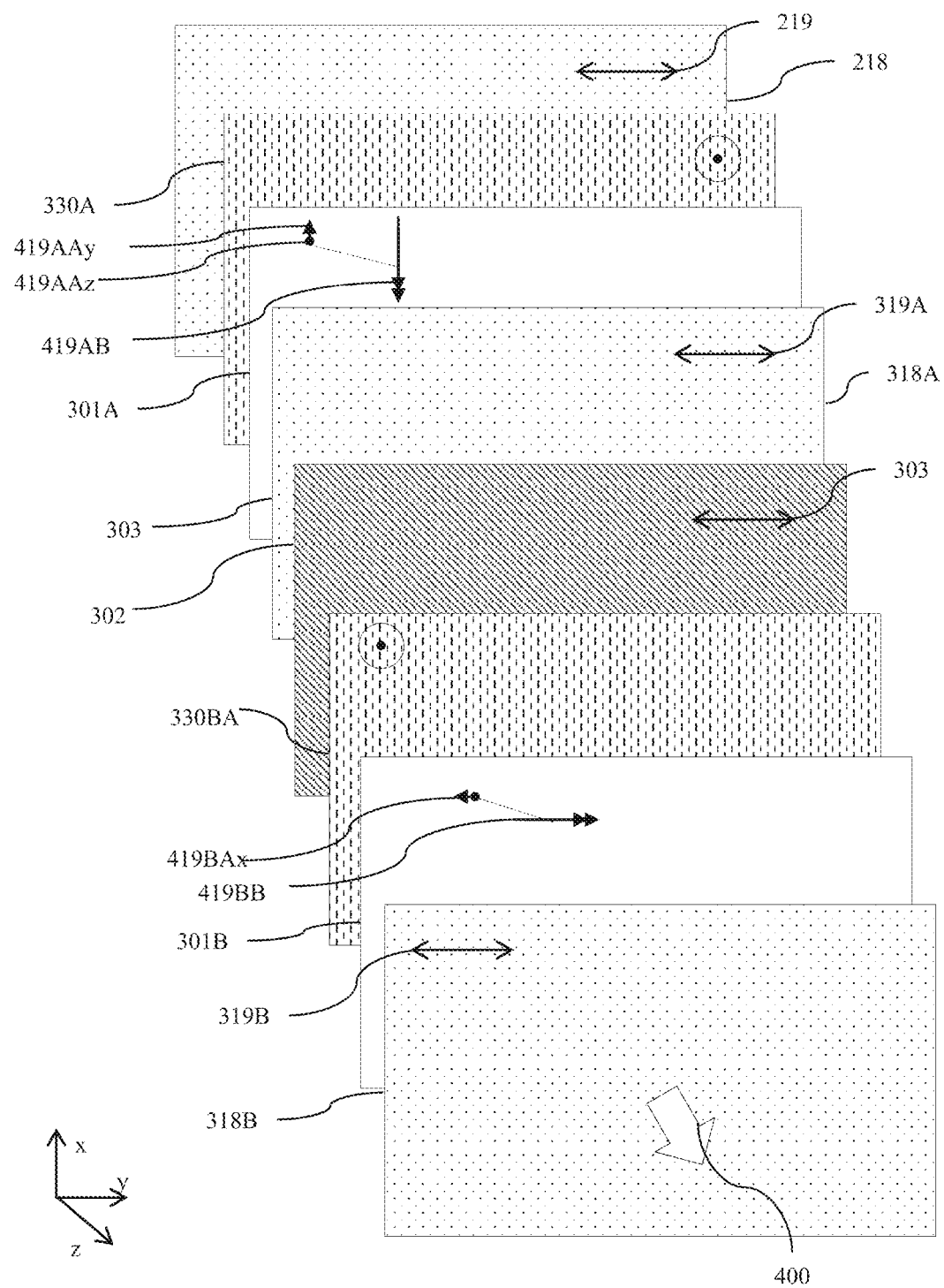
FIG. 47A is a schematic diagram illustrating in front perspective view an arrangement of polarisers and polar control retarders for the embodiment of FIG. 46 wherein the first and second polar control retarders are crossed.

FIG. 47A is a schematic diagram illustrating in front perspective view an arrangement polarisers and polar control retarders for the embodiment of FIG. 46 wherein the first and second polar control retarders are crossed and the spatial light modulator comprises the parallax barrier 700. In this embodiment, liquid crystal alignment in the switchable polar control retarder 301A is provided by homeotropic alignment layer with alignment direction 419AAz with pretilt direction 419AAy and homogeneous alignment layer with pretilt direction 419AB, where the directions 419AAy, 419AB are anti-parallel; and liquid crystal alignment in the switchable polar control retarder 301B is provided by homeotropic alignment layer with alignment direction 419BAz with pretilt direction 419BAy and homogeneous alignment layer with pretilt direction 419BB, where the directions 419BAy, 419BB are anti-parallel, and directions 419AAy, 419AB are orthogonal to directions 419BAy, 419BB.

Features of the embodiment of FIG. 47A not discussed in further detail may be assumed to correspond to the features with equivalent reference numerals as discussed above, including any potential variations in the features.

Figure 47B:
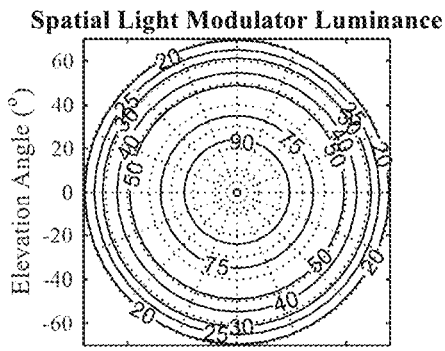
FIG. 47B is a graph illustrating a simulated polar profile of luminance output of an emissive spatial light modulator without the barrier structure.

FIG. 47B is a graph illustrating a simulated polar profile of luminance output of an emissive spatial light modulator without the barrier structure 700 of FIG. 46.

Figure 47C:
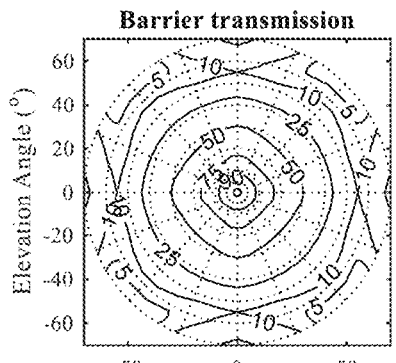
FIG. 47C is a graph illustrating a simulated polar profile of transmission of the barrier structure of light from the pixels of the emissive spatial light modulator.

FIG. 47C is a graph illustrating a simulated polar profile of transmission of the barrier structure of FIG. 2 of light from the pixels of the emissive spatial light modulator. An illustrative example is provided in TABLE 9 where the emissive spatial light modulator 48 and the aligned parallax barrier 700 has an output luminance profile having a full width half maximum that is at most 40 degrees.

TABLE 9

| Parameter, x-axis direction | Illustrative value |
|---|---|
| Pixel 224 pitch | 20 microns |
| Pixel 224 emitting width | 10 microns |
| Barrier aperture 702 width | 10 microns |
| Barrier separation, d | 20 microns |

TABLE 10

| Layer | Alignment type | Pretilt/ deg | In-plane alignment direction | LC layer 314 retardance (range) | Additional passive retarder 330 type | Additional passive retarder 330 retardance (range) |
|---|---|---|---|---|---|---|
| 419BB | Homogeneous | 2 | 270 | 1250 nm | | |
| 419BA | Homeotropic | 88 | 90 | (700 nm~2500 nm) | | |
| 330B | | | | | Negative C-plate | −1000 nm (−400 nm to −2100 nm) |
| 419AB | Homogeneous | 2 | 180 | 1250 nm | | |
| 419AA | Homeotropic | 88 | 0 | (700 nm~2500 nm) | | |
| 330A | | | | | Negative C-plate | −1000 nm (−400 nm to −2100 nm) |

Figure 47D:
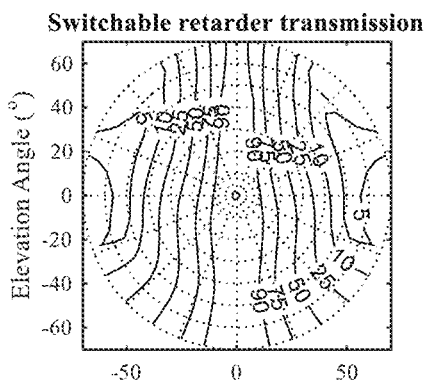
FIG. 47D is a graph illustrating a simulated polar profile of transmission of the second polar control retarder of FIG. 47A arranged between the first and second additional polarisers wherein the electric vector transmission directions of the polarisers are parallel.
Figure 47E:
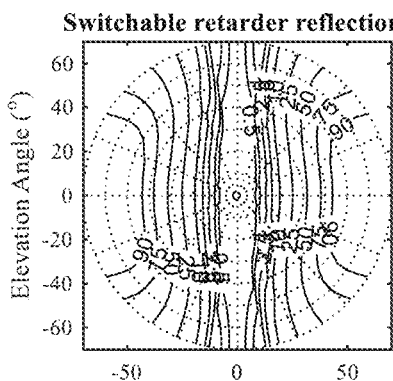
FIG. 47E is a graph illustrating a simulated polar profile of reflectivity of the second polar control retarder of FIG. 47A arranged between a reflective polariser and the second additional polariser wherein the electric vector transmission directions of the polarisers are parallel.
Figure 47F:
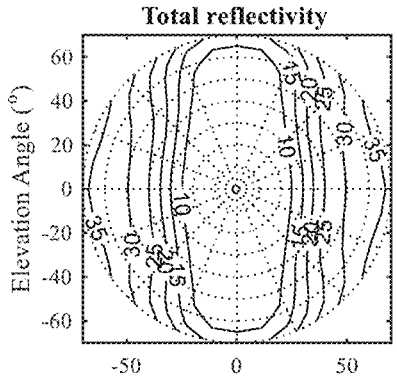
FIG. 47F is a graph illustrating a simulated polar profile of the total reflectivity comprising the reflectivity of FIG. 47E and the Fresnel reflectivity from the front surface of the display device.
Figure 47G:
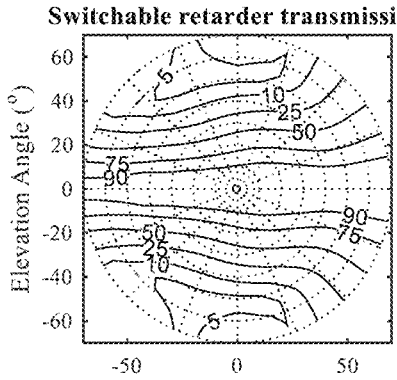
FIG. 47G is a graph illustrating a simulated polar profile of transmission of the first polar control retarder of FIG. 47A arranged between the display polariser and the first additional polariser wherein the electric vector transmission directions of the polarisers are parallel.
Figure 47H:
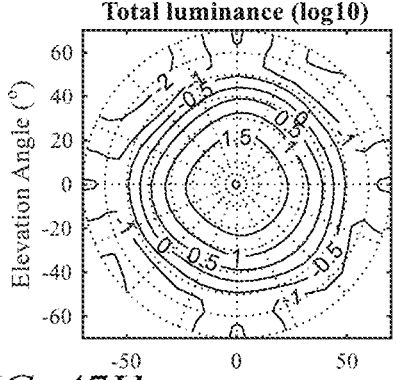
FIG. 47H is a graph illustrating a simulated polar profile of the logarithm of total output luminance of the spatial light modulator and first and second polar control retarders of FIG. 47A.

FIG. 47D is a graph illustrating a simulated polar profile of transmission of the second polar control retarder of FIG. 47A and TABLE 10 arranged between the first and second additional polarisers wherein the electric vector transmission directions of the polarisers are parallel; FIG. 47E is a graph illustrating a simulated polar profile of reflectivity of the second polar control retarder of FIG. 47A and TABLE 10 arranged between a reflective polariser and the second additional polariser wherein the electric vector transmission directions of the polarisers are parallel; FIG. 47F is a graph illustrating a simulated polar profile of the total reflectivity comprising the reflectivity of FIG. 47E and TABLE 10 and the Fresnel reflectivity from the front surface of the display device; FIG. 47G is a graph illustrating a simulated polar profile of transmission of the first polar control retarder of FIG. 47A and TABLE 10 arranged between the display polariser and the first additional polariser wherein the electric vector transmission directions of the polarisers are parallel; and FIG. 47H is a graph illustrating a simulated polar profile of the logarithm of total output luminance of the spatial light modulator and first and second polar control retarders of FIG. 47A.

Figure 47I:
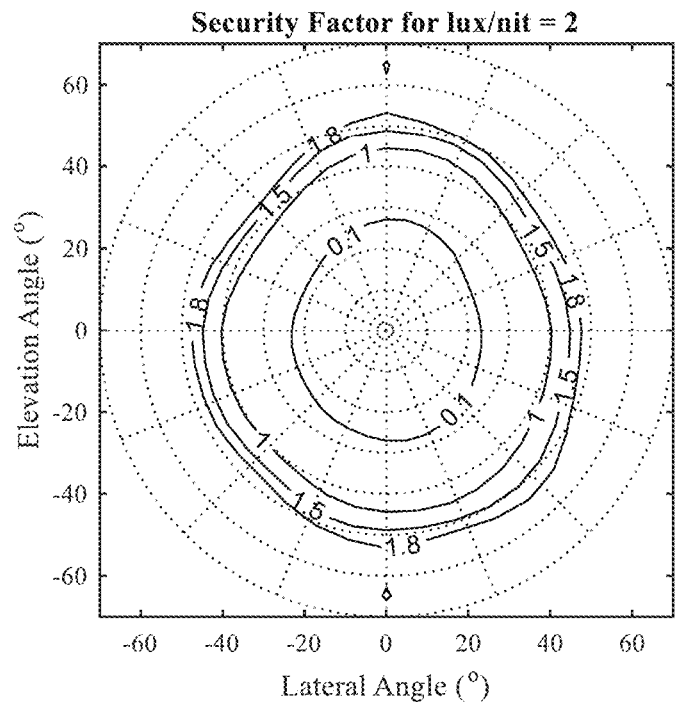
FIG. 47I is a graph illustrating a simulated polar profile of the security level, S of the arrangement of FIG. 47A in privacy mode for an ambient illuminance measured in lux that is twice the head-on display luminance measured in nits.

FIG. 47I is a graph illustrating a simulated polar profile of the security level, S of the arrangement of FIG. 47A, TABLE 9 and TABLE 10 in privacy mode for an ambient illuminance measured in lux that is twice the head-on display luminance measured in nits. Advantageously an emissive display may be provided with a polar profile of security level that is desirable for both landscape and portrait operation.

Figure 47J:
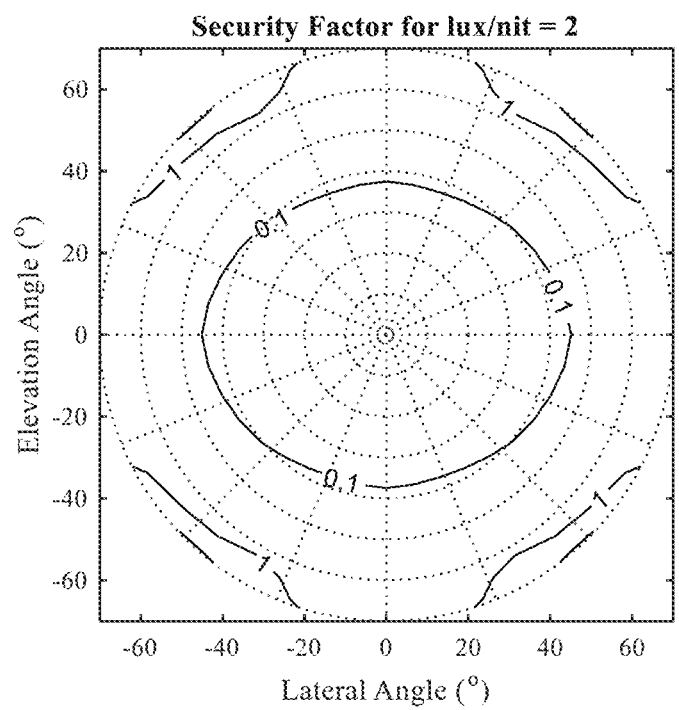
FIG. 47J is a graph illustrating a simulated polar profile of the security level, S of the arrangement of FIG. 47A in public mode for an ambient illuminance measured in lux that is twice the head-on display luminance measured in nits.

FIG. 47J is a graph illustrating a simulated polar profile of the security level, S of the arrangement of FIG. 47A, TABLE 9 and TABLE 10 in privacy mode for an ambient illuminance measured in lux that is twice the head-on display luminance measured in nits. In public mode, the output is determined by the profile 47B multiplied by the profile 47C. Security factor is illustrated in FIG. 47J. Advantageously security factor, S is less that 0.1 over a wide polar angular range so that an image can be clearly seen on the display.

As alternatives to the embodiment of TABLE 10, the retardances and alignment layers of the first and/or second polar control retarders 301A, 301B may be provided by two homogeneous alignment layers or two homeotropic alignment layers. In comparison to the arrangement of TABLE 10, the polar range for high security factor and the resilience to applied pressure may be modified to achieve desirable alternative characteristics.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A display device comprising:
an emissive spatial light modulator comprising an array of pixels arranged in a pixel layer;
a parallax barrier forming an array of apertures, wherein the parallax barrier is separated from the pixel layer by a parallax distance along an axis along a normal to the plane of the pixel layer;
wherein each pixel is aligned with a respective aperture in the array of apertures with a one-to-one correspondence.

2. A display device according to claim 1, wherein the parallax barrier directs light from each pixel into a common viewing window.

3. A display device according to claim 1, wherein, along a direction in which the apertures are closest, the apertures have a width a and the pixels have a width w meeting a requirement that $a \geq w$.

4. A display device according to claim 1, wherein, along a direction in which the apertures are closest, the apertures have a width a, the pixels have a pitch p and the pixels have a width w meeting a requirement that $a \leq (p-w/2)$.

5. A display device according to claim 1, wherein the parallax barrier has a separation d from the pixels and the pixels have a pitch p along a direction in which the apertures are closest and material between the parallax barrier and the pixels has a refractive index n meeting a requirement that $2d/p \leq \sqrt{(2n^2-1)}$.

6. A display device according to claim 1, wherein the parallax barrier has a separation d from the pixels and the apertures have a width a along a direction in which the apertures are closest and material between the parallax barrier and the pixels has a refractive index n meeting a requirement that $d \geq a\sqrt{(n^2-1)}/2$.

7. A display device according to claim 6, wherein the parallax barrier has a separation d from the pixels and the apertures have a width a along a direction in which the apertures are closest and material between the parallax barrier and the pixels has a refractive index n meeting a requirement that $d \geq an\sqrt{(1-3/(4n^2))}/\sqrt{3}$.

8. A display device according to claim 1, wherein a pitch p' along a direction in which the apertures are closest is smaller than a pitch p of the respective aligned pixels along the direction in which the pixels are closest; and
a viewing window is formed at a viewing window plane that is on an output side of the spatial light modulator.

9. A display device according to claim 1, wherein the parallax barrier forms a two dimensional array of apertures, each pixel being aligned with a respective aperture.

10. A display device according to claim 9, wherein the pixels are arranged in columns and rows,
the direction in which the apertures are closest is at 45 degrees with respect to an electric vector transmission direction of an output linear polariser; and
each pixel has a light emission region that is a square shape with edges rotated by 45 degrees with respect to the electric vector transmission direction of the output linear polariser.

11. A display device according to claim 10, wherein the apertures have a square shape with edges rotated by 45 degrees with respect to the electric vector transmission direction of the output linear polariser; or the apertures have a circular shape.

12. A display device according to claim 1, wherein for at least some of the pixels the light emission region comprises light emitting sub-regions and non-light emitting sub-regions.

13. A display device according to claim 12, wherein the ratio of the area of light emitting sub-regions to non-light emitting regions is different for red, green and blue pixels.

14. A display device according to claim 1, wherein the parallax barrier forms a one dimensional array of apertures, the pixels being arranged in columns, each column of pixels being aligned with a respective aperture.

15. A display device according to claim 14, wherein each pixel has a light emission region that is extended in the direction in which the apertures are extended;
the width of the red, green and blue light emission regions are the same for each of the pixels; and
the height of the light emission regions are different for red, green and blue light emitting pixels.

16. A display device according to claim 1, wherein the parallax barrier is arranged to absorb light incident thereon.

17. A display device according to claim 16, wherein the display device is for use in ambient illumination and the parallax barrier absorbs at least some of the ambient illumination transmitted through the apertures that is reflected from the pixel layer.

18. A display device according to claim 1, wherein the absorption of the region of the parallax barrier between the apertures is less than 100%, and
is greater than 80% preferably greater than 90% and more preferably greater than 95%.

19. A display device according to claim 1, wherein the display device has one or more additional layers between the pixel layer and the parallax barrier, wherein the pixels, the one or more additional layers and the parallax barrier are formed as a monolithic stack.

20. A display device according to claim 19, wherein the one or more additional layers comprise at least one light transmitting inorganic layer arranged to provide a barrier to water and oxygen.

21. A display device according to claim 1, wherein the parallax barrier comprises at least one light transmitting inorganic material that is arranged to provide a barrier to water and oxygen.

22. A display device according to claim 1, wherein the parallax barrier is arranged between the pixel layer and at least one light transmitting inorganic layer that is arranged to provide a barrier to water and oxygen.

23. A display device according to claim 1, wherein an output polariser is arranged on the output of the spatial light modulator, the output polariser being a linear polariser; and
a reflection control quarter-wave retarder is arranged between the output polariser and spatial light modulator.

24. A display device according to claim 23, wherein the parallax barrier is arranged between the pixel layer and the reflection control quarter-wave retarder.

25. A display device according to claim 23, wherein at least one of the output polariser and additional polariser, when crossed with a notional polariser of the same material has transmission for wavelengths from 520 nm to 560 nm that is less than the transmission for wavelengths from 450 nm to 490 nm.

26. A display device according to claim 25, wherein
the transmission for wavelengths from 450 nm to 490 nm is greater than 1%, preferably greater than 2% and most preferably greater than 3%; and
the transmission for wavelengths from 520 nm to 560 nm is less than 3%, preferably less than 2% and most preferably less than 1%.

27. A display device according to claim 23, wherein the output polariser is a reflective polariser.

28. A display device according to claim 1, further comprising an additional polariser arranged on the output side of the output polariser, the additional polariser being a linear polariser; and
at least one polar control retarder arranged between the output polariser and the additional polariser.

29. A display device according to claim 28, wherein the at least one polar control retarder further comprises at least one passive retarder.

30. A display device according to claim 29, wherein the at least one polar control retarder is capable of simultaneously introducing no net relative phase shift to orthogonal polarisation components of light passed by the output polariser along an axis along a normal to the plane of the at least one polar control retarder and introducing a relative phase shift to orthogonal polarisation components of light passed by the reflective polariser along an axis inclined to a normal to the plane of the at least one polar control retarder.

31. A display device according to claim 29, wherein the at least one passive retarder comprises a retarder having its optical axis perpendicular to the plane of the retarder, the at least one passive retarder having a retardance for light of a wavelength of 550 nm in a range from −150 nm to −900 nm, preferably in a range from −200 nm to −500 nm and most preferably in a range from −250 nm to −400 nm.

32. A display device according to claim 29, wherein the at least one retarder comprises first and second quarter-wave plates arranged between the additional polariser and the output polariser, the first quarter-wave plate being arranged on the input side of the second quarter-wave plate and being arranged to convert a linearly polarised polarisation state passed by the output polariser on the input side thereof into a circularly polarised polarisation state, and the second quarter-wave plate on the output side being arranged to convert a circularly polarised polarisation state that is incident thereon into a linearly polarised polarisation state that is passed by the additional polariser on the output side thereof; and at least one retarder arranged between the pair of quarter-wave plates.

33. A display device according to claim 32, wherein the retarder arranged between the pair of quarter-wave plates comprises a retarder having its optical axis perpendicular to the plane of the retarder, the at least one passive retarder having a retardance for light of a wavelength of 550 nm in a range from −150 nm to −500 nm, preferably in a range from −200 nm to −400 nm and most preferably in a range from −250 nm to −350 nm.

34. A display device according to claim 28, wherein the at least one polar control retarder comprises a switchable liquid crystal retarder comprising a layer of liquid crystal material and electrodes arranged to apply a voltage for switching the layer of liquid crystal material.

35. A display device according to claim 34, wherein the at least one polar control retarder is arranged, in a first switchable state of the switchable liquid crystal retarder, simultaneously to introduce no net relative phase shift to orthogonal polarisation components of light passed by the reflective polariser along an axis along a normal to the plane of the at least one polar control retarder and to introduce a net relative phase shift to orthogonal polarisation components of light passed by the reflective polariser along an axis inclined to a normal to the plane of the at least one polar control retarder; and in a second switchable state of the switchable liquid crystal retarder, simultaneously to introduce no net relative phase shift to orthogonal polarisation components of light passed by the reflective polariser along an axis along a normal to the plane of the at least one polar control retarder and to introduce no net relative phase shift to orthogonal polarisation components of light passed by the reflective polariser along an axis inclined to a normal to the plane of the at least one polar control retarder.

36. A display device according to claim 1, further comprising a reflective polariser arranged between the output polariser and the at least one polar control retarder, the reflective polariser being a linear polariser arranged to pass the same linearly polarised polarisation component as the output polariser.

37. A display device according to claim 1, wherein the pixels comprise light emitting diodes.

38. A display device according to claim 37, wherein the light emitting diodes are organic light emitting diodes comprising an organic light emitting material.

39. A display device according to claim 38, wherein the thickness of the light emitting material is different for each of the red, green and blue light emitting regions.

40. A display device according to claim 37, wherein at least some of the light emitting diodes are inorganic micro light emitting diodes.

41. A display device according to claim 40, wherein the apertures have an absorption that has a transmission gradient at the edges of the aperture that has a transmission gradient width of greater than 1 micron, preferably greater than 2 microns and more preferably greater than 3 microns.

42. A display device according to claim 1, wherein the array of apertures is formed on a touch sensor electrode array.

43. A display device according to claim 1, wherein the at least one absorbing region of the parallax barrier comprises a touch sensor electrode array.

44. A display device according to claim 1, wherein at least some of the apertures of the parallax barrier comprise a colour filter.

45. A display device according to claim 44, wherein the apertures of the parallax barrier comprise an array of red, green and blue colour filters.

46. A reflectivity control display device for use in ambient illumination comprising:
a display device comprising:
an emissive spatial light modulator comprising an array of pixels arranged in a pixel layer;
a parallax barrier forming an array of apertures, wherein the parallax barrier is separated from the pixel layer by a parallax distance along an axis along a normal to the plane of the pixel layer;
each pixel being aligned with a respective aperture in the array of apertures with a one-to-one correspondence, wherein the parallax barrier is configured to absorb at least some of the ambient illumination.

47. A reflectivity control display device according to claim 46, wherein the parallax barrier directs light from each pixel into a common viewing window.

48. A reflectivity control display device according to claim 47, wherein, along a direction in which the apertures are closest, the apertures have a width a and the pixels have a width w meeting a requirement that a≥w.

49. A reflectivity control display device according to claim 46, wherein the parallax barrier absorbs at least some of the ambient illumination that is reflected from the pixel layer.

50. A reflectivity control display device according to claim 46, wherein, along a direction in which the apertures are closest, the apertures have a width a, the pixels have a pitch p and the pixels have a width w meeting a requirement that a≤(p−w/2).

51. A reflectivity control display device according to claim 46, wherein the parallax barrier has a separation d from the pixels and the pixels have a pitch p along a direction in which the apertures are closest and material between the parallax barrier and the pixels has a refractive index n meeting a requirement that $2d/p \leq \sqrt{(2n^2-1)}$.

52. A reflectivity control display device according to claim 51, wherein the parallax barrier has a separation d from the pixels and the apertures have a width a along a direction in which the apertures are closest and material between the parallax barrier and the pixels has a refractive index n meeting a requirement that $d \geq an\sqrt{(1-3/(4n^2))}/\sqrt{3}$.

53. A reflectivity control display device according to claim 46, wherein the pitch P along a direction in which the apertures are closest is smaller than the pitch p of the respective aligned pixels along a direction in which the pixels are closest; and
 a viewing window is formed at a viewing window plane that is on an output side of the spatial light modulator.

54. A reflectivity control display device according to claim 46, wherein the parallax barrier forms a two dimensional array of apertures, each pixel being aligned with a respective aperture.

55. A reflectivity control display device according to claim 54, wherein the pixels are arranged in columns and rows,
 the direction in which the apertures are closest is at 45 degrees with respect to an electric vector transmission direction of an output linear polariser; and
 each pixel has a light emission region that is a square shape with edges rotated by 45 degrees with respect to the electric vector transmission direction of the output linear polariser.

56. A reflectivity control display device according to claim 55, wherein the apertures have a square shape with edges rotated by 45 degrees with respect to the electric vector transmission direction of the output linear polariser; or the apertures have a circular shape.

57. A reflectivity control display device according to claim 46, wherein the absorption of the region of the parallax barrier between the apertures is less than 100%, and is greater than 80% preferably greater than 90% and more preferably greater than 95%.

58. A reflectivity control display device according to claim 46, wherein the display device has one or more additional layers between the pixel layer and the parallax barrier, wherein the pixels, the one or more additional layers and the parallax barrier are formed as a monolithic stack.

59. A reflectivity control display device according to claim 58, wherein the one or more additional layers comprise at least one light transmitting inorganic layer arranged to provide a barrier to water and oxygen.

60. A reflectivity control display device according to claim 46, wherein the parallax barrier comprises at least one light transmitting inorganic material that is arranged to provide a barrier to water and oxygen.

61. A reflectivity control display device according to claim 46, wherein the parallax barrier is arranged between the pixel layer and at least one light transmitting inorganic layer that is arranged to provide a barrier to water and oxygen.

62. A reflectivity control display device according to claim 46, wherein an output polariser is arranged on the output of the spatial light modulator, the output polariser being a linear polariser; and
 a reflection control quarter-wave retarder is arranged between the output polariser and spatial light modulator.

63. A reflectivity control display device according to claim 62, wherein the parallax barrier is arranged between the pixel layer and the reflection control quarter-wave retarder.

64. A reflectivity control display device according to claim 62, wherein at least one of the output polariser and additional polariser, when crossed with a notional polariser of the same material has transmission for wavelengths from 520 nm to 560 nm that is less than the transmission for wavelengths from 450 nm to 490 nm.

65. A reflectivity control display device according to claim 64, wherein
 the transmission for wavelengths from 450 nm to 490 nm is greater than 1%, preferably greater than 2% and most preferably greater than 3%; and
 the transmission for wavelengths from 520 nm to 560 nm is less than 3%, preferably less than 2% and most preferably less than 1%.

66. A reflectivity control display device according to claim 46, wherein the pixels comprise light emitting diodes.

67. A reflectivity control display device according to claim 66, wherein the light emitting diodes are organic light emitting diodes comprising an organic light emitting material.

68. A reflectivity control display device according to claim 67, wherein the thickness of the light emitting material is different for each of the red, green and blue light emitting regions.

69. A reflectivity control display device according to claim 68, wherein for at least some of the pixels the light emission region comprises light emitting sub-regions and non-light emitting sub-regions.

70. A reflectivity control display device according to claim 69, wherein the ratio of the area of light emitting sub-regions to non-light emitting regions is different for red, green and blue pixels.

71. A reflectivity control display device according to claim 46, wherein at least some of the light emitting diodes are inorganic micro light emitting diodes.

72. A reflectivity control display device according to claim 71, wherein the apertures have an absorption that has a transmission gradient at the edges of the aperture that has a transmission gradient width of greater than 1 micron, preferably greater than 2 microns and more preferably greater than 3 microns.

73. A reflectivity control display device according to claim 46, wherein the array of apertures is formed on a touch sensor electrode array.

74. A reflectivity control display device according to claim 46, wherein the at least one absorbing region of the parallax barrier comprises a touch sensor electrode array.

75. A display device according to claim 46, wherein the display device has no polariser arranged on the output side of the spatial light modulator.

76. A privacy display device having landscape and portrait privacy modes, the privacy display device comprising:
   an emissive spatial light modulator comprising an array of pixels arranged in a pixel layer; and
   a parallax barrier forming an array of apertures, wherein the parallax barrier is separated from the pixel layer by a parallax distance along an axis along a normal to the plane of the pixel layer;
   wherein the parallax barrier forms a two dimensional array of apertures arranged in a plurality of columns and a plurality of rows, each pixel being aligned with a respective aperture in a one-to-one correspondence.

* * * * *